United States Patent
Semo et al.

(10) Patent No.: US 12,159,200 B2
(45) Date of Patent: Dec. 3, 2024

(54) PHOTONIC QUANTUM COMPUTATION WITH DIRTY PHOTONS

(71) Applicants: QUANTUM SOURCE LABS LTD., Tel Aviv-Jaffa (IL); YEDA RESEARCH AND DEVELOPMENT CO. LTD., Rehovot (IL)

(72) Inventors: Gil Semo, Tel-Aviv (IL); Ziv Aqua, Rehovot (IL); Oded Melamed, Shoham (IL); Dan Charash, Herzliya (IL); Serge Rosenblum, Rehovot (IL); Barak Dayan, Tel-Aviv (IL)

(73) Assignees: Yeda Research and Development Co. Ltd., Rehovot (IL); Quantum Source Labs Ltd., Tel Aviv-Jaffa (IL)

( * ) Notice: Subject to any disclaimer, the term of this patent is extended or adjusted under 35 U.S.C. 154(b) by 21 days.

(21) Appl. No.: 18/299,815

(22) Filed: Apr. 13, 2023

(65) Prior Publication Data
US 2024/0338585 A1    Oct. 10, 2024

Related U.S. Application Data

(63) Continuation of application No. PCT/IB2022/000564, filed on Apr. 27, 2022.
(Continued)

(30) Foreign Application Priority Data

Apr. 27, 2021   (IL) .......................................... 282705

(51) Int. Cl.
*G06N 10/40* (2022.01)

(52) U.S. Cl.
CPC .................................. *G06N 10/40* (2022.01)

(58) Field of Classification Search
CPC ...................................................... G06N 10/40
See application file for complete search history.

(56) References Cited

U.S. PATENT DOCUMENTS

| | | |
|---|---|---|
| 5,640,022 A | 6/1997 | Inai |
| 5,917,195 A | 6/1999 | Brown |
| | (Continued) | |

FOREIGN PATENT DOCUMENTS

WO    WO 2016/157184 A1    10/2016

OTHER PUBLICATIONS

International Search Report and Written Opinion for PCT International Application No. PCT/IB2023/052601, filed Mar. 16, 2023, 13 pages, mailed Apr. 18, 2023.
(Continued)

*Primary Examiner* — Nghia M Doan
(74) *Attorney, Agent, or Firm* — Finnegan, Henderson, Farabow, Garrett & Dunner, L.L.P.

(57) ABSTRACT

Systems and methods for generating photonic graph states for quantum computing include coupling a quantum emitter to a cavity, generating a first dirty photon having a first temporal profile, using the first dirty photon to form a first photonic qubit, generating a second dirty photon having a second temporal profile, using the second dirty photon to form a second photonic qubit, using the quantum emitter coupled to the cavity to entangle the first photonic qubit with the second photonic qubit to form a pair of entangled photonic qubits, and using the pair of entangled photonic qubits for quantum computation.

20 Claims, 31 Drawing Sheets

Related U.S. Application Data

(60) Provisional application No. 63/320,454, filed on Mar. 16, 2022.

(56) References Cited

U.S. PATENT DOCUMENTS

| | | | |
|---|---|---|---|
| 8,941,053 | B1 | 1/2015 | Biedermann et al. |
| 8,975,617 | B2 | 3/2015 | Berco |
| 9,858,531 | B1 | 1/2018 | Monroe et al. |
| 10,304,535 | B2 | 5/2019 | Dayan et al. |
| 10,423,887 | B2 * | 9/2019 | Roetteler ............. B82Y 10/00 |
| 10,504,033 | B1 | 12/2019 | King et al. |
| 11,150,609 | B1 | 10/2021 | Parazzoli et al. |
| 11,475,347 | B1 | 10/2022 | Rudolph et al. |
| 11,501,198 | B1 | 11/2022 | Birchall et al. |
| 11,832,467 | B2 | 11/2023 | Shin et al. |
| 2007/0104420 | A1 | 5/2007 | Franson et al. |
| 2007/0288684 | A1 * | 12/2007 | Bergou ............. B82Y 10/00 |
| | | | 711/101 |
| 2010/0033256 | A1 | 2/2010 | Strabley et al. |
| 2014/0140651 | A1 | 5/2014 | Hafezi et al. |
| 2015/0077821 | A1 | 3/2015 | Smith et al. |
| 2018/0053551 | A1 | 2/2018 | Dayan et al. |
| 2019/0181611 | A1 | 6/2019 | Maleki et al. |
| 2020/0116623 | A1 | 4/2020 | Cooper-Roy et al. |
| 2021/0296558 | A1 | 9/2021 | Englund et al. |
| 2021/0304053 | A1 | 9/2021 | Pant et al. |
| 2021/0406756 | A1 | 12/2021 | Amini et al. |
| 2023/0194343 | A1 | 6/2023 | Knaut et al. |
| 2023/0419157 | A1 | 12/2023 | Wan et al. |

OTHER PUBLICATIONS

International Search Report and Written Opinion for PCT International Application No. PCT/IB2022/000564, filed Apr. 27, 2022, 20 pages, mailed Mar. 31, 2023.

Israeli Office Action and International Search Report issued by the Israeli Patent Office for patent application No. 282705, dated Mar. 3, 2022.

Alton et al.; "Strong interactions of single atoms and photons near a dielectric boundary" Nature Physics, vol. 7, No. 2 (2011): 159-165.

Armani et al.; "Ultra-high-Q toroid microcavity on a chip", Letter to Nature, vol. 421.6926 (2003): pp. 925-928.

Bartolucci et al.; "Fusion-based quantum computation", Nature Communications 14 (2021). arXiv preprint arXiv:2101.09310.

Baur et al.; "Single-photon switch based on Rydberg blockade.", Physical review letters 112.7, pp. 073901-1-073901-05 and Supplemental Material pp. 1-8, (2014).

Bechler et al.; "A passive photon-atom qubit swap operation", Letters, Nature Physics, vol. 14, pp. 996-1000, (2018). http://dx.doi.org/10.1038/NPHOTON.2015.227.

Birnbaum et al.; "Photon blockade in an optical cavity with one trapped atom", Nature, vol. 436.7047, pp. 87-90, (2005).

Blinov et al.; "Observation of entanglement between a single trapped atom and a single photon" Nature, vol. 428.6979, pp. 153-157; (2004).

Carmichael, H.J.; "Quantum trajectory theory for cascaded open systems", Physical Review Letters, vol. 70, No. 15, 2 pages of coversheets and pp. 2273-2276, (1993).

Chang et al.; "A single-photon transistor using nanoscale surface plasmons", Nature Physics, vol. 3, No. 11, pp. 807-812, (2007).

Chang et al.; "Efficiently coupled microring circuit for on-chip cavity QED with trapped atoms", Applied Physics Letters 117, 174001, coversheet and pp. 1-6, (2020). https://doi.org/10.1063/5.0023464.

Chen et al.; "All-optical switch and transistor gated by one stored photon", Science, vol. 341, issue 6147, Table of Contents pp. 691 and 693 and pp. 768-770, (2013).

Cirac et al.; "Quantum state transfer and entanglement distribution among distant nodes in a quantum network", Physical Review Letters, vol. 78, No. 16, cover sheets 2 pages and pp. 3221-3224, (1997).

Dawes et al.; "All-optical switching in rubidium vapor" Science, vol. 308, No. 5722, Table of Contents pp. 589, 591 and 593, pp. 672-674, (2005).

Dayan et al.; "A photon turnstile dynamically regulated by one atom" Science. vol. 319.5866, cover sheet and pp. 1-8, (2008).

ÐorÐević et al.; "Entanglement transport and a nanophotonic interface for atoms in optical tweezers", Science 373, pp. 1-16 (2021) https://arxiv.org/pdf/2105.06485.pdf.

Duan et al.; "Scalable photonic quantum computation through cavity-assisted interactions", Physical Review Letters, vol. 92, No. 12, Cover sheet 2 pages, pp. 127902-1-127902-4, (2004).

Fleischhauer et al.; "Electromagnetically induced transparency: Optics in coherent media", Reviews of Modern Physics, vol. 77, No. 2, pp. 633-673, (2005).

Fushman et al.; "Controlled phase shifts with a single quantum dot", Science, 320.5877, coversheet, pp. 1-7, (2008).

Gaetan et al.; "Observation of collective excitation of two individual atoms in the Rydberg blockade regime", Nature Physics, Letters, vol. 5, pp. 115-118, (2009).

Gea-Banacloche et al.; "Photon subtraction and addition by a three-level atom in an optical cavity", Physical Review A 88.3, pp. 033832-1-033832-8, (2013).

Hacker et al.; "A photon-photon quantum gate based on a single atom in an optical resonator", Nature, vol. 536, pp. 193-196 (2016).

Hacker et al.; "Deterministic creation of entangled atom-light Schrödinger-cat states" Nature Photonics 13.2, 110-114; (2019).

Hofmann et al.; "Optimized phase switching using a single-atom nonlinearity", Journal of Optics B: Quantum and Semiclassical Optics, Institute of Physics Publishing, vol. 5, pp. 218-221, (2003).

Hoi et al.; "Demonstration of a single-photon router in the microwave regime.", Physical review letters, American Physical Society, 107 .7, pp. 073601-1-073601-5, (2011).

Jaksch et al.; "Fast quantum gates for neutral atoms", Physical Review Letters, vol. 85, No. 10, pp. 2 cover sheet pages, pp. 2208-2211, (2000).

Junge et al.; "Strong coupling between single atoms and nontransversal photons", Physical Review Letters, American Physical Society, 110.21, pp. 213604-1-213604-5, (2013).

Kimble; "The quantum internet", Nature vol. 453, issue No. 7198, 1 coversheet, p. iii and pp. 1023-1030, (2008).

Koshino et al.; "Deterministic photon-photon SWAP gate using a Λ system", American Physical Society, Physical Review A, 82.1, pp. 010301-1-010301-4, (2010).

Kuhn et al.; "Deterministic single-photon source for distributed quantum networking", Physical review letters, vol. 89, No. 6, Cover sheet 2 pages and pp. 067901-1-067901-4, (2002).

McKeever et al.; "Deterministic generation of single photons from one atom trapped in a cavity" Science, vol. 303(5666), pp. 1935 and 1937 and pp. 1992-1994, (2004).

Morin et al.; "Deterministic Shaping and Reshaping of Single-Photon Temporal Wave Functions", Phys. Rev. Lett., pp. 1-5 and supplemental material pp. 1-6, vol. 123, 133602 (2019).

Mücke et al.; "Generation of single photons from an atom-cavity system", Physical Review A, 87(6), pp. 063805-1-063805-6, (2013).

Peyronel et al.; "Quantum nonlinear optics with single photons enabled by strongly interacting atoms", Nature, Letter, vol. 488, issue No. 7409, cover sheet, p. 4 and pp. 57-60, (2012).

Pichler et al.; "Universal photonic quantum computation via time-delayed feedback", Proceedings of the National Academy of Sciences, vol. 114, No. 43, pp. 11362-11367, (2017) www.pnas.org/cgi/doi/10.1073/pnas.1711003114.

Pinotsi et al.; "Single photon absorption by a single quantum emitter", American Physical Society, Physical Review Letters 100. 9, pp. 093603-1-093603-4, (2008).

Press et al.; "Photon antibunching from a single quantum-dot-microcavity system in the strong coupling regime.", American Physical Society, Physical Review Letters 98.11, pp. 117402-1-117402-4.

Reiserer et al.; "Nondestructive detection of an optical photon", Science, vol. 342, cover sheet, p. 1237 and pp. 1349-1351, (2013).

(56) References Cited

OTHER PUBLICATIONS

Reiserer et al.; "A quantum gate between a flying optical photon and a single trapped atom", Nature, Letter, vol. 508, issue No. 7495, Cover sheet, p. 148, and pp. 237-240, (2014).

Righini et al.; "Whispering gallery mode microresonators: fundamentals and applications", Società Italiana di Fisica, Rivista del Nuovo Cimento vol. 34, No. 7, 435-488, (2011).

Rosenblum et al.; "Photon routing in cavity QED: Beyond the fundamental limit of photon blockade", American Physical Society, Physical Review A, 84.3, pp. 033854-1-033854-11, (2011).

Rosenblum et al. "Extraction of a single photon from an optical pulse", Nature Photonics, vol. 10, 19-22 (2016). http://dx.doi.org/10.1038/NPHOTON.2015.227.

Shomroni et al.; "All-optical routing of single photons by a one-atom switch controlled by a single photon", Aug. 22, 2014, Science, vol. 345, Issue 6199, pp. 903-906 and supplementary material (2014).

Tamura; "Microring resonators on a suspended membrane circuit for atom-light interactions", Proceeding of the SPIE, SPIE, US, vol. 11689, Coversheet, p. 853 and pp. 116891D1-116891D6, XP060140267, ISSN: 0277-786X, DOI: 10.1117/12.2579079, (2021).

Thompson et al.; "Observation of normal-mode splitting for an atom in an optical cavity", The American Physical Society, Physical Review Letters, vol. 68, No. 8, pp. 1132-1135, (1992).

Thompson; "A quantum interface between single atoms and nanophotonic structures", Doctoral dissertation Harvard University, sheets iii-x and pp. 1-133, XP055750243, (2014).

Tiecke et al.; "Nanophotonic quantum phase switch with a single atom", Nature, vol. 508, No. 7495, coversheet, p. 148, and pp. 241-244, (2014).

Turchette et al.; "Measurement of conditional phase shifts for quantum logic", The American Physical Society, Physical Review Letters vol. 75, No. 25, 2 coversheets and pp. 4710-4713, (1995).

Volz et al.; "Nonlinear π phase shift for single fibre-guided photons interacting with a single resonator-enhanced atom", Nature Photonics, vol. 8, No. 12, pp. 965-970, (2014).

Weber et al.; "Photon-photon entanglement with a single trapped atom", Physical review letters, 102.3: 030501-1-030501-4, (2009).

Witthaut et al.; "Photon scattering by a three-level emitter in a one-dimensional waveguide", New Journal of Physics, vol. 12, No. 4, 043052, pp. 1-18, (2010).

Borregaard et al.; "One-Way Quantum Repeater Based on Near-Deterministic Photon-Emitter Interfaces", Physical Review X, vol. 10, 021071-1-021071-13, (2020).

Brown et al.; "Co-designing a scalable quantum computer with trapped atomic ions" Nature Partner Journals, Quantum Information (2016) 2, 16034, pp. 1-10.

Chang et al.; "Microring resonators on a suspended membrane circuit for atom-light interactions", Optical Society of America, Optica, vol. 6, No. 9, pp. 1203-1210, (2019).

Kroh et al., "Slow and Fast single photons from a quantum dot interacting with the excited state hyperfine structure of the Cesium D1—line", Nature Research Scientific Reports, 9:13728, 11 pages (2019).

\* cited by examiner

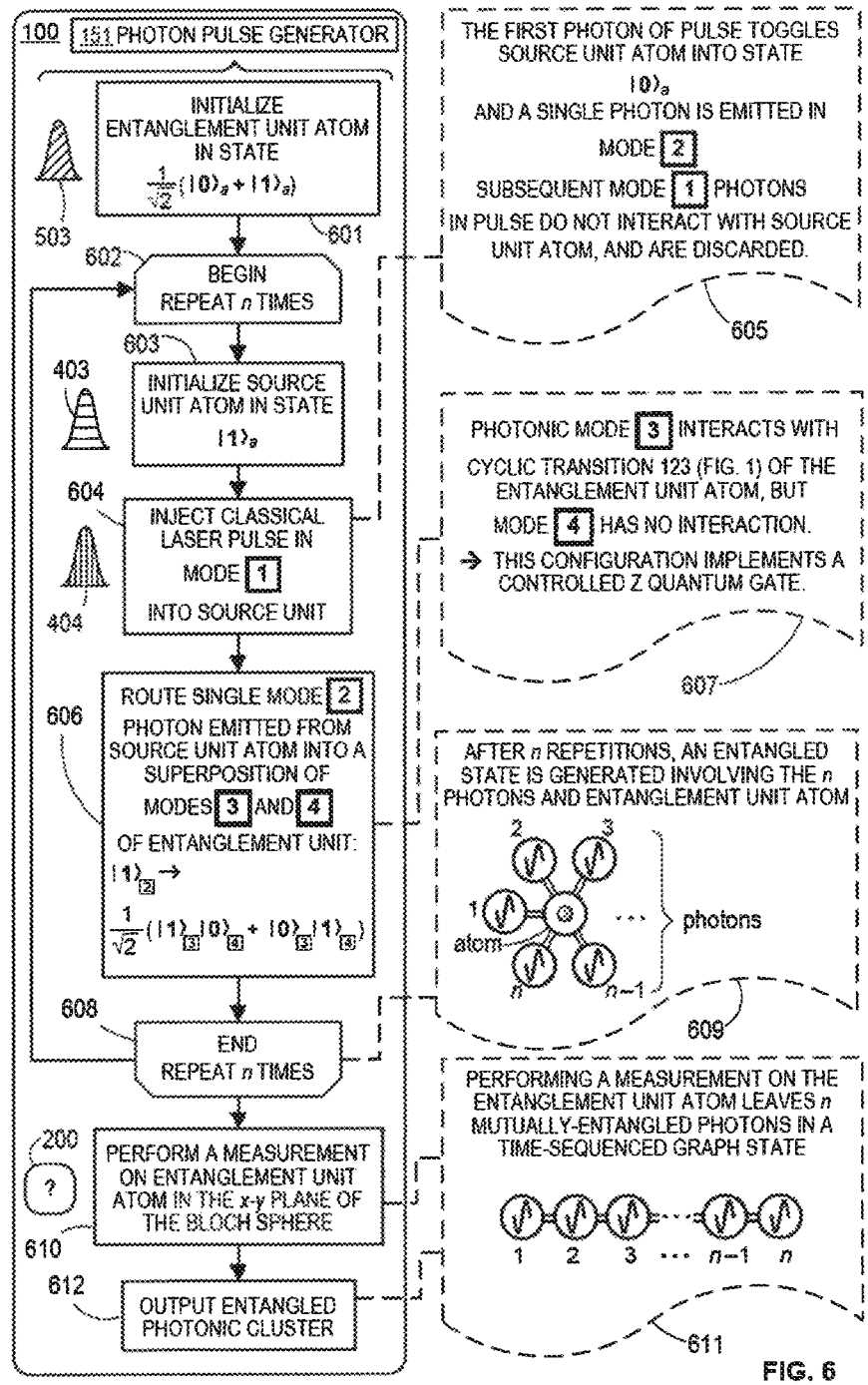

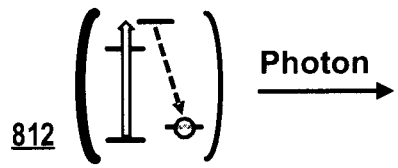
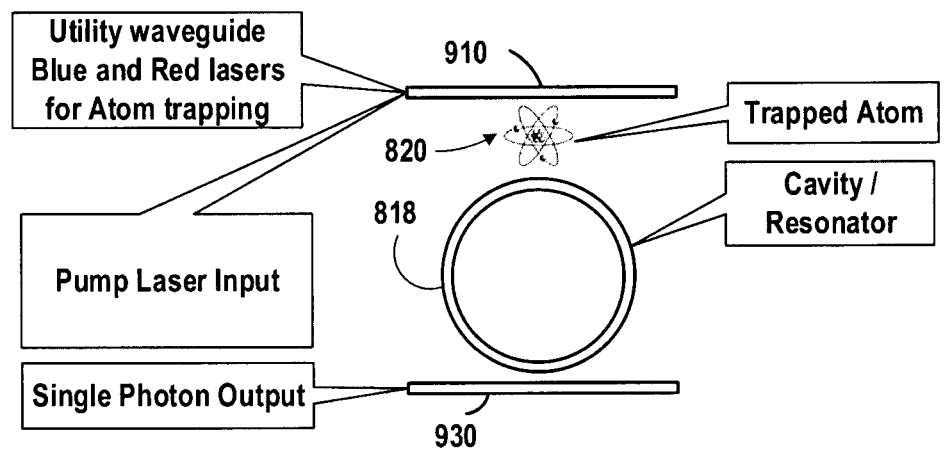
Fig. 9B - Photon generation
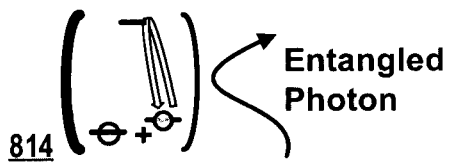
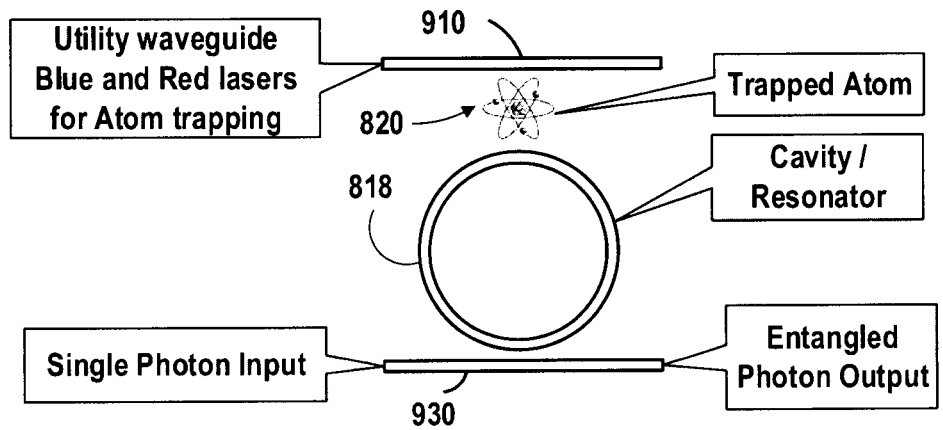
Fig. 9C - Entangling gate

PHOTONIC QUANTUM COMPUTATION WITH DIRTY PHOTONS

RELATED APPLICATIONS

The application is a continuation of PCT International Application No. PCT/IB2022/000564, filed Apr. 27, 2022, which is based upon and claims priority to U.S. Provisional Application No. 63/320,454, filed Mar. 16, 2022, and Israeli Patent Application No. 282705, filed Apr. 27, 2021, the entire contents of all of which are incorporated herein by reference.

FIELD

The present disclosure relates generally to quantum computation using cavity quantum electrodynamics (Cavity QED), and related apparatuses, systems, computer readable media and methods. Some embodiments involve the generation of photonic graph states.

BACKGROUND

Building commercially useful quantum computers (QC) can be challenging for many reasons, for example due to scalability issues which arise from increasing complexity, noise and crosstalk as more qubits are added. Also, quantum computation algorithms can exploit entangled states, and some quantum computation architectures may use a source of entangled states (also referred to as a Resource State Generator) for obtaining those entangled states. The present disclosure relates to a mechanism for use in or with such a source of entangled states. Currently, quantum computing remains restricted to the proof-of-concept stage, with a relatively small number of qubits sufficient only to demonstrate that quantum computing is feasible in principle. To make quantum computing practical for handling real-world problems, current devices need to be scaled up to handle large numbers of qubits, over 106, including qubits for error correction.

Qubits for quantum computing are often hosted in one of three physical platforms (or regimes): superconductors (superconducting states), atoms (e.g. ionic states), and photons (photonic states).

The photonic platform offers a number of significant practical advantages over the other platforms. Photons are relatively easy to generate and do not require cryogenic or ultra-high vacuum environments, and construction of micro-miniaturized, reliable photonic devices and their communication infrastructure is accomplished utilizing readily available fabrication technologies. Thus, the photonic platform is currently a leading candidate for achieving the high-level scaling necessary for practical quantum computing devices.

The full potential of the photonic platform, however, is not presently realized, in large part because generating entangled photonic states for use as an entanglement resource in photonic quantum computing is currently highly inefficient. Conventional arrangements rely on nonlinear effects in crystals to generate single photons. In order to produce photonic graph states, these photons are entangled in a probabilistic manner using linear optics elements. For this purpose, generated photons should be indistinguishable, generated according to perfectly timed and identically shaped pulses. Unfortunately, this requirement comes at the expense of the generation efficiency. Furthermore, in order to end up with a photonic graph state of a certain number of qubits, the probabilistic entangling process would require a much larger number of initial single photons, and hence a larger number of elements. These points of inefficiency are cumulative and seriously restrict efforts to scale the photonic platform to meaningful numbers of qubits.

It is therefore highly desirable to have apparatuses and methods for generating photonic graph states which reduce or eliminate probabilistic processes and their inherent inefficiencies, and which instead deterministically generate photonic graph states at maximal efficiency, or at an improved efficiency, for use as qubits. This goal is met, or facilitated, by embodiments of the present disclosure.

SUMMARY

A source of entangled states for use in a quantum computation architecture can use a matter-based or a light-based mechanism. Matter-based quantum computation mechanisms, e.g., those using trapped ions, superconducting qubits, or quantum dots, are sometimes considered more efficient for achieving entangled states than light-based ones. Light-based quantum computation mechanisms, e.g., silicon photonics, are considered to be more scalable and modular. So light-based mechanisms may be useful in addressing the above scalability problem.

Using the embodiments consistent with the present disclosure, a source of entangled states for use with quantum computation using a high number of qubits may be possible, for example with a photonic quantum computation. Such architectures may also offer a scalable architecture which can be manufactured in a standard silicon fabrication lab. A cavity quantum electrodynamics (Cavity QED) based mechanism for use in the embodiments consistent with the present disclosure can exploit both light and matter properties, and hence can serve as a source of entangled states in such architectures, leading to a scalable architecture that can be manufactured even in a standard silicon fabrication lab at a potentially reasonable cost.

As examples, some embodiments consistent with the present disclosure include a novel entangled photon cluster state generation apparatus. More particularly, the disclosure includes description of a chip implementation of a Cavity-QED system. The entangled photons can be used as the basic building blocks for a quantum computer.

Photon-based quantum computing is one of several approaches for quantum computing. In a photonic quantum computer, the quantum data may be stored in the photon's quantum state. A building block of photonic quantum computers may include entangled photons. Therefore, a need exists for generating entangled photons efficiently.

Embodiments of the present disclosure are capable of providing, or enabling this provision of, deterministic apparatuses and methods for generating, and entanglement of, single photons, multiple photons, and photonic graph states usable in quantum computing. By avoiding probabilistic processes, the present disclosure may achieve high efficiency, allowing a high degree of generated photons to be usable in qubits.

According to aspects of the present disclosure, there are provided systems, methods, devices, integrated circuitry devices, circuitries, layouts of integrated circuitry devices, computer-readable storage media, non-transitory computer-readable storage media, and signals as described herein. Other features of disclosed embodiments will be apparent from dependent claims, clauses, the attached drawings, and the description of exemplary embodiments with reference to the attached drawings, which follow.

Some disclosed embodiments involve coupling a quantum emitter at each of a plurality of coupling locations, such that each of a plurality of quantum emitters is associated with a differing coupling location, wherein each coupling location is associated with a different one of a plurality of photonic cavities, and wherein quantum emitters associated with each coupling location are configured to mediate interactions between consecutive incoming photonic qubits to generate a graph state; supplying photons to the plurality of photonic cavities, wherein the photonic cavities are configured to couple photonic qubits to the quantum emitters; and outputting the graph state via a plurality of photon output channels downstream of the plurality of cavities.

Some disclosed embodiments involve: positioning a plurality of quantum emitters at a plurality of coupling sites associated with a plurality of cavities; initializing a state of a quantum emitter qubit associated with each of the plurality of quantum emitters; transmitting photonic qubits toward the plurality of the quantum emitters in at least one first instance transmission for generating an entangling gate between the photonic qubits and the quantum emitter qubit in order to entangle the quantum emitter qubit and the photonic qubits; and following the at least one of the first instance transmissions, transmitting photonic qubits toward the plurality of quantum emitters in at least one second instance transmission for generating a SWAP gate between the photonic qubits and the quantum emitter qubits to map the quantum emitter qubits to photonic qubits.

Some disclosed embodiments involve: coupling a quantum emitter to a cavity; generating a first dirty photon having a first temporal profile; using the first dirty photon to form a first photonic qubit; generating a second dirty photon having a second temporal profile; using the second dirty photon to form a second photonic qubit; using the quantum emitter coupled to the cavity to entangle the first photonic qubit with the second photonic qubit to form a pair of entangled photonic qubits; and using the pair of entangled photonic qubits to perform quantum computations.

According to an aspect of the present disclosure, there is provided a quantum computing system, method and computer readable medium (or non-transitory computer-readable medium) that involve initializing a state of a resonator-coupled quantum emitter; receiving at least two photonic graph states, each of the at least two photonic graph states containing at least two photons; selecting at least one photon from each graph state; feeding the selected photons through an entangling gate via the resonator-coupled quantum emitter; and disentangling the resonator-coupled quantum emitter from the selected photons, wherein disentangling includes at least one of detecting the state of the resonator-coupled quantum emitter or mapping the state of the resonator-coupled quantum emitter to a state of an additional photon.

According to an aspect of the present disclosure, there is provided a quantum computing system, method and computer readable medium (or non-transitory computer-readable medium) that involve: initializing a state of a resonator-coupled quantum emitter having at least four levels arranged in an N-configuration, the N-configuration having a first ground state, a second ground state, a first excited state and a second excited state; tuning a frequency of a first transition between the first ground state and the first excited state; tuning a frequency of a second transition between the second ground state and the second excited state; tuning a frequency of a third transition between the second ground state and the first excited state; feeding a plurality of photons at a frequency corresponding to the frequency of the second transition, thereby entangling the plurality of photons to the resonator-coupled quantum emitter; and feeding a photon at a frequency corresponding to the frequency of at least one of the first transition or the third transition, thereby mapping a state of the resonator-coupled quantum emitter into a photon.

Some disclosed embodiments involve: a plurality of photonic processing stages, wherein each photonic processing stage includes at least two of an optical switch, a beam splitter, a waveguide or a photon generator; a plurality of heralding-free connections, each connection being located between adjacent photonic processing stages; and circuitry configured to regulate photon flow between adjacent stages such that decisions about stage settings or flow between adjacent stages are free of input from a previous stage.

According to aspects of the presently disclosed subject-matter, a deterministic photonic graph state generator and a method related thereto are provided. Deterministic single photon generation is combined with deterministic cavity-enhanced photon-atom entanglement to produce time-sequenced entangled photons, and in related embodiments, generating and entanglement units are incorporated into integrated arrays which emit multi-dimensional cluster states of entangled photons having one temporal dimension and one or two additional dimensions such as one or two spatial dimensions.

Single photon generation, atom-photon entanglement, and photon-photon entanglement may be accomplished by a four-state atomic system within an optical cavity, whose transitions are independently addressable according to energy and polarization of incoming photons. Types of operation include single-photon sourcing, atom-photon entanglement, multiple photon entanglement, and preparation and measurement of the atomic qubit.

According to one aspect, there is provided a method for sourcing a graph state of quantum-entangled photons, the method comprising (a photon source unit may also be referred to as a photon generator):

providing a photon source unit for sourcing single photons, the photon source unit comprising a source unit atom disposed within an intra-cavity field of a source-optical cavity;

providing a photon entanglement unit for quantum entanglement of photonic states, the photon entanglement unit atom disposed within an intra-cavity field of an entanglement-optical cavity;

sending a photon pulse to the photon entanglement unit to set the entanglement unit atom to an atomic quantum superposition state $$\frac{1}{\sqrt{2}}(|0\rangle + |1\rangle);$$

sending a photon pulse to the photon source unit to initialize the source unit atom to a quantum state |1>;

sending a photon pulse of photons in a first photonic mode into the photon source unit to cause the source unit atom to output a single photon in a second photonic mode, wherein the first photonic mode couples to a first transition of the source unit atom, and wherein the second photonic mode couples to a second transition of the source unit atom;

routing the single photon in the second photonic mode to the photon entanglement unit to a superposition of a third photonic mode and a fourth photonic mode;

wherein the third photonic mode couples to a third transition of the entanglement unit atom;

wherein the fourth photonic mode does not couple to any transition of the source unit atom;

wherein the fourth photonic mode does not couple to the entanglement-optical cavity; and wherein the photon in a superposition of a third photonic mode and a fourth photonic mode is quantum-entangled with the entanglement unit atom;

repeating the routing at least once to route at least one additional single photon in the second photonic mode to the photon entanglement unit in a superposition of the third photonic mode and the fourth photonic mode in quantum entanglement with the entanglement unit atom;

performing a measurement on the entanglement unit atom, thereby disentangling it from the photons in the superposition state of the third photonic mode and the fourth photonic mode;

wherein the at least two photons in the superposition state of the third photonic mode and the fourth photonic mode are quantum entangled; and outputting the at least two photons in the superposition state of the third photonic mode and the fourth photonic mode as time-sequenced mutually entangled photons.

Performing a measurement on the entanglement unit atom may include performing a measurement in an x-y plane of a Bloch sphere.

According to another aspect, there is provided a device for sourcing a graph state of quantum-entangled photons, the device comprising:

a plurality of single photon source units;

a first stage of linear optics elements; and a first plurality of entanglement units;

wherein the plurality of single photon source units, the first stage of linear optics elements, and the first plurality of entanglement units are correspondingly displaced along a predetermined spatial axis;

wherein each single photon source unit of the plurality of photon source units outputs single photons to the first stage of linear optics elements, and therefrom into a respective entanglement unit of the first plurality of entanglement units; and wherein the first plurality of entanglement unit outputs a one-dimensional spatial array of entangled photons in a time-dimensional sequence.

The single photon source units and/or the entanglement units may each comprise an atom being in a first ground state, a first excited state, a second ground state, a second excited state, or a superposition thereof, the atom being further configured to selectively undergo:

a first transition between the first ground state and the first excited state;

a second transition between the first excited state and the second ground state; and a third transition between the second ground state and the second excited state;

the device comprising an optical cavity defining an intracavity field for disposing therewithin the atom, a photonic waveguide coupled to the optical cavity, a magnet configured to produce a magnetic field on the atom, and a laser source configured to produce pulses of photons in coherent states, the device being configured such that each of the transitions are within the resonance of the optical cavity.

The first and second transitions may be selected such that they are orthogonally polarized with respect to each other.

The first and second excited states may be at the same energy level.

The first and second ground states may be at different energy levels from one another.

The laser source may be configured for selectively generating:

a pulse of initializing photons configured to initialize the atom by inducing it to undergo the first and second transitions from the first ground state to the second ground state via the first excited state; and a pulse of sourcing photons configured to source a single photon from the atom by inducing it to undergo the second and first transitions from the second ground state to the first ground state via the first excited state.

The laser source may be configured for selectively generating preparation photons configured to set the state of the atom to a quantum superposition state, the preparation photons being in state of superposition of first and second preparation modes, wherein interaction of the preparation photons with the atom results in its first and second ground states being in a state of superposition corresponding to the state of superposition of the first and second preparation modes, i.e., the interaction results in the first and second ground states of the atom being in a superposition with probability amplitudes equal to the probability amplitudes of the first and second preparation modes of the incoming preparation photons.

The atom may be a Rubidium atom.

The magnet may be a solenoid.

The first stage of linear optics elements may include phase control.

The device may further comprise:

a second stage of linear optics elements; and a second plurality of entanglement units;

wherein the second stage of linear optics elements, and the second plurality of entanglement units are correspondingly displaced with the plurality of single photon source units, the first stage of linear optics elements, and the first plurality of entanglement units along the predetermined spatial axis; and wherein the single photons in an entangled state output from each respective entanglement unit of the first plurality of entanglement units are input to the second stage of linear optics elements and therefrom into a respective entanglement unit of the second plurality of entanglement units.

The second plurality of entanglement units may be configured to output a two-dimensional spatial array of entangled photons in a time-dimensional sequence.

The device may be configured to produce entangled qubits for use with a quantum computer.

The device may be configured for carrying out the method of any of the aspects of the presently disclosed subject matter.

The foregoing summary provides certain examples of disclosed embodiments to provide a flavor for this disclosure and is not intended to summarize all aspects of the disclosed embodiments. Additional features and advantages of the disclosed embodiments will be set forth in part in the description that follows, and in part will be apparent from the description, or may be learned by practice of the disclosed embodiments. The features and advantages of the disclosed embodiments will be realized and attained by the elements and combinations particularly pointed out in the appended claims.

It is to be understood that both the foregoing general description and the following detailed description are examples and explanatory only and are not restrictive of the disclosed embodiments as claimed. The accompanying drawings constitute a part of this specification. The drawings illustrate several embodiments of the present disclosure and, together with the description, serve to explain the principles of the disclosed embodiments as set forth in the accompanying claims.

BRIEF DESCRIPTION OF THE DRAWINGS

The subject matter disclosed may best be understood by reference to the following detailed description when read with the accompanying drawings in which:

FIG. 6 is a flowchart of a method for sourcing photonic graph states according to a disclosed embodiment.

FIG. 9B schematically illustrates a photon generation according to some embodiments of the present disclosure.

FIG. 9C schematically illustrates an entangling gate according to some embodiments of the present disclosure.

Figure 1:
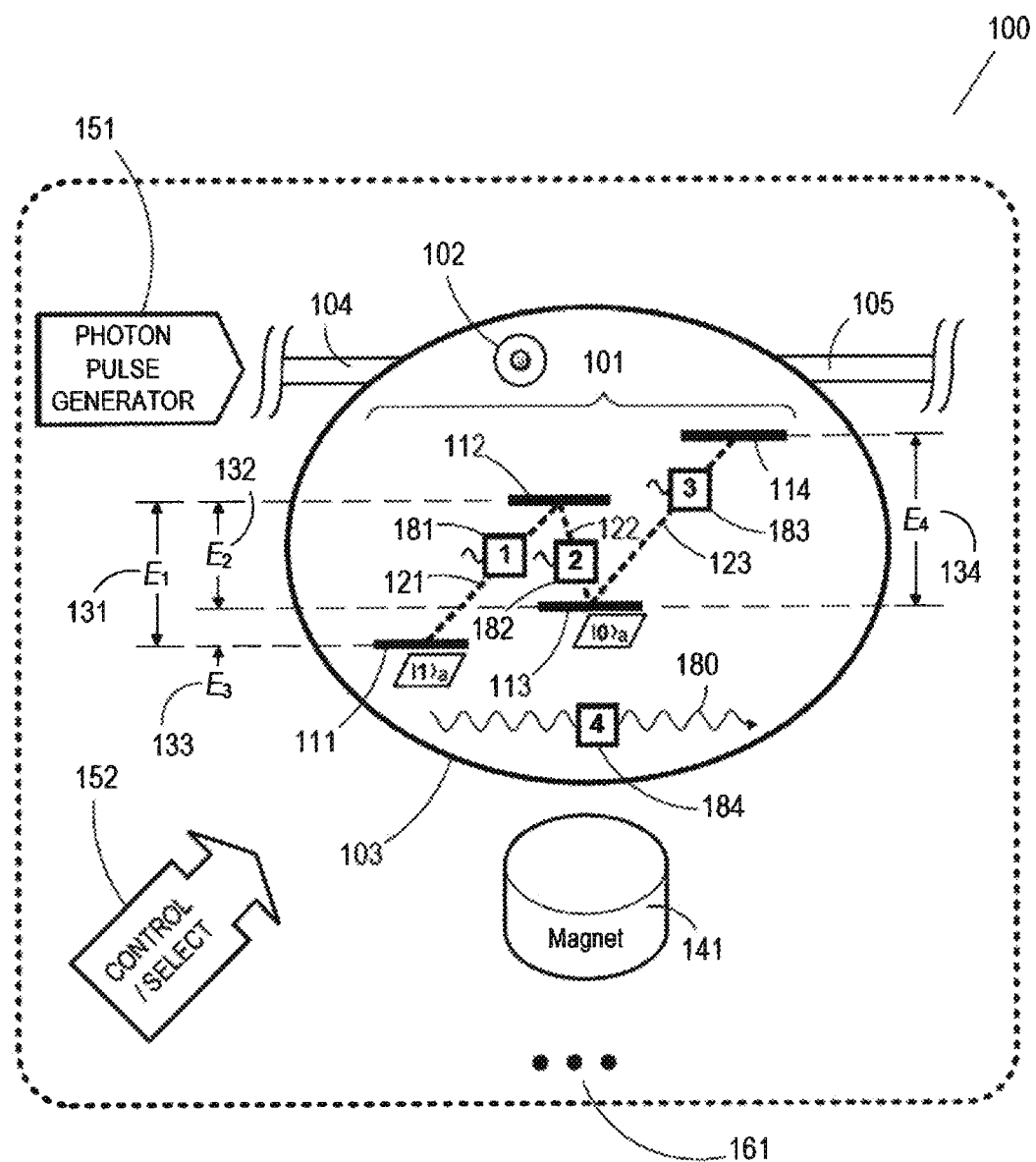
FIG. 1 schematically illustrates a device for use in quantum computing according to a disclosed embodiment.

For simplicity and clarity of illustration, elements shown in the figures are not necessarily drawn to scale, and the dimensions of some elements may be exaggerated relative to other elements. In addition, reference numerals may be repeated among the figures to indicate corresponding or analogous elements.

In the following description, various working examples are provided for illustrative purposes. However, it is to be understood the present disclosure may be practiced without one or more of these details. Reference will now be made in detail to non-limiting examples of this disclosure, examples of which are illustrated in the accompanying drawings. The examples are described below by referring to the drawings, wherein like reference numerals refer to like elements. When similar reference numerals are shown, corresponding description(s) are not repeated, and the interested reader is referred to the previously discussed figure(s) for a description of the like element(s).

Various embodiments are described herein with reference to systems, methods, devices, or computer readable media. It is intended that the disclosure of one is a disclosure of all. For example, it is to be understood that disclosure of a computer readable medium described herein also constitutes a disclosure of methods implemented by the computer readable medium, and systems and devices for implementing those methods, via for example, at least one processor or a circuitry. It is to be understood that this form of disclosure is for ease of discussion only, and one or more aspects of one embodiment herein may be combined with one or more aspects of other embodiments herein, within the intended scope of this disclosure.

DETAILED DESCRIPTION

Exemplary embodiments are described with reference to the accompanying drawings. The figures are not necessarily drawn to scale. While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items or meant to be limited to only the listed item or items. It should also be noted that as used herein and in the appended claims, the singular forms "a," "an," and "the" include plural references unless the context clearly dictates otherwise. Moreover, the relational terms herein such as "first" and "second" are used only to differentiate an entity or operation from another entity or operation, and do not require or imply any actual relationship or sequence between these entities or operations.

As used herein, unless specifically stated otherwise, the term "or" encompasses all possible combinations, except where infeasible. For example, if it is stated that a component can include A or B, then, unless specifically stated otherwise or infeasible, the component can include A, or B, or A and B. As a second example, if it is stated that a component can include A, B, or C, then, unless specifically stated otherwise or infeasible, the component can include A, or B, or C, or A and B, or A and C, or B and C, or A and B and C.

Embodiments described herein may refer to a non-transitory computer readable medium or a computer readable medium containing instructions that when executed by at least one processor (or a system or a circuitry or a device), cause the at least one processor (or the system or the circuitry or the device) to perform a method according to an embodiment of the present disclosure. Non-transitory computer readable media (or computer readable media) may be any medium capable of storing data in any memory in a way that may be read by any computing device (or any system) with a processor to carry out methods or any other instructions stored in the memory. The non-transitory computer readable medium (or the computer readable medium) may be implemented as hardware, firmware, software, or any combination thereof. Moreover, the software may preferably be implemented as an application program tangibly embodied on a program storage unit or computer readable medium consisting of parts, or of certain devices and/or a combination of devices. The application program may be uploaded to, and executed by, a machine comprising any suitable architecture (or circuitry). Preferably, the machine may be implemented on a computer platform having hardware (or circuitry) such as one or more central processing units ("CPUs"), a memory, and input/output interfaces. The computer platform may also include an operating system and microinstruction code. The various processes and functions described in this disclosure may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a vacuum chamber. Furthermore, a non-transitory computer readable medium may be any computer readable medium except for a transitory propagating signal.

The memory may include a Random Access Memory (RAM), a Read-Only Memory (ROM), a hard disk, an optical disk, a magnetic medium, a solid-state storage device, a flash memory, other permanent, fixed, volatile or non-volatile memory, or any other mechanism capable of storing instructions. The memory may include one or more separate storage devices collocated or disbursed, capable of storing data structures, instructions, or any other data. The memory may further include a memory portion containing instructions for the processor to execute. The memory may also be used as a working scratch pad for the processors or as a temporary storage.

Some embodiments involve at least one processor. "At least one processor" may include any physical device or group of devices having electric circuitry that performs a logic operation on an input or inputs. For example, the at least one processor may include one or more integrated circuits (IC), including application-specific integrated circuit (ASIC), microchips, microcontrollers, microprocessors, all or part of a central processing unit (CPU), graphics processing unit (GPU), digital signal processor (DSP), field-programmable gate array (FPGA), server, virtual server, or other circuits suitable for executing instructions or performing logic operations. The instructions executed by at least one processor may, for example, be pre-loaded into a memory integrated with or embedded into the controller or may be stored in a separate memory. The memory may include a Random Access Memory (RAM), a Read-Only Memory (ROM), a hard disk, an optical disk, a magnetic medium, a solid-state storage device, a flash memory, other permanent, fixed, or volatile memory, or any other mechanism capable of storing instructions. In some embodiments, the at least one processor may include more than one processor. Each processor may have a similar construction, or the processors may be of differing constructions that are electrically connected or disconnected from each other. For example, the processors may be separate circuits or integrated in a single circuit. When more than one processor is used, the processors may be configured to operate independently or collaboratively and may be co-located or located remotely from each other. The processors may be coupled electrically, magnetically, optically, acoustically, mechanically or by other means that permit them to interact.

Alternatively or additionally, some embodiments involve circuitry (or an integrated circuit or a layout of an integrated circuit device). The circuitry (or the integrated circuit or the layout of an integrated circuit device) may include one or more functional units (or one or more layout portions), wherein each functional unit (or each layout portion) is configured to perform one or more process steps. The one or more functional units (or the one or more layout portions) may be arranged (e.g., positioned and connected with each other or with another functional unit or with another layout portion) so that the circuitry (or the integrated circuit or the layout of an integrated circuit device) is capable of performing some or all steps of the method or the process. For example, circuitry (or an integrated circuit or a layout of an integrated circuit device) may perform some or all steps of a method or a process according to some disclosed embodiments.

In the examples or embodiments described herein, at least some of the features of the system, device, apparatus, integrated circuit device, or circuitry, such as a photonic chip or a photonic integrated circuit (PIC), are formed using a fabrication method such as lithography, for example using lithographic processing on a silicon-based substrate to form those features on the silicon-based substrate. It is also understood that other types of substrates may be used with the lithography process to form those features thereon. It is also understood that other techniques (e.g., other semiconductor device fabrication techniques such as etching, doping, diffusion, sputtering, or deposition, or self-assembly techniques) in the alternative, or in addition to, lithography may be used to form those features on a substrate, wherein such other techniques enable fabrication of those features with structures capable of serving their functions described herein.

The following paragraphs provide definitions of, and examples associated with, terminology employed in this disclosure. It is to be understood that where a feature is described functionally using these terms, that feature may be replaced with another feature sharing equivalent functionality. Embodiments and examples described herein may refer to following.

Some embodiments involve a graph state. A graph refers to a graph state. A graph state represents a relationship between a group of qubits, a qubit being a basic unit of quantum information. The group of qubits, for example, may be entangled. The relationship between a group of qubits may be entanglement relationship. For example, a qubit can be stored in (or belong to) a two-state quantum mechanical system, such as photons, atoms, and quantum emitters. For example, a graph state may include a representation of a composite quantum system. The composite quantum system may include multiple quantum subsystems. Each such subsystem may be represented by a node or a vertex of a graph, and an entanglement or interaction between a pair of subsystems can be represented by an edge connecting the pair of corresponding vertices. Graph state examples include: a photonic graph state; a cluster state, whose graph is a connected subset of a d-dimensional lattice; or a Greenberger-Horne-Zeilinger state (GHZ, state), whose graph is a multitude of vertices exclusively connected to a central vertex.

Figure 7:
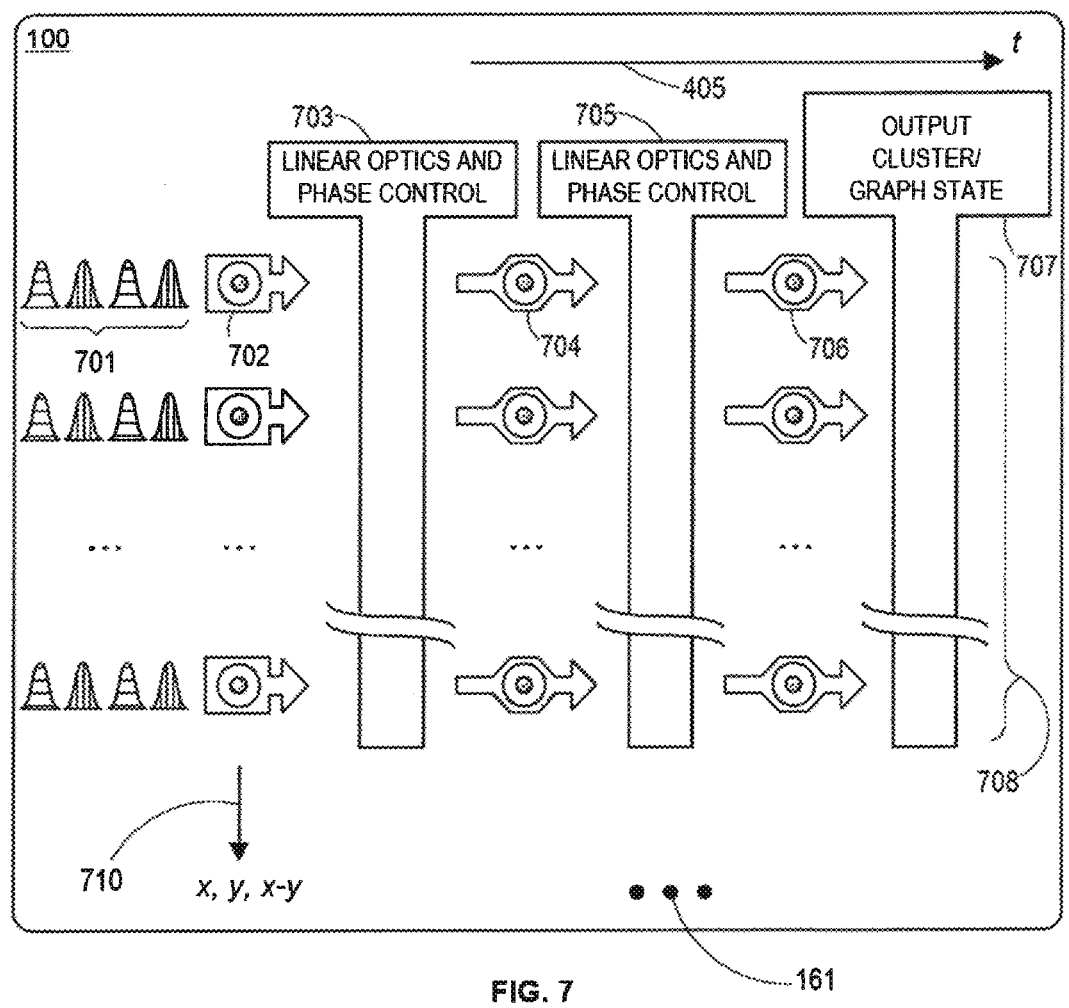
FIG. 7 schematically illustrates an apparatus for sourcing a multi-dimensional cluster state of quantum-entangled photonic states according to a disclosed embodiment.

By way of non-limiting example, FIG. 6 and FIG. 7 illustrate a method and an apparatus for sourcing a photonic graph state (e.g. n photons shown in step 609).

Some embodiments involve a photonic state. A photonic state refers to a condition or a configuration of one or more photons. For example, a photonic state may include a quantum state associated with degrees of freedom of one or more photons. Examples of a photonic state include a single photon state, wherein the state corresponds to the presence of exactly one photon within a specified mode. By way of non-limiting example, FIG. 4B and FIG. 5B illustrate a time sequential series 412 of single photonic states.

Some embodiments involve a photonic graph state. A photonic graph state refers to a graph state, as described earlier, applied to photons. For example, a photonic graph state includes a photonic condition where vertices are representative of photonic states. Photonic graph state examples include: a graph state where each vertex corresponds to a single-photon qubit, wherein the qubit describes the path of a single photon, the polarization of the single photon, the time-bin of the single photon, or the frequency of the single photon; or a graph state where each vertex corresponds to a continuous-variable photonic qubit, wherein the qubit is representative of a pair of orthogonal superposition states of photon-number states.

The graph state of FIG. 6 and FIG. 7 as previously described, is one non-limiting example of a photonic graph state.

Some embodiments involve a photonic qubit. A photonic qubit refers to a basic unit of quantum information stored in (or belonging to) one or more photons or electromagnetic field. For example, a photonic qubit includes a quantum bit encoded in a degree of freedom associated with a propagating or stationary mode of the electromagnetic field. Examples of a photonic qubit include a qubit encoded in the polarization, number of photons, phase, time bin, frequency, or position of an electromagnetic field. The electromagnetic field can be a propagating mode in a photonic waveguide, in vacuum, or a mode confined to an electromagnetic resonator.

Figure 9A:
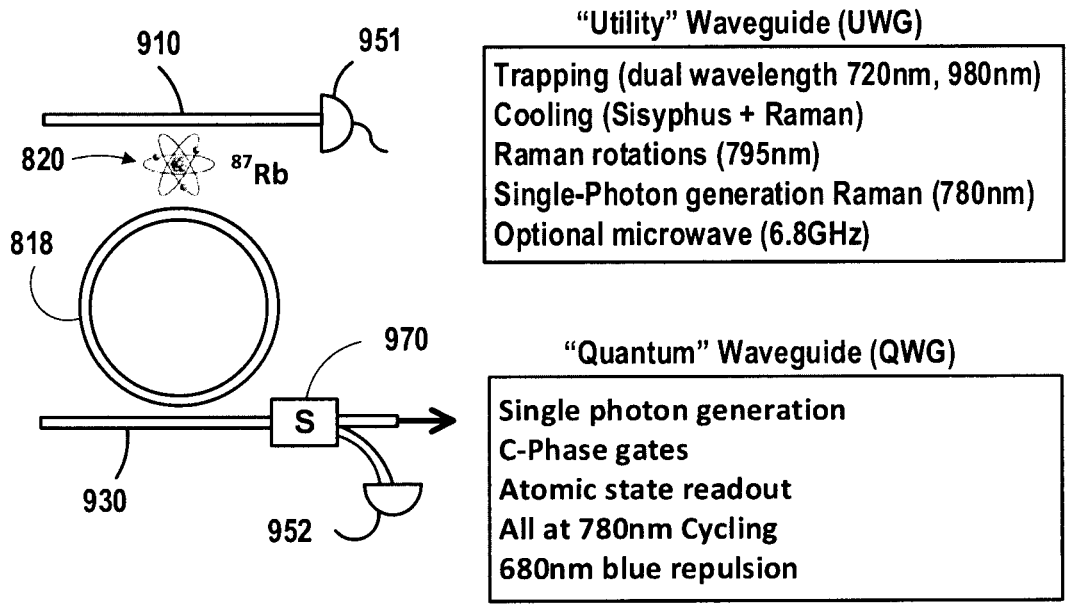
FIG. 9A schematically illustrates waveguides usable with an atom coupled to a cavity according to some embodiments of the present disclosure.
Figure 10:
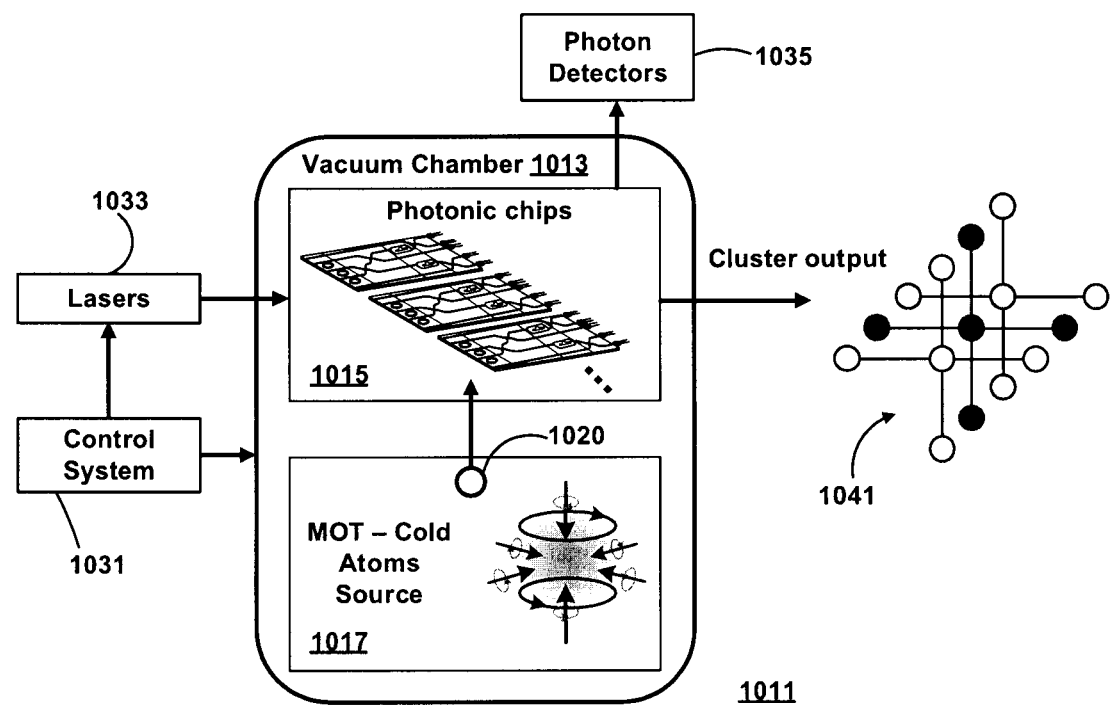
FIG. 10 schematically illustrates a system including a vacuum chamber usable with atoms and photonic chips according to some embodiments of the present disclosure.

Some embodiments involve a quantum emitter. A quantum emitter refers to a component configured to couple to electromagnetic modes. For example, a quantum emitter includes a stationary quantum system with an anharmonic spectrum, configured to couple to electromagnetic modes. In other words, a quantum emitter may be a stationary qubit capable of interacting with photons. A stationary qubit may refer to a material quantum system usable in storing and processing quantum information. For example, a stationary qubit may refer to a qubit operable to (or satisfies the conditions of): (i) store quantum information reliably on a nanosecond or greater timescale, (ii) reliably perform calculations and/or operations, including operations may move or convert the information to a flying qubit (e.g., a non-stationary qubit, or a photon), (iii) be reliably measured or read out, and/or (iv) be highly entangled. Examples of stationary qubits may include a qubit stored in, or belonging to, a quantum emitter. For example, qubits stored in, or belonging to, a rubidium or cesium atom may serve as a source of a stationary qubit. A Rydberg atom, for example, may also serve as a source of a stationary qubit. Use of a Rydberg atom may lead properties which are beneficial to quantum computing applications, for example, (i) strong response to electric and magnetic fields, (ii) long decay periods, and (iii) large electric dipole moments. A Rydberg atom may refer to an excited atom with one or more electrons that have a high principal quantum number, n. Examples of a quantum emitter include a quantum system having one or more of: an electronic or nuclear configuration of an ion or a neutral atom; an electronic or nuclear configuration of a defect or a quantum dot in a material substrate; or a configuration of a superconducting circuit containing one or more Josephson Junctions. A quantum emitter may be a superconducting qubit, a quantum dot, an atom, a neutral atom, an ion, a rubidium atom, a cesium atom, Strontium, Erbium, Ytterbium, Calcium, Barium, Beryllium, or Magnesium atom. The atom or the ion may be sourced from a Rydberg atom. A superconducting qubit may refer to a solid-state qubit sourced from a superconducting material, such as aluminum or a niobium-titanium alloy. Superconducting qubits may contain or be coupled to at least one Josephson junction. Examples of a superconducting qubit may include a charge qubit, a flux qubit, a phase qubit, and/or a hybrid thereof (e.g., a transmon). A quantum dot may refer to a quantum emitter having a substrate (e.g., a solid-state substrate such as a semiconductor particle) having optical and/or electronic properties exhibiting quantum mechanics principles, as described earlier. For example, a quantum dot may be a nanoparticle having optical and electronic properties that differ from its bulk constituent. In the presence of high energy photons (e.g., UV light), an electron in the quantum dot may excited to a high energy state and emit one or more photons when transitioning to a ground state. For example, quantum dots may be manufactured from one or more binary compounds such as lead sulfide, lead selenide, cadmium selenide, cadmium sulfide, cadmium telluride, indium arsenide, or indium phosphide. For example, quantum dots may be self-assembled from Indium Arsenide in a Gallium Arsenide substrate. For example, quantum dots may refer to atomic defects in a solid state substrate such as the nitrogen vacancy center in diamond. The atom 102 shown in FIG. 1 and FIG. 3, the atom 402 in FIG. 4A and FIG. 4B, the atom 502 in FIG. 5A and FIG. 5B, the Rubidium ($^{87}$Rb) atom 820 in FIG. 8 through FIG. 9C, and the one or more atoms 1020 in FIG. 10 are non-limiting examples of a quantum emitter.

Some embodiments involve a fluctuating quantum emitter. A fluctuating emitter refers to a quantum emitter whose physical situation or property fluctuates over time (at least temporally). For example, a quantum emitter may be fluctuating because its resonance frequency changes over time due to stray magnetic or electric fields. For example, a fluctuating emitter includes a quantum emitter whose transition frequencies may fluctuate in time (temporally) due to environmental noise. Examples of a fluctuating quantum emitter include: an atom whose transition frequencies fluctuate due to a time-varying magnetic field, electric field, or photonic trapping field; or a quantum dot whose transition frequencies fluctuate due to stochastic charges or spins in the surrounding solid-state lattice.

Some embodiments involve a state of a quantum emitter qubit. A state of a quantum emitter qubit refers to a condition or a configuration of the quantum emitter. For example, a state of a quantum emitter includes a configuration of a quantum emitter corresponding to a superposition of eigenstates of the Hamiltonian describing the quantum emitter. Examples of a state of a quantum emitter qubit include a ground state of a quantum emitter, corresponding to a lowest-energy eigenstate.

Figure 8:
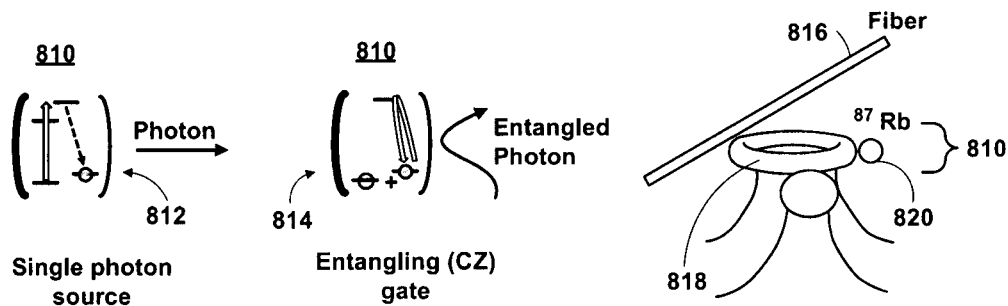
FIG. 8 schematically illustrates an atom coupled to a cavity consistent with some embodiments of the present disclosure.

Some embodiments involve a cavity or a resonator. A cavity may function as a resonator, and a resonator refers to a component that establishes or supports oscillations and/or normal modes. The oscillations, for example, may be resonant oscillations of a discrete set of normal modes at an associated discrete set of resonant frequencies. For example, a resonator may be capable of confining electromagnetic fields in electromagnetic modes having particular frequencies of oscillation. For example, a cavity or a resonator includes an electromagnetic resonator configured to confine an electromagnetic field in space and time. The cavity or the resonator may support a discrete set of electromagnetic modes, each associated with a specific resonance frequency and lifetime of the confined field. Examples of a cavity or a resonator include: a photonic cavity; an optical cavity; a whispering gallery mode cavity; a Fabry-Perot cavity; or a ring cavity. A typical cavity can be an optical cavity or a microwave cavity. The optical cavity 103 in FIG. 1 and FIG. 3, and the cavity 818 in FIG. 8 through FIG. 9C are non-limiting examples of a resonator.

Some embodiments involve a quantum emitter coupled to a resonator (or a resonator-coupled quantum emitter). A quantum emitter coupled to a resonator (or a resonator-coupled quantum emitter) refers to a quantum emitter that is enabled to interact with a resonator. For example, a quantum emitter coupled to a resonator (or a resonator-coupled quantum emitter) may include a quantum emitter arranged to interact with an electromagnetic field confined by a resonator, which may be a component or group of components configured to confine electromagnetic field in space and time. The component or group of components may support a discrete set of electromagnetic modes, each associated with a specific resonance frequency and lifetime of the confined field. Such a quantum emitter coupled to a resonator (or a resonator-coupled quantum emitter) may also be referred to as a quantum emitter coupled to a cavity, a quantum emitter coupled to a photonic cavity, or a quantum emitter coupled to an optical cavity, depending on which component functions as a resonator. So a quantum emitter coupled to a resonator (or a resonator-coupled quantum emitter) may include a quantum emitter whose dipole field overlaps with an electromagnetic mode of a resonator (e.g. a cavity, a photonic cavity, or an optical cavity).

For example, a quantum emitter (or an atom) disposed within an intra-cavity field of a cavity (or a photonic cavity or a resonator or an optical cavity) is a quantum emitter coupled to a cavity, (or a quantum emitter coupled to a photonic cavity, or a quantum emitter coupled to a resonator, or a quantum emitter coupled to an optical cavity). The atom 102 contained within an optical cavity 103 in FIG. 1, the Rubidium ($^{87}$Rb) atom 820 coupled to a cavity 818 in configuration 810 in FIG. 8, and the Rubidium ($^{87}$Rb) atom 820 coupled to a cavity 818 in FIG. 9A through FIG. 9C are non-limiting examples of a quantum emitter coupled to a resonator (or a resonator-coupled quantum emitter).

Some embodiments involve a coupling location or a coupling site. A coupling location or a couple site includes an area (e.g., a volume or a region) configured to enable coupling between a quantum emitter and a resonator (or a cavity or a photonic cavity or an optical cavity). For example, it may include an area that positions a quantum emitter within an intra-cavity field of a resonator (or a cavity or a photonic cavity or an optical cavity), or which enables a quantum emitter's dipole field to overlap with an electromagnetic mode of a resonator (or a cavity or a photonic cavity or an optical cavity).

Some embodiments involve quantum emitter positioning. Quantum emitter positioning refers to arranging or locating a quantum emitter to enable interaction between the quantum emitter and a resonator (or a cavity or photonic cavity or an optical cavity). Examples of such quantum emitter positioning include one or more of: arranging a quantum emitter to be located at a coupling location or at a coupling site (e.g. positioning or locating a quantum emitter at a coupling location or at a coupling site); coupling a quantum emitter to a resonator (or a cavity or photonic cavity or an optical cavity); disposing a quantum emitter within an intra-cavity field of a resonator (or a cavity or photonic cavity or an optical cavity); trapping a quantum emitter in proximity of a resonator (or a cavity or photonic cavity or an optical cavity); lithographically locating a quantum dot in proximity to a resonator (or a cavity or photonic cavity or an optical cavity); or lithographically locating a resonator (or a cavity or photonic cavity or an optical cavity) in proximity to a self-assembled quantum dot.

Some embodiments involve trapping a quantum emitter (e.g., an atom or an alkali atom). Trapping a quantum emitter refers to generating a trap which keeps the quantum emitter within a coupling location. For example, trapping a quantum emitter may involve confining the spatial degree of freedom of the quantum emitter (or the atom or the alkali atom) using a configuration of electromagnetic fields. Examples of trapping a quantum emitter (or an atom or an alkali atom) include: trapping an ion using electrical fields and radio frequency (or microwave) fields; trapping an atom using a magneto-optical trap (MOT) configuration; or trapping an atom using off-resonant laser beams (atomic tweezers). By way of non-limiting example, FIG. 9A illustrates a utility waveguide 910 for carrying a pulse or a field for generating a trap, and FIG. 10 illustrates a Magneto-optical trap (MOT) for trapping one or more atoms 1020. The pulse or the field in FIG. 9A is configured to trap the Rb atom 820 at a coupling location, e.g. next to the cavity 818 (or the resonator or the ring shape in the figure). This pulse or field may be configured to generate and/or contain an evanescent field around the waveguide 910 so that evanescent field trapping can be used to keep the Rb atom 820 at, or within, the coupling location. The Magneto-optical trap in FIG. 10 is configured to trap the one or more atoms 1020 at, or within, a coupling location.

Some embodiments involve being in proximity to a photonic cavity (or a cavity or a resonator or an optical cavity). Being in proximity to a photonic cavity (or a cavity or a resonator or an optical cavity) refers to being within an electromagnetic mode of a photonic cavity (or a cavity or a resonator or an optical cavity). Examples of being in proximity to a photonic cavity (or a cavity or a resonator or an optical cavity) include being: between two reflective surfaces of a Fabry-Perot cavity; within, or at, a coupling location or coupling site as described earlier; within an intra-cavity field of a resonator (or a cavity or a photonic cavity or an optical cavity) as described earlier; within, or at, a coupling location or coupling site, enabling a quantum emitter's dipole field to overlap with an electromagnetic mode of a resonator (or a cavity or a photonic cavity or an optical cavity) as described earlier; and/or within the evanescent field of a whispering gallery cavity as described earlier.

Some embodiments involve coupling a photonic qubit to a quantum emitter, or coupling a qubit to an atomic qubit. Coupling a (photonic) qubit to a quantum emitter (an atomic qubit) refers to enabling interaction between the qubit (the qubit of one or more photons) and qubit of the quantum emitter (the atomic qubit, i.e., qubit of the atom when the atom is functioning as the quantum emitter). For example, coupling a (photonic) qubit to a quantum emitter (an atomic qubit) may include enabling an interaction between a qubit (or a photonic qubit) and a quantum emitter (or an atomic qubit) by creating an overlap between the dipole field of the quantum emitter (or the atom) and the electromagnetic field of the qubit (or the photonic qubit) as described earlier.

Some embodiments involve a superconducting qubit. A superconducting qubit refers to a qubit stored in or belonging to a superconducting electronic circuit (e.g., a network of electrical elements using superconductors). For example, a superconducting qubit may include an electrical circuit from superconducting material containing or coupled to one or more Josephson Junctions. Examples of a superconducting qubit include: a superconducting transmon qubit; a superconducting fluxonium qubit; or a superconducting bosonic qubit.

Some embodiments involve a quantum emitter including a quantum dot. A quantum emitter including a quantum dot may refer to a quantum emitter having a substrate (e.g., a solid state substrate such as a semiconductor particle) having optical and/or electronic properties exhibiting quantum mechanics principles. For example, a quantum dot may be formed from nanoscale semiconductor materials arranged to tightly confine either electrons or electron holes. For example, a quantum emitter including a quantum dot may include a stationary quantum system with an anharmonic spectrum, configured to couple to an electromagnetic degree of freedom, wherein the quantum system includes a spatially defined region within a solid-state substrate for confining charge carriers within that substrate in all three dimensions. Examples of a quantum emitter including a quantum dot include: a gate-defined quantum dot, wherein the spatial region is defined by electric fields controlled by electrodes; or a self-assembled quantum dot, wherein the spatial region consists of a material with a smaller band-gap than the surrounding region. For example, quantum dots may be self-assembled from Indium Arsenide in a Gallium Arsenide substrate. Quantum dots, for example, may refer to atomic defects in a solid state substrate such as the nitrogen vacancy center in diamond.

Figure 3:
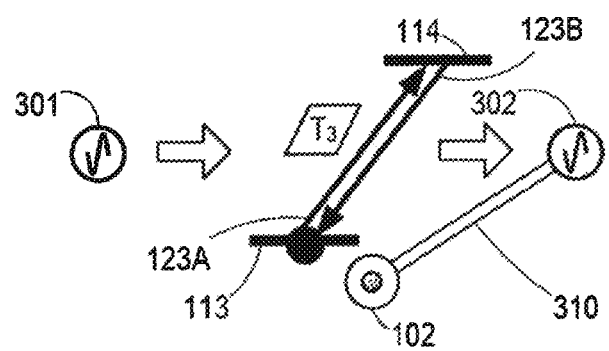
FIG. 3 schematically illustrates entanglement of an atom with a photon using the device shown in FIG. 1.

Some embodiments involve photon-quantum emitter entanglement. Photon-quantum emitter entanglement refers to a condition where state(s) of one or more photons are linked with state(s) of one or more quantum emitters. For example, the states(s) of the one or more photons may be related to the state(s) of the one or more quantum emitters in such a way that those state(s) cannot be described independently of each other. This entanglement produces, for example, a correlation between measurements of those states, correlating a measurement of the state(s) of the one or more photons to a measurement of the state(s) of the one or more quantum emitters, whereby mutual information may be stored or processed using this correlation. For example, photon-quantum emitter entanglement may include an inseparate (non-separable) state of a composite quantum system composed of at least one photon and at least one quantum emitter, wherein the at least one quantum emitter is entangled with the photonic state (e.g. the photonic state of the at least one photon). By way of a non-limiting examples, FIG. 3 illustrates an entanglement between the atom 102 and photon 302 with a double line 310.

Some embodiments involve an entangling gate. As used herein, the term "entangling gate" refers to any component, group of components, control sequence, or operations (reversible or irreversible) that cause any degree of entanglement between quantum elements (e.g., any quantum particles, group of quantum particles, or qubits). For example, an entangling gate may include a quantum circuit configured to entangle qubits. For example, a quantum emitter coupled to a resonator (or a cavity, a photonic cavity, or an optical cavity) described earlier may be capable of functioning as an entangling gate. An entangling gate or operation may involve sending a single photon through a beam-splitter to two resonator-coupled quantum emitters. Further mapping the two quantum emitters qubits into photonic qubits may generate a three-photon entangled state (i.e., a Greenberger-Horne-Zeilinger state). Examples of an entangling gate include: a controlled-Z entangling gate (CZ gate); a controlled NOT entangling gate (CNOT gate); a square root of a SWAP entangling gate; or an imaginary SWAP entangling gate (iSWAP gate).

Figure 5A:
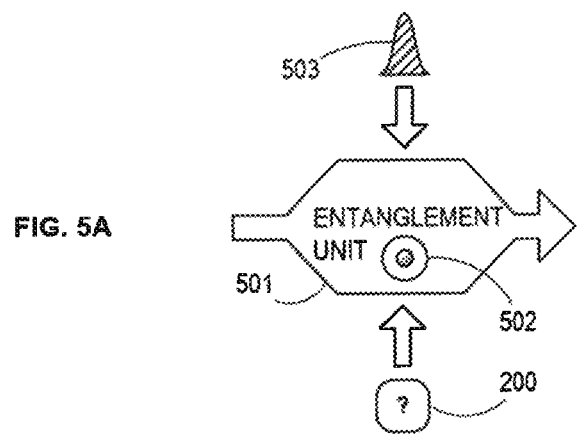
FIG. 5A schematically shows an entanglement unit for quantum entanglement of a photonic state with an atomic state according to a disclosed embodiment.

By way of non-limiting examples, FIG. 8 and FIG. 9C illustrate the Rubidium ($^{87}$Rb) atom 820 coupled to a cavity 818 in configuration 810 in FIG. 8 and the Rubidium ($^{87}$Rb) atom 820 coupled to a cavity 818 in FIG. 9C being implemented as an entangling (CZ) gate, and FIG. 5A through FIG. 5B illustrate entanglement unit 501 (including an entanglement unit atom 502) being implemented as an entangling gate.

A controlled-Z gate (CZ, gate) refers to a quantum gate operable on two qubits, such that their combined quantum state acquires a conditional phase shift (e.g., a phase shift of pi). For example, the combined quantum state of the two qubits may acquire the phase shift of pi when both qubits are in a state associated with the logical 1, and no phase shift otherwise. By way of non-limiting examples, FIG. 3 illustrates a controlled-Z, gate implementation, and FIG. 8 and FIG. 9C illustrate the Rubidium ($^{87}$Rb) atom 820 coupled to a cavity 818 in configuration 810 being implemented as an entangling (CZ) gate.

A SWAP gate refers to a quantum gate operable on two qubits, such that a quantum state of a first qubit is transferred to a second qubit, and a quantum state of the second qubit is transferred to the first qubit. For example, when the two qubits are represented by quantum systems A and B, such that the quantum state of A is transferred to B, and the quantum state of B is transferred to A. By way of a non-limiting example, FIG. 2E illustrates a SWAP gate 201 performing "read" and "write" operations of a qubit on an atom 102.

Some embodiments involve mapping a quantum emitter qubit to a photonic qubit. Mapping a quantum emitter qubit to a photonic qubit refers to transferring a quantum emitter qubit to a photonic qubit. For example, such mapping may include transferring quantum information stored in a qubit of a quantum emitter to a qubit of one or more photons. In one example, mapping a quantum emitter qubit to a photonic qubit may be a consequence of performing a SWAP gate operation on a quantum emitter qubit and a photonic qubit as described earlier. For example, feeding a photon at a frequency corresponding to a frequency of a particular transition of a resonator-coupled quantum emitter may map a state of a resonator-coupled quantum emitter onto a photon. By way of a non-limiting example, FIG. 2E illustrates mapping using a SWAP gate 201 so that the atom 102's (which is a non-limiting example of a quantum emitter) initial superposition state of the first and second ground states 111, 113 with probability amplitudes γ and δ is transferred to outgoing photon 204 (as shown with its superposition state of modes 1 and 2 with probability amplitudes δ and γ), and the incoming photon 202's superposition of photonic modes 1 and 2 with probability amplitudes α and β is transferred to the atom 102 (as shown with the atom 102 being left in a superposition state of the first and second ground states 111, 113 with probability amplitudes β and α).

Some embodiments involve a photonic chip. A photonic chip refers to a device integrating elements or components that operate at optical or infrared wavelengths. For example, such a device may be microfabricated. The microfabrication process may involve a lithography as described earlier. Examples of a photonic chip include a chip incorporating one or more of the following: integrated lasers; channels or waveguides for carrying lasers, pulse of photons and/or one or more single photons; waveguides; switches; phase modulators; resonators; interferometers; beam splitters; photonic amplifiers; nonlinear waveguides; nonlinear resonators; amplitude modulators; integrated magnetic field generator such as a solenoid; detectors; and one or more controllers (or circuitry) configured to control or receive output from any one or more of the above elements or components of the chip.

Some embodiments involve an atomic dispenser. An atomic dispenser refers to component or group of components arranged to provide one or more atoms. An atomic dispenser is a non-limiting example of a quantum emitter dispenser arranged to dispense (or provide) one or more quantum emitters. For example, an atomic dispenser may include a source of atoms for creating an atomic vapor within a chamber. The chamber may typically include a vacuum chamber. Examples of an atomic dispenser include a source configured to be resistively heated to dispense or provide atoms. The dispensed atoms can be one or more of, among others, Cesium, Potassium, Sodium, Rubidium, and Lithium, for example.

Some embodiments involve a jet of atoms. A jet of atoms refers to a stream or beam of atomic vapor. The stream or beam of atomic vapor may be provided by, or dispensed by, an atomic dispenser described earlier. For example, a jet of atoms may include a directional beam including hot atomic vapor emerging from an atomic dispenser.

Some embodiments involve cooling a jet of atoms. Cooling a jet of atoms refers to cooling (or reducing) motion and/or speed of motion of atoms in the jet. For example, cooling a jet of atoms may include cooling the motional degrees of freedom of atoms in the jet.

Some embodiments involve a cavity (or a resonator) formed within the silicon nitride layer. For example, a cavity (or a resonator), as defined earlier, formed within the silicon nitride layer may involve a planar layer incorporating a connected region including silicon nitride. The connected region may be embedded in a different material whose index of refraction is lower than that of silicon nitride. A cavity (or a resonator) formed within the silicon nitride layer may be formed in a silicon nitride region surrounded by silica, wherein the silicon-nitride region may include a straight or curvilinear line, or the silicon-nitride region may include a ring. By way of non-limiting example, the optical cavity 103 in FIG. 1 and, the cavity 818 in FIG. 8 through FIG. 9C may be formed in a silicon nitride region.

Some embodiments involve a dirty photon. A dirty photon refers to a photon that is distinguishable from another photon, for example when performing quantum computation. A dirty photon may include, for example, a propagating (itinerant) photon in a mixed state of multiple spatio-temporal modes, e.g. of multiple temporal profiles. Entangling photons through a cavity-enhanced atom-photon interaction (e.g., using a quantum emitter coupled to a resonator or a resonator-coupled quantum emitter described earlier) enables use of such dirty photons in quantum computation operations. This is because entangling photons through a cavity-enhanced atom-photon interaction (e.g., using a quantum emitter coupled to a resonator or a resonator-coupled quantum emitter described earlier) does not require use of indistinguishable photons (clean photons), which would otherwise have been the case for probabilistic entanglement with linear optics. For example, this means an input photon pulse (e.g., the pulse 404 in FIG. 4A) does not have to be precisely timed and shaped. Single photons produced according to some disclosed embodiments are perfectly suitable for qubit entanglement using a quantum emitter coupled to a resonator or a resonator-coupled quantum emitter described earlier even when the photons exhibit irregularities that make them readily distinguishable.

Some embodiments involve a temporal profile. A temporal profile refers to a temporal envelope of a field of a propagating photon. Examples of a temporal profile include: an exponentially decreasing or increasing profile with a certain decay time and initial time; a constant profile with a certain initial time and final time; or a gaussian profile with specific average time and temporal variance.

Some embodiments involve a photonic delay line. A photonic delay line refers to a component or group of components arranged to introduce a time delay for a pulse of one or more photons or a light beam. For example, a photonic delay line may include a photonic setup incorporating a photonic waveguide serving to delay the arrival time of an incoming pulse with respect to a pulse not entering the photonic waveguide. An optical delay line, which may make use of the visible segment of the electromagnetic spectrum, is an example of a photonic delay line. An optical delay line can have a fixed or tunable delay. The (photonic or optical) delay line can be controlled by a (optical) switch determining whether an optical pulse passes through the delay line or not. For example, the (photonic or optical) delay line may be implemented in free space, in fibers, or in on-chip waveguides.

Some embodiments involve manipulating an alkali atom (or manipulating a quantum emitter). Manipulating an alkali atom (or manipulating a quantum emitter) refers to controlling an external or internal state (e.g., a condition or a configuration) of the alkali atom (or the quantum emitter). For example, the internal state may correspond to an electronic configuration, nuclear configuration or a combination thereof. The external state, for example, may correspond to the motion of an alkali atom in a coupling location.

Some embodiments involve cooling an alkali atom (or cooling a quantum emitter). Cooling in this context refers to reducing motion and/or speed of an alkali atom (or a quantum emitter). For example, cooling an alkali atom (or cooling a quantum emitter) may impact the motional degrees of freedom of the alkali atom (or the quantum emitter).

Some embodiments involve a heralding-free connection. A heralding free connection refers to a connection, or a link, which does not use heralding (or a feedforward). For example, a heralding (or a feedforward) may be achieved by detecting one photon from a pair of single photons generated in highly correlated states and using a photonic or optical delay line to "herald" the other photon from the pair, whereby the state of the other photon is known prior to its detection (the feedforward). A heralding-free connection therefore refers to a connection, or a link, which does not require, and does not involve, such heralding (or feedforward).

The embodiments, clauses, claims, or examples, described herein relate to use of one or more cavities (e.g. a resonator described herein) coupled with a quantum emitter (e.g. an ion, an atom, or a quantum dot) for use in quantum computation, and their related system, device, apparatus, method, (non-transitory) computer readable media, or computer readable media. Such uses may be compatible with another embodiment described herein.

By way of non-limiting example, the coupled cavity and quantum emitter (or the cavity coupled quantum emitter) described herein may be used in one of the example configuration of an atom and an optical cavity (or a cavity QED)) used in a device for a deterministic photonic graph state generator described herein, wherein the optical cavity (or the resonator) and the atom (or the quantum emitter) are arranged so that the coupling therebetween occurs at an atom trap or other particle trap (also referred to as a coupling location or a coupling site, or the location (the site) where an intra-cavity field of a source-optical cavity or an entanglement-optical cavity is present) of the example configuration. In an example of the configuration in the deterministic photonic graph state generator of the present disclosure, a cavity corresponds to an optical cavity 103 and a quantum emitter corresponds to an atom 102 shown in FIG. 1 and FIG. 3, an atom 402 in FIG. 4A and FIG. 4B, an atom 502 in FIG. 5A and FIG. 5B. In other non-limiting examples, a cavity corresponds to a cavity 818 in FIG. 8 through FIG. 9C, and a quantum emitter corresponds to a Rubidium ($^{87}$Rb) atom 820 in FIG. 8 through FIG. 9C, or one or more atoms 1020 in FIG. 10.

Figure 12A:
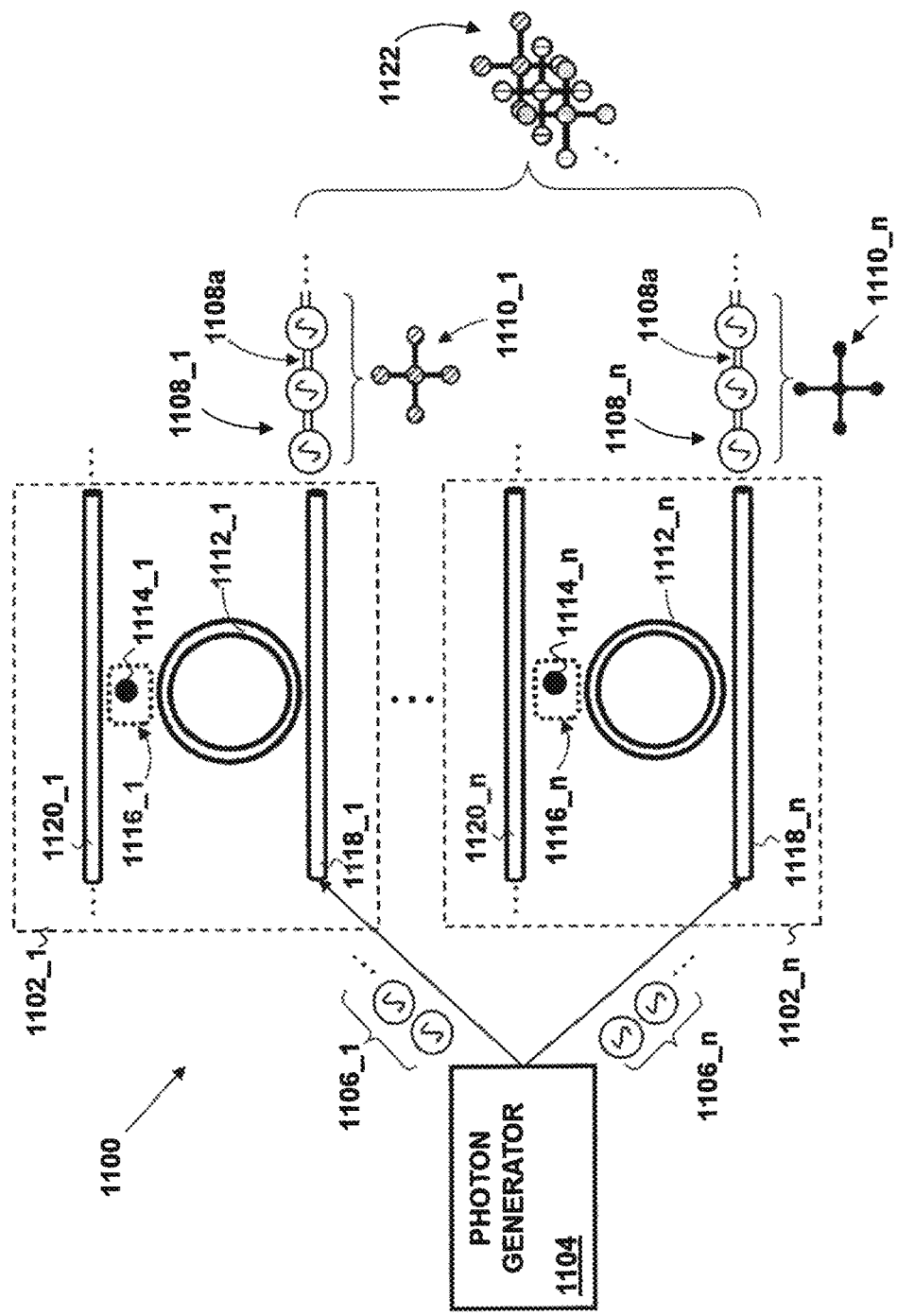
FIG. 12A schematically illustrates an exemplary implementation for a quantum computing system related to providing multiple cavities for generating a graph state consistent with some disclosed embodiments.
Figure 12B:
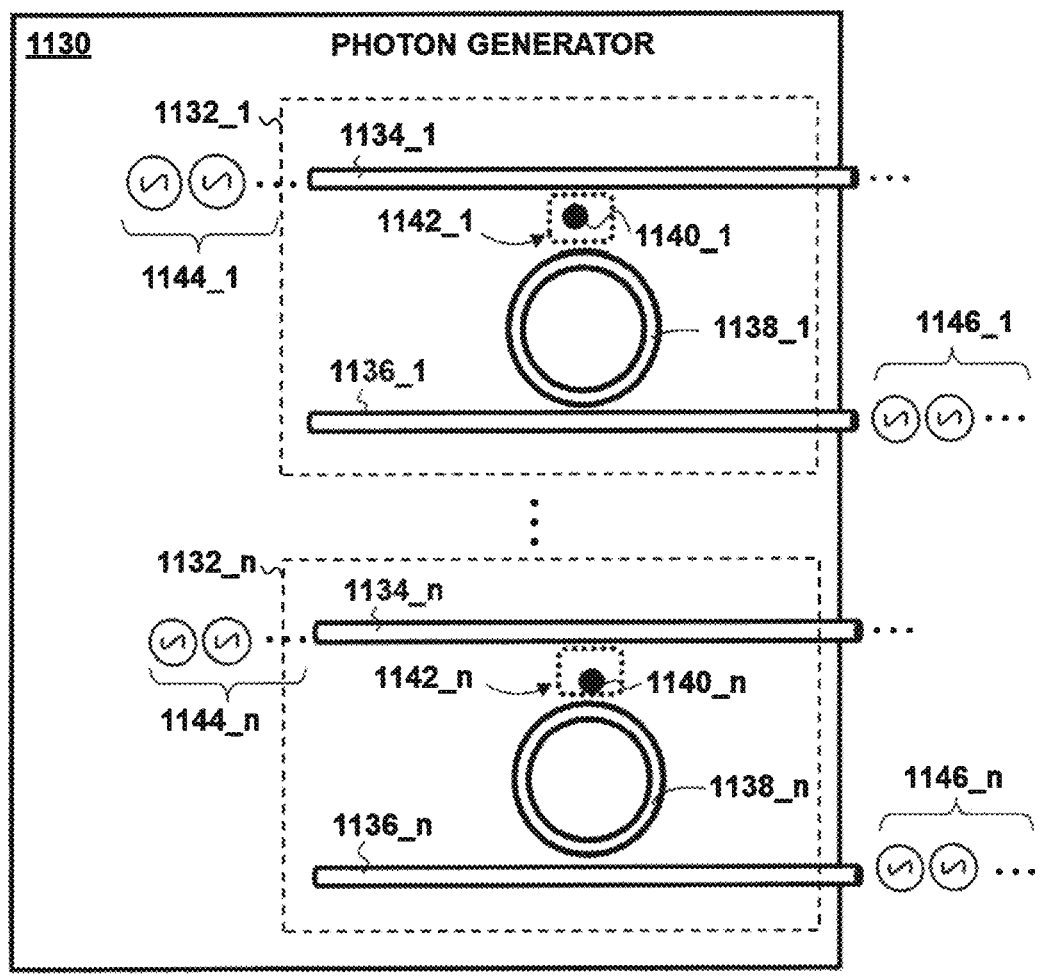
FIG. 12B schematically illustrates a photon generator providing multiple cavities consistent with some disclosed embodiments.
Figure 12C:
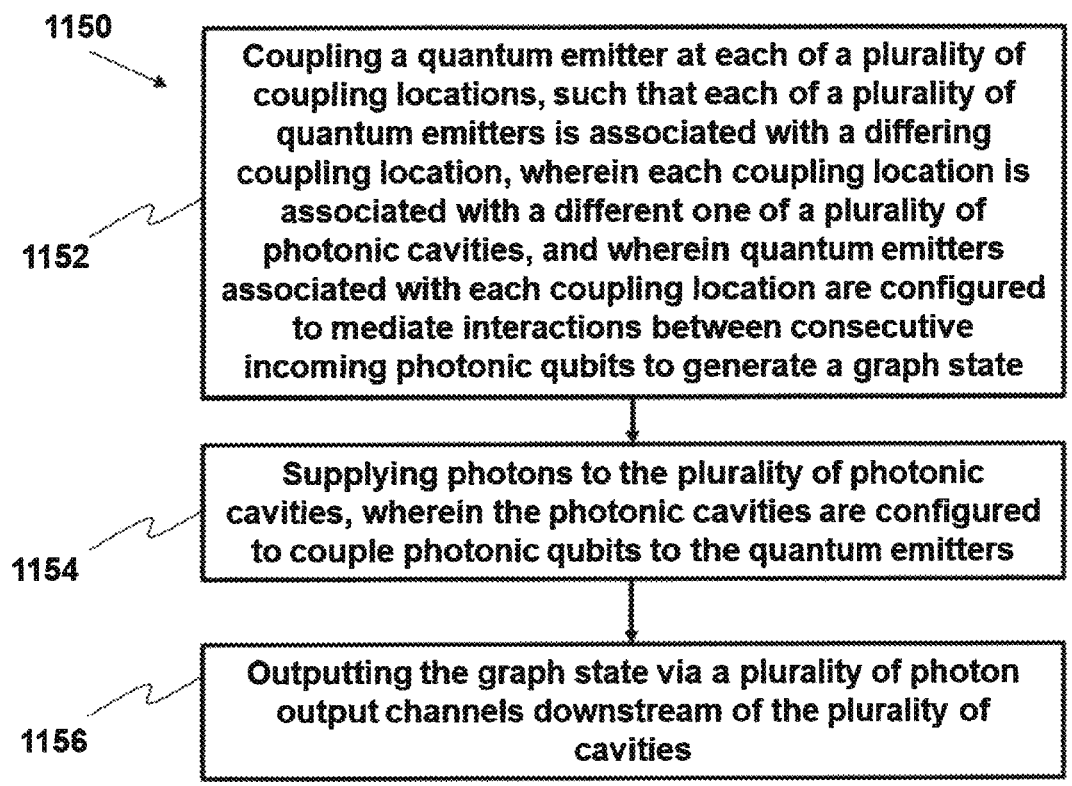
FIG. 12C is a block diagram of an example process related to providing multiple cavities for generating a graph state according to some disclosed embodiments.
Figure 12D:
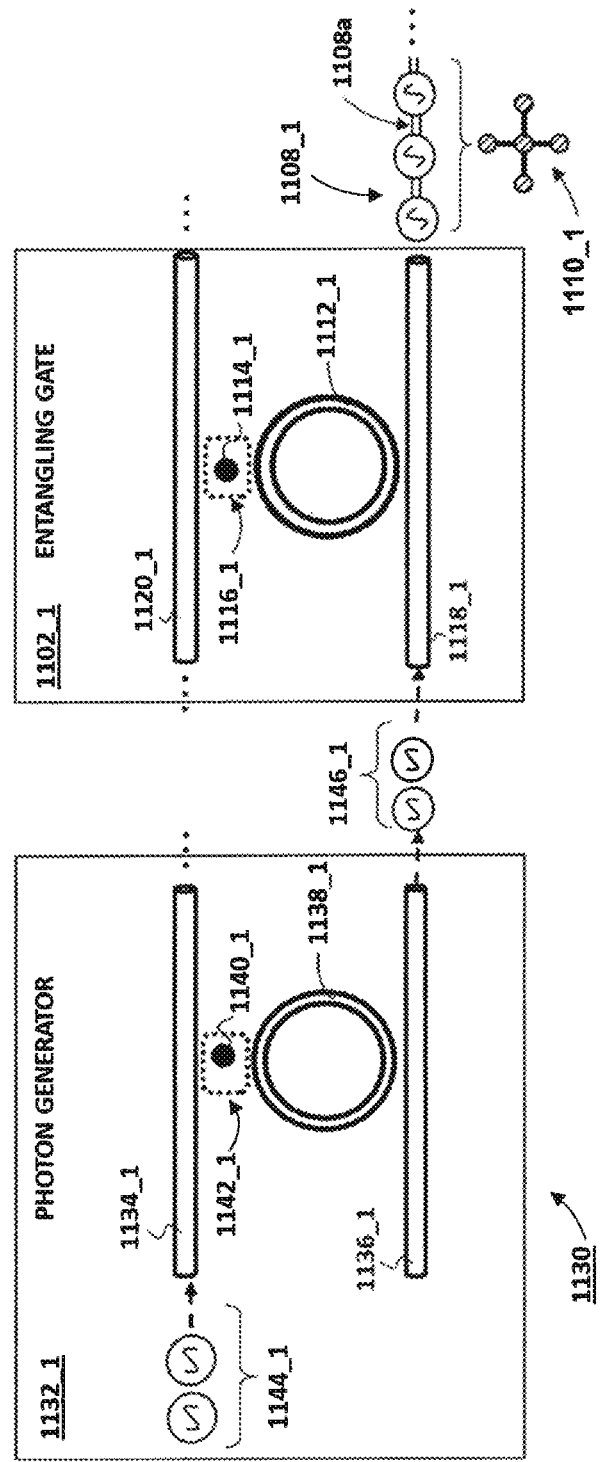
FIG. 12D schematically illustrates an exemplary implementation for a quantum computing system related to providing multiple cavities for generating a graph state according to some disclosed embodiments.

For example, the coupled cavity and quantum emitter (or the cavity coupled quantum emitter) described herein may be used in one of the example configurations of a photonic cavity-coupled quantum emitter, e.g. in embodiments related to providing multiple cavities for generating a graph state or those shown in FIG. 12A through FIG. 12D (e.g. an example optical cavity 1112_1 1112_n 1138_1 1138_n and an example quantum emitter 1114_1 1114_n 1140_1 1140_n shown in FIG. 12A, FIG. 12B and FIG. 12D).

Figure 13A:
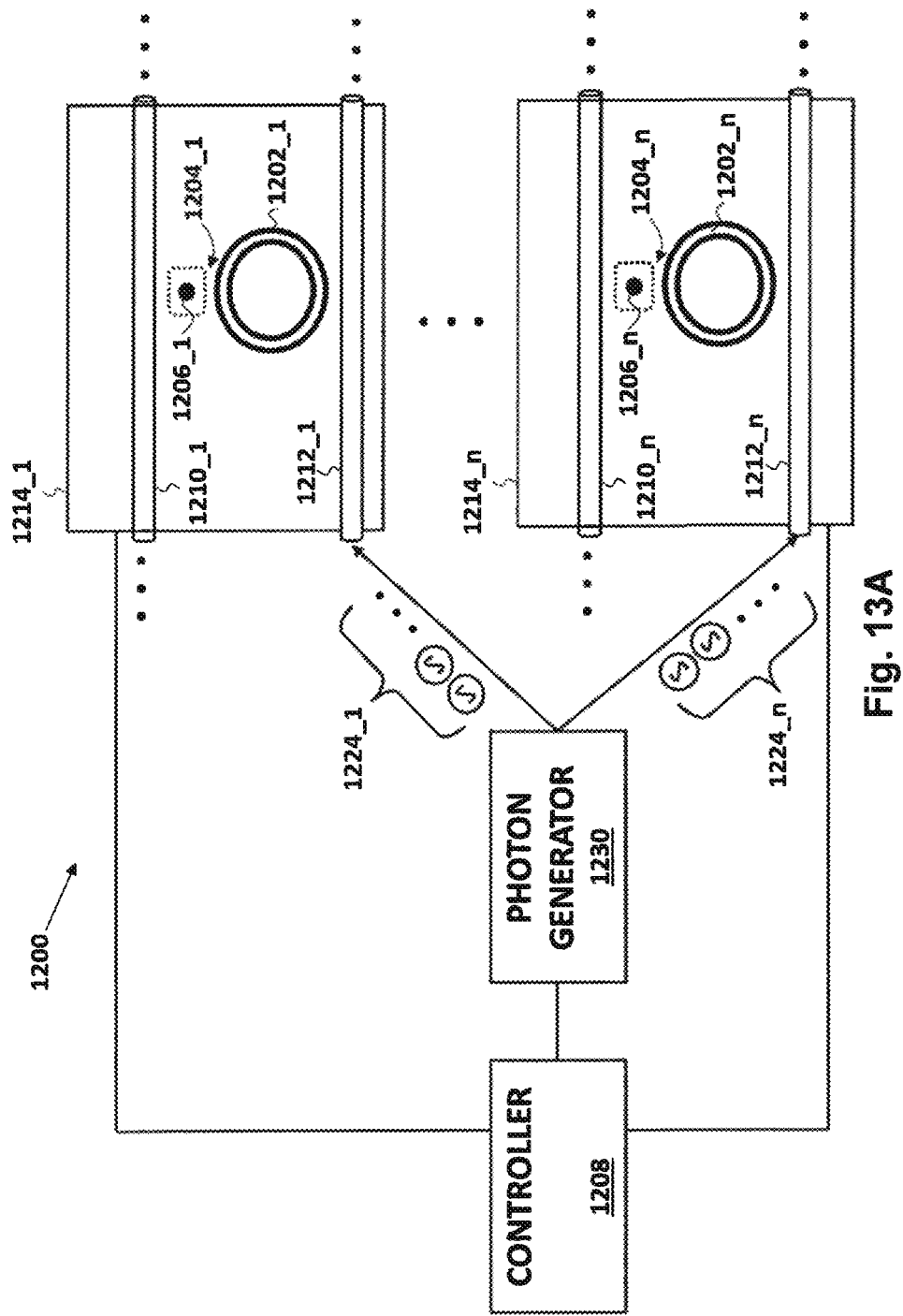
FIG. 13A to FIG. 13C, together, schematically illustrate exemplary implementations of a system according to some embodiments related to generating photonic graph states.
Figure 13B:
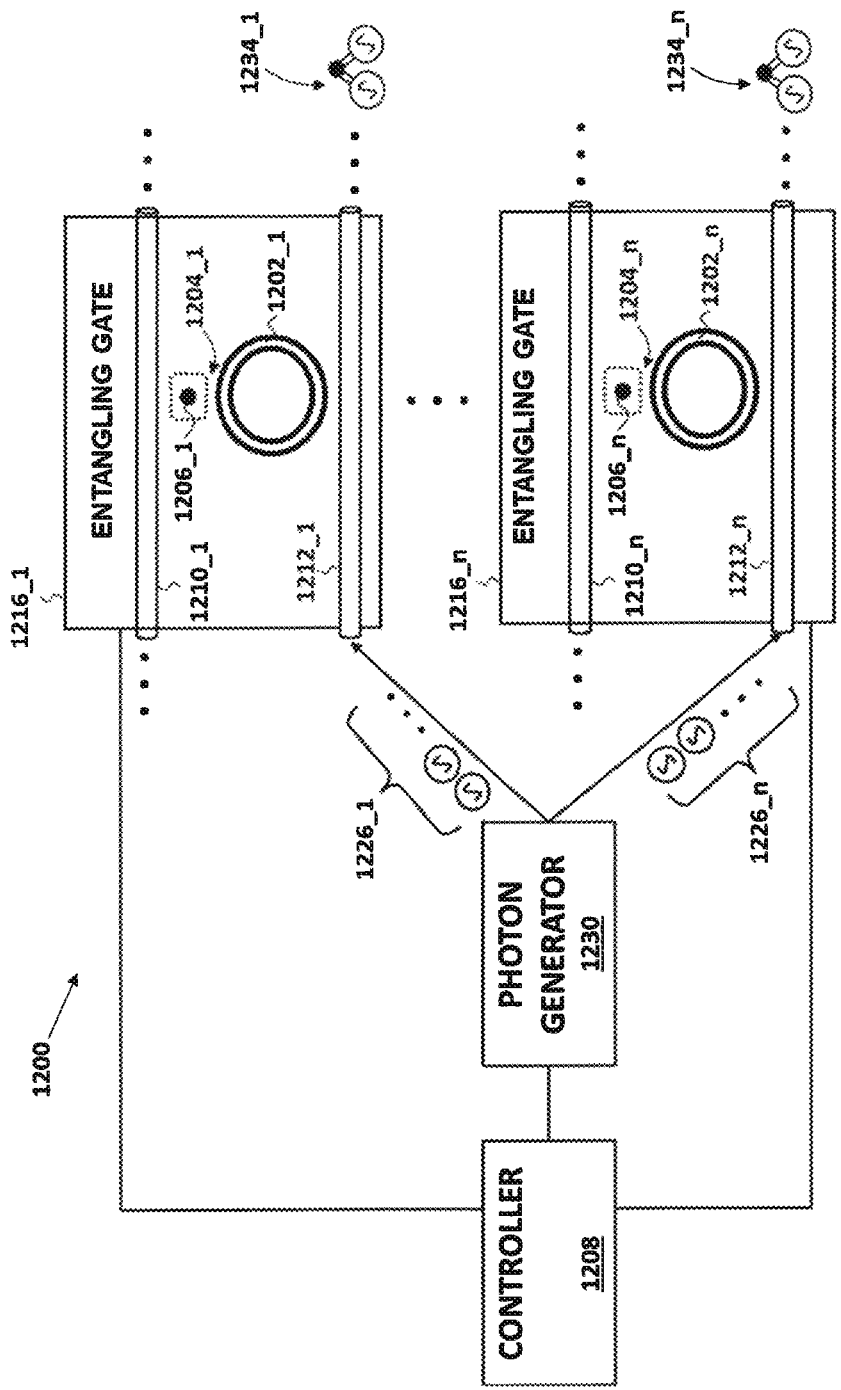
Figure 13C:
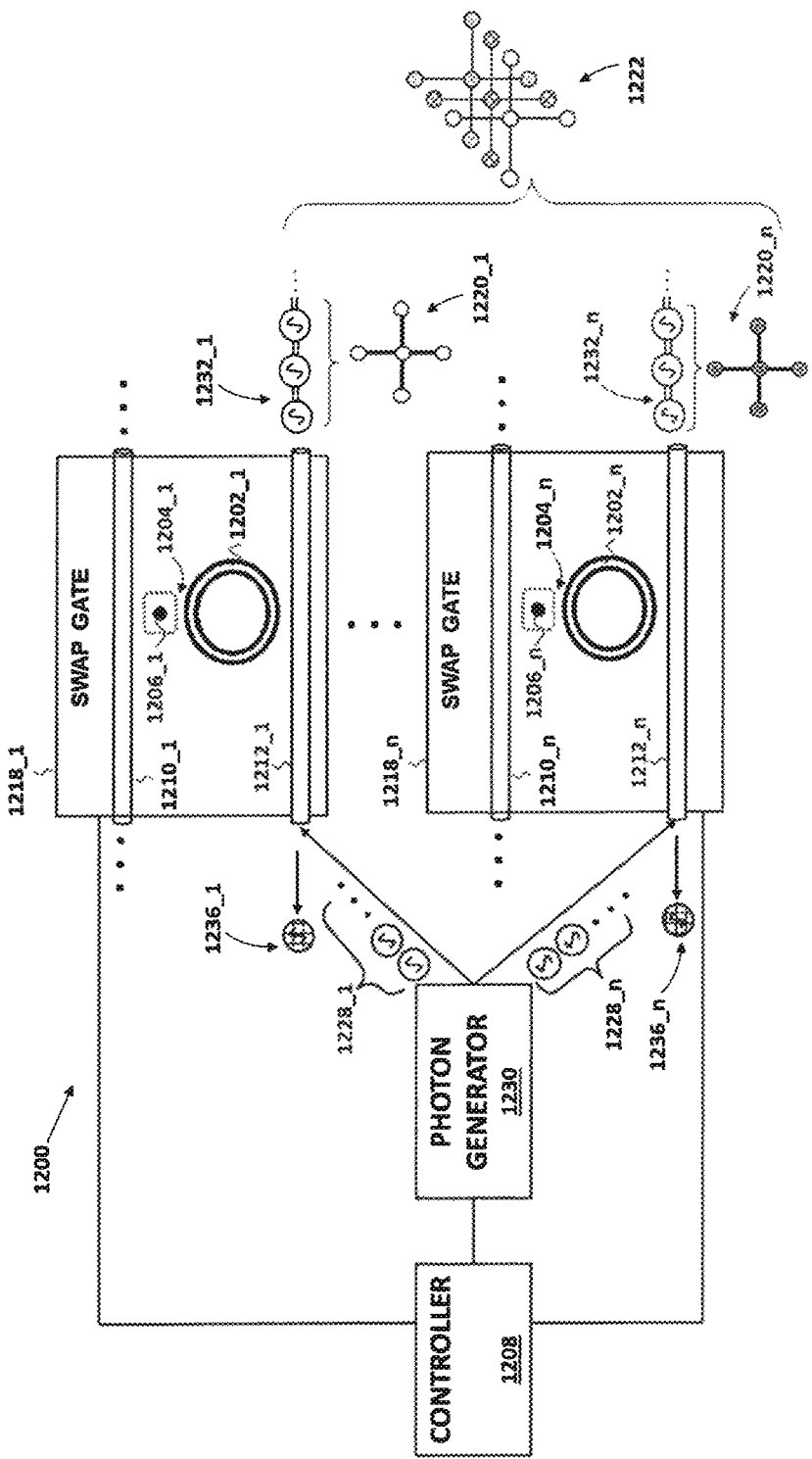

For example, the coupled cavity and quantum emitter (or the cavity coupled quantum emitter) described herein may be used in one of the example configurations of a cavity-coupled quantum emitter, e.g. in embodiments related to generating photonic graph states or those shown in FIG. 13A through FIG. 13I) (e.g. an example cavity 1202_1 1202_n and an example quantum emitter 1206_1 1206_n shown in FIG. 13A, FIG. 13B and FIG. 13C).

Figure 14A:
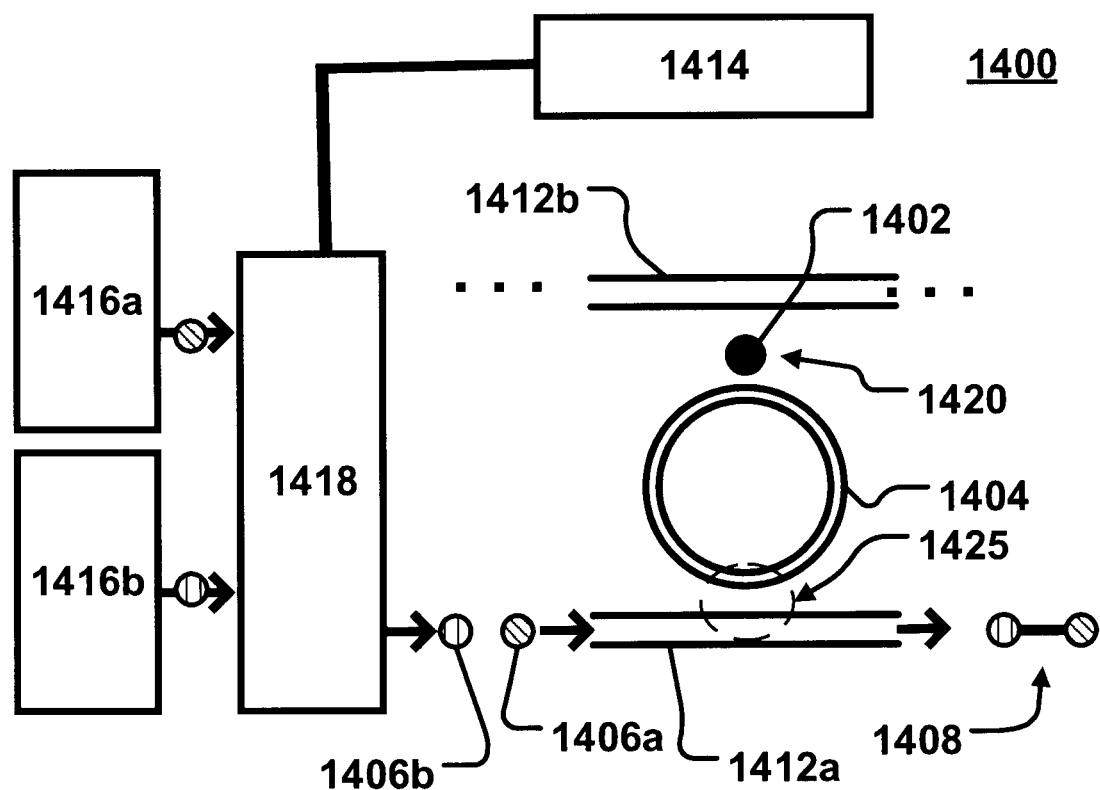
FIG. 14A schematically illustrates an exemplary implementation of a system or a device according to some embodiments related to generating photonic graph states for quantum computing.
Figure 14B:
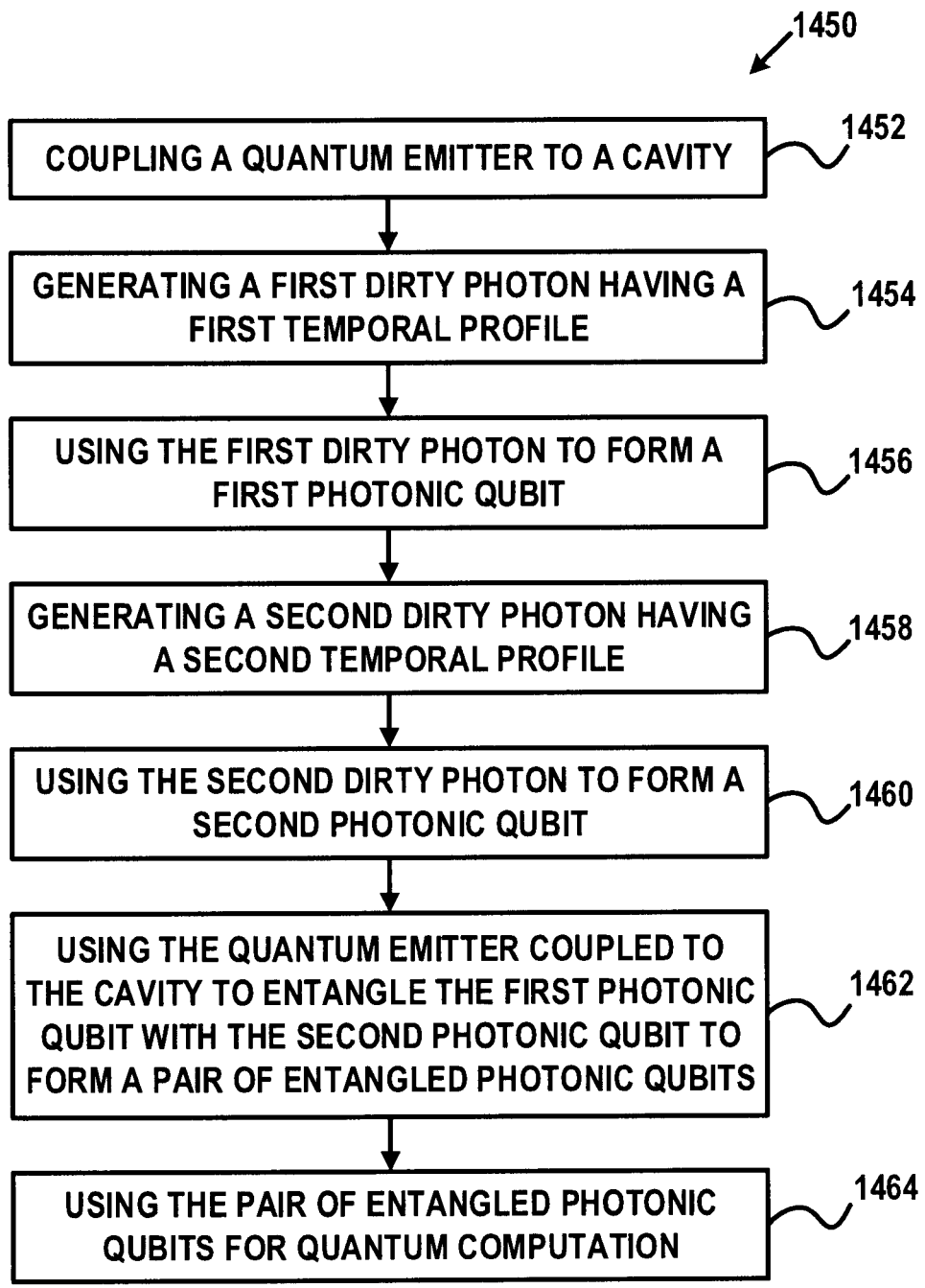
FIG. 14B is a flowchart of an example process according to some embodiments related to generating photonic graph states for quantum computing.
Figure 15A:
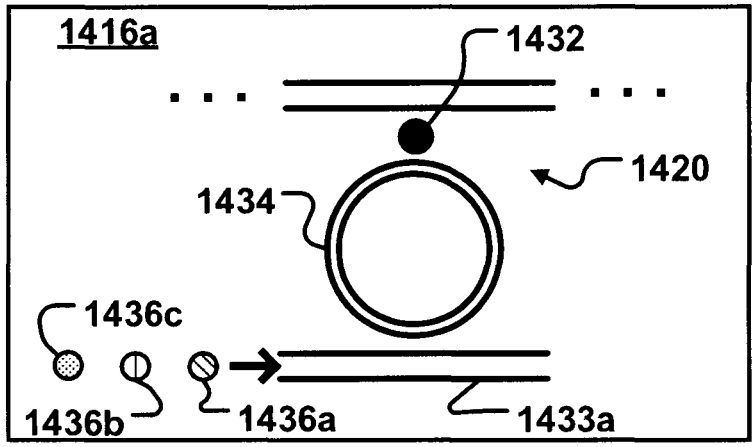
FIG. 15(A) to FIG. 15(C) schematically illustrates a single-photon Raman interaction (SPRINT) mechanism using a quantum emitter coupled to a resonator (or a cavity) according to some embodiments of the present disclosure.
Figure 15B:
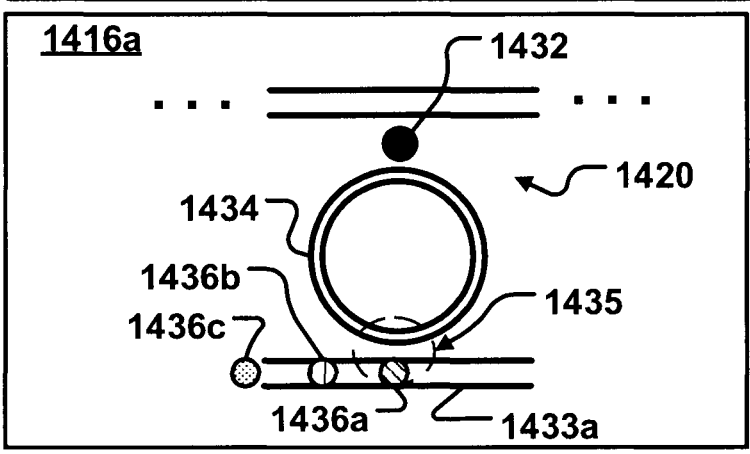
Figure 15C:
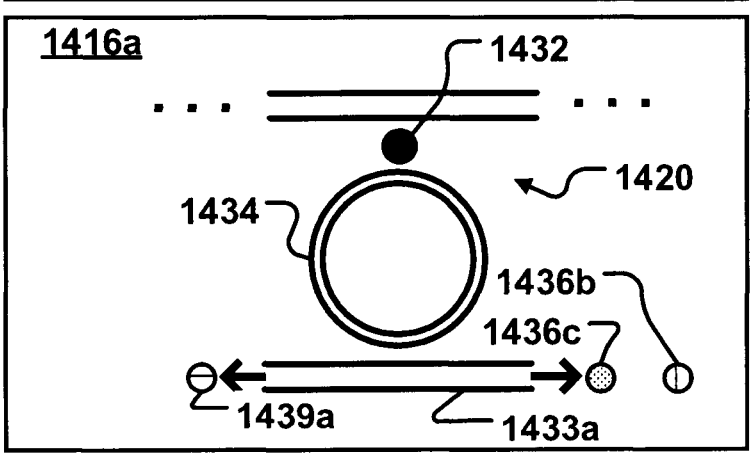

For example, the coupled cavity and quantum emitter (or the cavity coupled quantum emitter) described herein may be used in one of the example configurations of a cavity-coupled quantum emitter, e.g. in embodiments related to generating photonic graph states for quantum computing or those shown in FIG. 14A through FIG. 15(A) to FIG. 15(C) (e.g. an example cavity 1404 and an example quantum emitter 1402 shown in FIG. 14A or an example resonator 1434 and an example quantum emitter 1432 shown in FIG. 15(A) to FIG. 15(C)).

Figure 11A:
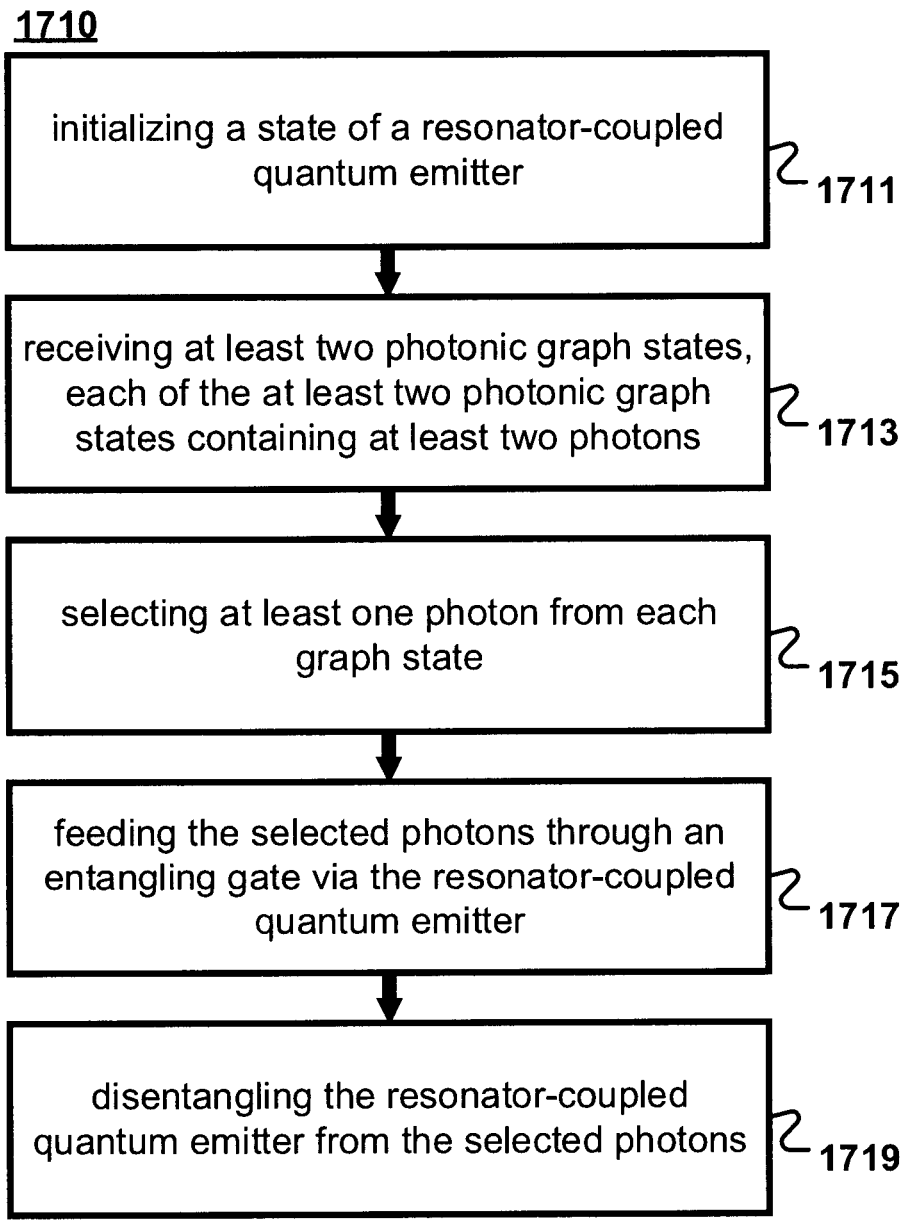
FIG. 11A schematically illustrates a quantum computing method according to some embodiments related to entangling photonic graphs.
Figure 11B:
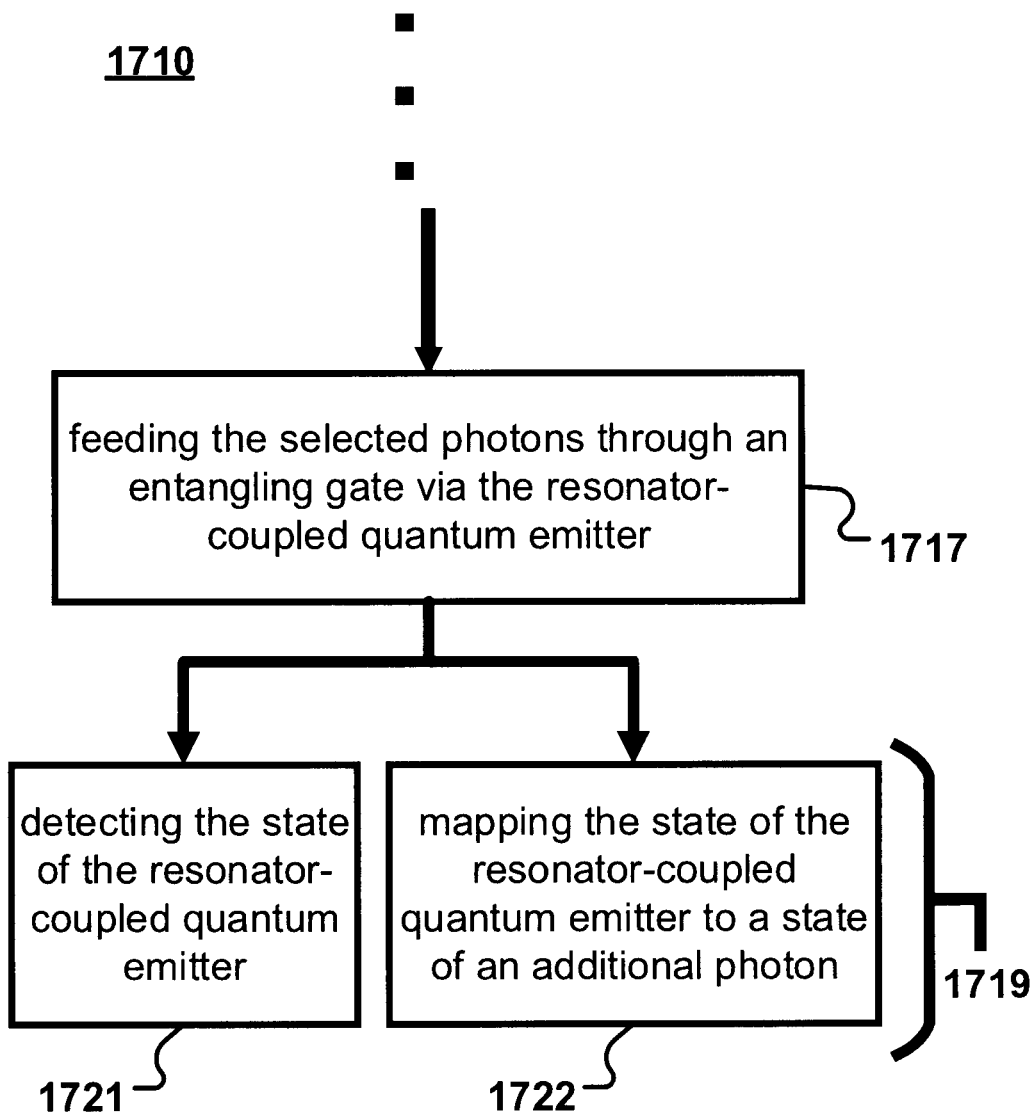
FIG. 11B schematically illustrates a quantum computing method according to some embodiments related to entangling photonic graphs.
Figure 11C:
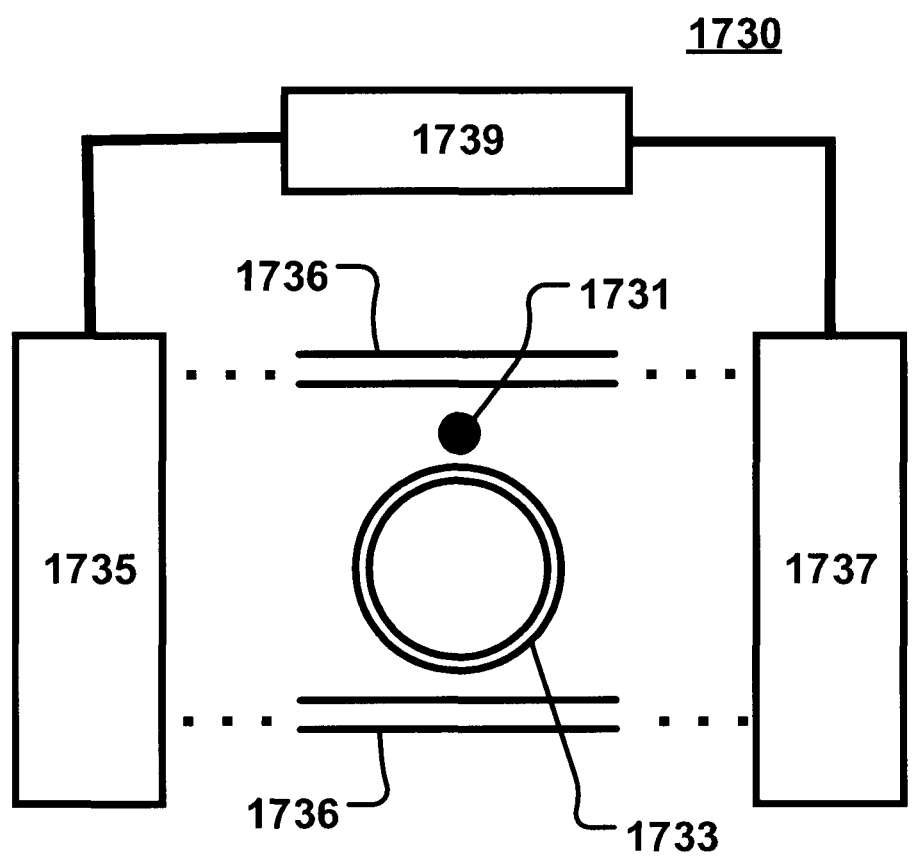
FIG. 11C schematically illustrates a quantum computing system according to some embodiments related to entangling photonic graphs.
Figure 11D:
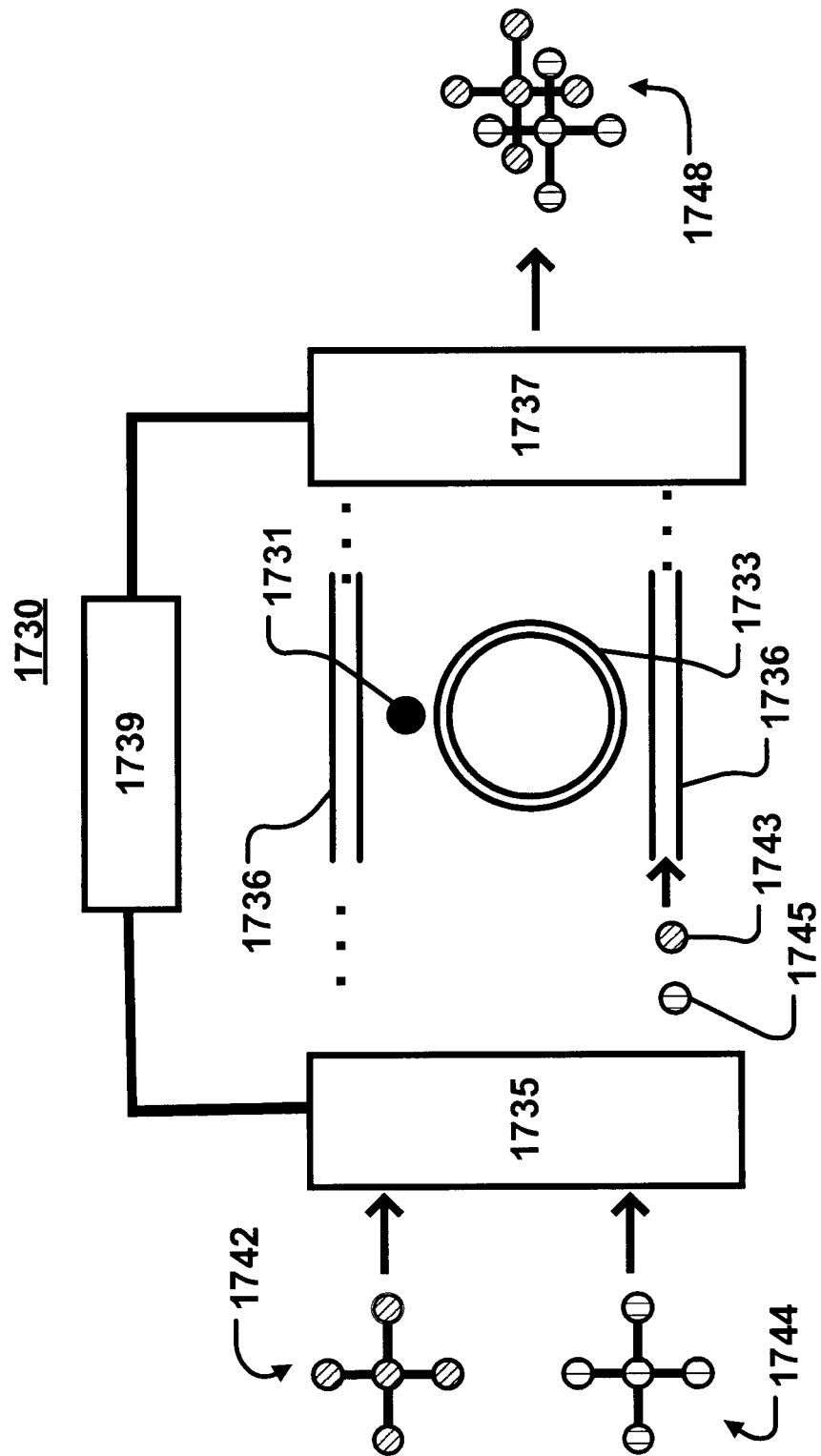
FIG. 11D schematically illustrates a quantum computing system according to some embodiments related to entangling photonic graphs, forming a cluster, according to some disclosed embodiments.

For example, the coupled cavity and quantum emitter (or the cavity coupled quantum emitter) described herein may be used in one of the example configurations of a resonator-coupled quantum emitter, e.g., in embodiments related to entangling photonic graphs or those shown in FIG. 11A through FIG. 11D (e.g., an example resonator 1733 and an example quantum emitter 1731 shown in FIG. 11C or FIG. 11D).

Figure 16A:
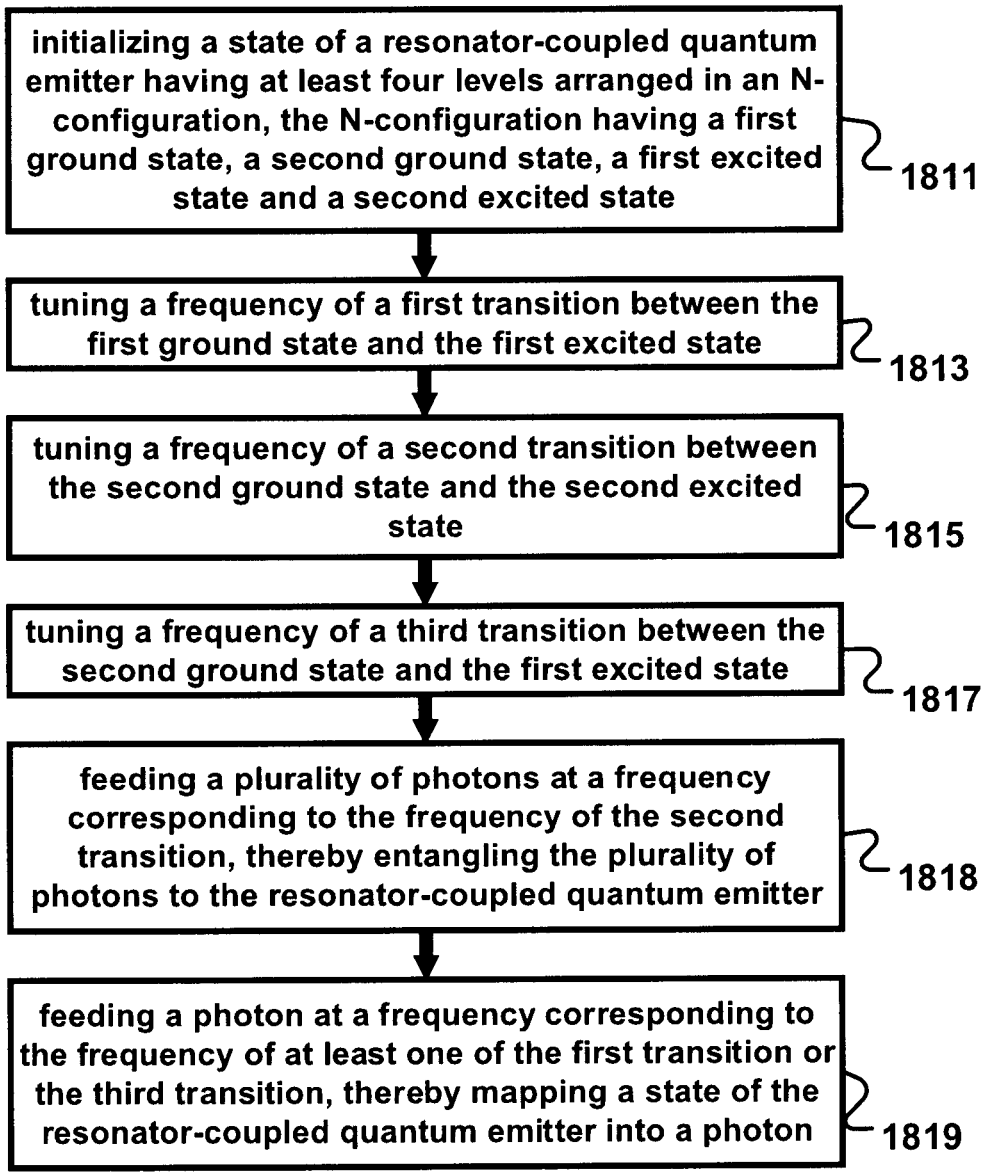
FIG. 16A is a flow diagram of a quantum computing method according to some embodiments related to N-configuration resonator-coupled quantum emitter.
Figure 16B:
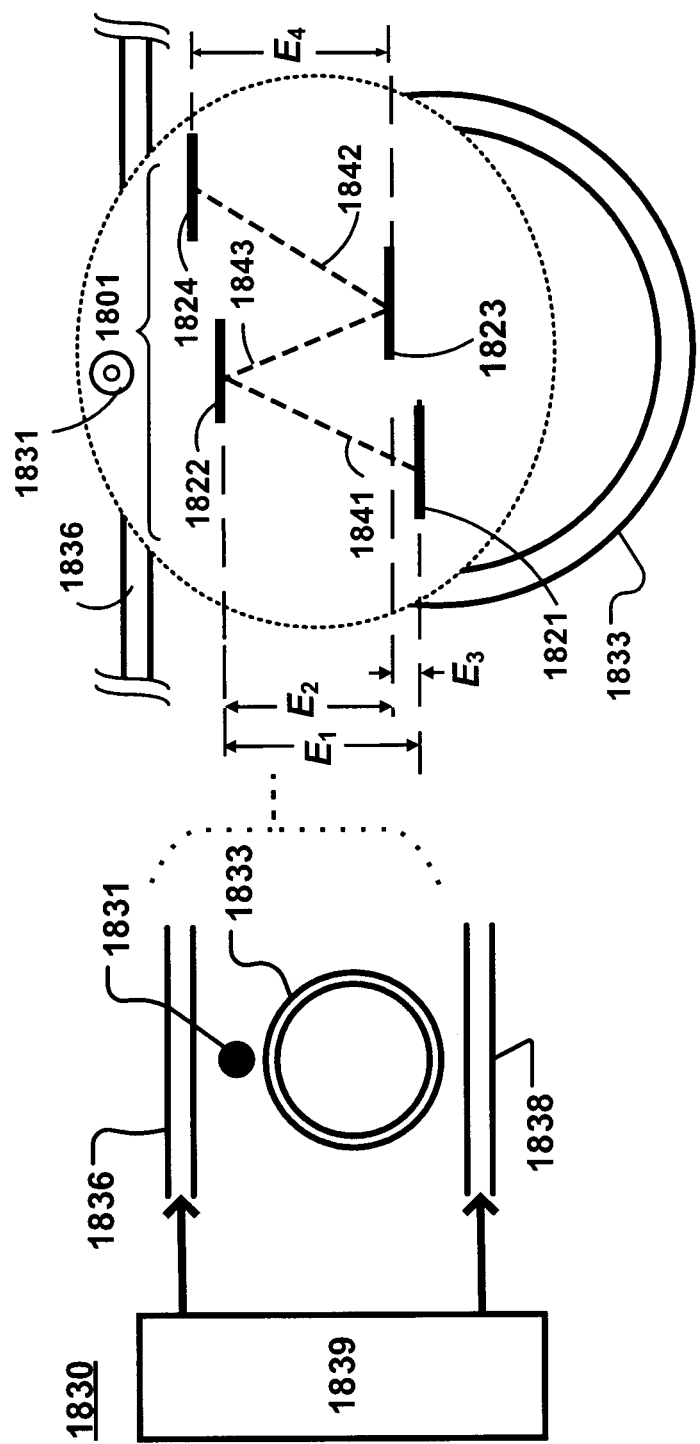
FIG. 16B schematically illustrates a quantum computing system according to some embodiments related to N-configuration resonator-coupled quantum emitter.
Figure 16C:
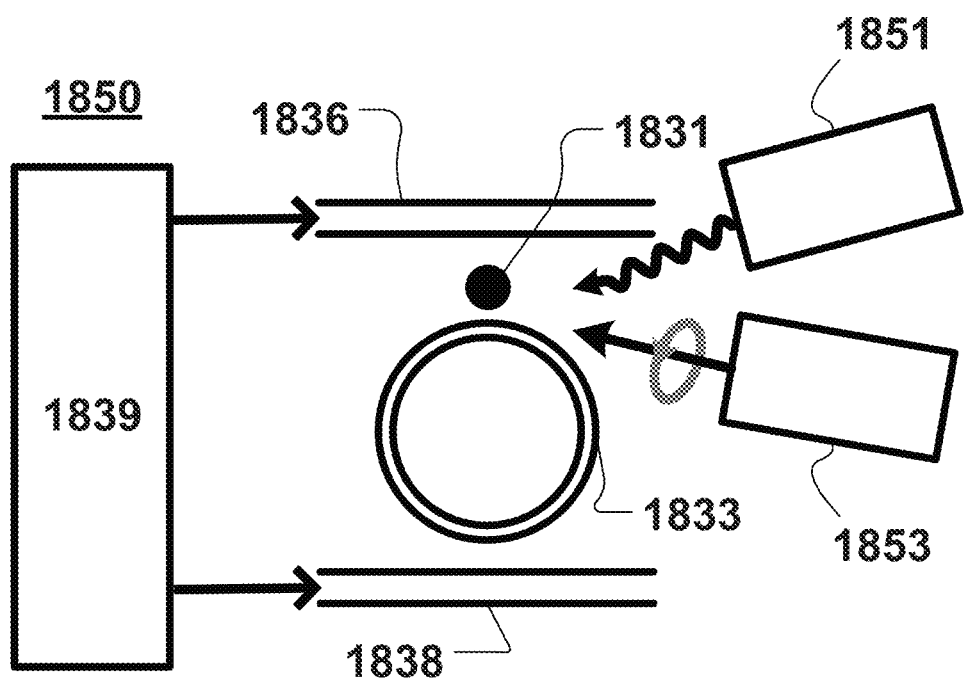
FIG. 16C schematically illustrates a quantum computing system according to some embodiments related to N-configuration resonator-coupled quantum emitter.
Figure 16D:
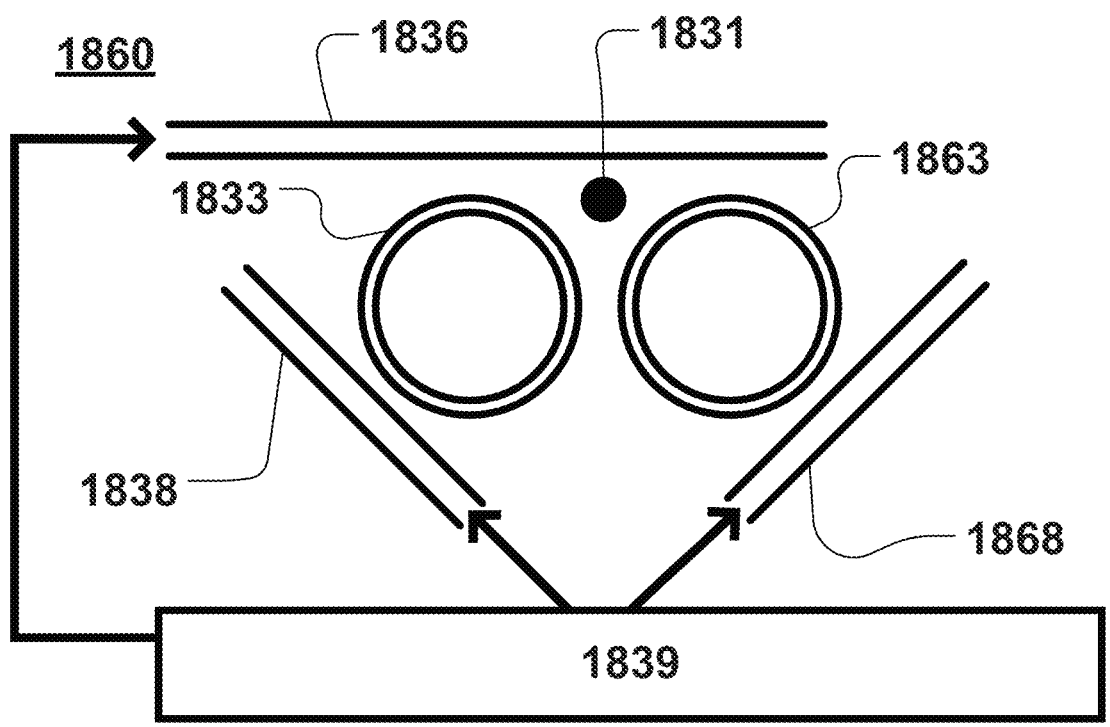
FIG. 16D schematically illustrates a quantum computing system according to some embodiments related to N-configuration resonator-coupled quantum emitter.

For example, the coupled cavity and quantum emitter (or the cavity coupled quantum emitter) described herein may be used in one of the example configurations of a resonator-coupled quantum emitter, e.g., in embodiments related to N-configuration resonator-coupled quantum emitter or those shown in FIG. 16A through FIG. 16D (e.g. an example resonator 1833 1863 and an example quantum emitter 1831 shown in FIG. 16B through FIG. 16D.

Figure 17A:
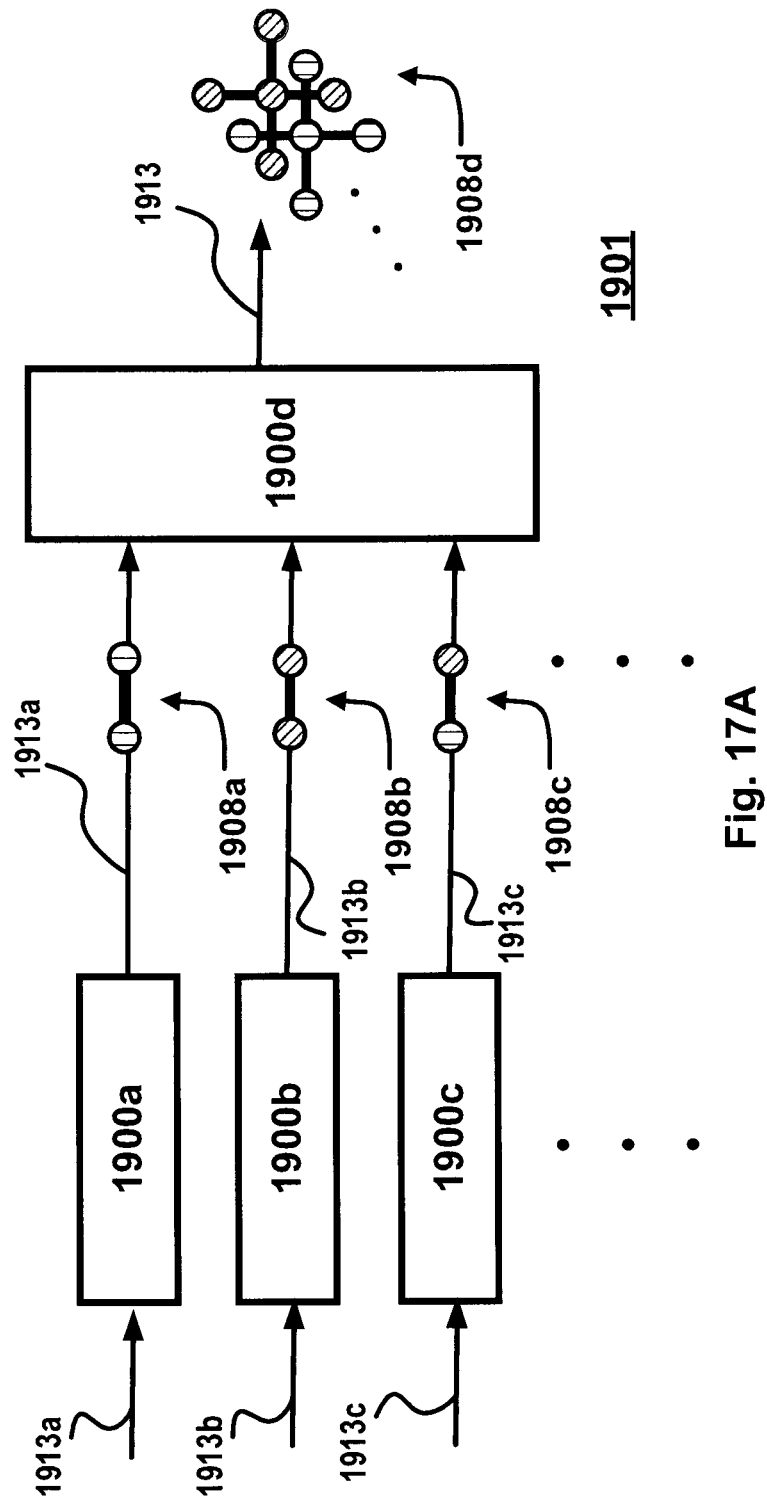
FIG. 17A schematically illustrates an exemplary implementation of a system or a device according to some embodiments related to use of heralding-free connections.
Figure 17B:
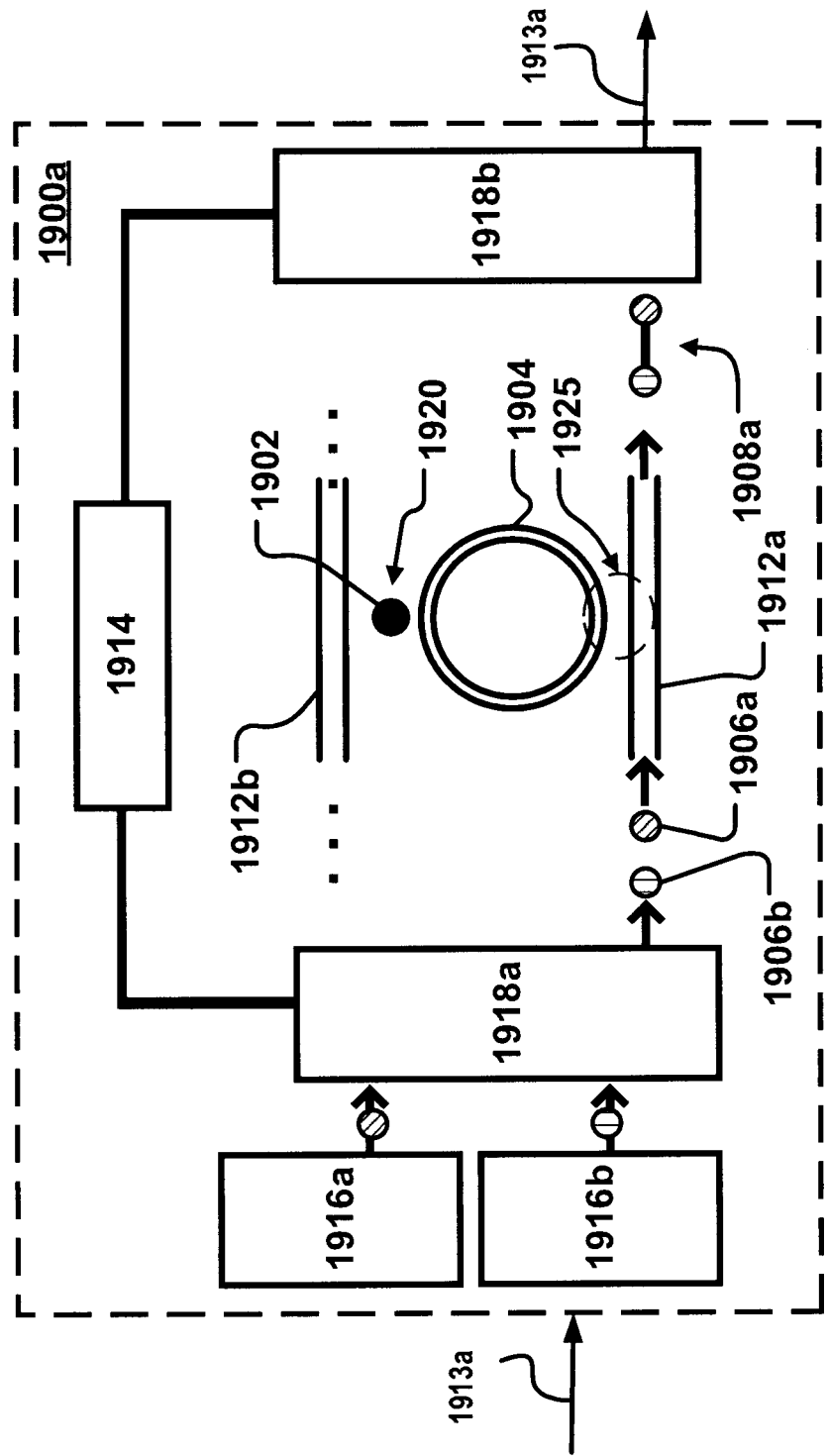
FIG. 17B and FIG. 17C schematically illustrate exemplary implementations of a photonic processing stage according to some embodiments related to use of heralding-free connections.
Figure 17C:
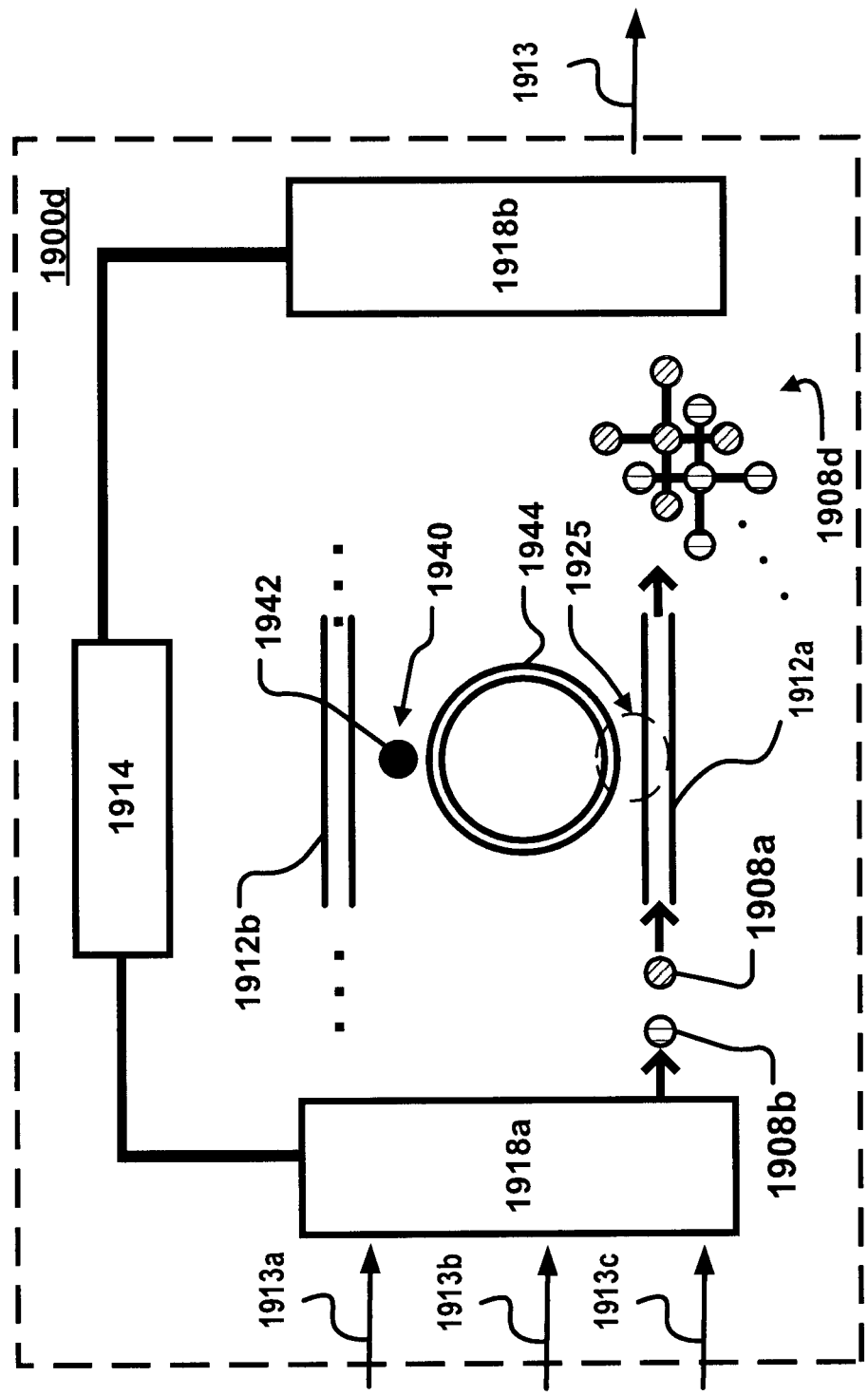

For example, the coupled cavity and quantum emitter (or the cavity coupled quantum emitter) described herein may be used in one of the example configurations of a resonator-coupled quantum emitter, e.g., in embodiments related to use of heralding-free connections or those shown in FIG. 17A through FIG. 17I) (e.g., an example resonator 1904 1944 and an example quantum emitter 1902 1942 shown in FIG. 17B and FIG. 17C).

Use of micron-scale optical cavities in at least some of these non-limiting examples enables coupling a single photon (or alternatively, two or more photons) with a single atom, whereby that optical cavity coupled atom can be used as a photon generator as shown in FIG. 8 to FIG. 9B, or as the atom with which an input photon can establish an entangled state as shown in FIG. 8, FIG. 9A and FIG. 9C.

For example, a Rubidium ($^{87}$Rb) atom coupled to a cavity 810 shown in FIG. 8 can be used with waveguides (e.g. formed using a fiber 816 or a nanofiber or an on-chip waveguide) to generate a photon ("single photon source" 812 or a "photon generator"), or to entangle a photon passing by ("entangling gate" 814, e.g. a controlled-Z, gate (CZ, gate)).

As illustrated by the example shown in FIG. 9A, the waveguide may include a utility waveguide 910 for carrying a pulse for generating a trap, which traps the Rb atom 820 at a coupling location, e.g., next to the cavity 818 (or the resonator or the ring shape in the figure). The pulse may be configured to generate an evanescent field around the waveguide 910 so that evanescent field trapping can be used to trap the Rb atom 820 at the coupling location. The parameters of the pulse for generating an evanescent field may be determined based on the particular arrangement of the Rb atom 820 (or any other quantum emitter used in its place), cavity 818, coupling location, and/or waveguides 816, 910, 930. The pulse may be configured so that it is capable of trapping cold atoms (Rb atoms 820 or quantum emitters) in the vicinity of an optical nanofiber (a waveguide 816). By way of non-limiting example, with an optical nanofiber having a diameter of around 400 nm, a large fraction of the fiber-guided light propagates in an evanescent field in the surrounding vacuum. An optical dipole trap can then be generated in this evanescent field when pulses having two wavelengths are injected in the guided mode of the nanofiber: The first pulse may be red detuned, being configured to pull atoms towards the nanofiber where its evanescent field is more intense. The second pulse may be blue detuned, being configured to provide a repulsive potential that prevents (or discourages) the atoms from crashing onto the surface of the nanofiber. The combination of the two contributions may lead to a potential minimum at the coupling location, for example located around 200 nm away from the surface of the nanofiber. In one embodiment, the red detuned pulse may have a wavelength of 850 nm (or for example, 980 nm) and the blue detuned pulse may have a wavelength of 690 nm (or for example, 720 nm). A detector 951 may be located at an end of the utility waveguide 910 for carrying the pulse for generating a trap so that the pulse may be detected at the detector 951 and an appropriate controlling of the pulse may be performed based on the measurements form the detector 951.

As illustrated by the example shown in FIG. 9A, the waveguides may also include a quantum waveguide 930 for outputting a photon. This output photon could be a photon generated by the Rb atom 820 (when the cavity QED is used as a photon source 812), or it could be an entangled photon which is in an entangled state with the Rb atom 820 (when the cavity QED) is used as an entangling (CZ) gate 814 and a photon is input through, and carried by, the quantum waveguide 930). This facilitates a single photon generation, a CZ gate or an atomic state readout. A switch/router 970 may be positioned at an output channel side of the quantum waveguide 930 so that, when a measurement (or a detection) of an output photon is required, the output photon is directed to a detector 952 located at a branch of the quantum waveguide 930 that branches off from the quantum waveguide 930.

As illustrated by the atom 820 coupled to a cavity 818 configuration example shown in FIG. 9B, when the configuration is used for photon generation 812, a utility waveguide 910 may be connected to a pump laser input, carrying blue and red lasers for trapping the atom 820 at a coupling location between the waveguide 910 and the cavity 818 (resonator). Another waveguide (e.g. a quantum waveguide 930) may be provided within an interacting distance of the cavity 818 (resonator) so that the generated photon may be carried by the other waveguide.

As illustrated by the atom 820 coupled to a cavity 818 configuration example shown in FIG. 9C, when the configuration is used for an entangling (CZ) gate 814, a utility waveguide 910 may carry blue and red lasers for trapping the atom 820 at a coupling location between the waveguide 910 and the cavity 818 (resonator). Another waveguide (e.g. a quantum waveguide 930) may be provided within an interacting distance of the cavity 818 (resonator) so that one or more single photons may be carried therein, facilitating an interaction between the carried photon and the trapped atom 820 via the cavity 818 (resonator), whereby the interaction leads to the carried photon becoming entangled with the atom 820 and is then output as an entangled photon.

According to an embodiment of the present disclosure, a perforated vacuum chamber 1013 may be used in the example arrangement 1011 shown in FIG. 10, which includes a combination of one or more photonic chips 1015 with a cold atom source 1017 based Resource state generator (RSG), the combination forming part of a hybrid system 1011, wherein one or more lasers 1033 and a controller (or a control system 1031) provide input to the photonic chip 1015 for controlling its operations or a Magneto-optical trap (MOT) for trapping one or more atoms 1020 from the cold atom source 1017, and wherein photon detectors 1035 connected to the photonic chips 1015 detect photons in, or from, the photonic chips 1015, so that the photonic chips 1015 can be controlled to output a cluster state of photonic states 1041. For example, either or both of the controller (or the control system 1031) or/and the photonic chip 1015 may include circuitry, and/or at least one processor and at least one memory, wherein the circuitry and/or the at least one processor is configured to carry out some or all steps of a quantum computing method described herein according to some disclosed embodiment.

Some embodiments involve multiple photonic cavities, each photonic cavity being associated with a coupling location and a quantum emitter. A cavity refers to a structure, enclosure or container that may function as a resonator, which is a component for establishing or supporting oscillations, as described earlier. A photonic cavity may thus refer to a resonator (or a component) for establishing or supporting electromagnetic modes associated with photons. For example, the photonic cavity may correspond to a cavity in a cavity QED setup, an optical cavity, a whispering gallery mode cavity, or a Fabry-Perot cavity. A coupling location includes an area (e.g., a volume or a region) configured to enable coupling between a quantum emitter and a photonic cavity. For example, it may include an area that positions a quantum emitter within an intra-cavity field of a photonic cavity, or which enables a quantum emitter's dipole field to overlap with an electromagnetic mode of a photonic cavity, as described earlier. For example, when a quantum emitter is in a coupling location, this enables the quantum emitter to couple with a photonic cavity, whereby the quantum emitter interacts with the established or supported electromagnetic modes of the photonic cavity. A quantum emitter refers to a component configured to couple to electromagnetic modes, as described earlier. For example, a quantum emitter includes a stationary quantum system with an anharmonic spectrum, configured to couple to electromagnetic modes. In other words, a quantum emitter may be a stationary qubit capable of interacting with photons.

When a quantum emitter is coupled to a photonic cavity (also referred to as a photonic cavity-coupled quantum emitter) in its associated coupling location, the quantum emitter is coupled to electromagnetic modes of the photonic cavity. Thus the quantum emitter has its dipole field overlapping with an electromagnetic mode of the photonic cavity, and the photonic cavity-coupled quantum emitter may be configured to release or emit a photon when excited (e.g., functioning as a photon generator) or interact with a photon passing by the photonic cavity (e.g., functioning as an entangling gate for entangling photons). Therefore, by providing or having multiple photonic cavities, each photonic cavity being associated with a coupling location and a quantum emitter, it is possible to release or emit multiple photons, interact with multiple photons, or interact with a photon multiple times.

For example, multiple photonic cavity-coupled quantum emitters may be used as multiple photon generators. These photon generators may provide multiple single photons concurrently (e.g., in parallel). Multiple photonic cavity-coupled quantum emitters may be used as multiple entangling gates. These entangling gates may operate to entangle multiple photons concurrently (e.g., in parallel). Or multiple photonic cavity-coupled quantum emitters may be used as a combination of a photon generator and an entangling gate (e.g., as group of components comprising at least one photon generator and at least one entangling gate) to generate a photon and then interact with it. As described earlier, a photon generator refers to a source of individual photons, and an entangling gate refers to a component or group of components or a control sequence configured to entangle qubits, which in this case are qubits belonging to photons or photonic qubits. For example, an entangling gate may include a quantum circuit configured to entangle photonic qubits.

Figure 4A:
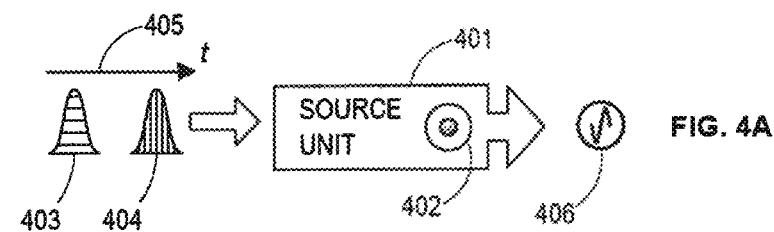
FIG. 4A schematically shows a single-photon source unit according to a disclosed embodiment.
Figure 4B:
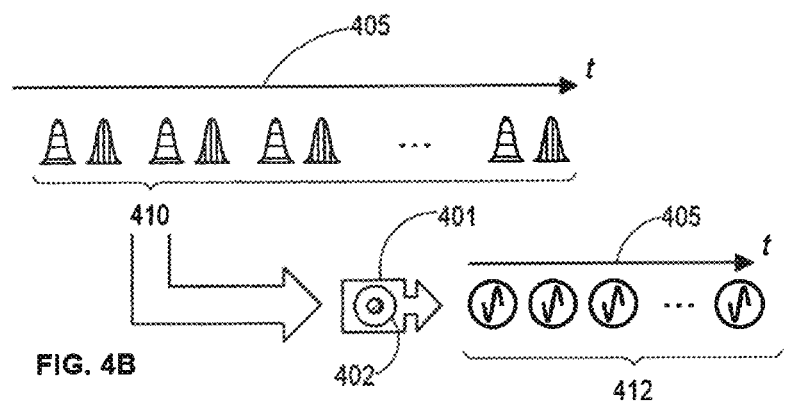
FIG. 4B schematically shows producing a sequential series of single photons from the photon source unit of FIG. 4A.
Figure 5B:
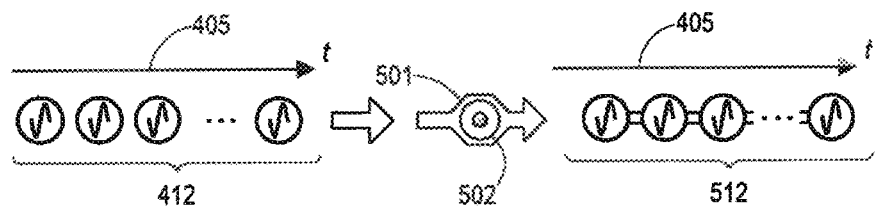
FIG. 5B schematically illustrates quantum entanglement of a sequential series of photonic states with an atomic state according to a disclosed embodiment.

By way of non-limiting example, FIG. 4A and FIG. 4B illustrate source unit 401 (including a source unit atom 402 as quantum emitter) being implemented as a photon generator, FIG. 8 to FIG. 9B illustrate a Rubidium (87Rb) atom 820 as a quantum emitter being coupled to a cavity 818 to function as a photon generator, FIG. 5A and FIG. 5B illustrate entanglement unit 501 (including an entanglement unit atom 502 as quantum emitter) being implemented as an entangling gate, and FIG. 8 and FIG. 9C illustrate a Rubidium (87Rb) atom 820 as a quantum emitter being coupled to a cavity 818 to function as an entangling gate.

When used for an entangling gate, each quantum emitter (e.g., associated with one of the coupling locations and photonic cavities) may mediate interactions between consecutive incoming photonic qubits, for example to generate a graph state (or multiple graph states) as an output. As described earlier, a graph state represents a relation between a group of qubits, a qubit being a basic unit of quantum information. Thus, the generated graph state (or multiple graph states) from the consecutive incoming photonic qubits represents a relation between qubits that are stored in (or belonging to) output photons. A photon generator may be provided to supply photons toward each of the multiple photonic cavities, e.g., to enable the interactions between consecutive incoming photonic qubits via the quantum emitter. In some disclosed embodiments, the photon generator may include one or more photonic cavity-coupled quantum emitters configured to provide photons. Each of the multiple photonic cavities may facilitate the interaction between the photonic qubits and the associated quantum emitter. Multiple output channels may also be positioned downstream of the multiple photonic cavities to output a graph state after the interaction between the phonic qubits and the associated quantum emitter. For example, each photonic cavity may have an associated output channel for outputting a graph state. Alternatively, some or all of the multiple photonic cavities may share an output channel for outputting the graph state.

By way of a non-limiting example, FIG. 12A illustrates an exemplary implementation for a quantum computing system 1100 related to providing multiple cavities for generating a graph state. Quantum computing system 1100 in FIG. 12A is intended merely to facilitate the conceptualizing of one exemplary implementation for a quantum computing system and does not limit the disclosure to any particular implementation. The outputted graph state or states may, for example, be one or more time-sequential series of entangled photons, which may then be used as qubits for quantum computing applications. System 1100 may include multiple entangling gates 1102_1 to 1102_n, each including a configuration suitable for entangling photonic qubits as described earlier, with n being any integer greater than 1. Entangling gates 1102_1 to 1102_n may each receive from a photon generator 1104 a series of input photons 1106_1 to 1106_n, respectively. Each of entangling gates 1102_1 to 1102_n may output a time-sequential series of entangled photons 1108_1 to 1108_n, respectively, to form photonic graph states 1110_1 to 1110_n, or 1122. FIG. 12A depicts input photons 1106_1 to 1106_n as separate photons without connectors therebetween to indicate the states of input photons 1106_1 to 1106_n before being input into entangling gates 1102_1 to 1102_n. Before they are input into entangling gates 1102_1 to 1102_n, these states of input photons 1106_1 to 1106_n are independent, in other words they are not entangled (disentangled) and there is no correlation between them. By contrast, the output photons of time-sequential series 1108_1 to 1108_n are connected via a double line 1108a to indicate their entanglement. Entanglement between photons refers to a condition where state(s) of two or more photons are linked with state(s) of each other. For example, states of two or more photons may be related to each other in such a way that those state(s) cannot be described independently of each other. This entanglement produces, for example, a correlation between measurements of those states, whereby mutual information may be stored or processed using this correlation.

Entangling gate 1102_1 in FIG. 12A includes a first waveguide 1118_1, a photonic cavity 1112_1, a quantum emitter 1114_1, a second waveguide 1120_1, and a coupling location 1116_1 located between photonic cavity 1112_1 and the second waveguide 1120_1. Similarly, entangling gate 1102_n in FIG. 12A includes a first waveguide 1118_n, a photonic cavity 1112_n, a quantum emitter 1114_n, a second waveguide 1120_n, and a coupling location 1116_n located between photonic cavity 1112_n and the second waveguide 1120_n. In the description that follows, details provided for entangling gate 1102_1 may analogously apply to entangling gate 1102_n.

Some embodiments involve quantum computing. Quantum computing may refer to a computation that is performed through the utilization or application of one or more quantum state properties, such as superposition, entanglement, and interference. Some embodiments involve a quantum computing system, and a quantum computing system may thus include a component or group of components configured to facilitate performance of a calculation or an operation via quantum computing. For example, a quantum computing system may generate a graph state, which may include multiple time-sequential series of entangled photons for use as qubits in a quantum computation.

By way of non-limiting example, FIG. 12A illustrates an exemplary implementation of a quantum computing system 1100, consistent with some disclosed embodiments. Quantum computing system 1100 in FIG. 12A includes multiple entangling gates 1102_1 to 1102_n. Entangling gates 1102_1 to 1102_n may each receive a series of consecutive input photons 1106_1 to 1106_n from photon generator 1104. Entangling gates 1102_1 to 1102_n together, may generate from input photons 1106_1 to 1106_n, any of graph states 1110_1 to 1110_n and/or 1122, which are associated with time-sequential series of entangled photons 1108_1 to 1108_n.

Some embodiments involve a plurality of photonic cavities. A cavity refers to a structure, enclosure or container that may function as a resonator, which is a component for establishing or supporting resonant oscillations at a discrete set of resonant frequencies, as described earlier. A photonic cavity may thus refer to a resonator (or a component) for establishing or supporting electromagnetic modes associated with photons.

By way of non-limiting example, FIG. 12A and FIG. 12B illustrate exemplary implementations of multiple photonic cavities 1112_1 to 1112_n and 1138_1 to 1138_n according to some embodiments related to providing multiple cavities for generating a graph state. Photonic cavities 1112_1 to 1112_n may be included in entangling gates 1102_1 to 1102_n, respectively and may facilitate generating any of graph states 1110_1 to 1110_n or 1122, which are associated with time-sequential series of entangled photons 1108_1 to 1108_n. Photonic cavities 1138_1 to 1138_n may be included in photon generating units 1132_1 to 1132_n, respectively, and may facilitate generating one or more photons.

Some embodiments involve a plurality of coupling locations for quantum emitter positioning. A coupling location includes an area configured to enable coupling between a quantum emitter and a photonic cavity as described earlier. For example, positioning a quantum emitter in a coupling location enables the quantum emitter to couple with a photonic cavity, whereby the quantum emitter interacts with the established or supported electromagnetic modes of the photonic cavity. A quantum emitter refers to a component configured to couple to electromagnetic modes, as described earlier. Quantum emitter positioning refers to arranging or locating a quantum emitter to enable interaction between the quantum emitter and a photonic cavity, as described earlier. Thus, a quantum computing system may include multiple coupling locations for positioning multiple quantum emitters and thereby forming multiple coupled pairs of a quantum emitter and a photonic cavity. This, for example, enables multiple concurrent (e.g., parallel) interactions between the multiple quantum emitters and the multiple photonic cavities.

By way of non-limiting example, FIG. 12A and FIG. 12B illustrate exemplary implementations of a plurality of coupling locations for quantum emitter positioning according to some disclosed embodiments. Entangling gates (1102_1 to 1102_n) and photon generating units (1132_1 to 1132_n) each include a coupling location (1116_1 to 1116_n and 1142_1 to 1142_n), respectively. Coupling locations (1116_1 to 1116_n and 1142_1 to 1142_n) are located between photonic cavities (1112_1 to 1112_n and 1138_1 to 1138_n) and respective corresponding waveguide (1120_1 to 1120_n and 1134_1 to 1134_n). Positioning (e.g., entrapment or trapping) quantum emitters (1114_1 to 1114_n and 1140_1 to 1140_n) in respective coupling locations (1116_1 to 1116_n and and 1142_1 to 1142_n), for example between corresponding waveguide (1120_1 to 1120_0 and 1134_1 to 1134_n) and corresponding photonic cavity (1112_1 to 1112_n and 1138_1 to 1138_n), enables interactions between quantum emitters (1114_1 to 1114_n and 1140_1 to 1140_n) and corresponding photonic cavities (1112_1 to 1112_n and 1138_1 to 1138_n).

In some embodiments, each coupling location is associated with a differing one of the plurality of photonic cavities. Such an association refers to being affiliated with or corresponding to. Thus, each coupling location may be affiliate with or correspond to a different photonic cavity so that each photonic cavity is capable of coupling with one or more quantum emitters positioned at its affiliated or corresponding coupling location (e.g., only its corresponding coupling location).

By way of non-limiting example, FIG. 12A illustrates an exemplary implementation of each coupling location being associated with a differing one of the plurality of photonic cavities. Coupling location 1116_1 is associated with photonic cavity 1112_1 and coupling location 1116_n is associated with photonic cavity 1112_n, each of photonic cavities 1112_1 and 1112_n being different, e.g., separate, photonic cavity. FIG. 12B also illustrate an exemplary implementation of each coupling location being associated with a differing one of the plurality of photonic cavities, wherein coupling location 1142_1 is associated with photonic cavity 1138_1 and coupling location 1142_n is associated with photonic cavity 1138_n, each of photonic cavities 1138_1 and 1138_n being different, e.g., separate, photonic cavity.

In some disclosed embodiments, quantum emitters associated with each coupling location are configured to mediate interactions between consecutive incoming photonic qubits to generate a graph state. Mediating refers to facilitating, enabling, or otherwise promoting interactions. The interactions may transfer, communicate, associate, and/or establish a correlation between the incoming photonic qubits. For example, a quantum emitter may facilitate an entanglement (e.g., an interaction) between incoming photons, the quantum emitter being a means through which these interactions between incoming photons are achieved. Consecutive refers to being successive, or sequential, such as one coming after another in a time-sequence. A photonic qubit refers to a basic unit of quantum information stored in (or belonging to) one or more photons or electromagnetic field as described earlier. For example, a photonic qubit includes a quantum bit encoded in a degree of freedom associated with a propagating or stationary mode of the electromagnetic field. A photonic qubit may exhibit characteristics particular to quantum mechanical systems, such as superposition with respect to a degree of freedom (e.g., of one or both vertical and horizontal polarization states) and/or entanglement (e.g., between multiple photonic qubits or with quantum emitter qubits). Thus, each coupling location may have a corresponding (e.g., associated) quantum emitter positioned therein to facilitate interactions (e.g., entanglement) between incoming sequential photonic qubits through the corresponding (e.g., associated) quantum emitter to generate the graph state. For example, each quantum emitter may facilitate entanglement of multiple photonic qubits.

By way of non-limiting example, FIG. 12A illustrates an exemplary implementation of quantum emitters associated with each coupling location and configured to mediate interactions between consecutive incoming photonic qubits to generate a graph state, consistent with some disclosed embodiments. Entangling gate 1102_1 includes quantum emitter 1114_1 associated with coupling location 1116_1. Photon generator 1104 provides a plurality of single photons, e.g., as a sequence of individual input photons 1106_1, to entangling gate 1102_1 via waveguide 1118_1. Input photons 1106_1 are not entangled with each other (or are in disentangle states), as indicated by the absence of connecting double lines between them. Entangling gate 1102_1 is configured so that each photon of input photons 1106_1 interacts with quantum emitter 1114_1 via photonic cavity 1112_1, whereby a photonic qubit of the photon of input photons 1106_1 becomes entangled with a qubit of quantum emitter 1114_1. Once more than one photon from input photons 1106_01 have gone through this interaction with quantum emitter 1114_1, those more than one photons are entangled with each other. This results in the consecutive incoming photonic qubits becoming entangled and being output as entangled output photons 1108_1. In other words, quantum emitter 1114_1 mediates the interaction between consecutive incoming photonic qubits. These interactions result in output photons 1108_1 being entangled with one another as indicated by inter-connecting double lines 1108a. Similarly, entangling gate 1102_0 includes quantum emitter 1114_n associated with coupling location 1116_n. Entangling gate 1102_n may similarly receive input photons 1106_n and mediate interactions therebetween to produce output photons 1108_n that are entangled as indicated by inter-connecting lines 1108a.

According to some disclosed embodiments, the quantum emitter may be a stationary qubit capable of interacting with photons. A stationary qubit may be capable of interacting with protons if the two are so arranged. By way of non-limiting example, the quantum emitter may be a stationary quantum system with an anharmonic spectrum, configured to couple to electromagnetic modes. For example, the quantum emitter may include a quantum system having one or more of: an electronic or nuclear configuration of an ion or a neutral atom; an electronic or nuclear configuration of a defect or a quantum dot in a material substrate; or a configuration of a superconducting circuit containing one or more Josephson Junctions. FIG. 12A illustrates a non-limiting example of such a quantum emitter according to some embodiments related to providing multiple cavities for generating a graph state. Quantum emitter 1114_1 may be suspended (e.g., trapped) between photonic cavity 1112_1 and waveguide 1120_1, allowing quantum emitter 1114_1 within coupling location 1116_1 to interact, via photonic cavity 1112_1, with photons (e.g., incoming photonic qubits) carried by waveguide 1118_1.

For example, the quantum emitter may include a superconducting qubit. A superconducting qubit refers to a qubit stored in or belonging to a superconducting electronic circuit (e.g., a network of electrical elements using superconductors), as described earlier. Turning to FIG. 12A or FIG. 12B, one or more of quantum emitters 1114_1 to 1114_n or 1140_1 to 1140_n may include a superconducting electronic circuit or a superconducting qubit.

The quantum emitter may, for example, include a quantum dot. A quantum emitter including a quantum dot may refer to a quantum emitter having a solid-state substrate (e.g., a semiconductor particle) having optical and/or electronic properties exhibiting quantum mechanics principles, as described earlier. Turning to FIG. 12A or FIG. 12B, one or more of quantum emitters 1114_1 to 1114_n or 1140_1 to 1140_n may include a quantum dot.

The quantum emitter may, for example, include an atom. Turning to FIG. 12A or FIG. 12B, one or more of quantum emitters 1114_1 to 1114_n or 1140_1 to 1140_n may include an atom, such as atom 102 of FIG. 1. According to some disclosed embodiments, the atom is neutral. Neutral refers to an atom that lacks an overall electric charge, such as when the number of protons in the atom equals the number of electrons. According to some disclosed embodiments, the atom is an ion. Ion refers to a particle or an atom that has an overall electric charge, such as an atom having an unequal number of protons and electrons. According to some disclosed embodiments, the quantum emitter includes a rubidium atom, as described earlier. The rubidium atom may be neutral or an ion. According to some disclosed embodiments, the quantum emitter includes a cesium atom, as described earlier. According to some disclosed embodiments, the quantum emitter includes at least one of Strontium, Erbium, Ytterbium, Calcium, Barium, Beryllium, or Magnesium atom, as described earlier.

According to some embodiments, a photon generator is configured to supply photons to the plurality of photonic cavities. These supplied photons may then serve as incoming photons to which incoming photonic qubits belong or relate. A photon generator refers to a component or group of components configured to provide one or more photons.

For example, a photon generator may refer to a source of individual photons as described earlier with respect to FIG. 8 to FIG. 9B. As another example, a photon generator may correspond to photon source unit 401 of FIG. 4A. Thus, a photon generator may supply one or more photons, for example supply multiple sequences of individual photons to each of multiple photonic cavities. By way of non-limiting example, FIG. 12A, FIG. 12B and FIG. 12D illustrate exemplary implementations of a photon generator configured to provide or generate photons according to some embodiments related to providing multiple cavities for generating a graph state. These photons may then be supplied to a plurality of photonic cavities, supplying incoming photonic qubits consistent with some disclosed embodiments. Photon generator 1104 and 1130 may supply input photons 1106_1 (or photons 1146_1 in FIG. 12D)) to photonic cavity 1112_1 via waveguide 1118_1. Photon generator 1104 and 1130 may also supply input photons 1106_n (or photons 1146_1 in FIG. 12D)) to photonic cavity 1112_n via waveguide 1118_n. It is understood that there may be more than one photon generator, each photon generator supplying input photons to one or more photonic cavities.

In some disclosed embodiments, photonic cavities are configured to couple photonic qubits to the quantum emitters. Coupling photonic qubits to quantum emitters refers to facilitating interactions between the photonic qubits and the quantum emitters. For example, this interaction may be facilitated in an absence of physical contact between the photonic qubits and the quantum emitters. The photonic cavities may, for example, act as a means for enabling this interaction between a photonic qubit and a quantum emitter. This interaction, for example, may cause a statistical correlation or correspondence between the physical behaviors of a photonic qubit and a quantum emitter. Thus, by coupling a photonic qubit to a quantum emitter, the photonic cavity may cause a statistical correlation between the physical behaviors of the photonic qubit and quantum emitter. For example, a change of state of the photonic qubit may occur concurrently with a corresponding change of state of the quantum emitter qubit coupled thereto. The photonic cavities may, for example, act as a means for enabling the photonic qubits to become entangled with the quantum emitter qubits, this enabling being achieved through this coupling between the photonic qubits and the quantum emitters. For example, the coupled photonic qubits may correspond to or may be associated with the input photons (or incoming photons) received from a photon generator.

By way of non-limiting example, FIG. 12A and FIG. 121) illustrate exemplary implementations of photonic cavities configured to couple photonic qubits to quantum emitters according to some embodiments related to providing multiple cavities for generating a graph state. Each of photonic cavities 1112_1 to 1112_n may enable photonic qubits (e.g., associated with input photons 1106_1 to 1106_n in FIG. 12A or photon 1146_1 in FIG. 121)) to become coupled with quantum emitter 1114_1 to 1114_n. This coupling, for example, then enables entanglement between input photons 1106_1 to 1106_n in FIG. 12A or photon 1146_1 in FIG. 12D), and quantum emitter 1114_1 to 1114_n.

Some disclosed embodiments involve a plurality of photon output channels downstream of the plurality of cavities to output the graph state. Downstream refers to ensuing, following, or subsequent to. For example, downstream may refer to being positioned to follow a direction of a temporal or spatial flow, or progression. The upstream cavities may be the plurality of photonic cavities described earlier. A plurality of photon output channels may, for example, be located subsequent to the direction of the spatial flow of the input photons. For example, the plurality of photon output channels may be located between the plurality of cavities and the output graph state. The photon output channels may carry or transport a time-sequential series of entangled photons (e.g., entangled using a photonic cavity-coupled quantum emitters) to an output, outputting a graph state formed from these entangled photons.

By way of non-limiting example, FIG. 12A illustrates an exemplary implementation of a plurality of photon output channels downstream of a plurality of cavities to output a graph state according to some embodiments related to providing multiple cavities for generating a graph state. A plurality of photon output channels, each carrying or transporting a series of entangled photons 1108_1 to 1108_n, are located subsequent to (e.g., following or downstream of) photonic cavities 1112_1 to 1112_n, respectively. Entangled photons 1108_1 to 1108_n may form one or more graph states, which are an output of quantum computing system 1100, in FIG. 12A. Examples of such output graph states include graph states 1110_1 corresponding to entangled photons 1108_1, graph state 1110_n corresponding to entangled photons 1108_n, and graph state 1112 (which may also be referred to as cluster state, whose graph is a connected subset of a d-dimensional lattice) formed from a combination of entangled photons 1108_1 to 1108_n. It is to be noted that graph states 1110_1 to 1110_n and cluster state 1122 are intended as exemplary conceptual illustrations only, and do not limit the disclosure to a particular graph state or a particular cluster.

Some embodiments involve a photon generator including at least one additional photonic cavity. In embodiments that include an entangling gate that entangles photons, an additional photonic cavity may be provided for supplying photons to the entangling gate. In embodiments that include a photon generator, an additional cavity may be provided to serve as an additional photon generator. As described earlier, with respect to the photonic cavity, the additional photonic cavity may likewise be coupled to a quantum emitter, and the quantum emitter may interact with the established or supported electromagnetic modes of the additional photonic cavity, enabling the additional photonic cavity-coupled quantum emitter to release or generate one or more photons upon excitation. The excitation may occur, for example, using a laser carried in a nearby waveguide 910 as shown in FIG. 9B. This enables the additional photonic cavity and the quantum emitter to function as a photon generator. For example, some embodiments related to providing multiple cavities for generating a graph state may involve such a photon generator functioning as photon generator 1104 of FIG. 12A.

In some disclosed embodiments, the photon generator also includes at least one additional quantum emitter and at least one additional coupling location for quantum emitter positioning, each additional coupling location being associated with a differing one of the at least one additional photonic cavity. An additional quantum emitter may be additional to the quantum emitter already provide in the entangling or in the photon generator. The quantum emitter may have a similar configuration to the configuration previously described. When an additional photonic cavity is employed as described earlier, an additional coupling location may be provided. The additional coupling location, which may have a similar configuration to the configuration previously described, may enable the additional quantum emitter to couple to the additional photonic cavity and thereby function as a photon generator.

Photon source unit for sourcing single photons described herein is a non-limiting example of such photon generator. For example, FIG. 8 to FIG. 9B illustrate that a Rubidium (87Rb) atom 820 as a quantum emitter being coupled to a cavity 818 can function as a photon generator. As another example, FIG. 4A and FIG. 4B illustrate one exemplary implementations of a photon generator (e.g., source unit 401) including at least one additional photonic cavity. Source unit 401 includes an optical cavity, such as optical cavity 103 of FIG. 1, and atom 402 (e.g., a quantum emitter). After an initializing pulse 403 initializes the state of atom 402 to be in state 111 (FIG. 1), a generating pulse 404 may cause transition 121A and transition 122A of FIG. 2A, resulting in atom 402 emitting photon 406. Repeating this process produces a time sequential series 412 of output photons in FIG. 4B. These output photons may then be provided to any one of entangling gate 1102_1 to 1102_n, enabling entangling gate to generate a graph state 1110_1 to 1110_n.

By way of non-limiting example, FIG. 12B illustrates a photon generator 1130 according to some embodiment related to providing multiple cavities. Photon generator 1130 is intended to facilitate conceptualizing an exemplary photon generator and not to limit the disclosure to particular implementation details. It may be appreciated that additional configurations, variations and implementations may serve as a photon generator for use with some disclosed embodiments. Photon generator 1130 in FIG. 12B includes at least one additional photonic cavity (e.g., photonic cavities 1138_1 to 1138_n) in at least one photon generation unit 1132_1 to 1132_n. The at least one additional photonic cavity would be additional to photonic cavities 1112_1 to 1112_n of quantum computing system 1100 in FIG. 12A if photon generator 1130 is used as photon generator 1104 in quantum computing system 1100. While photon generator 1130 is shown having multiple photonic cavities 1138_1 to 1138_n and multiple photon generation unit 1132_1 to 1132_n, this is intended as illustrative only, and photon generator 1130 may be implemented with a single additional photonic cavity and a single photon generation unit.

While the description that follows refers to multiple photon generating units 1132_1 to 1132_n, this is merely an exemplary implementation, and photon generator 1130 may be implemented using a single photon generating unit. Photon generating units 1132_1 to 1132_n in FIG. 12B are arranged similarly to entangling gates 1102_1 to 1102_n in FIG. 12A. Each photon generating unit 1132_1 to 1132_n has first waveguide 1134_1 to 1134_n, second waveguide 1136_1 to 1136_n, photonic cavity 1138_1 to 1138_n, and quantum emitter 1140_1 to 1140_n. Quantum emitter 1140_1 to 1140_n may be positioned (e.g., suspended or trapped) at its associated coupling location 1142_1 to 1142_n located between its associated photonic cavity 1138_1 to 1138_n and first waveguide 1134_1 to 1134_n. For example, as described above with respect to single photon source 812 of FIG. 9B, first waveguide 1134_1 to 1134_n may carry lasers (e.g. a pulse of photons 1144_1 to 1144_n) for positioning or trapping quantum emitter 1140_1 to 1140_n at its coupling location 1142_1 to 1142_n, and, additionally, first waveguide 1134_1 to 1134_n may carry a laser (e.g. a pulse of photons 1144_1 to 1144_n) which can excite quantum emitter 1140_1 to 1140_n to cause generation of output photon 1146_1 to 1146_n, outputted via second waveguide 1136_1 to 1136_n.

For example, the pulse of photons 1144_1 to 1144_n may alternate between initializing photons (e.g., photon 403) and generating photons (e.g., photon 404) as described above with respect to FIG. 4A and FIG. 4B.

Photonic cavities 1138_1 to 1138_n are coupled to corresponding quantum emitter 1140_1 to 1140_n, enabling (additional) photonic cavity-coupled quantum emitter 1140_1 to 1140_n to release or generate one or more photons 1146_1 to 1146_n upon excitation.

The released or generated photons 1146_1 to 1146_n may be provided to entangling gates 1102_1 to 1102_n of FIG. 12A as input photons 1106_1 to 1106_n as shown in FIG. 12D). In other words, in some embodiments related to providing multiple cavities for generating a graph state, an output photon sequence 1146_1 to 1146_n in FIG. 12B may correspond to input photons 1106_1 to 1106_n of FIG. 12A and may thus be provided to entangling gate 1102_1 to 1102_n via waveguides 1118_1 to 1118_n as shown in FIG. 12D.

Thus, by way of non-limiting example, FIG. 121) illustrates multiple cavities for generating a graph state, wherein photon generation unit 1132_1 (having photonic cavity 1138_1) is used as a photon generator 1130 and 1104 for supplying photons 1146_1 to entangling gate 1102_1 (having photonic cavity 1112_1) to generate a graph state 1110_1, which is associated with entangled output photons 1108_1. In some disclosed embodiments related to providing multiple cavities for generating a graph state, a quantum computing system includes more than one of such combination of photon generation unit 1132_1 and entangling gate 1102_1, with each combination being configured to generate a graph state. In some disclosed embodiments related to providing multiple cavities for generating a graph state, more than one photon generation unit may supply photons to one entangling gate. In some other disclosed embodiments related to providing multiple cavities for generating a graph state, one photon generation unit may supply photons to more than one entangling gate. In these disclosed embodiments related to providing multiple cavities for generating a graph state, a controller may be provided to control (e.g., direct or switch between different waveguides) flow of input and output photons between photon generation unit(s) and entangling gate(s). For example, such controller may include one or more processors. A memory, a circuit component or circuitry may also be provided for performing the controlling.

Second waveguide 1136_1 to 1136_n may carry fields that couple to a specific electromagnetic mode or modes of the photonic cavities 1138_1 to 1138_n to generate output photons 1146_1 to 1146_n.

As described earlier, some disclosed embodiments involve a photon generator including at least one additional quantum emitter. Examples of a quantum emitter, described above in some embodiments related to providing multiple cavities for generating a graph state, are also applicable to the at least one additional quantum emitter of a photon generator. For example, the at least one additional quantum emitter may include a stationary qubit capable of interacting with photons. Turning to FIG. 12A and FIG. 12B, each of quantum emitters 1114_1 to 1114_n may have associated with it a stationary qubit that interacts with photons 1106_1 to 1106_n via corresponding photonic cavity 1112_1 to 1112_n, and each of quantum emitters 1140_1 to 1140_n may have associated with it a stationary qubit that may interact with input photons 1144_1 to 1144_n. For example, the at least one additional quantum emitter may include a superconducting qubit, wherein another example, the at least one additional quantum emitter may include a quantum dot. The at least one additional quantum emitter may, for example, include an atom, such as atom 402 in FIG. 4A or atom 820 in FIG. 9B. In another example, the at least one additional quantum emitter may include a rubidium atom, as described earlier. In yet another example, the at least one additional quantum emitter may include at least one of Strontium, Erbium, Ytterbium, Calcium, Barium, Beryllium, or Magnesium atom, as described earlier.

By way of non-limiting example, FIG. 12C illustrates an example process 1150 for generating a graph state according to some embodiments related to providing multiple cavities for generating a graph state. This example process 1150 may be a part of a quantum computing method for generating a graph state. While the block diagram in FIG. 12C may be described below in connection with certain implementation embodiments presented in other figures, those implementations are provided for illustrative purposes only, and are not intended to serve as a limitation on the block diagram. As examples of steps of the process are described throughout this disclosure, those examples described earlier are not repeated or are simply summarized in connection with FIG. 12C. In some disclosed embodiments, the example process 1150 may be performed by at least one processor or circuitry, for example in control system 1031 and/or photonic chips 1015 of FIG. 10, to perform operations or functions described herein. In some disclosed embodiments, some aspects of the process 1150 may be implemented as software (e.g., program codes or instructions) that are stored in a memory provided with the at least one processor, or a non-transitory computer readable medium or a computer readable medium. In some embodiments, some aspects of the process 1150 may be implemented as hardware (e.g., a specific-purpose circuit). In some embodiments, the process 1150 may be implemented as hardware or as a combination of software and hardware.

FIG. 12C includes process steps (or method steps) 1152 to 1156. At step 1152, the process or the method involves coupling a quantum emitter at each of a plurality of coupling locations, such that each of a plurality of quantum emitters is associated with a differing coupling location, wherein each coupling location is associated with a different one of a plurality of photonic cavities, and wherein quantum emitters associated with each coupling location are configured to mediate interactions between consecutive incoming photonic qubits to generate a graph state. For example, FIG. 12A illustrates an exemplary implementation of multiple quantum emitters (e.g., quantum emitters 1114_1 to 1114_n) coupled at a plurality of coupling locations (e.g., coupling locations 1116_1 to 1116_n) such that each quantum emitter is associated with a differing coupling location (e.g., quantum emitter 1114_1 is associated with coupling location 1116_1, and quantum emitter 1114_n is associated with coupling location 1116_n). Moreover, each coupling location is associated with a different one of the photonic cavities (e.g., coupling location 1116_1 is associated with photonic cavity 1112_1, and coupling location 1116_n is associated with photonic cavity 1112_n). Each of quantum emitters 1114_1 to 1114_n associated with corresponding coupling location 1116_1 to 1116_n is configured to mediate interactions between consecutive incoming photonic qubits (e.g., associated with input photons 1106_1 to 1106_n) to generate a graph state (e.g., any of graph states 1110_1 to 1110_n and 1122.

At step 1154, the process involves supplying photons to the plurality of photonic cavities, wherein the photonic cavities are configured to couple photonic qubits to the quantum emitters. For example, FIG. 12A illustrates an exemplary implementation of supplying photons to the plurality of photonic cavities configured to couple photonic qubits to the quantum emitters. Photon generator 1104 is configured to supply input photons 1106_1 to 1106_n toward photonic cavities 1112_1 to 1112_n via waveguides 1118_1 to 1118_n. Similarly, photon generator 1130 or photon generation unit 1132_1 of FIG. 12B may supply output photons 1146_1 to 1146_n as input photons 1106_1 to 1106_n toward photonic cavities 1112_1 to 1112_n via waveguides 1118_1 to 1118_n of entangling gate 1102_1 to 1102_n as shown in FIG. 12D). Photonic cavities 1112_1 to 1112_n may then couple photonic qubits (e.g., associated with the input photons) to quantum emitter 1114_1 to 1114_n. In other words, photonic cavities 1112_1 to 1112_n may then facilitate interactions between photonic qubits (e.g., associated with the input photons) and quantum emitter 1114_1 to 1114_n.

At step 1156, the process involves outputting the graph state via a plurality of photon output channels downstream of the plurality of cavities, consistent with some disclosed embodiments. For example, FIG. 12A illustrates an exemplary implementation of outputting the graph state via a plurality of photon output channels downstream of the plurality of cavities. Each entangling gates 1102_1 to 1102_n outputs a graph state 1110_1 to 1110_n of entangled photons 1108_1 to 1108_n. In addition, the combination of entangling gates 1102_1 to 1102_n may collectively output cluster state 1122.

Some disclosed embodiments involve a non-transitory computer-readable medium (or a computer-readable medium or a computer program) including instructions that, when executed by at least one processor (or an apparatus), cause the at least one processor (or the apparatus) to carry out a method or a process according to some disclosed embodiments.

For example, the non-transitory computer-readable medium (or a computer-readable medium or a computer program) may include instructions that, when executed by at least one processor (or an apparatus), cause the at least one processor (or the apparatus) to carry out a quantum computing method described herein. According to embodiments related to providing multiple cavities for generating a graph state, the instructions may cause the at least one processor (or the apparatus) to carry out the quantum computing method or the process 1150 shown in FIG. 12C.

The same examples described earlier for each system feature of the embodiments related to providing multiple cavities for generating a graph state are also applicable to corresponding features of this non-transitory computer-readable medium (or a computer-readable medium or a computer program) embodiment.

According to other embodiments related to providing multiple cavities for generating a graph state, there are an apparatus, a device, a system, an integrated circuitry device, or circuitry, including at least one processor (and a memory) configured to carry out the quantum computing method or the process 1150 shown in FIG. 12C. The same examples described earlier for each system feature of the embodiments related to providing multiple cavities for generating a graph state are also applicable to corresponding features of these embodiments.

According to yet another embodiment related to providing multiple cavities for generating a graph state, there is a layout of an integrated circuit device or circuitry, comprising layout portions, each layout portion defined to pattern each feature from the combination of features of the quantum computing system 1100 in FIG. 12A or the photon generator 1130 in FIG. 12B or the photon generator 1130 and the entangling gate 1102_1 in FIG. 12D). For example, there is a layout of an integrated circuit device or a circuitry, including: a photonic cavity layout portion defined to pattern a plurality of cavities; a coupling location layout portion defined to pattern a plurality of coupling locations for quantum emitter positioning, each coupling location being associated with a differing one of the plurality of photonic cavities; a photon generator layout portion defined to pattern a photon generator or a channel for carrying a photon supplied by a photon generator to the plurality of photonic cavities; and an output channel layout portion defined to pattern a plurality of photon output channels downstream of the plurality of cavities. In some disclosed embodiments, the photon generator layout portion may be defined to pattern at least one additional photonic cavity. In those disclosed embodiments, the photon generator layout portion may also be defined to pattern at least one additional coupling location for quantum emitter positioning, each additional coupling location being associated with a differing one of the at least one additional photonic cavity. In some disclosed embodiments, the layout of an integrated circuit device or circuitry further comprises a controller layout portion defined to pattern a controller for controlling (e.g., directing or switching between different waveguides) flow of input and output photons between the photon generator and the plurality of photonic cavities, and the plurality of photon output channels, wherein the controller may comprise one or more processor and a memory, a circuit component or circuitry for performing the controlling.

It is understood that when a quantum emitter that can be lithographically located (e.g. a quantum dot) is used, the coupling location layout portion may be defined to also pattern the quantum emitter. The same examples described earlier for each system feature of the embodiments related to providing multiple cavities for generating a graph state are also applicable to corresponding features of this embodiment.

Some disclosed embodiments involve generating photonic graph states using one or more interactions of photonic qubits with quantum emitters, each quantum emitter being coupled to a cavity. Such embodiments may involve a quantum computing method for generating photonic graph states. In such a quantum computing method for generating photonic graph states, a plurality of quantum emitters may be positioned at a plurality of coupling sites associated with a plurality of different cavities (e.g., cavities functioning as a resonator such as photonic cavities or optical cavities, whispering gallery mode cavities, Fabry-Perot cavities, or ring-shaped cavities). A state of a quantum emitter qubit associated with each of the plurality of quantum emitters may be initialized so that the quantum emitter is configured to perform a specific function when generating photonic graph states. This initializing refers to setting a baseline condition for the quantum emitter coupled to a cavity (also referred to as a cavity-coupled quantum emitter). For example, initializing may include establishing an inceptive tuned state system for the cavity-coupled quantum emitter. The inceptive tuned state system, for example, may refer to the cavity-coupled quantum emitter being in a particular state or a superposition state of states. For example, such initializing may involve using a laser or applying a magnetic field on the quantum emitter. Photonic qubits may then be transmitted toward the plurality of the quantum emitters in at least a first instance, to generate an entangling gate (e.g., a controlled-Z-quantum gate or CZ gate) between the photonic qubits and the quantum emitter qubit. By way of a non-limiting example, the entangling gate may be implemented according to the techniques described herein with respect to FIG. 3, FIG. 5A-FIG. 5B, and FIG. 9C. Following the at least one of the first instance transmissions, photonic qubits may be transmitted toward the plurality of quantum emitters in at least one second instance transmission for generating a SWAP gate between the photonic qubits and the quantum emitter qubits, and which may serve to map the quantum emitter qubits to photonic qubits. By way of a non-limiting example, the SWAP gate may be implemented according to the techniques described herein with respect to FIG. 2E. For example, the entangling gate of FIG. 3 may be performed multiple times (e.g., n times to entangle n photonic qubits to a quantum emitter qubit as described with reference to FIG. 6), followed by the SWAP gate of FIG. 2E (e.g., to disentangle the quantum emitter qubit from the entangled photonic qubits), to generate a photonic graph state (e.g., of the entangled photonic qubits, wherein the quantum emitter qubit is no longer entangled with those entangled photonic qubits).

For example, multiple configurations, each including at least a quantum emitter coupled to a cavity at a coupling site, may be provided. Each configuration may be initialized to operate in one of multiple operation modes of use, e.g., an entanglement mode whereby one or more photonic qubits may be entangled with a quantum emitter qubit associated with the quantum emitter, and a SWAP mode whereby a state of the quantum emitter qubit is swapped with a state of a photonic qubit, thereby disentangling the quantum emitter qubit from the entangled photonic qubits. In an example, as the SWAP mode involves swapping qubit states, an initializing pulse of one or more photons (which have a particular desired state) may be used on a cavity-coupled quantum emitter operating in the SWAP mode to initialize the cavity-coupled quantum emitter. By combining these configurations of different operation modes into a particular sequence, a quantum computing method is able to generate a photonic graph state as an output. For example, a cavity-coupled quantum emitter may be initialized by operating it in a SWAP mode and interacting it with an initializing pulse. Then a plurality of photons may be introduced to interact with the initialized cavity-coupled quantum emitter operating in the entanglement mode to entangle the photons with the cavity-coupled quantum emitter. This cavity coupled quantum emitter may then be operated in a SWAP mode again with a photon from another pulse swapping its state with the cavity-coupled quantum emitter, thereby disentangling the cavity-coupled quantum emitter from the entangled photons. This then results in a photonic graph state of entangled photons. By way of non-limiting example, FIG. 6 illustrates such a process.

By way of another non-limiting example, FIG. 13A to FIG. 13C illustrate exemplary implementations of a quantum computing system 1200 for generating photonic graph states, consistent with some disclosed embodiments. Quantum computing system 1200 is intended merely to facilitate the conceptualizing of one exemplary implementation for a quantum computing system to generate photonic graph states and does not limit the disclosure to any particular implementation. Quantum computing system 1200 may include a plurality of configurations (1214_1 to 1214_n), each configuration including a cavity (e.g., cavities 1202_1 to 1202_n), which functions as a resonator capable of establishing or supporting electromagnetic modes, and a quantum emitter (e.g., quantum emitters 1206_1 to 1206_n) positioned at a coupling site (e.g., coupling sites 1204_1 to 1204_n), respectively, where n is any integer greater than 1. Each one of coupling sites 1204_1 to 1204_n may be associated with a differing one of cavities (1202_1 to 1202_n) and a differing one of quantum emitters (1206_1 to 1206_n), e.g., quantum emitter 1206_1 may be positioned at coupling site 1204_1 in association with cavity 1202_1 and quantum emitter 1206_n may be positioned at coupling site 1204_n in association with cavity 1202_n.

Quantum computing system 1200 may further include a controller 1208, waveguides (1210_1 to 1210_n and 1212_1 to 1212_n), and at least one photon generator 1230. Waveguides (1210_1 to 1210_n) may be configured to facilitate in positioning (e.g., trapping) of quantum emitters (1206_1 to 1206_n) at coupling sites (1204_1 to 1204_n), e.g., by establishing an evanescent field around its surface at or around the coupling sites.

Controller 1208 may include circuitry or at least one processor to control the operation of configurations (1214_1 to 1214_n). For example, controller 1208 may include a switch to alternate between different operational stages or configurations (1214_1 to 1214_n) operating in different modes. For example, at a given time, each configuration (1214_1 to 1214_n) may be in an initializing stage (e.g., FIG. 13A), an entanglement stage (e.g., FIG. 13B), or a SWAP stage (e.g., FIG. 13C), described in greater detail herein below. Controller 1208 may control operational aspects for any of waveguides (1210_1 to 1210_n and 1212_1 to 1212_n), e.g., by controlling the timing, phase, frequency, intensity, amplitude, polarity, and any other characteristic of a pulse or a laser being carried by the waveguides that may affect the operation of configurations (1214_1 to 1214_n). For example, Controller 1208 may control characteristics of trapping lasers (e.g., blue and red lasers) for trapping or positioning a quantum emitter in the coupling site, which may be carried in waveguides 1210_1 to 1210_n, as illustrated by the non-limiting examples in FIG. 9A-FIG. 9C. Controller 1208 may control characteristics of a magnetic field or a laser, which e.g., may be used during the initializing to induce a desired state in one or more quantum emitters (1206_1 to 1206_n). Controller 1208 may also control the coupling (e.g., entrapment) between quantum emitters (1206_1 to 1206_n) and cavities (1202_1 to 1202_n) at coupling sites (1204_1 to 1204_n), respectively.

Controller 1208 may control operational aspects of photon generator 1230, described in greater detail herein below. Controller 1208 may control synchronizing and timing aspects of the operation of configurations (1214_1 to 1214_n). For example, controller 1208 may cause configuration 1214_1 to be initialized concurrently with causing another configuration 1214_n to operate as an entangling gate or a SWAP gate. Alternatively, controller 1208 may cause an output from configuration 1214_n to be carried in a channel and serve as an input for configuration 1214_1. As one non-limiting example, controller 1208 may include a switch to automatically (e.g., and repeatedly) control one or more cycles through the initializing stage, entanglement stage, and SWAP stage for each of configurations (1214_1 to 1214_n). As another non-limiting example, controller 1208 may include a clock to synchronize the operation between differing ones of configurations (1214_1 to 1214_n), and optionally, with additional components and/or circuitry. As another non-limiting example, controller 1208 may include at least one processor for controlling the operation of configurations (1214_1 to 1214_n), e.g., to synchronize or otherwise oversee or govern the operations of differing ones of configurations (1214_1 to 1214_n).

Photon generator 1230 may be optically coupled to waveguides (1210_1 to 1210_n and 1212_1 to 1212_n) to provide photons to configurations (1214_1 to 1214_n). Controller 1208 may control the operation of photon generator 1230 to provide photons according to the different operational stages of configurations (1214_1 to 1214_n). For example, controller 1208 may cause photon generator 1230 to provide photons to initialize quantum emitters (1206_1 to 1206_n) during the initializing stage, provide photons (1226_1 to 1226_n) for entangling gates (1216_1 to 1216_n) during the entanglement stage, and to provide photons (1228_1 to 1228_n) for SWAP gates (1218_1 to 1218_n) during the SWAP stage, respectively.

As a non-limiting example, at least one photon generator 1230 (e.g., controlled by controller 1208) may operate in a similar manner to those described herein with respect to FIG. 4A, FIG. 4B and/or FIG. 9B. According to some non-limiting examples, photon generator 1230 may include at least three photon generators (e.g., each operating similarly to single-photon source unit 401 or the single photon source 812). A first photon generator for providing photons for the initializing stage (e.g., to initialize quantum emitters 1206_1 to 1206_n), a second photon generator for providing photons (1226_1 to 1226_n) for the entangling stage (e.g., to generate or operate an associated configuration as entangling gate 1216_1 to 1216_n), and a third photon generator for providing photons (1228_1 to 1228_n) for the SWAP stage (e.g., to generate or operate an associated configuration as SWAP gate 1218_1 to 1218_n). Alternatively, controller 1208 may control operational aspects of photon generator 1230 (e.g., a single photon generator) to emit any one or more of photons 1224_1 to 1224_n for the initializing stage, photons 1226_1 to 1226_n for the entangling stage, and photons 1228_1 to 1228_n for the SWAP stage. As noted, controller 1230 may control the operation of photon generator 1230 and configurations (1214_1 to 1214_n) to cycle through different stages and synchronize operations therebetween.

Controller 1208 may facilitate controlling any of the operational aspects of quantum computing system 1200. For example, controller 1208 may control a component or group of components of quantum computing system 1200 to facilitate positioning quantum emitters (1206_1 to 1206_n) at coupling sites (1204_1 to 1204_n) by controlling one or more operational characteristics of waveguides (1210_1 to 1210_n), e.g., relating to the wavelength, phase, amplitude, polarity and modalities of a pulse or a laser being carried in the waveguide. Controller 1208 may facilitate initializing the states for quantum emitter qubits, each state and quantum emitter qubit being associated with each of quantum emitters 1206_1 to 1206_n in FIG. 13A. Controller 1208 may further facilitate transmitting photonic qubits associated with photons (1226_1 to 1226_n) for entangling gates 1216_1 to 1216_n in FIG. 13B. Controller 1208 may further facilitate transmitting photonic qubits associated with photons (1228_1 to 1228_n) for SWAP gates 1218_1 to 1218_n in FIG. 13C respectively, so that photonic graph states such as a photonic graph state 1220_1 to 1220_n and/or a cluster state 1222 may be generated as described in greater detail herein below. It is to be noted that entangling gates 1216_1 to 1216_n and SWAP gates 1218_1 to 1218_n may each be generated from configurations 1214_1 to 1214_n in FIG. 13A after an appropriate initialization process, respectively. For example, depending on the mode of operation as controlled by controller 1208, configurations (1214_1 to 1214_n) may alternately operate in an entangling mode for the entangling stage and a SWAP mode for the SWAP stage.

Some embodiments involve a quantum computing method for generating photonic graph states. A photonic graph state refers to a condition or a configuration of one or more photons, where a photonic state may include a quantum state associated with degrees of freedom of one or more photons, as described earlier. For example, a photonic graph state may represent a relationship between a group of photonic qubits, each photonic qubit representing a basic unit of quantum information. For example, a photonic graph state may include a condition where vertices may be representative of photonic states, and where a photonic state refers to a condition of one or more photons, and where edges may be representative of entanglement between the photonic states. A photonic graph state, for example, may refer to a plurality of entangled photons or a state thereof.

By way of a non-limiting example, FIG. 13A to FIG. 13C, together, illustrate an exemplary implementation of a quantum computing system 1200 for generating photonic graph states (1220_1 to 1220_n and 1222), consistent with some disclosed embodiments. Quantum computing system 1200 includes quantum emitters (1206_1 to 1206_n) positioned at coupling sites (1204_1 to 1204_n) between respective waveguide (1210_1 to 1210_n) and cavity (1202_1 to 1202_n).

Turning to FIG. 13A, controller 1208 may control the operation of photon generator 1230 to provide a sequence of photons (1224_1 to 1224_n) (e.g., initialization photons) to waveguides (1212_1 to 1212_n) to initialize quantum emitters (1206_1 to 1206_n) of configurations (1214_1 to 1214_n), respectively. Turning to FIG. 13B, controller 1208 may control the operation of photon generator 1230 to provide a plurality of photons (1226_1 to 1226_n) to waveguides (1212_1 to 1212_n) respectively, as sources of photonic qubits for entangling gates (1216_1 to 1216_n), whereby an entangling gate between the photonic qubits and the quantum emitter qubit is generated, as illustrated by a quantum-emitter qubit entangled with two photonic qubits (1234_1 to 1234_n). Turning to FIG. 13C, controller 1208 may control the operation of photon generator 1230 to provide one or more photons (1228_1 to 1228_n) for SWAP gates (1218_1 to 1218_n) to waveguides (1212_1 to 1212_n), whereby SWAP gates (1218_1 to 1218_n) are generated, and quantum emitter qubits (e.g., associated with quantum emitters 1206_1 to 1206_n) are mapped to photonic qubits associated with reflected output photons 1236_1 to 1236_n. This leaves entangled photons 1231_1 to 1232_n, which can form photonic graph states 1220_1 to 1220_n and/or a cluster 1222 depending on how inputs and outputs of entangling gates are connected.

In an example, photon generator 1230 may include multiple photon generators, one photon generator configured to generate photons (1224_1 to 1224_n) for configurations (1214_1 to 1214_n), respectively, another photon generator configured to generate photons (1226_1 to 1226_n) for entangling gates (1216_1 to 1216_n), respectively, and another photon generator to generate photons (1228_1 to 1228_n) for SWAP gate (1218_1 to 1218_n), respectively. Controller 1208 may switch between the photon generators as needed to generate graph states (1220_1 to 1220_n, and 1222). Alternatively, controller 1208 may control the operation of photon generator 1230 (e.g., as a single photon generator) to generate photons (1224_1 to 1224_n), photons (1226_1 to 1226_n) (e.g., a first transmission instance), photons (1228_1 to 1228_n) (e.g., a second transmission instance) for the initialization stage, entanglement stage, and SWAP stage, respectively.

Some embodiments involve positioning a plurality of quantum emitters at a plurality of coupling sites associated with a plurality of cavities. A quantum emitter refers to a component configured to couple to electromagnetic modes, as described earlier. A coupling site includes an area or a region configured to enable the coupling between a quantum emitter and a cavity (which is an example of a resonator), as described earlier. A cavity refers to a structure, enclosure or container that functions as a resonator for establishing or supporting oscillations or normal modes, as described earlier. A photonic cavity is an example of a cavity, which is capable of establishing or supporting electromagnetic modes associated with photons.

Positioning a plurality of quantum emitters at a plurality of coupling sites refers to arranging or locating the quantum emitters to enable interactions between the quantum emitters and each quantum emitter's associated one or more cavities, as described earlier. Examples of such quantum emitter positioning include one or more of: arranging a quantum emitter to be located at a coupling site (e.g. positioning or locating a quantum emitter at a coupling site); coupling a quantum emitter to a cavity; disposing a quantum emitter within an intra-cavity field of a cavity; trapping a quantum emitter in proximity of a cavity; lithographically locating a quantum dot in proximity to a cavity; or lithographically locating a cavity in proximity to a self-assembled quantum dot. For example, positioning a quantum emitter s at a plurality of coupling sites. Trapping a quantum emitter refers to generating a trap which keeps the quantum emitter within a coupling site, as described earlier. By way of non-limiting example, FIG. 9A illustrates a utility waveguide 910 for carrying a pulse or a field for generating a trap, and FIG. 10 illustrates a Magneto-optical trap (MOT) for trapping one or more atoms 1020. The pulse or the field in FIG. 9A is configured to trap the Rb atom 820 (an example quantum emitter) at a coupling site, e.g. next to the cavity 818 (or the resonator or the ring shape in the figure). This pulse or field may be configured to generate and/or contain an evanescent field around the waveguide 910 so that evanescent field trapping can be used to keep the Rb atom 820 at, or within, the coupling site. The Magneto-optical trap in FIG. 10 is configured to trap the one or more atoms 1020 at, or within, a coupling site.

Thus, a quantum computing system may include multiple coupling sites for positioning multiple quantum emitters and thereby form multiple coupled pairs of a quantum emitter and a cavity (e.g., a photonic cavity). This, for example, may enable multiple concurrent (e.g., parallel) interactions between the multiple quantum emitters and multiple photons via the multiple cavities. It is understood that more than one quantum emitter may be coupled to one cavity, or more than one cavity may be coupled to one quantum emitter and function in a similar way concurrently (e.g., in parallel), provided interactions between each quantum emitter and each cavity can be enabled from such couplings.

By way of a non-limiting example, FIG. 13A to FIG. 13C illustrate a plurality of quantum emitters being positioned at a plurality of coupling sites associated with a plurality of cavities according to some embodiments related to generating photonic graph states. Configurations (1214_1 to 1214_n), entangling gates (1216_1 to 1216_n) and SWAP gates (1218_1 to 1218_n) each includes coupling site (1204_1 to 1204_n) associated with a cavity (1202_1 to 1202_n). Each coupling site (1204_1 to 1204_n) is located between its associated cavity (1202_1 to 1202_n) and its associated waveguide (1210_1 to 1210_n). Blue and red lasers for trapping a quantum emitter at a coupling site, as described earlier with reference to FIG. 9A to FIG. 9C, may then be carried by waveguide (1210_1 to 1210_n). These blue and red lasers generate an evanescent field around waveguide (1210_1 to 1210_n), which for example is used to trap or keep the associated quantum emitter (1206_1 to 1206_n) at, or within, its associated coupling site (1204_1 to 1204_n). Controller 1208 may control circuitry or optics elements to position quantum emitters at coupling sites. For example, controller 1208 may control lasers used for trapping quantum emitters at coupling sites. Controller 1208 may control characteristics of these blue and red lasers used for trapping. The positioning (e.g., entrapment or trapping) of quantum emitters (1206_1 to 1206_n) in respective coupling sites (1204_1 to 1204_n), for example between corresponding waveguide (1210_1 to 1210_n) and cavity (1202_1 to 1202_n), enables interactions between quantum emitters (1206_1 to 1206_n) and their associated cavities (1202_1 to 1202_n), for example by enabling each quantum emitter's dipole field to overlap with an electromagnetic mode of an associated cavity with which the quantum emitter is thereby coupled. For example, photon generator 1230 may include multiple photon generators, one photon generator configured to generate photons (1224_1 to 1224_n) for configurations (1214_1 to 1214_n), respectively, another photon generator configured to generate photons (1226_1 to 1226_n) for entangling gates (1216_1 to 1216_n), respectively, and another photon generator to generate photons (1228_1 to 1228_n) for SWAP gate (1218_1 to 1218_n), respectively. Controller 1208 may switch between the photon generators as needed to generate graph states (1220_1 to 1220_n, and 1222). Alternatively, controller 1208 may control the operation of photon generator 1230 (e.g., as a single photon generator) to generate photons (1224_1 to 1224_n), photons (1226_1 to 1226_n) (e.g., first transmission instance), photons (1228_1 to 1228_n) (e.g., second transmission instance) for the initialization stage, entanglement stage, and SWAP stage, respectively.

Some embodiments involve initializing a state of a quantum emitter qubit associated with each of the plurality of quantum emitters. A quantum emitter qubit refers to a basic unit of quantum information stored in, or belonging to, a quantum emitter, as described earlier. Initializing a quantum emitter qubit associated with each of the plurality of quantum emitters may involve setting a baseline condition for the quantum emitter. For example, initializing may include establishing an inceptive tuned state system for the quantum emitter. By way of non-limiting example, FIG. 1 illustrates a four-state system 101 of an atom 102 (an example quantum emitter) contained within an optical cavity 103. This may involve preparing the quantum emitter in a superposition of a first and second ground states. The initializing may involve inducing the quantum emitter to undergo one or more transitions from a state to another state, e.g., exposing the quantum emitter to a laser and/or by applying a magnetic field to the quantum emitter.

In some disclosed embodiments, initializing may cause the state of the quantum emitter qubit to correspond to an equal superposition of two ground states of the quantum emitter. The ground state may be stationary state of lowest energy, and the energy of the ground state may be lower than an excited state, e.g., at a zero-point energy. A superposition may refer to being in multiple states at the same time, for example until a measurement is taken. A superposition, for example, may refer to adding together (or superposing) of two or more quantum states, and an equal superposition may refer to having these two or more quantum states with an equal probability. For example, FIG. 1 illustrates a four-state system 101 of atom 102 (an example quantum emitter) coupled to optical cavity 103, wherein atom 102 may be initialized in a superposition of first and second ground states 111 and 113, respectively. FIG. 2E and FIG. 3 illustrate an example of such an initialized state of a quantum emitter coupled to a cavity, wherein the atom 102 (an example quantum emitter) is in an initial superposition state of first and second ground states 111, 113 after an initialization process. Frequencies of one or more transitions from one state to another may also be tuned by light-shift using a laser or by Zeeman shift through an application of a magnetic field.

As one non-limiting example, one or more of the quantum emitter qubits (e.g., associated with the quantum emitter) may be initialized to the desired state as described with respect to FIGS. 4A and 5A, e.g., using pulses 403 and 503, respectively. As another non-limiting example, the quantum emitters may be initialized to any of the states or any superposition of the states shown in FIG. 1.

In an example, a controller (e.g., controller 1208) may control a component, group of components (e.g., optics elements) or circuitry to initialize a quantum emitter qubit associated with each of the plurality of quantum emitters. The controller may, for example, control a photon pulse generator and/or a magnetic field generator to expose the quantum emitter (on which the quantum emitter qubit is stored, or to which the quantum emitter qubit belongs to) to a laser and/or to apply a magnetic field to the quantum emitter. The controller, for example, may control photon pulse generator 151 and/or magnet 141 in FIG. 1. This may then induce the quantum emitter to undergo one or more transitions from a state to another state until a desired state for the next stage is reached. For example, the next stage might be an entanglement stage and the desired state of the quantum emitter enables the quantum emitter to function as an entangling gate (1216_1 to 1216_n). The next stage might be a SWAP stage and the desired state of the quantum emitter enables the quantum emitter to function as a SWAP gate (1218_1 to 1218_n). By way of non-limiting examples, FIG. 3 illustrates an example of a desired state for an entanglement stage and FIG. 2E illustrates an example of a desired state for a SWAP stage, which is the initial superposition state of first and second ground states 111, 113 after an initialization process.

Some embodiments involve transmitting photonic qubits toward the plurality of the quantum emitters in at least one first instance transmission for generating an entangling gate between the photonic qubits and the quantum emitter qubit in order to entangle the quantum emitter qubit and the photonic qubits. A photonic qubit refers to a basic unit of quantum information stored in (or belonging to) one or more photons or electromagnetic field, as described earlier. An entangling gate refers to any component, group of components, control sequence, or operations (reversible or irreversible) that cause any degree of entanglement between quantum elements (e.g., any quantum particles, group of quantum particles, or qubits), as described above. For example, a controlled-Z entangling gate (CZ, gate) is for a type of an entangling gate. By way of non-limiting examples of an entangling gate, FIG. 3 illustrates a controlled-Z, entangling gate implementation, and FIG. 8 and FIG. 9C illustrate the Rubidium ($^{87}$Rb) atom 820 coupled to a cavity 818 in configuration 810 being implemented a controlled-Z entangling gate. As another example, photon entanglement unit 501 in FIG. 5A and FIG. 5B is a type of an entangling gate. Transmitting refers to transporting or carrying, e.g., via a channel or a waveguide. Thus, for example, transmitting photonic qubits toward the plurality of the quantum emitters in at least one first instance transmission for generating an entangling gate between the photonic qubits and the quantum emitter qubit, refers to, initially, carrying photons (to which photonic qubits belong), e.g., via a channel or a waveguide, toward the quantum emitters to cause an entanglement between the photonic qubits and the quantum emitter qubit (e.g., as described with reference to captions 602 to 609 in FIG. 6).

In an example, a controller (e.g., controller 1208) may control a component, group of components (e.g., optics elements) or circuitry to transmit photonic qubits toward the plurality of the quantum emitters in a first instance, whereby an entangling gate between the photonic qubits and the quantum emitter qubit is generated, and the quantum emitter qubit and the photonic qubits are entangled. The controller may, for example, control a photon generator or a photon source unit to provide photons, to which photonic qubits belong. The controller may also control one or more of a switch, a beam splitter, and a waveguide to direct and carry the provided photons toward the quantum emitters, which are initialized to be in a desired state for an entangling gate, to cause an entanglement between the photonic qubits and the quantum emitter qubit.

By way of a non-limiting example, FIG. 13B illustrates quantum computing system 1200 including waveguides (1212_1 to 1212_n) for transmitting photonic qubits toward the plurality of the quantum emitters to generate an entangling gate between the photonic qubits and the quantum emitter qubit to entangle the quantum emitter qubit and the photonic qubits according to some embodiments related to generating photonic graph states. For example, controller 1208 may control the operation of photon generator 1230 to provide photons 1226_1 to 1226_n to waveguides (1212_1 to 1212_n), e.g., during an entanglement stage for entangling gates (1216_1 to 1216_n) of quantum computing system 1200. Controller 1208 may further control how cavity (1202_1 to 1202_n) functions or interacts with quantum emitter (1206_1 to 1206_n), e.g. by controlling frequencies and/or other characteristics of a light pulse being input into cavity (1202_1 to 1202_n), to cause photons 1226_1 to 1226_n (e.g., transported via waveguides 1212_1 to 1212_n) to interact with quantum emitter (1206_1 to 1206_n) via its associated cavity 1202_1 to 1202_n, wherein the association is that they are coupled to enable an interaction therebetween. This then causes photonic qubits (e.g., associated with photons 1226_1 to 1226_n) to become entangled with a quantum emitter qubit (e.g., associated with the relevant quantum emitter 1206_1 to 1206_n). Controller 1208 may thus control operational aspects of system 1200 such that cavities (1202_1 to 1202_n), waveguides (1210_1 to 1210_n and 1212_1 to 1212_n), and quantum emitters (1206_1 to 1206_n) positioned at coupling sites (1204_1 to 1204_n), as a whole operate as entangling gates (1216_1 to 1216_n), outputting photonic qubits that are entangled with the quantum emitter qubit (1234_1 to 1234_n).

Some embodiments involve, following the at least one of the first instance transmissions, transmitting photonic qubits toward the plurality of quantum emitters in at least one second instance transmission for generating a SWAP gate between the photonic qubits and the quantum emitter qubits to map the quantum emitter qubits to photonic qubits. A SWAP gate refers to a quantum gate operable on two qubits, such that a quantum state of a first qubit is transferred to a second qubit, and a quantum state of the second qubit is transferred to the first qubit, as described above. For example, SWAP gate 201 of FIG. 2E may be an exemplary implementation of a SWAP gate.

Thus, in an example, after the first instance transmission of photons, which causes photonic qubits (e.g., associated with the photons transmitted in the first instance transmission) to entangle with the quantum emitter qubits (e.g., from the cavities and quantum emitters positioned at the coupling sites operating as entangling gates), a controller (e.g., controller 1208) may control a component, group of components (e.g., optics elements) or circuitry to cause a second instance transmission (e.g., of another photon sequence). The controller may control a component, group of components (e.g., optics elements) or circuitry to transmit photonic qubits toward the plurality of the quantum emitters for the second time (after the first instance), whereby a SWAP gate between photon qubit of a first photon to interact with a quantum emitter and the quantum emitter qubit is generated, and the quantum emitter qubit is mapped to that photonic qubit. The controller may, for example, control a photon generator or a photon source unit to provide one or more photons, to which one or more photonic qubits belong. The controller may also control one or more of a switch, a beam splitter, and a waveguide to direct and carry the provided one or more photons toward the quantum emitters, which are initialized to be in a desired state for a SWAP gate, to cause mapping of quantum emitter qubits to the one or more photonic qubits. The mapping or transferring of a state of a quantum emitter qubit from a quantum emitter to a photonic qubit of a photon leaves the quantum emitter with the state of the photonic qubit before the mapping or transferring. This in effect disentangles the quantum emitter qubit from entangled photonic qubits it had previous interacted with as an entangling gate because the quantum emitter qubit now has the state of the last photonic qubit which was not entangled with those photonic qubits. This then leaves only those previously interacted photonic qubits in entanglement with each other, which form a photonic graph state or a cluster state (e.g., as described with reference to caption 611 in FIG. 6). This mapping may also free the quantum emitter to be initialized to a desired state for an entangling gate again to entangle its quantum emitter qubit with photonic qubits of other incoming photons.

This SWAP gate operation may be based on a single-photon Raman interaction (SPRINT) mechanism described in Bechler O. et. al. "A passive photon-atom qubit swap operation" *Nature Physics* 14, 996-1000 (2018), Rosenblum S. et. al. "Extraction of a single photon from an optical pulse" *Nature Photonics* 10, 19-22 (2016) and Shomroni, I. et al. "All-optical routing of single photons by a one-atom switch controlled by a single photon" *Science* 345.6199, 903-906 (2014), the entire content and single photon extraction and SPRINT mechanism related contents of which are incorporated herein by reference. For example, a quantum emitter is coupled to a cavity at a coupling site. Two transitions in a multi-level quantum emitter (e.g., a single atom such as Rb atom having at least two ground states and at least one exited state) are coupled via the cavity (e.g., a micro-resonator) to different directions of waveguide. The arrangement of the quantum emitter, the cavity, and the waveguide (e.g., as shown in FIG. 13C with quantum emitters 1206_1 to 1206_n, cavities 1202_1 to 1202_n, and waveguides 1212_1 to 1212_n) is such that light or a photon being carried in the waveguide is evanescently coupled into the cavity by the waveguide. Here, being evanescently coupled refers to being able to interact or transfer through an evanescent field around a waveguide. When a pulse including a plurality of photons (e.g., photons 1228_1 to 1228_n in FIG. 13C) is introduced into the waveguide (e.g. 1212_1 to 1212_n in FIG. 13C), the first photon of the pulse in the waveguide coming from one direction then interacts with the quantum emitter (e.g., quantum emitter 1206_1 to 1206_n) via its coupled cavity (e.g., cavity 1202_1 to 1202_n) through its evanescent coupling. This interaction causes the first photon of the pulse coming from this direction to be deterministically reflected as illustrated by the reflected photon 1236_1 to 1236_n shown in FIG. 13C due to destructive interference in the transmission. This interaction between the first photon and the quantum emitter is analogous to mapping a quantum emitter qubit to a photonic qubit as described earlier with reference to a SWAP gate 201 from FIG. 2E or SWAP gate 1218_1 to 1218_n in FIG. 13C. This interaction also results in Raman transfer of the quantum emitter (e.g., quantum emitter 1206_1 to 1206_n) from a ground state to another ground state, and the quantum emitter becomes transparent to subsequent photons from that direction (e.g., a second photon onwards from that pulse of photons such as photons 1228_1 to 1228_n in FIG. 13C). This means those subsequent photons are just transmitted to the other end of waveguide. Thus, the mapped photon from this SPRINT mechanism is the first photon of an input pulse that interacted with the cavity-coupled quantum emitter for the first time, and hence reflected to be output in the direction it first came from. FIG. 15(A) to FIG. 15(C) illustrates this SPRINT mechanism, which is described in more detail later.

By way of a non-limiting example, FIG. 13C illustrates system 1200 which, following a first instance transmission, transmits photonic qubits toward the plurality of quantum emitters in a second instance for generating a SWAP gate between the photonic qubits and the quantum emitter qubits to map the quantum emitter qubits to photonic qubits according to some disclosed embodiments related to generating photonic graph states. For example, controller 1208 may control the operation of photon generator 1230 to provide photons (1228_1 to 1228_n) to waveguides (1212_1 to 1212_n), respectively, e.g., in the SWAP stage of system 1200. Controller 1208 may further control optics elements or circuitry such as switches and waveguides to direct a second instance transmission of photonic qubits (e.g., associated with photons 1228_1 to 1228_n) towards quantum emitters (1206_1 to 1206_n). The interaction between the photonic qubits from the second instance transmission (e.g. associated with photons 1228_1 to 1228_n) and quantum emitters (1206_1 to 1206_n) via cavities (1202_1 to 1202_n) function as SWAP gates (1218_1 to 1218_n), e.g., causing cavities (1202_1 to 1202_n) and quantum emitters (1206_1 to 1206_n) positioned at coupling sites (1204_1 to 1204_n), respectively, to operate as SWAP gates, as described with respect to FIG. 2E. Consequently, the states of quantum emitters (1206_1 to 1206_n) may be transferred with (e.g., swapped), or mapped to, the states of photonic qubits (e.g., associated with photons 1228_1 to 1228_n of the second instance transmission), respectively. Thus, the second instance transmission may cause a disentanglement between the quantum emitter qubit, e.g., associated with quantum emitters (1206_1 to 1206_n), and the already entangled photonic qubits (e.g., generated by the first instance transmission, during the entanglement stage). Each of SWAP gates (1218_1 to 1218_n) may output mutually entangled photons (1232_1 to 1232_n), depicted as entangled by connecting double lines, which corresponding to photonic graph states 1220_1 to 1220_n, respectively, or a cluster state 1222 depending on the arrangement of the entangling gates before the SWAP gate is used.

According to some embodiments, transmitting in the first instance includes transmitting a plurality of photonic qubits in a sequence in order to cause a plurality of photon-quantum emitter entanglements, and wherein transmitting in the second instance, follows the first instance in order to output a photonic graph state. A sequence order may refer to a specific order, a progression arranged as a particular series, or a series in the sense of one coming after another. Thus, a plurality of photonic qubits of the first transmission instance (e.g., provided with a plurality of photons during the entanglement stage) may be transmitted in a sequential manner, e.g., one photonic qubit after another, or one photon after another (e.g., as described with reference to captions 602 to 609 in FIG. 6). This then enables a quantum emitter to interact with one photon after another, its quantum emitter qubit becoming entangled with each photonic qubit one after another, resulting in a plurality of photon-quantum emitter entanglements. This results in a plurality of photonic qubits entangled with the quantum emitter qubit. In order to output a photonic graph state, which does not have a quantum emitter qubit as one of qubits in the entangled state, the quantum emitter qubit must become disentangled form that plurality of photonic qubits. Thus, transmitting in the second instance, which leads to mapping of a state of a quantum emitter qubit from a quantum emitter to a photonic qubit of a photon and hence disentangling of the quantum emitter qubit from the other entangled photonic qubits, follows the first instance, leaving only photonic qubits in entanglement with each other, forming a photonic graph state to be output (e.g., as described with reference to captions 610 to 612 in FIG. 6).

By way of a non-limiting example, a combination or a sequence of an entangling gate in FIG. 13B followed by a SWAP gate in FIG. 13C may be used when transmitting a first instance of photonic qubits in a sequence to cause a plurality of photon-quantum emitter entanglements, and transmitting a second instance of photonic qubits, following the first instance, to output a photonic graph state. For example, one or more photon generator, one or more entangling gate and/or one or more SWAP gate may be arranged in an array 708 shown in FIG. 7 with a controller controlling the linear optics and phase control elements 702, 705 connecting different stages, wherein each stage includes at least one of the photon generators, the entangling gate and/or the SWAP gate. Further details on how such an array might operate to generate photonic graph states or cluster states are provided below with reference to FIG. 7.

For example, as described earlier with reference to the first instance transmission and an entangling gate, a controller (e.g., controller 1208) may first control a component, group of components (e.g., optics elements) or circuitry to transmit photonic qubits toward the plurality of the quantum emitters in a first instance, whereby the quantum emitter qubit and the photonic qubits are entangled. The controller may, for example, control a photon generator or a photon source unit to provide photons, to which photonic qubits belong, for the first instance transmission. The controller may also control one or more of a switch, a beam splitter, and a waveguide to direct and carry the provided photons toward the quantum emitters, which are initialized (e.g., under the control of the controller as described earlier with reference to the initializing a state of a quantum emitter qubit) to be in a desired state for an entangling gate, to cause an entanglement between the photonic qubits and the quantum emitter qubit.

As described earlier with reference to the second instance transmission and a SWAP gate, a controller (e.g., controller 1208) may control a component, group of components (e.g., optics elements) or circuitry to cause a second instance transmission (e.g., of another photon sequence). The controller may control a component, group of components (e.g., optics elements) or circuitry to transmit photonic qubits toward the plurality of the quantum emitters for the second time (after the first instance), whereby the quantum emitter qubit is no longer entangled with the photonic qubits associated with the photons from the first instance transmission. This in effect disentangles the quantum emitter qubit from entangled photonic qubits and leaves only those previously interacted photonic qubits in entanglement with each other, which form a photonic graph state or a cluster state (e.g., as described with reference to caption 611 in FIG. 6) to be output. The controller may, for example, control a photon generator or a photon source unit to provide one or more photons, to which one or more photonic qubits belong. The controller may also control one or more of a switch, a beam splitter, and a waveguide to direct and carry the provided one or more photons toward the quantum emitters, which are initialized (e.g., under the control of the controller as described earlier with reference to the initializing a state of a quantum emitter qubit) to be in a desired state for a SWAP gate.

According to some embodiments, initializing involves using a SWAP gate. As described earlier, a SWAP gate refers to a quantum gate operable on two qubits, such that a quantum state of a first qubit is transferred to a second qubit, and a quantum state of the second qubit is transferred to the first qubit. This swapping means when a SWAP gate is used between a photonic qubit and a quantum emitter qubit, a state of the quantum emitter qubit is mapped to the photonic qubit while a state of the photonic qubit is mapped to the quantum emitter qubit. Thus, by controlling the characteristics of the photon 1228_1 to 1228_n (which are input to waveguide 1212_1 to 1212_n and swap its state with the quantum emitter qubit) so that they to correspond to a desired state, it is possible to use a SWAP gate between the quantum emitter qubit and a photonic qubit of that photon 1228_1 to 1228_n to map the desired state onto the quantum emitter qubit as a part of the initializing step. The desired state may be for an entangling gate, for example. For example, a controller (or controller 1208) may control a component, group of components such as optics elements, or circuitry to control or set the characteristics of photon 1228_1 to 1228_n. For example, initialization photons may be provided to, or transmitted toward, the cavities to interact with the quantum emitters to cause an exchange of (e.g., swap) quantum states between the quantum emitters and photonic qubits associated with the initialization photons.

By way of non-limiting example, FIG. 13C taken together with FIG. 2E illustrate an exemplary implementation of initializing of quantum emitters (1206_1 to 1206_n) using a SWAP gate. Controller 1208 may control the operation of photon generator 1230 to provide photons (1228_1 to 1228_n) to configurations (1218_1 to 1218_n) via waveguides (1212_1 to 1212_n), respectively. For example, when the desired state for the initialized quantum emitter is a superposition of ground states 111, 113 with probability amplitudes $\beta$ and $\alpha$ but quantum emitter (1206_1 to 1206_n) is in a superposition of states (e.g., first and second ground states 111, 113 of FIG. 1 with probability amplitudes $\gamma$ and $\delta$, respectively), controller 1208 may control to provide photons 1228_1 to 1228_n in a superposition of photonic modes (e.g., modes 1 and 2 of FIG. 1 with probability amplitudes $\alpha$ and $\beta$, respectively). When a photon 1228_1 to 1228_n interacts with a quantum emitter 1206_1 to 1206_n their states may be swapped, outputting a reflected photon 1236_1 to 1236_n e in a superposition of modes (e.g., modes 1 and 2 with probability amplitudes $\delta$ and $\gamma$, respectively) and leaving the quantum emitter (1206_1 to 1206_n) in a superposition of ground states 111, 113 with probability amplitudes $\beta$ and $\alpha$, respectively), as described in greater detail with respect to FIG. 2E.

According to some embodiments, initializing includes applying microwaves. Microwave may refer to an electromagnetic radiation with wavelengths ranging from about one meter to about one millimeter and corresponding to frequencies between approximately 300 MHz and 300 GHz, respectively.

According to some embodiments, initializing includes applying optical beams. An optical beam may refer to electromagnetic waves that remain concentrated around a mean axis upon free propagation, or electromagnetic waves that are guided by structures, such as waveguides. Turning to FIG. 13A, controller 1208 may control operational aspects of photon generator 1230 to apply optical beams, via any of waveguides (1210_1 to 1210_n and 1212_1 to 1212_n), to configurations (1214_1 to 1214_n), respectively.

According to some embodiments, the plurality of quantum emitters includes an atom, and wherein positioning includes trapping the atom in proximity to a cavity. As described earlier, such trapping may involve using blue and red lasers for trapping a quantum emitter at a coupling site. Turning to FIG. 13A to FIG. 13C, one or more of quantum emitters (1206_1 to 1206_n) may include an atom, such as atom 102 of FIG. 1. The atom may be positioned at a coupling site (1204_1 to 1204_n) by trapping the atom in proximity to a cavity (1202_1 to 1202_n).

According to some embodiments, the plurality of quantum emitters includes a quantum dot, and positioning includes at least one of: lithographically locating the quantum dot in proximity to a cavity; or lithographically locating the cavity in proximity to a self-assembled quantum dot. A quantum emitter including a quantum dot may refer to a quantum emitter having a substrate (e.g., a solid-state substrate or a semiconductor particle) having optical and/or electronic properties exhibiting quantum mechanics principles, as described earlier. A self-assembled quantum dot may refer to semiconductor heterostructures that confine charge carriers in three directions. Turning to FIG. 13A to FIG. 13C, one or more of quantum emitters (1206_1 to 1206_n) may include a quantum dot. The quantum dots may be positioned at coupling sites 1204_1 to 1204_n using lithographical techniques, such as by lithographically positioning the quantum dots in proximity to cavities (1202_1 to 1202_n), or by lithographically positioning cavities (1202_1 to 1202_n) in proximity self-assembled quantum dots.

According to some embodiments, the photonic qubits are generated using a quantum emitter coupled to a cavity. For example, the quantum emitter coupled to a cavity may be configured to generate or release one or more photon. By way of non-limiting examples, source unit 401 in FIG. 4A and FIG. 4B, and photon generator 812 in FIG. 8 and FIG. 9B are examples of such use of quantum emitter coupled to a cavity. Such quantum emitter coupled to a cavity may be, for example, be provided in photon generator 1230 of FIG. 13A to FIG. 13C.

According to some disclosed embodiments, the quantum emitter may be a stationary quantum system with an anharmonic spectrum, configured to couple to electromagnetic modes. In other words, as described earlier. The quantum emitter may include a stationary qubit capable of interacting with photons. For example, the quantum emitter may include a quantum system having one or more of: an electronic or nuclear configuration of an ion or a neutral atom; an electronic or nuclear configuration of a defect or a quantum dot in a material substrate.

According to some embodiments, the quantum emitter includes a superconducting qubit. A superconducting qubit refers to a qubit stored in or belonging to a superconducting electronic circuit (e.g., a network of electrical elements using superconductors) containing one or more Josephson Junctions, as described earlier.

According to some embodiments, the quantum emitter includes a quantum dot. A quantum emitter including a quantum dot may refer to a quantum emitter having a substrate (e.g., a solid-state substrate or a semiconductor particle) having optical and/or electronic properties exhibiting quantum mechanics principles, as described earlier.

According to some embodiments, the quantum emitter includes an atom. According to some embodiments, the atom is neutral. Neutral refers to an atom that lacks an overall electric charge, such as when the number of protons in the atom equals the number of electrons. According to some alternative embodiments, the atom is an ion. Ion refers to a particle or an atom that has an overall electric charge, such as an atom having an unequal number of protons and electrons. According to some embodiments, the quantum emitter includes at least one of a rubidium atom or a cesium atom, as described earlier. The rubidium or cesium atom may be neutral or an ion. According to some embodiments, the quantum emitter includes at least one of Strontium, Erbium, Ytterbium, Calcium, Barium, Beryllium, or Magnesium atom, as described earlier.

According to some embodiments, the entangling gate is one of a controlled-Z gate (CZ gate), a controlled NOT gate (CNOT gate), a square root of a SWAP gate, or an imaginary SWAP gate (iSWAP gate). A controlled-Z gate (CZ gate) refers to a quantum gate operable on two qubits, such that their combined quantum state acquires a conditional phase shift (e.g., a phase shift of pi, as described above). For example, one or more of entangling gates 1216_1 to 1216_n may function as any one of a CZ gate, a CNOT gate, a square root of a SWAP gate, or an iSWAP gate. For example, entangling gate 1216_1 may be a controlled-Z gate (CZ gate).

By way of non-limiting example, FIG. 13l) illustrates an example process 1260 (or an example method) for generating photonic graph states, consistent with some disclosed embodiments. While the block diagram in FIG. 13l) may be described below in connection with certain implementation embodiments presented in other figures, those implementations are provided for illustrative purposes only, and are not intended to serve as a limitation. As examples of steps of the process are described throughout this disclosure, which are also applicable to the example process 1260, those aspects are not repeated or are simply summarized in connection with FIG. 13D). In some disclosed embodiments, the process 1260 may be performed by at least one processor or circuitry, for example controller 1208, configured to perform operations or functions described herein. In some embodiments, some aspects of the process 1260 may be implemented as software (e.g., program codes or instructions) that are stored in a memory provided with the at least one processor, a non-transitory computer readable medium, or a computer readable medium. In some embodiments, some aspects of the process 1260 may be implemented as hardware (e.g., a specific-purpose circuit). In some embodiments, the process 1260 may be implemented as a combination of software and hardware.

FIG. 13l) includes process steps 1262 to 1268. At step 1262, the process involves positioning a plurality of quantum emitters at a plurality of coupling sites associated with a plurality of cavities. For example, turning to FIG. 13A, quantum emitters (1206_1 to 1206_n) may be positioned at coupling sites (1204_1 to 1204_n) associated with cavities (1202_1 to 1202_n), respectively.

At step 1264, the process involves initializing a state of a quantum emitter qubit associated with each of the plurality of quantum emitters. Initializing may, for example, involve using a SWAP gate and/or applying microwaves. For example, the initializing may involve controlling a component, group of components (e.g., optics elements) or circuitry to initialize a quantum emitter qubit associated with each of the plurality of quantum emitters. The controlling may include controlling a photon pulse generator and/or a magnetic field generator to expose the quantum emitter (on which the quantum emitter qubit is stored, or to which the quantum emitter qubit belongs to) to a laser and/or to apply a magnetic field to the quantum emitter. For example, photon pulse generator 151 and/or magnet 141 in FIG. 1 may be controlled in this manner.

At step 1266, the process involves transmitting photonic qubits toward the plurality of the quantum emitters in at least one first instance transmission for generating an entangling gate between the photonic qubits and the quantum emitter qubit in order to entangle the quantum emitter qubit and the photonic qubits. For example, transmitting in at least one first instance transmission may involve controlling a component, group of components (e.g., optics elements) or circuitry to transmit photonic qubits toward the plurality of the quantum emitters in a first instance. For example, such controlling may include one or more of: controlling a photon generator or a photon source unit to provide photons, to which photonic qubits belong; and controlling one or more of a switch, a beam splitter, and a waveguide to direct and carry the provided photons toward the quantum emitters, which are initialized to be in a desired state for an entangling gate, to cause an entanglement between the photonic qubits and the quantum emitter qubit.

At step 1268, the process involves following the at least one of the first instance transmissions, transmitting photonic qubits toward the plurality of quantum emitters in at least one second instance transmission for generating a SWAP gate between the photonic qubits and the quantum emitter qubits to map the quantum emitter qubits to photonic qubits. For example, transmitting in at least one second instance transmission may involve controlling a component, group of components (e.g., optics elements) or circuitry to transmit photonic qubits toward the plurality of the quantum emitters for the second time (after the first instance). The controlling may, for example, include one or more of: controlling a photon generator or a photon source unit to provide one or more photons, to which one or more photonic qubits belong; and controlling one or more of a switch, a beam splitter, and a waveguide to direct and carry the provided one or more photons toward the quantum emitters.

For example, transmitting in the first instance may include transmitting a plurality of photonic qubits in a sequence in order to cause a plurality of photon-quantum emitter entanglements, and transmitting in the second instance may follow the first instance in order to output a photonic graph state. In an example, the non-transitory computer-readable medium (or a computer-readable medium or a computer program) may include instructions that, when executed by at least one processor (or an apparatus), cause the at least one processor (or the apparatus) to carry out a process or a quantum computing method described herein. According to some embodiments related to generating photonic graph states, the instructions may cause the at least one processor (or the apparatus) to carry out the quantum computing method or the process 1260 shown in FIG. 13D.

The same examples described earlier for each process or system feature of the embodiments related to generating photonic graph states are also applicable to corresponding features of this non-transitory computer-readable medium (or a computer-readable medium or a computer program) embodiment.

Figure 13D:
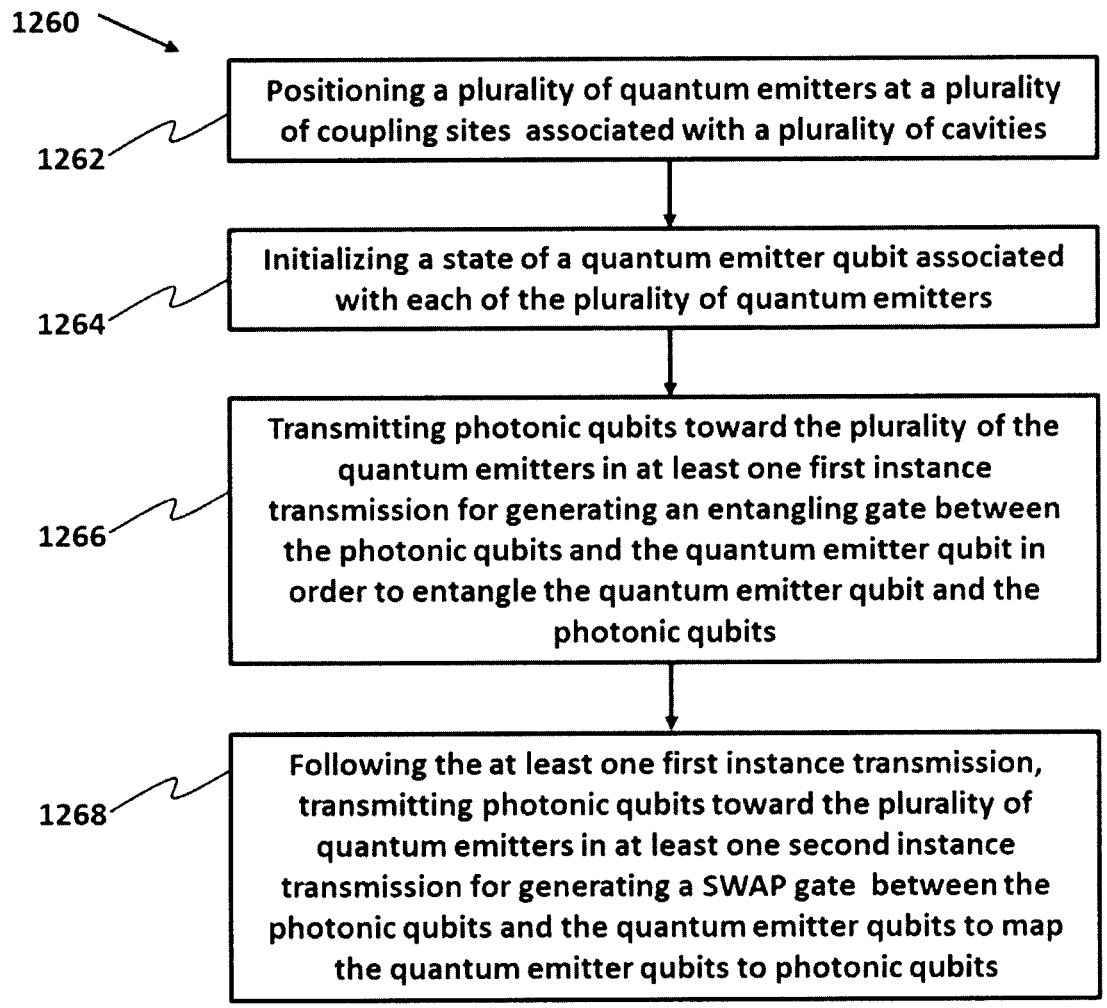
FIG. 13D is a block diagram of an example process according to some embodiments related to generating photonic graph states.

According to other embodiments related to generating photonic graph states, there are provided an apparatus, a device, a system, an integrated circuitry device, or circuitry, including at least one processor (and a memory) configured to carry out the quantum computing method or the process 1260 shown in FIG. 13D. The same examples described earlier for each process or system feature of the embodiments related to generating photonic graph states are also applicable to corresponding features of these embodiments.

According to yet another embodiment related to generating photonic graph states, a layout of an integrated circuit device or circuitry is provided, comprising layout portions, each layout portion defined to pattern each feature from the combination of features of the system 1200 in FIG. 13A to FIG. 13C, entangling gate 1216_01 to 1216_n in FIG. 13B, or SWAP gate 1218_1 to 1218_n in FIG. 13C according to some embodiments related to generating photonic graph states. By way of example, a layout of an integrated circuit device or a circuitry, includes: a cavity layout portion defined to pattern a plurality of cavities; a coupling site layout portion defined to pattern a plurality of coupling sites for positioning a plurality of quantum emitters; and a controller layout portion defined to pattern circuitry or at least one processor.

In some disclosed embodiments, the layout of an integrated circuit device or a circuitry, further includes a photon generator layout portion defined to pattern a photon generator or a channel for carrying a photon supplied by a photon generator toward a cavity or a quantum emitter. In some disclosed embodiments, the photon generator layout portion may be defined to pattern another cavity and another coupling site for positioning another quantum emitter to the other cavity. In some disclosed embodiments, circuitry layout portion may be defined to pattern one or more of: a waveguide for carrying one or more photons or lasers; and one or more linear optics elements for performing various functions involved in directing or transporting one or more photons, controlling a flow of one or more photons, manipulating states of the one or more photons, and/or performing quantum computations.

In some disclosed embodiments, the controller layout portion is defined to pattern a controller for controlling (e.g., directing or switching between different waveguides) flow of input and output photons between photon generator(s) and entangling gate(s) or SWAP gate(s), wherein the controller may comprise one or more processor and a memory, a circuit component, or circuitry for performing the controlling.

It is understood that when a quantum emitter that can be lithographically located (e.g. a quantum dot) is used, the coupling location layout portion may be defined to also pattern the quantum emitter. The same examples described earlier for each process or system feature of the embodiments related generating photonic graph states are also applicable to corresponding features of this embodiment.

Some embodiments involve generating photonic graph states for quantum computing. Quantum computing may refer to a computation that is performed through utilization or application of one or more quantum state properties, such as superposition, entanglement and interference. As described earlier, a graph state represents a relation between a group of qubits, a qubit being a basic unit of quantum information. A photonic graph state refers to a graph state representing a relation between a group of photonic qubits. As described earlier, a photonic qubit refers to a basic unit of quantum information stored in (or belonging to) one or more photons or electromagnetic field. For example, the generated graph state (or multiple graph states) from consecutive incoming photonic qubits may represent a relation between qubits that are stored in (or belonging to) output photons.

Generating photonic graph states for quantum computing refers to creating and/or providing a plurality of photons usable in a computation that is performed through utilization or application of one or more quantum state properties. The plurality of photons may have a group of associated photonic qubits, and a relation between this group of associated photonic qubits may be represented using graph states. For example, generating photonic graph states for quantum computing may include determining operating parameters and instructions for generating photonic graph states. Consistent with some embodiments related to generating photonic graph states for quantum computing, and as described below, photonic graph states may, for example, be generated by entangling one or more photonic qubits in a sequence. In this example, a photonic graph state may be a type of multi-qubit state that can be represented by a graph, wherein each photonic qubit may be represented by a vertex of the graph, and an edge between a pair of photonic qubits may represent an interaction between the pair, e.g., entanglement.

Some embodiments involve coupling a quantum emitter to a cavity. A cavity refers to a structure, enclosure or container that may function as a resonator, which is a component for establishing or supporting electromagnetic modes, as described earlier. For example, the cavity may correspond to a cavity in a cavity QED setup, an optical cavity, a whispering gallery mode cavity, or a Fabry-Perot cavity. A quantum emitter refers to a component configured to couple to electromagnetic modes, as described earlier. For example, a quantum emitter may include a stationary quantum system with an anharmonic spectrum, configured to couple to electromagnetic modes. Coupling a quantum emitter to a cavity refers to enabling interaction between the quantum emitter and the cavity. For example, enabling interaction between qubit of the quantum emitter and the cavity by enabling the quantum emitter's dipole field to overlap with an electromagnetic mode of the cavity. When a quantum emitter is coupled to a cavity (also referred to as a cavity-coupled quantum emitter) in its associated coupling location, the quantum emitter is coupled to electromagnetic modes of the cavity. Thus, the cavity-coupled quantum emitter may be configured to release or emit a photon when excited (e.g., functioning as a photon generator) or interact with a photon passing by the cavity (e.g., functioning as an entangling gate for entangling photons).

By way of non-limiting example, FIG. 4A and FIG. 4B illustrate source unit 401 (including a source unit atom 402 as quantum emitter) being implemented as a photon generator, FIG. 8 to FIG. 9B illustrate a Rubidium (87Rb) atom 820 as a quantum emitter being coupled to a cavity 818 to function as a photon generator, FIG. 5A and FIG. 5B illustrate entanglement unit 501 (including an entanglement unit atom 502 as quantum emitter) being implemented as an entangling gate, and FIG. 8 and FIG. 9C illustrate a Rubidium (87Rb) atom 820 as a quantum emitter being coupled to a cavity 818 to function as an entangling gate.

In some embodiments, such coupling may involve positioning the quantum emitter within an intra-cavity field of the cavity. As described earlier, positioning the quantum emitter refers to arranging or locating a quantum emitter to enable interaction between the quantum emitter and the cavity. For example, positioning the quantum emitter within an area configured to enabling coupling between the quantum emitter and the cavity, wherein the area may also be referred to as a coupling location or a coupling site. As described earlier, quantum emitter positioning may, for example, include one or more of: arranging a quantum emitter to be located at a coupling location or at a coupling site (e.g. positioning or locating a quantum emitter at a coupling location or at a coupling site); disposing a quantum emitter within an intra-cavity field of a cavity; trapping a quantum emitter in proximity of a cavity; lithographically locating a quantum dot in proximity to a cavity; or lithographically locating a cavity in proximity to a self-assembled quantum dot. Trapping a quantum emitter in proximity of a cavity refers to generating a trap which keeps the quantum emitter within a coupling location associated with the cavity, as described earlier. For example, a configuration of electromagnetic fields such as electrical fields, radio frequency (or microwave) fields, a magneto-optical trap (MOT) configuration, and/or off-resonant laser beams (atomic tweezers) may be used to keep the quantum emitter within the coupling location. FIG. 14A illustrates a non-limiting example of a coupling location 1420.

According to some embodiments, the quantum emitter is a stationary qubit capable of interacting with photons. A stationary qubit may refer to a material quantum system usable in storing and processing quantum information. For example, a stationary qubit may refer to a qubit operable to (or satisfies the conditions of): (i) store quantum information reliably on a nanosecond or greater timescale, (ii) reliably perform calculations and/or operations, including operations may move or convert the information to a flying qubit (e.g.

a non-stationary qubit, or a photon), (iii) be reliably measured or read out, and/or (iv) be highly entangled. Examples of stationary qubits may include a qubit stored in, or belonging to, a quantum emitter. For example, qubits stored in, or belonging to, a rubidium or cesium atom may serve as a source of a stationary qubit. A Rydberg atom, for example, may also serve as a source of a stationary qubit. Use of a Rydberg atom may lead properties which are beneficial to quantum computing applications, for example, (i) strong response to electric and magnetic fields, (ii) long decay periods, and (iii) large electric dipole moments. A Rydberg atom may refer to an excited atom with one or more electrons that have a high principal quantum number, n.

For example, the quantum emitter may include a superconducting qubit. As described earlier, a superconducting qubit refers to a qubit stored in or belonging to a superconducting electronic circuit (e.g., a network of electrical elements using superconductors). For example, a superconducting qubit may refer to a solid-state qubit sourced from a superconducting material, such as aluminum or a niobium-titanium alloy. Superconducting qubits may contain or be coupled to at least one Josephson junction. Examples of a superconducting qubit may include a charge qubit, a flux qubit, a phase qubit, and/or a hybrid thereof (e.g., a transmon).

In an example, the quantum emitter may include a quantum dot. A quantum emitter including a quantum dot may refer to a quantum emitter having a substrate (e.g., a solid state substrate such as a semiconductor particle) having optical and/or electronic properties exhibiting quantum mechanics principles, as described earlier. For example, a quantum dot may be a nanoparticle having optical and electronic properties that differ from its bulk constituent. In the presence of high energy photons (e.g., UV light), an electron in the quantum dot may excited to a high energy state and emit one or more photons when transitioning to a ground state. For example, quantum dots may be manufactured from one or more binary compounds such as lead sulfide, lead selenide, cadmium selenide, cadmium sulfide, cadmium telluride, indium arsenide, or indium phosphide. For example, quantum dots may be self-assembled from Indium Arsenide in a Gallium Arsenide substrate. For example, quantum dots may refer to atomic defects in a solid state substrate such as the nitrogen vacancy center in diamond.

In an example, the quantum emitter may include at least one of an atom or an ion. The atom may be neutral. Neutral refers to an atom that lacks an overall electric charge, such as when the atom has an equal number of protons and electrons. Ion refers to a particle or an atom that has an overall electric charge, such as an atom having an unequal number of photons and electrons. The atom or the ion may be sourced from rubidium. And/or the atom or the ion may be sourced from cesium. In an example, the atom or the ion may be sourced from a Rydberg atom. In an example, the quantum emitter may include at least one of Strontium, Erbium, Ytterbium, Calcium, Barium, Beryllium, or Magnesium atom.

Some embodiments involve generating a first dirty photon having a first temporal profile. As described earlier, a dirty photon refers to a photon that is distinguishable from another photon, for example when performing quantum computation. A dirty photon may include, for example, a propagating (itinerant) photon in a mixed state of multiple spatio-temporal modes, e.g., of multiple temporal profiles. For example, a dirty photon exhibits irregularities (e.g., in its temporal profile) that make it readily distinguishable from another photon (e.g., based on the irregularities in its temporal profile). A temporal profile may refer to an envelope of a field of a propagating photon, as addressed earlier. Examples of a temporal profile include: an exponentially decreasing or increasing profile with a certain decay time and initial time; a constant profile with a certain initial time and final time; a frequency and phase modulating profile with a certain initial time and final time and modulation frequency and phase; or a gaussian profile with specific average time and temporal variance.

As described earlier, a photonic qubit refers to a basic unit of quantum information stored in (or belonging to) one or more photons or electromagnetic field. Using a dirty photon to form a photonic qubit, or using a first dirty photon to form a first photonic qubit, refers to establishing or providing the dirty photon or the first dirty photon as a source of the photonic qubit or the first photonic qubit. The photonic qubit or the first photonic qubit is then stored in, or belongs to, the dirty photon or the first dirty photon, or electromagnetic field associated therewith. For example, establishing or providing the dirty photon or the first dirty photon as the source may involve carrying the dirty photon or the first dirty photon to, through, or from, one or more linear optics elements. For example, linear optics elements may include one or more of: a channel (e.g., a waveguide), a reflector (e.g., a mirror), a beam splitter, a lens, a phase shifter, or another linear optics instrument capable of manipulating a property or motion of a photon.

Generating a dirty photon, or generating a first dirty photon, refers to providing, releasing or emitting a photon which may be distinguishable from another photon, for example, a photon that has been, or will be, provided, released or emitted. For example, a photon may be "dirty" because a photon generator used to provide, release or emit the photon was not controlled to be precise in terms of its input pulse's time and/or shape, or frequency, as described earlier. Single photons produced according to some disclosed embodiments are perfectly suitable for photonic qubit entanglement using a quantum emitter coupled to a cavity described herein even when the photons exhibit irregularities (e.g., in their temporal profiles) that make them readily distinguishable.

A photon source unit for sourcing single photons described herein is a non-limiting example of such photon generator capable of providing potentially dirty photons. By way of non-limiting example, FIG. 4A and FIG. 4B illustrate an emitted photon 406 and a time sequential series 412 of output photons, which may be dirty photons, being generated by source unit 401 (including a source unit atom 402 as quantum emitter). In another non-limiting example, FIG. 8 to FIG. 9B also illustrate a single photon, which may be a dirty photon, being generated and output by a Rubidium ($^{87}$Rb) atom 820 coupled to a cavity 818. Turning to source unit 401 in FIG. 4A and FIG. 4B, source unit 401 includes a cavity, such as optical cavity 103 of FIG. 1, and atom 402 (e.g., a quantum emitter). After initializing pulse 403 initializes the state of atom 402 to be in state 111 (FIG. 1), generating pulse 404 may cause transition 121A and transition 122A of FIG. 2A, resulting in atom 402 emitting photon 406. Repeating this process produces a time sequential series 412 of output photons in FIG. 4B. According to some embodiments related to generating photonic graph states for quantum computing, generating pulse 404 is not required to be precisely controlled, e.g., in terms of its pulse time and/or shape, and the output photons may therefore potentially be dirty. The output photons have temporal profiles which may exhibit irregularities and hence be potentially distinguishable.

A photonic quantum computation refers to a computation that is performed through utilization or application of one or more quantum state properties of one or more photons. Conventional photonic quantum computation, which uses linear optics elements to generate photonic graph states, relies on using indistinguishable photons (also referred to as clean photons), because they do not exhibit any irregularities (e.g., in their temporal profiles). This is because some of the operations involved in such conventional photonic quantum computation requires use of destructive interference between more than one photon, and this destructive interference relies on the more than one photons being indistinguishable from one another. For example, if the photons used in those conventional quantum computation are distinguishable, this can then lead to degradation in fidelity of generated photonic graph states and increased errors in the computation.

By contrast, performing photonic quantum computation using entangling of photons through a cavity-enhanced quantum emitter-photon interaction (e.g., using a quantum emitter coupled to a cavity, which is also referred to as a cavity-coupled quantum emitter) enables use of such dirty photons in quantum computation operations. This is because entangling photons through a cavity-enhanced quantum emitter-photon interaction uses a cavity-coupled quantum emitter as a mediator for entangling those photons. The cavity-coupled quantum emitter mediates interactions between the photons to generate a photonic graph state. Mediating refers to facilitating, enabling, or otherwise promoting interactions. The interactions may transfer, communicate, associate, and/or establish a correlation between the incoming photonic qubits. For example, a cavity-coupled quantum emitter may facilitate an entanglement (e.g., an interaction) between incoming photons, the cavity-coupled quantum emitter being a means through which these interactions between incoming photons are achieved. Thus, a photonic quantum computation using some embodiments related to generating photonic graph states for quantum computing described herein, does not require use of indistinguishable photons (also referred to as clean photons), which would otherwise have been the case for probabilistic entanglement with linear optics. This means, for example, that an input photon pulse when generating photons for use in quantum computation (e.g., generating pulse 404 in FIG. 4A) does not have to be precisely timed and shaped, and may result in the generation of dirty photons having temporal profiles which are not precisely controlled or tuned, as described earlier. However, use of one or more cavity-coupled quantum emitters mean those generated photons are still suitable for use in quantum computing operations.

Some embodiments involve generating a second dirty photon having a second temporal profile and some embodiments involve using the second dirty photon to form a second photonic qubit. For example, the second dirty photon may be generated and used to form a second photonic qubit in a manner similar to generating and using the first dirty photon to form a first photonic qubit described earlier. Examples described earlier in relation to generating and using the first dirty photon, and to forming the first photonic qubit, are also applicable to the second dirty photon.

Some embodiments involve using the quantum emitter coupled to the cavity to entangle the first photonic qubit with the second photonic qubit to form a pair of entangled photonic qubits. A pair of entangled photonic qubits refers to a condition where states of the pair of photonic qubits are linked, as described earlier. For example, the states of the pair of photonic qubits may be related to each other in such a way that those state(s) cannot be described independently of each other. This entanglement produces, for example, a correlation between measurements of those states, correlating a measurement of the state of one photonic qubit to a measurement of the state of the other photonic qubit, whereby mutual information may be stored or processed using this correlation. A quantum emitter coupled to a cavity (or a cavity-coupled quantum emitter) may be used to function as an entangling gate, as described earlier. An entailing gate refers to a component or group of components or a control sequence configured to entangle qubits. Thus, the cavity-coupled quantum emitter may interact with the first photonic qubit and the second photonic qubit, e.g., in a sequential manner, so that the first photonic qubit and the second photonic qubit are entangled with the cavity-coupled quantum emitter and hence with each other.

By way of non-limiting example, FIG. 5A and FIG. 5B illustrate entanglement unit 501 (including an entanglement unit atom 502 as quantum emitter) being implemented as an entangling gate to generate a time-sequential series 512 of entangled photons, and FIG. 8 and FIG. 9C illustrate a Rubidium ($^{87}$Rb) atom 820 as a quantum emitter being coupled to a cavity 818 to function as an entangling gate.

Some embodiments involve using the pair of entangled photonic qubits for quantum computation. Performing quantum computation may refer to applying operations on photonic qubits, wherein applying the operations rely on utilization or application of one or more quantum state properties such as superposition, entanglement and interference. The entangled photonic qubits may be carried through, or directed by, linear optics elements and/or via quantum emitters, thereby enabling transportation and/or manipulation of the information encoded therewith.

Some embodiments involve generating a third dirty photon having a third temporal profile different from the first and second temporal profiles and using the third dirty photon to form a third photonic qubit. For example, the third dirty photon may be generated and used to form a third photonic qubit in a manner similar to generating and using the first or second dirty photon to form a first or second photonic qubit, as described earlier. Examples described earlier in relation to generating and using the first or second dirty photon, and to forming the first or second photonic qubit, are also applicable to the third dirty photon. A temporal profile refers to a temporal envelope of a field of a propagating photon, as described earlier. Examples of a temporal profile include: an exponentially decreasing or increasing profile with a certain decay time and initial time; a constant profile with a certain initial time and final time; or a gaussian profile with specific average time and temporal variance. Thus, the third temporal profile of the third dirty photon being different from the first and second temporal profiles of the first and second dirty photons refers to a field of the third dirty photon having a profile that acts or changes differently over time than fields of the first and second dirty photons.

Some embodiments involve using the quantum emitter coupled to the cavity to entangle the third photonic qubit with the first or second photonic qubit, to form three entangled photonic qubits. For example, as described earlier, the cavity-coupled quantum emitter may interact with the third photonic qubit and the first or second photonic qubit, e.g., in a sequential manner, so that the third photonic qubit and the first or second photonic qubit are entangled with the cavity-coupled quantum emitter and hence with each other.

Examples described earlier in relation to entangling the first photonic qubit with the second photonic qubit are also applicable to entangling the third dirty photon with the first or second photonic qubit.

Some embodiments involve using the three entangled photonic qubits for quantum computation. For example, as described earlier with reference to using the pair of entangled photonic qubits for quantum computation, the three entangled photonic qubits may be carried through, or directed by, linear optics elements and/or via quantum emitters, thereby enabling transportation and/or manipulation of the information encoded therewith.

Some embodiments involve using the cavity coupled to the quantum emitter to entangle a plurality of additional photons to generate a photonic graph. An additional photon refers to a photon that is other than the first dirty photon, the second dirty photon and/or third dirty photon described earlier. For example, the additional photon may be generated and used to form an additional photonic qubit in a manner similar to generating and using the first dirty photon (or the second or third dirty photon) to form a first photonic qubit (or the second or third photonic qubit) described earlier. Examples described earlier in relation to generating and using the first dirty photon (or the second or third dirty photon), and to forming the first photonic qubit (or the second or third photonic qubit), are also applicable to the additional photons. Using the cavity coupled to the quantum emitter to entangle a plurality of additional photons refers to the quantum emitter coupled to the cavity (or the cavity-coupled quantum emitter) being used to function as an entangling gate, as described earlier in relation to entailing the first photonic qubit with the second photonic qubit to form a pair of entangled photonic qubits. As the additional photons are entangled with the cavity-coupled quantum emitter one by one, the cavity-coupled quantum emitter generates a photonic graph of entangled photons which includes the additional photons as well as the first and second dirty photons. If the third dirty photon is also entangled using the cavity-coupled quantum emitter, the entangled photons include the third photonic. This photonic graph of entangled photons may, for example, then be used for quantum computation. Examples described earlier in relation to entailing the first photonic qubit with the second photonic qubit or entangling the third photonic qubit with the first or second photonic qubit, are also applicable to entangling a plurality of additional photons.

By way of non-limiting example, FIG. 5A and FIG. 5B illustrate entanglement unit 501 (including an entanglement unit atom 502 as quantum emitter) being implemented as an entangling gate to generate a time-sequential series 512 of entangled photons, and FIG. 6 illustrates repeating an entangling process using such entanglement unit 501 according to some embodiments. Step 602 for repeating a loop of steps 603 to 606 results in the entanglement unit atom (such as atom 502) being entangled with states of a plurality of photons, which then enables generating of a photonic graph with n entangled photons as shown in caption 609, 611.

In some examples, at least some of the additional photons are dirty. The additional dirty photons may be similar to the first dirty photon, or the second dirty photon described earlier, or a third dirty photon to be described later. For example, a dirty additional photon may be generated and used in a similar manner as the first or second dirty photon to form an additional photonic qubit. The quantum emitter coupled to the cavity may then be used to entangle the formed additional photonic qubit with the first and/or second photonic qubit, or any other photonic quit, to form a plurality of entangled photonic qubits. This plurality of entangled photonic qubits may then be used for quantum computation. Examples and explanation described herein in relation to the first, second or third dirty photon are also applicable to the additional photons that are dirty.

In some embodiments, the first dirty photon is generated by extraction from a coherent laser pulse using a quantum emitter coupled to a cavity. A laser pulse refers to laser light in a form of optical pulses, e.g., a temporally confined pulse including a specified average number of photons. A coherent laser pulse refers to a laser pulse with wavelengths of the laser light being in phase in space and time. A quantum emitter coupled to a cavity (also referred to as a cavity-coupled quantum emitter) may then be used to extract a photon from the coherent laser pulse. This extracted photon may be considered a first dirty photon which is generated by extraction from the coherent laser pulse using a quantum emitter coupled to a cavity. The cavity-coupled quantum emitter used for this extraction may be a different cavity-coupled quantum emitter from the quantum emitter coupled to the cavity to entangle the first photonic qubit with the second photonic qubit. Thus, this extraction cavity-coupled quantum emitter may be an additional quantum emitter to the quantum emitter used for the entangling.

By way of non-limiting example, FIG. 15(A) to FIG. 15(C), illustrates a single-photon Raman interaction (SPRINT) mechanism used in such a photon extraction from a coherent laser pulse, which is based on a quantum emitter coupled to a cavity. This photon extraction is based on a single-photon Raman interaction (SPRINT) mechanism described in Bechler ( ) et. al. "A passive photon-atom qubit swap operation" *Nature Physics* 14, 996-1000 (2018), Rosenblum S. et. al. "Extraction of a single photon from an optical pulse" *Nature Photon* 10, 19-22 (2016) and Shomroni, I. et al. "All-optical routing of single photons by a one-atom switch controlled by a single photon" *Science* 345.6199, 903-906 (2014), the entire content and single photon extraction and SPRINT mechanism related contents of which are incorporated herein by reference. For example, quantum emitter 1432 is coupled to cavity 1434 at a coupling location 1420 as shown in FIG. 15(A). Two transitions in a multi-level quantum emitter (quantum emitter 1432 or e.g., a single atom such as Rb atom having at least two ground states and at least one exited state) are coupled via cavity 1434 (e.g., a micro-resonator) to different directions of waveguide 1433a. The arrangement of quantum emitter 1432, cavity 1434, and waveguide 1433a is such that light or a photon being carried in waveguide 1433a is evanescently coupled into cavity 1434 by waveguide 1433a. Here, being evanescently coupled refers to being able to interact or transfer through an evanescent field around a waveguide.

As shown in FIG. 15(A), a coherent laser pulse including a plurality of photons 1436a, 1436b, 1436c is introduced into waveguide 1443a. As shown in FIG. 15(B), first photon 1436a of the coherent laser pulse in waveguide 1433a coming from one direction then interacts with quantum emitter 1432 via cavity 1434 through its evanescent coupling 1435. This interaction causes first photon 1436a of the coherent laser pulse coming from this direction to be deterministically reflected as illustrated by reflected photon 1439a shown in FIG. 15(C) due to destructive interference in the transmission. This interaction between first photon 1436a and quantum emitter 1432 is analogous to mapping a quantum emitter qubit to a photonic qubit as described earlier with reference to a SWAP gate 201 from FIG. 2E. This interaction results in Raman transfer of quantum emitter 1432 from a ground state to another ground state, and quantum emitter 1432 becomes transparent to subsequent photons from that direction (e.g., second photon 1436b and third photon 1436c from the coherent laser pulse). In other words, as shown in FIG. 15(C), the subsequent photons (e.g., second photon 1436b and third photon 1436c from the coherent laser pulse) are just transmitted to the other end of waveguide 1433a. Reflected photon 1439a may then serve as the first dirty photon which is generated by extraction from the coherent laser pulse using quantum emitter 1432 coupled to cavity 1434. Therefore, a SPRINT mechanism-based cavity-coupled quantum emitter can be used to extract a dirty photon from a coherent laser pulse. The extracted dirty photon from this SPRINT mechanism is the first photon of the coherent laser pulse that interacted with the cavity-coupled quantum emitter for the first time, and hence reflected to be output in the direction from which it first came. As the subsequent photons of the coherent laser pulse are just transmitted, the first photon of the coherent laser pulse to interact with the cavity-coupled quantum emitter is extracted as a reflected photon, while the rest of the photons of the coherent laser pulse carries on as if unaffected.

In some embodiments, the second dirty photon is generated by extraction from a coherent laser pulse using a quantum emitter coupled to a cavity. For example, the second dirty photon may be generated by extraction from a coherent laser pulse in a similar manner to how the first dirty photon is generated by extraction from a coherent laser pulse described earlier. The first dirty photon and the second dirty photon, for example, may be generated by extraction from a coherent laser pulse using a quantum emitter coupled to a cavity. Examples described earlier in relation to generating the first dirty photon are also applicable to generating the second dirty photon. Similarly, in some embodiments, the third dirty photon and/or the additional photon may be generated by extraction from a coherent laser pulse using a quantum emitter coupled to a cavity.

In some embodiments, the first dirty photon is generated from a fluctuating quantum emitter. A fluctuating quantum emitter refers to a quantum emitter whose physical situation or property changes over time (at least temporally), as described earlier. For example, a quantum emitter may be fluctuating because its resonance frequency changes over time due to stray magnetic or electric fields. Such a fluctuating quantum emitter may be used to generate a first dirty photon. For example, a fluctuating quantum emitter may be used as a quantum emitter to be coupled to a cavity in a photon source unit for sourcing single photons (e.g., source unit 401 in FIG. 4A) or a photon generator (e.g., a quantum emitter 820 coupled with a cavity resonator 818 in FIG. 9B) described herein, so that the fluctuating quantum emitter may provide a photon upon excitation.

In some embodiments, the second dirty photon is generated from a fluctuating quantum emitter. For example, at least one of the first dirty photon and the second dirty photon may be generated from a fluctuating quantum emitter. In some embodiments, the third dirty photon and/or the additional photon are generated from a fluctuating quantum emitter. Examples described earlier in relation to a first dirty photon being generated from a fluctuating quantum emitter are also applicable to such embodiments.

In some embodiments, spectra of the first dirty photon and the second dirty photon are within an interaction bandwidth of the quantum emitter coupled to the cavity. A spectrum refers to a range of wavelengths of electromagnetic radiation. Spectra of the first dirty photon and the second dirty photon refer to ranges of wavelengths of electromagnetic radiation associated with the first dirty photon and the second dirty photon. An interaction bandwidth of the quantum emitter coupled to the cavity refers to a range of frequencies for which an interaction with the quantum emitter coupled to the cavity is possible. For example, an interaction bandwidth of the quantum emitter may be an absorption spectrum of the quantum emitter, where electromagnetic field is more likely to interact with the quantum emitter at frequencies that fall within the interaction bandwidth. Similarly, in some embodiments, spectra of the third dirty photon and/or the additional photon may be within an interaction bandwidth of the quantum emitter coupled to the cavity.

In some embodiments, the second temporal profile is different from the first temporal profile. A temporal profile refers to an envelope of a field of a propagating photon, as described earlier. Examples of a temporal profile include: an exponentially decreasing or increasing profile with a certain decay time and initial time; a constant profile with a certain initial time and final time; or a gaussian profile with specific average time and temporal variance. Thus, the second temporal profile of the second dirty photon being different from the first temporal profile of the first dirty photon refers to fields of the second and first dirty photons having profiles that act or change differently over time. Similarly, in some embodiments, temporal profile of the third dirty photon and/or the additional photon may be different from the first temporal profile.

In some other embodiments, the second temporal profile is the same as the first temporal profile. In such other embodiments, fields of the second and first dirty photons have profiles that act or change in the same way over time. Similarly, in some embodiments, temporal profile of the additional photon may be the same as the first temporal profile.

In some embodiments, at least one of the first dirty photon and the second dirty photon are obtained from an optical delay line. As described earlier, an optical delay line refers to a component or group of components arranged to introduce a time delay for a pulse of one or more photons. An optical delay line can have a fixed or tunable delay. For example, the optical delay line may be controlled by an optical switch determining whether an optical pulse passes through the delay line or not. The optical delay line may, for example, be implemented in free space, in fibers, and/or in on-chip waveguides. In an example, the optical delay line may be configured to synchronize a timing for obtaining at least one of the first and second dirty photons. For example, the optical delay line may be configured to carry at least one of the first and second dirty photons so that the first and second dirty photons are provided to the quantum emitter coupled to the cavity in a sequential manner, and so that the first and second dirty photons are entangled with the quantum emitter coupled to the cavity one by one. An optical switch for selectively engaging the optical delay line may also be provided with at least one processor or circuitry. Such a processor or circuitry may be configured to control the optical switch to lengthen a travel path of the at least one of the first and second dirty photons. In another example, when one or more photons are generated, the photons may be sent through a beam splitter creating two separate pulses, one or both pulses may then be directed into an optical delay line configured to create a time delay in the one or both pulses being carried by the optical delay line. The time delay may alter the temporal coherence of the photons, leading to the pulses having different temporal profiles and hence resulting in outputting of one or more dirty photons.

In some embodiments, the first dirty photon and the second dirty photon are each part of a graph, wherein the graph contains photonic qubits lacking quantum emitter qubits. A graph refers to a graph state, which represents an entanglement relationship between a group of qubits, a qubit being a basic unit of quantum information, as described earlier. This may mean that the graph is a photonic graph, and the first dirty photon and the second dirty photon do not come from a quantum emitter but from another source which does not involve a quantum emitter. In some embodiments, the first dirty photon and the second dirty photon are each part of a graph, wherein the graph contains photonic and quantum emitter qubits. This may mean that at least one of the first dirty photon and the second dirty photon comes from a quantum emitter, or a photon generator that uses a quantum emitter to generate a photon.

By way of non-limiting example, FIG. 14A illustrates an exemplary system 1400 or an exemplary device according to some embodiments related to generating photonic graph states for quantum computing. The system 1400 in FIG. 14A includes: cavity 1404; quantum emitter 1402 couplable to cavity 1404; photon generator 1416a, 1416b configured to generate dirty photons; and circuitry 1418 configured to perform a quantum computing method according to an embodiment related to generating photonic graph states for quantum computing described herein.

FIG. 14A shows two separate photon generators 1416a, 1416b but it is understood that a single photon generator may generate first dirty photon 1406a and second dirty photon 1406b. In some examples, according to some embodiments related to generating photonic graph states for quantum computing, photon generator 1416a, 1416b may include a quantum emitter coupled to a cavity (e.g., quantum emitter 1432 coupled to cavity 1434 in FIG. 15(A) to FIG. 15(C)), and photon generator 1416a, 1416b may be configured to generate first dirty photon 1406a and/or second dirty photon 1406b by extraction from a coherent laser pulse using the quantum emitter coupled to the cavity (e.g., quantum emitter 1432 coupled to cavity 1434 in FIG. 15(A) to FIG. 15(C),), as described earlier. In some examples, as described earlier, a quantum emitter in photon generators 1416a, 1416b may be an atom or a fluctuating quantum emitter.

In an example, circuitry 1418 may be configured to control photon generator 1416a, 1416b to generate first dirty photon 1406a having a first temporal profile and second dirty photon 1406b having a second temporal profile, and circuitry 1418 may be configured to use first dirty photon 1406a to form a first photonic qubit and use second dirty photon 1406b to form a second photonic qubit.

The system 1400 in FIG. 14A includes waveguides 1412a, 1412b configured to carry one or more photons or lasers. Waveguides 1412a, 1412b in FIG. 14A may, for example, serve the same purpose as waveguides 816, 910, 930 in FIG. 8 to FIG. 9C. Circuitry 1418 may include one or more linear optics elements configured to perform various functions involved in directing or transporting one or more photons, controlling a flow of one or more photons, manipulating states of the one or more photons, and/or performing quantum computations. For example, circuitry 1418 may be configured to use one or more linear optics elements to: couple quantum emitter 1402 to cavity 1404; use quantum emitter 1402 coupled to cavity 1404 to entangle the first photonic qubit with the second photonic qubit to form a pair of entangled photonic qubits 1408; and use the pair of entangled photonic qubits 1408 for quantum computation. In some disclosed embodiments related to generating photonic graph states for quantum computing, controller 1414 may be provided to control (e.g., direct or switch between different waveguides) flow of input and output photons between photon generator(s) and entangling gate(s). For example, such controller 1414 may include one or more processors. A memory, a circuit component or circuitry may also be provided for performing the controlling.

Circuitry 1418 may, for example, receive first dirty photon 1406a and second dirty photon 1406b from photon generator 1416a, 1416b and output first dirty photon 1406a and second dirty photon 1406b so that they may be carried in waveguides 1412a, 1412b as a sequence of photons. In an example, circuitry 1418 may also include an optical delay line configured to carry at least one of first dirty photon 1406a and second dirty photon 1406b, as described earlier for some embodiments related to generating photonic graph states for quantum computing. First dirty photon 1406a and second dirty photon 1406b may then interact with quantum emitter 1402 via cavity 1404 through evanescent coupling 1425 between first dirty photon 1406a or second dirty photon 1406b and cavity 1404 provided by waveguide 1412a, as described earlier with reference to FIG. 15(A) to FIG. 15(C). This interaction between quantum emitter 1402 and first dirty photon 1406a and second dirty photon 1406b may then lead entanglement of the first photonic qubit with the second photonic qubit, as described earlier in relation to some embodiments related to generating photonic graph states for quantum computing.

By way of non-limiting example, FIG. 14B illustrates an example process 1450 according to some embodiments related to generating photonic graph states for quantum computing. As examples of steps of the process are described throughout this disclosure, those examples described earlier are not repeated or are simply summarized in connection with FIG. 14B. In some disclosed embodiments, the example process 1450 is performed by at least one processor or circuitry, for example in control system 1031 and/or photonic chips 1015 of FIG. 10, or in circuitry 1418 and/or controller 1414 of FIG. 14A, to perform operations or functions described herein. In some disclosed embodiments, some aspects of the process 1450 may be implemented as software (e.g., program codes or instructions) that are stored in a memory provided with the at least one processor, or a non-transitory computer readable medium or a computer readable medium. In some embodiments, some aspects of the process 1450 may be implemented as hardware (e.g., a specific-purpose circuit). In some embodiments, the process 1450 may be implemented as hardware or as a combination of software and hardware.

FIG. 14B includes process steps (or method steps) 1452 to 1464. It will be readily appreciated that various implementations are possible and that any combination of components or devices may be utilized to implement the example process. It will also be readily appreciated that the illustrated process can be altered to modify the order of steps, delete steps, or further include additional steps, such as steps directed to examples or embodiments described herein.

At step 1452, the process involves coupling a quantum emitter to a cavity. As described earlier, FIG. 14A and FIG. 15(A) to FIG. 15(C) illustrate examples of quantum emitter 1402, 1432 coupled to cavity 1404, 1434.

At step 1454, the process involves generating a first dirty photon having a first temporal profile, and at step 1456, using the first dirty photon to form a first photonic qubit. At step 1458, the process involves generating a second dirty photon having a second temporal profile, and at step 1460, using the second dirty photon to form a second photonic qubit. As described earlier, FIG. 14A illustrates examples of first dirty photon 1406*a* and second dirty photon 1406*b*, which are used to form the first and second photonic qubits.

At step 1462, the process involves using the quantum emitter coupled to the cavity to entangle the first photonic qubit with the second photonic qubit to form a pair of entangled photonic qubits. At step 1464, the process involves using the pair of entangled photonic qubits for quantum computation. FIG. 14A illustrates an example pair of entangled photonic qubits 1408, as described earlier.

As mentioned previously, conventional quantum computation relies on linear optics to generate a graph, which requires photons used therewith to be almost indistinguishable ("clean") so that a destructive interference can be achieved. In such conventional quantum computation, any distinguishability between photons results in a degradation in fidelity of a graph or errors. Using non-linear elements, for example using an interaction between a photon and a quantum emitter coupled to a cavity, quantum computation with distinguishable ("dirty") photons is possible. Embodiments related to generating photonic graph states for quantum computing described herein provide illustrative examples of such photonic quantum computation capable of using "dirty" (distinguishable) photons.

For example, the non-transitory computer-readable medium (or a computer-readable medium or a computer program) may include instructions that, when executed by at least one processor (or an apparatus), cause the at least one processor (or the apparatus) to carry out a process or a quantum computing method described herein. According to embodiments related to generating photonic graph states for quantum computing, the instructions may cause the at least one processor (or the apparatus) to carry out the quantum computing method or the process 1450 shown in FIG. 14B.

The same examples described earlier for each process or system feature of the embodiments related to generating photonic graph states for quantum computing are also applicable to corresponding features of this non-transitory computer-readable medium (or a computer-readable medium or a computer program) embodiment.

According to other embodiments related to generating photonic graph states for quantum computing, there are provided an apparatus, a device, a system, an integrated circuitry device, or circuitry, including at least one processor (and a memory) configured to carry out the quantum computing method or the process 1450 shown in FIG. 14B. The same examples described earlier for each process or system feature of the embodiments related to generating photonic graph states for quantum computing are also applicable to corresponding features of these embodiments.

According to yet another embodiment related to generating photonic graph states for quantum computing, a layout of an integrated circuit device or circuitry is provided, comprising layout portions, each layout portion defined to pattern each feature from the combination of features of the system 1400 in FIG. 14A or photon generator 1416*a* in FIG. 15(A) to FIG. 15(C). By way of example, a layout of an integrated circuit device or a circuitry, includes: a cavity layout portion defined to pattern a cavity; a coupling location layout portion defined to pattern a coupling location for coupling a quantum emitter to the cavity; a photon generator layout portion defined to pattern a photon generator or a channel for carrying a photon supplied by a photon generator toward the cavity; and circuitry layout portion defined to pattern circuitry. In some disclosed embodiments, the photon generator layout portion may be defined to pattern another cavity and another coupling location for coupling another quantum emitter to the other cavity. In some disclosed embodiments, circuitry layout portion may be defined to pattern one or more of: a waveguide for carrying one or more photons or lasers; and one or more linear optics elements for performing various functions involved in directing or transporting one or more photons, controlling a flow of one or more photons, manipulating states of the one or more photons, and/or performing quantum computations.

In some disclosed embodiments, the layout of an integrated circuit device or circuitry further comprises a controller layout portion defined to pattern a controller for controlling (e.g., directing or switching between different waveguides) flow of input and output photons between photon generator(s) and entangling gate(s), wherein the controller may comprise one or more processor and a memory, a circuit component or circuitry for performing the controlling.

It is understood that when a quantum emitter that can be lithographically located (e.g. a quantum dot) is used, the coupling location layout portion may be defined to also pattern the quantum emitter. The same examples described earlier for each process or system feature of the embodiments related generating photonic graph states for quantum computing are also applicable to corresponding features of this embodiment.

Some disclosed embodiments involve initializing a state of a resonator-coupled quantum emitter. A quantum emitter may include any component configured to couple to electromagnetic modes, a resonator may include any component that establishes electromagnetic modes, and a resonator-coupled quantum emitter may include a quantum emitter enabled to interact with a resonator. For example, a resonator coupled quantum emitter may include a component or group of components that confine an electromagnetic field in space and time. The component or group of components may support a discrete set of electromagnetic modes, each associated with a specific resonance frequency and lifetime of the confined field. Initializing the state of a resonator-coupled quantum emitter may involve setting a baseline condition for the resonator-coupled quantum emitter. For example, initializing may include establishing an inceptive tuned state system for the resonator-coupled quantum emitter. The initialized resonator-coupled quantum emitter may be one of a plurality of initialized resonator-coupled quantum emitters. The initialization of multiple resonator-coupled quantum emitters may occur simultaneously or sequentially.

By way of non-limiting example, FIG. 1 illustrates a four-state system 101 of an atom 102 contained within an optical cavity 103. This may involve preparing the resonator-coupled quantum emitter in a superposition of a first and second ground states. The initializing may involve inducing the resonator-coupled quantum emitter to undergo one or more transitions from a state to another state.

In some disclosed embodiments, initializing may cause the state of the resonator-coupled quantum emitter to be an equal superposition of two ground states. The ground state may be stationary state of lowest energy, and the energy of the ground state may be referred to as a zero-point energy. A superposition may refer to being in multiple states at the same time, for example until a measurement is taken. A superposition, for example, may refer to adding together (or superposing) of two or more quantum states, and an equal superposition may refer to having these two or more quantum states with an equal probability.

FIG. 2E and FIG. 3 illustrate an example of such an initialized state of a resonator-coupled quantum emitter, wherein the atom 102 (an example quantum emitter) is in an initial superposition state of first and second ground states 111, 113 after an initialization process. Frequencies of one or more transitions from one state to another may also be tuned by light-shift using a laser or through an application of a magnetic field.

By way of non-limiting example, embodiments related to entangling photonic graphs or those shown in FIG. 11A through FIG. 11D involve such initializing a state of a resonator-coupled quantum emitter (e.g., an example resonator 1733 and an example quantum emitter 1731 shown in FIG. 11C or FIG. 11D).

For example, the resonator may include a cavity, a photonic cavity, an optical cavity, a whispering gallery mode cavity, a Fabry-Perot cavity, or a ring (shaped) cavity. As described earlier, a resonator-coupled quantum emitter may include a quantum emitter whose dipole field overlaps with an electromagnetic mode of the resonator, e.g., a quantum emitter or an atom disposed within an intra-cavity field of the resonator. By way of non-limiting example, FIG. 11C illustrate an example of such a quantum emitter or an atom disposed within an intra-cavity field of the resonator with an example resonator 1733 and an example quantum emitter 1731.

By way of non-limiting example, the quantum emitter may be a stationary quantum system with an anharmonic spectrum, configured to couple to electromagnetic modes. In other words, as described earlier, a quantum emitter may be a stationary qubit capable of interacting with photons. For example, the quantum emitter may include a quantum system having one or more of: an electronic or nuclear configuration of an ion or a neutral atom; an electronic or nuclear configuration of a defect or a quantum dot in a material substrate; or a configuration of a superconducting circuit containing one or more Josephson Junctions. For example, the quantum emitter may be any one or more of a superconducting qubit, a quantum dot, an atom, a neutral atom, an ion, a rubidium atom, a cesium atom, Strontium, Erbium, Ytterbium, Calcium, Barium, Beryllium, or Magnesium atom (either neutral or in an ion form). For example, the quantum emitter may include a superconducting qubit. For example, the quantum emitter may include a quantum dot. For example, the quantum emitter may include an atom. An atom (e.g., a rubidium atom or a cesium atom) may be neutral. Alternatively, such an atom may be an ion. Similarly, if a Strontium, Erbium, Ytterbium, Calcium, Barium, Beryllium, or Magnesium atom is employed, such an atom may be neutral or in an ion form.

Some disclosed embodiments involve receiving at least two photonic graph states, each of the at least two photonic graph states containing at least two photons, and selecting at least one photon from each graph state. A graph state represents a relationship between a group of qubits, a qubit being a basic unit of quantum information, and a photonic graph state refers to a graph state, as described earlier, applied to photons. For example, a photonic graph state may include a photonic condition where vertices may be representative of photonic states, and where a photonic state refers to a condition of one or more photons. For example, each of the at least two photonic graph states may be a photonic graph state (e.g., a quantum state associated with degrees of freedom of one or more photons) described earlier, which is a quantum state representative of a composite quantum system. The composite quantum system may include multiple quantum subsystems. Each subsystem may be represented by a node or a vertex of a graph. For example, each photonic graph state may have vertices which are representative of photonic states, wherein each vertex corresponds to a single-photon qubit. For example, the single-photon qubit may describe a path of a single photon, the polarization of the single photon, the time-bin of the single photon, or the frequency of the single photon. Or, each vertex may correspond to a continuous-variable photonic qubit, wherein the qubit is representative of a pair of orthogonal superposition states of photon-number states.

At least two photonic graph states may be provided, for example, by a photonic graph state generator, e.g. a deterministic photonic graph state generator described herein, or any other type of generator capable of generating photonic graph states containing at least two photons. Selecting at least one photon from each graph state may involve carrying these at least two photons of each graph state in a channel (or a waveguide), and using a (beam) splitter to split the at least two photons into individual single photons, whereby at least one photon from each graph state is selected.

By way of non-limiting example, a switch such as the switches 1735, 1737 shown in FIG. 11D may be used to direct the at least two photons in a channel (or a waveguide) and/or split the at least two photons into individual single photons. Additionally or alternatively, the at least one photon may be provided, or made available for selection, using a single photon generator (e.g. a photon source unit described herein), a resonator-coupled quantum emitter configured to generate a photon described herein, and/or an optical cavity coupled atom configured to be used as a photon generator as shown in FIG. 8 to FIG. 9B.

Then at least one photon from each photonic graph state is selected for feeding through an entangling gate as described below so that the selected photons from the at least two photonic graph states can be entangled with each other and eventually entangle the at least two photonic graph states. For example, the entangled photonic states form or generate a larger cluster of entangled photons. The feeding through an entangling gate, for example, may be sequential.

By way of non-limiting example, a multi-dimensional cluster of entangled photons having one temporal dimension and one or more additional dimensions such as one or two spatial dimensions may be formed or generated. Such a cluster state may be represented by a graph which is a connected subset of a d-dimensional lattice. Non-limiting examples of such clusters include a cluster of photonic states 1041 shown in FIG. 10, a cluster of entangled photons 1748 shown in FIG. 11D, a time-sequenced cluster state of n photonic states in an entangled state in FIG. 6, and a time-sequence 405 of entangled photons in photonic clusters and/or graph states shown in FIG. 7.

By way of non-limiting example, embodiments related to entangling photonic graphs or those shown in FIG. 11A through FIG. 11D involve such receiving at least two photonic graph states, each of the at least two photonic graph states containing at least two photons and selecting at least one photon from each graph state.

Some disclosed embodiments involve feeding selected photons through an entangling gate via a resonator-coupled quantum emitter. For example, this feeding through an entangling gate via a resonator-coupled quantum emitter may involve feeding the selected photons sequentially, i.e., one by one, through a waveguide so that each selected photon interacts with a resonator-coupled quantum emitter via the resonator, whereby the photonic states of those selected photons become entangled with the state of the resonator-coupled quantum emitter, and hence with the state of each other.

As described earlier, an entangling gate refers to a component or group of components configured to entangle qubits. For example, an entangling gate may include a quantum circuit configured to entangle qubits. An entangling gate may include a resonator-coupled quantum emitter described earlier configured to function as an entangling gate. For example, the entangling gate may be one of a controlled-Z gate (CZ, gate), a controlled NOT gate (CNOT gate), a square root of a SWAP gate, or an imaginary SWAP gate (iSWAP gate). The resonator-coupled quantum emitter may be configured to function as any one or more of these gates.

By way of non-limiting example, FIG. 11C or FIG. 11D illustrate a resonator-coupled quantum emitter (e.g. an example resonator 1733 and an example quantum emitter 1731) being implemented as an entangling gate. FIG. 3 illustrates a controlled-Z gate implementation. FIG. 5A and FIG. 5B illustrate entanglement unit 501 (including an entanglement unit atom 502) being implemented as an entangling gate. And FIG. 8 and FIG. 9C illustrate a Rubidium ($^{87}$Rb) atom 820 coupled to a cavity 818 in configuration 810 being implemented as an entangling gate.

Non-limiting examples of a waveguide include the quantum waveguide 930 in FIG. 9A through FIG. 9C or the channel 1736 in FIG. 11C through FIG. 11D.

FIG. 11D illustrates a sequential feeding of photons through an entangling gate. In this example, photons 1743, 1745 from two graph states 1742, 1744 are sequentially fed to a channel 1736 (e.g. a waveguide) to form or generate a cluster of entangled photons 1748. Photon 1743 is selected from photonic graph state 1742 and photon 1745 is selected from photonic graph state 1744. These selected photons 1743, 1745 are sequentially fed through an entangling gate (e.g. a resonator-coupled quantum emitter such as an example resonator 1733 and an example quantum emitter 1731) to form or generate a cluster of entangled photonic states (e.g. a cluster of entangled photons 1748). The formed or generated cluster of entangled photonic state may then be used in performing operations in quantum computation.

FIG. 5B and FIG. 6 also show an example cluster in the form of a time-sequenced cluster state of n photonic states in an entangled state, wherein a time-sequenced series 412 of single photons generated by single photon source unit 401 in FIG. 4B are fed through entanglement unit 501 one by one to generate a time-sequential series 512 of entangled photons (e.g. steps 602 through 606 being repeated n times at step 608).

By way of non-limiting example, embodiments related to entangling photonic graphs or those shown in FIG. 11A through FIG. 11D involve such sequentially feeding the selected photons through an entangling gate via the resonator-coupled quantum emitter (e.g. via an example quantum emitter 1731 coupled to an example resonator 1733 shown in FIG. 11C or FIG. 11D).

Some disclosed embodiments involve disentangling a resonator-coupled quantum emitter from one or more selected photons. Disentangling refers to freeing something from an entanglement (e.g. removing the entangled condition). Disentangling a resonator-coupled quantum emitter from one or more selected photons refers to freeing a resonator-coupled quantum emitter from a photon-quantum emitter entanglement described earlier, wherein a state of the quantum emitter is entangled with state(s) of the one or more selected photons (photonic states). For example, the disentangling may include at least one of detecting the state of the resonator-coupled quantum emitter or mapping the state of the resonator-coupled quantum emitter to a state of an additional photon.

Detecting the state of the resonator-coupled quantum emitter collapses entanglement with the last photon it interacted with, disentangling the resonator-coupled quantum emitter from that photon and any other photon that the resonator-coupled quantum emitter had interacted with previously.

As described earlier, mapping a state of a resonator-coupled quantum emitter to a state of an additional photon refers to transferring a state of the resonator-coupled quantum emitter qubit to the additional photon qubit. For example, mapping a state of a resonator-coupled quantum emitter to a state of an additional photon may be a consequence of performing a SWAP gate operation on the quantum emitter qubit and the additional photon qubit, wherein the SWAP gate operation results in the state of the resonator-coupled quantum emitter being transferred to the additional photon and the state of the additional photon being transferred to the resonator-coupled quantum emitter. In other words, the mapping may be achieved by applying a SWAP gate on the quantum emitter and an additional photon. As described earlier, feeding an additional photon at a frequency corresponding to a frequency of a particular transition of the resonator-coupled quantum emitter may map a state of the resonator-coupled quantum emitter onto the additional photon while leaving the resonator-coupled quantum emitter disentangled from the selected photons because the state of the resonator-coupled quantum emitter has been swapped with the state of that additional photon.

Step 610 of FIG. 6 illustrates an example of disentangling which involves performing a measurement on the entanglement unit atom, in other words detecting a state of the entanglement unit atom (which is an example of the resonator-coupled quantum emitter such as the atom 502). For example, this measurement may be measurement 200 illustrated schematically in FIG. 2E. Carrying out measurement 200 disentangles the entanglement unit atom from being quantum entangled with the photons, leaving a time-sequenced cluster state of n photonic states in an entangled state to be output for qubit use in quantum computing.

FIG. 2E illustrates an example of disentangling which involves mapping from an atom to a photon using a SWAP gate 201, which may be used to perform a "read" or a "write" operation on a qubit of the atom 102. In the illustrated example, the state of an incoming photon is swapped with the state of the atom (which is an example of the resonator-coupled quantum emitter such as the atom 502).

By way of non-limiting example, embodiments related to entangling photonic graphs or those shown in FIG. 11A through FIG. 11D involve such disentangling the resonator-coupled quantum emitter (e.g. an example quantum emitter 1731 coupled to an example resonator 1733)) from selected photons. For example, the disentangling may include at least one of detecting the state of the resonator-coupled quantum emitter or mapping the state of the resonator-coupled quantum emitter to a state of an additional photon as described earlier.

By way of non-limiting example, FIG. 11A illustrates a quantum computing method 1710 according to an embodiment related to entangling photonic graphs to form or generate a cluster of entangled photons. The quantum computing method 1710 shown in FIG. 11A includes: step 1711 of initializing a state of a resonator-coupled quantum emitter; step 1713 of receiving at least two photonic graph states, each of the at least two photonic graph states containing at least two photons; step 1715 of selecting at least one photon from each graph state; step 1717 of feeding the selected photons through an entangling gate via the resonator-coupled quantum emitter; and step 1719 of disentangling the resonator-coupled quantum emitter from the selected photons. The feeding of the selected photons through an entangling gate may be sequential. For example, the disentangling includes at least one of step 1721 of detecting the state of the resonator-coupled quantum emitter or/and step 1722 of mapping the state of the resonator-coupled quantum emitter to a state of an additional photon as shown in FIG. 11B.

The same examples described earlier for each step of the embodiments related to entangling photonic graphs are also applicable to the embodiments shown in FIG. 11A and FIG. 11B.

Some disclosed embodiments involve a quantum computing system comprising a resonator-coupled quantum emitter, a plurality of switches, and at least one processor or circuitry configured to control the plurality of switches.

For example, a resonator-coupled quantum emitter may be as described earlier. A resonator may be a ring-shaped whispering gallery mode cavity. Alternatively or additionally, the resonator may include a resonator of a different shape and/or configuration, which is couplable to the quantum emitter to achieve the same effect. The resonator may be capable of interacting with the quantum emitter to facilitate an interaction between a photon being carried in a waveguide and the quantum emitter. For example, the resonator may have an electromagnetic mode which overlaps with dipole field of the quantum emitter, and/or has an intra-cavity field within which the quantum emitter can be disposed or positioned.

A switch refers to a component or group of components configured to establish or break a connection in a circuit. The plurality of switches, for example, may be a component or group of components capable of establishing or breaking a connection with a channel (a waveguide) through which a photon, a pulse of one or more photons, a laser, or any electromagnetic beam may be carried.

At least one processor may include any physical device or group of devices having electric circuitry that performs a logic operation on an input or inputs. The quantum computing system may also include a memory for storing instructions to be executed by the at least one processor.

Circuitry may include one or more functional units (or one or more layout portions), wherein each functional unit (or each layout portion) is configured to perform one or more process steps. The one or more functional units (or the one or more layout portions) may be arranged (e.g. positioned and connected with each other or with another functional unit or with another layout portion) so that the circuitry is capable of performing some or all steps of the method or the process. For example, circuitry may perform some or all steps of a method or a process according to some disclosed embodiments.

For example, the at least one processor or the circuitry may be configured to control the plurality of switches to perform one or more steps of a quantum computing method described herein.

FIG. 11C illustrates an example of a quantum computing system 1730 according to an embodiment related to entangling photonic graphs to form or generate a cluster of entangled photons. The quantum computing system 1730 may be related to the quantum computing method 1710 shown in FIG. 11A and FIG. 11B. For example, the quantum computing system 1730 may be configured to perform the quantum computing method 1710. The quantum computing system shown in FIG. 11C comprises: a resonator-coupled quantum emitter 1731 (e.g. an example quantum emitter 1731 coupled to an example resonator 1733 shown in FIG. 11C); a plurality of switches 1735, 1737; and at least one processor (or a controller 1739 shown in FIG. 11C) configured to control the plurality of switches 1735, 1737 to: initialize a state of the resonator-coupled quantum emitter 1731; receive at least two photonic graph states, each of the at least two photonic graph states containing at least two photons; select at least one photon from each graph state; feed the selected photons through an entangling gate via the resonator-coupled quantum emitter 1731; and disentangle the resonator-coupled quantum emitter 1731 from the selected photons. The feeding of the selected photons through an entangling gate may be sequential. The disentangling may involve at least one of detecting the state of the resonator-coupled quantum emitter 1731 or mapping the state of the resonator-coupled quantum emitter 1731 to a state of an additional photon.

The quantum computing system 1730 in FIG. 11C may also include a plurality of channels 1736 (e.g., waveguides) for carrying a laser (or a pulse) or a magnetic field applicator (e.g., a magnetic field generator or a solenoid) for initializing the state of the resonator-coupled quantum emitter 1731, the at least two photons, and/or the additional photon. The quantum emitter 1731 may be coupled to a resonator which may be a ring-shaped whispering gallery mode cavity 1733 as shown in FIG. 11C. It is understood that another resonator of a different shape and/or configuration may be coupled to the quantum emitter 1731 to achieve the same effect as long as the other resonator is capable of being coupled with the quantum emitter as described earlier.

The plurality of switches includes a switch such as switches 1735, 1737 shown in FIG. 11D), which can be used to direct the at least two photons to a channel (or a waveguide) and/or to direct the at least two photons when splitting the at least two photons into individual single photons.

FIG. 11D illustrates an example of an embodiment related to entangling photonic graphs, wherein the quantum computing system 1730 shown in FIG. 11C is used to entangle photonic graphs 1742, 1744 to form or generate a cluster of entangled photons 1748. As described earlier, the selected photon 1743 (from photonic graph state 1742) and the selected photon 1745 (from photonic graph state 1744) may be sequentially fed through an entangling gate (e.g. a resonator-coupled quantum emitter such as an example resonator 1733 and an example quantum emitter 1731 shown in FIG. 11C or FIG. 11D via a channel 1736 (e.g. a waveguide), whereby selected photons 1743, 1745 interact with resonator-coupled quantum emitter 1733, 1731 and become entangled, eventually forming or generating a cluster of entangled photons 1748 when all the photons from photonic graph states 1742, 1744 have gone through the entailing gate. The cluster of entangled photons 1748 may then be used in performing operations in quantum computation.

The same examples described earlier for each step of the embodiments related to entangling photonic graphs are also applicable to corresponding system features of the embodiments shown in FIG. 11C and FIG. 11D.

Some disclosed embodiments involve a non-transitory computer-readable medium (or a computer-readable medium or a computer program) including instructions that, when executed by at least one processor (or an apparatus), cause the at least one processor (or the apparatus) to carry out a method or a process according to some disclosed embodiments.

For example, the non-transitory computer-readable medium (or a computer-readable medium or a computer program) may include instructions that, when executed by at least one processor (or an apparatus), cause the at least one processor (or the apparatus) to carry out a quantum computing method described herein. According to embodiments related to entangling photonic graphs to form or generate a cluster of entangled photons, the instructions may cause the at least one processor (or the apparatus) to carry out a quantum computing method 1710 shown in FIG. 11A or FIG. 11B.

The same examples described earlier for each step of the embodiments related to entangling photonic graphs are also applicable to corresponding features of this non-transitory computer-readable medium (or a computer-readable medium or a computer program) embodiment.

According to other embodiments related to entangling photonic graphs to form or generate a cluster of entangled photons, there are an apparatus, a device, a system, an integrated circuitry device, or circuitry, comprising at least one processor (and a memory) configured to carry out the quantum computing method 1710 shown in FIG. 11A or FIG. 11B. The same examples described earlier for each step of the embodiments related to entangling photonic graphs are also applicable to corresponding features of these embodiments.

According to yet another embodiment related to entangling photonic graphs to form or generate a cluster of entangled photons, there is a layout of an integrated circuit device or circuitry, comprising layout portions, each layout portion defined to pattern each feature from the combination of features of the quantum computing system 1730 shown in FIG. 11C or FIG. 11D). For example, there is a layout of an integrated circuit device or a circuitry, comprising: a resonator-coupled quantum emitter layout portion defined to pattern one or more resonators and at least one coupling locations for positioning a resonator-coupled quantum emitter (e.g. an example resonator 1733 and an example quantum emitter 1731 in FIG. 11C or FIG. 11D); a switch layout portion defined to pattern a plurality of switches 1735, 1737; and a controller layout portion defined to pattern at least one processor (or a controller 1739 in FIG. 11C or FIG. 11D configured to control the plurality of switches 1735, 1737 to: initialize a state of the resonator-coupled quantum emitter 1731; receive at least two photonic graph states, each of the at least two photonic graph states containing at least two photons; select at least one photon from each graph state; feed the selected photons through an entangling gate via the resonator-coupled quantum emitter 1731; and disentangle the resonator-coupled quantum emitter 1731 from the selected photons. The feeding of the selected photons through an entangling gate may be sequential. The disentangling may involve at least one of detecting the state of the resonator-coupled quantum emitter 1731 or mapping the state of the resonator-coupled quantum emitter 1731 to a state of an additional photon. The layout of an integrated circuit device or circuitry may also include a channel layout portion defined to pattern a plurality of channels 1736 (e.g. waveguides) for carrying a laser (or a pulse) or a magnetic field applicator (e.g. a magnetic field generator or a solenoid) for initializing the state of the resonator-coupled quantum emitter 1731, the at least two photons, and/or the additional photon.

It is understood that when a quantum emitter that can be lithographically located (e.g. a quantum dot) is used, the resonator-coupled quantum emitter layout portion may be defined to pattern one or more resonators and the resonator-coupled quantum emitter (e.g. the quantum dot). The same examples described earlier for each step of the embodiments related to entangling photonic graphs are also applicable to corresponding features of this embodiment.

According to yet another embodiment related to entangling photonic graphs to form or generate a cluster of entangled photons, there is a method for controlling or initializing the quantum computing system 1730 shown in FIG. 11C, wherein the method comprises corresponding method steps of the quantum computing method 1710 shown in FIG. 11A or FIG. 11B. According to yet other embodiments related to entangling photonic graphs to form or generate a cluster of entangled photons, there are a signal or a data carrier signal carrying a cluster, a graph state or photonic qubits generated using the quantum computing system 1730 shown in FIG. 11C or FIG. 11D), or the quantum computing method 1710 shown in FIG. 11A or FIG. 11B. The same examples described earlier for each step of the embodiments related to entangling photonic graphs are also applicable to corresponding features of these embodiments.

The embodiments related to entangling photonic graphs described herein are capable of entangling photonic graphs using a quantum emitter-photon entangling gate. For example the quantum computing system 1730 shown in FIG. 11C or FIG. 11D, or the quantum computing method 1710 shown in FIG. 11A or FIG. 11B, may be used to form or generate a cluster of photonic states (e.g. a cluster of entangled photons 1748 shown in FIG. 11D)). Such a quantum emitter-photon entangling gate, for example an atom-photon controlled-Z (CZ) gate, can be used to entangle photonic graphs to form larger clusters of entangled photonic states. This way of entangling photonic graphs can result in a cluster of dirty (distinguishable) photons, wherein a dirty photon refers to a distinguishable photon which is distinguishable from another photon. For example, as described earlier, a dirty photon may include a propagating (itinerant) photon in a mixed state of multiple spatio-temporal modes, e.g. of multiple temporal profiles. However, it is understood that use of such quantum emitter-photon entangling gate (e.g. a resonator-coupled quantum emitter) when performing quantum logic gate operations means quantum computation operations can be performed using this cluster of dirty (distinguishable) photons even when these photons exhibit irregularities that make them distinguishable.

Some disclosed embodiments involve a resonator-coupled quantum emitter having at least four levels arranged in an N-configuration, the N-configuration having a first ground state, a second ground state, a first excited state and a second excited state. The excited state and ground state are relative terms in that the excited state is one that has a higher energy level than the ground state. For example, a ground state may refer to a stationary state of lowest energy, and the energy of the ground state may be referred to as a zero-point energy. An excited state refers to any quantum state that has a higher energy than the ground state. Excitation refers to an increase in energy level above a chosen starting point, which usually is the ground state but sometimes can also be an already-excited state. Spontaneous or induced emission of a quantum of energy (such as a photon or a phonon) may occur shortly after a system (e.g., a quantum emitter or an atom) is promoted to an excited state, returning the system to a state with lower energy, e.g., a less excited state or the ground sate. N-configuration refers to an arrangement that may be represented by the shape of the letter "N". At least four levels arranged in an N-configuration refers to each of the at least four levels being represented by an endpoint or a vertex in the "N" shape, and a transition connecting a lower level with a higher level being represented by an edge in the "N" shape. For example, the at least four levels may refer to at least four energy levels of the resonator-coupled quantum emitter, each energy level corresponding to one of the first ground state, the second ground state, the first excited state, or the second excited state, and each edge in the N-configuration may represent a transition between one ground state and one excited state.

According to some embodiments of an N-configuration resonator-coupled quantum emitter, for example those shown in FIG. 16A through FIG. 16D (e.g. an example resonator 1833, 1863 and an example quantum emitter 1831 shown in FIG. 16B through FIG. 16D), by controlling or setting the first ground state, the second ground state, the first excited state, the second excited state, and frequencies of transitions between two of those states of a resonator-coupled quantum emitter, the resonator-coupled quantum emitter may be configured to perform different types of operations. This enables controlling of the resonator-coupled quantum emitter to perform different operations. For example, the same resonator-coupled quantum emitter may be controlled so that it may be used for performing a SWAP gate operation or a controlled-Z (CZ) gate operation. A controlled magnetic field with a particular frequency and amplitude, for example, may enable control or manipulation of energy levels associated with those states, whereby a particular type of photon may be generated, released, or emitted from the resonator-coupled quantum emitter.

As described earlier, a quantum emitter includes any component configured to couple to electromagnetic modes; a resonator includes any component that establishes electromagnetic modes; and a resonator-coupled quantum emitter may include a quantum emitter enabled to interact with a resonator. For example, a resonator coupled quantum emitter may include a component or group of components that confine an electromagnetic field in space and time. The component or group of components may support a discrete set of electromagnetic modes, each associated with a specific resonance frequency and lifetime of the confined field. The resonator, for example, may include a cavity, a photonic cavity, an optical cavity, a whispering gallery mode cavity, a Fabry-Perot cavity, or a ring (shaped) cavity. As described earlier, a resonator-coupled quantum emitter may include a quantum emitter whose dipole field overlaps with an electromagnetic mode of the resonator, e.g. a quantum emitter or an atom disposed within an intra-cavity field of the resonator. By way of non-limiting example, FIG. 16B through FIG. 16D illustrate examples of such a quantum emitter disposed within an intra-cavity field of the resonator with example resonator 1833, 1863 and example quantum emitter 1831.

The quantum emitter may, for example, be a stationary quantum system with an anharmonic spectrum, configured to couple to electromagnetic modes of a resonator. As described earlier, a quantum emitter may be a stationary qubit capable of interacting with photons. For example, the quantum emitter may include a quantum system having one or more of: an electronic or nuclear configuration of an ion or a neutral atom; an electronic or nuclear configuration of a defect or a quantum dot in a material substrate; or a configuration of a superconducting circuit containing one or more Josephson Junctions. For example, the quantum emitter may include any one or more of a superconducting qubit, a quantum dot, an atom, a neutral atom, an ion, a rubidium atom, a cesium atom, Strontium, Erbium, Ytterbium, Calcium, Barium, Beryllium, or Magnesium atom (either neutral or in an ion form). For example, the quantum emitter may include one of a superconducting qubit or a quantum dot. For example, the quantum emitter may include an atom. The quantum emitter may, for example, include at least one of a rubidium atom or a cesium atom. The atom (or the rubidium atom or the cesium atom) may be neutral. Alternatively, the atom (or the rubidium atom or the cesium atom) may be an ion. In another example, the quantum emitter may include at least one of Strontium, Erbium, Ytterbium, Calcium, Barium, Beryllium, or Magnesium atom, and, similarly, the atom may be neutral or in an ion form.

In some disclosed embodiments, a resonator coupled quantum emitter includes a quantum emitter coupled to at least one resonator. For example, the resonator coupled quantum emitter may be one quantum emitter coupled to one resonator. In another example, the resonator coupled quantum emitter may be one quantum emitter coupled to two resonators, or the resonator-coupled quantum emitter may include two resonators coupled to a single quantum emitter. In yet another example, the resonator-coupled quantum emitter may include more than two resonators coupled to a single quantum emitter.

By way of non-limiting examples, FIG. 1 illustrates a four-state system 101 of an atom 102 (which is an example of a quantum emitter) contained within an optical cavity 103 (which is an example of a resonator) having first ground state 111, first excited state 112, second ground state 113, and second excited state 114, FIG. 16B illustrates quantum emitter 1831 coupled to resonator 1833 wherein the resonator-coupled quantum emitter 1831 has first ground state 1821, second ground state 1823, first excited state 1822, and second excited state 1824 arranged in an N-configuration 1801, and FIG. 16D) illustrates two resonators 1833, 1863 coupled to single quantum emitter 1831.

Some disclosed embodiments involve initializing a state of a resonator-coupled quantum emitter. A state of a resonator-coupled quantum emitter refers to a condition or a configuration of the quantum emitter, as described earlier. For example, the state of a resonator-coupled quantum emitter may be an electronic state, a nuclear state, or a combination thereof. Initializing a state of a resonator-coupled quantum emitter may refer to setting a baseline condition for the resonator-coupled quantum emitter. For example, initializing may include establishing an inceptive tuned state system for the resonator-coupled quantum emitter. The inceptive tuned state system, for example, may refer to the resonator-coupled quantum emitter being in a particular state or a superposition state of states from its N-configuration of a first ground state, a second ground state, a first excited state, and a second excited state.

In some disclosed embodiments, the initializing of the state of the resonator-coupled quantum emitter includes preparing the resonator-coupled quantum emitter in a superposition state of the first ground state and the second ground state. A superposition may refer to being in multiple states at the same time, for example until a measurement is taken. A superposition, for example, may refer to adding together (or superposing) of two or more quantum states. For example, initializing a state of a resonator-coupled quantum emitter, setting a baseline condition, establishing an inceptive tuned state system, and/or preparing the resonator-coupled quantum emitter may involve using a pulse (e.g., a laser pulse or a group of photons) having an appropriate superposition of modes so that when the resonator-coupled quantum emitter interacts with the pulse, a desired state associated with the appropriate superposition of modes is mapped on to the resonator-coupled quantum emitter.

In some examples the superposition state is an equal superposition of the first ground state and the second ground state. An equal superposition may refer to having the two or more quantum states with an equal probability.

By way of non-limiting example, FIG. 2E and FIG. 3 illustrate an example of an initialized state of a resonator-coupled quantum emitter, wherein atom 102 (an example quantum emitter) is in an initial superposition state of first and second ground states 111, 113 after an initialization process, and FIG. 1 illustrates a four-state system 101 of an atom 102 contained within an optical cavity 103. Initializing this four-state system may involve preparing the resonator-coupled quantum emitter in a superposition of a first and second ground states. This initializing may involve inducing the resonator-coupled quantum emitter to undergo one or more transitions from a state to another state. For example, when entanglement unit atom 502, which also has a four-state system as in atom 102, is used in entanglement unit 501 in FIG. 5A and FIG. 5B described herein, initializing entanglement unit atom 502 involves preparing atom 502 into superposition state $1/\sqrt{2}(|0>_a+|1>_a)$. This is done by introducing a pulse 503 in the appropriate superposition of modes 1 and 2, in order to swap in the desired state.

Some disclosed embodiments involve tuning a frequency of a transition between two states. A transition refers to a change in energy level, e.g., a change from one state to another state. A frequency of a transition refers to an energy difference between the energy levels of the two states. When one or more photons with a frequency corresponding to the transition frequency interacts with a resonator-coupled quantum emitter, the transition may occur. Tuning a frequency of a transition refers to tweaking, adjusting and/or setting the frequency for that transition. For example, tuning a frequency of a transition between two states may involve one or more of: using a magnetic field and/or a laser. For example, turning a frequency of a transition may occur by light-shift using a laser and/or through Zeeman shift using a magnetic field.

Some disclosed embodiments involve one or more of: tuning a frequency of a first transition between the first ground state and the first excited state; tuning a frequency of a second transition between the second ground state and the second excited state; and tuning a frequency of a third transition between the second ground state and the first excited state. In an example, the tuning of the frequencies of the first transition, the second transition and the third transition starts before the initializing. The tuning of one or more of the frequencies of the transitions may occur by light-shift using a laser. The light-shift may refer to ac-Stark shift, which is a perturbative effect that shifts an atomic energy level in a laser field. The tuning of one or more of the frequencies of the transitions may occur through application of a magnetic field. For example, the tuning of one or more of the frequencies of the transitions may occur through application of a Zeeman shift using the magnetic field.

Figure 2A:
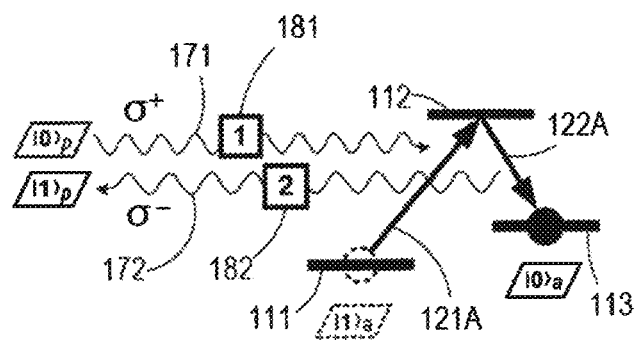
FIG. 2A is a state diagram for a process of the device shown in FIG. 1.
Figure 2B:
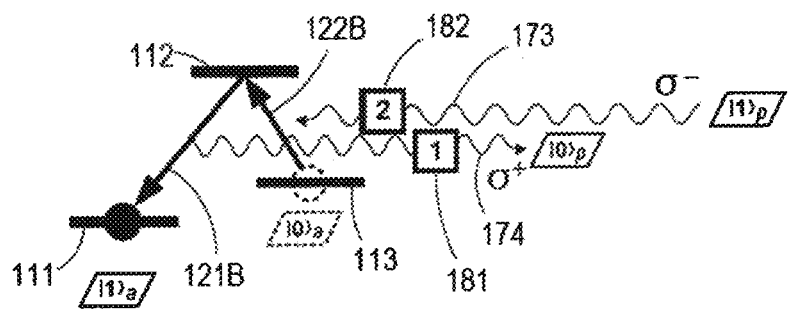
FIG. 2B is a state diagram for another process of the device shown in FIG. 1.

By way of non-limiting example, FIG. 1 illustrates a laser source 151 providing pulses for altering a state of atom 102 (an example of a quantum emitter coupled to a resonator), a magnet 141 for generating a magnetic field configured to ensure transitions are within a bandwidth of optical cavity 103 (an example of a resonator) and/or set energy levels of excited states or ground states, and transitions 121, 122, 123 having a particular energy being associated with a particular interacting photonic mode 1, 2, 3 as also shown in FIG. 2A and FIG. 2B.

By way of non-limiting example, FIG. 16B illustrates transitions 1841, 1842, 1843 and FIG. 16C illustrates a laser source 1851 and a magnetic field generator 1853 configured to provide a laser or a magnetic field usable in such tuning of a frequency of a transition.

Some disclosed embodiments involve feeding a plurality of photons at a frequency corresponding to the frequency of the second transition, thereby entangling the plurality of photons to the resonator-coupled quantum emitter. For example, feeding a plurality of photons includes sequentially feeding a plurality of single photons. This sequential feeding may involve feeding the plurality of photons one by one through a waveguide so that each photon interacts with a resonator-coupled quantum emitter via the resonator, whereby the plurality of photons is entangled with the resonator-coupled quantum emitter one by one. The second transition is between the second ground state and the second excited state. In an example, the resonator-coupled quantum emitter may be prepared/initialized in a superposition state of the first ground state and the second ground state, and when a photon at a frequency corresponding to the frequency of the second transition is fed to a waveguide, the photon interacts with the resonator-coupled quantum emitter via the resonator (through an evanescent field around the waveguide). This interaction causes the second transition from the second ground state to the second excited state of the resonator-coupled quantum emitter to occur. The resonator-coupled quantum emitter then transitions back to the second ground state, releasing or emitting an output photon. This sequence of events effects a pi phase shift to the emitted photon conditioned on the resonator-coupled quantum emitter being in the second ground state. The emitted photon may therefore be entangled with the resonator-coupled quantum emitter.

By way of non-limiting example, FIG. 16B illustrates second transition 1842 between second ground state 1823 and second excited state 1824 of quantum emitter 1831. By way of non-limiting example, FIG. 3 illustrates incoming photon 301 in mode 3 (photonic mode 3 being associated with transition 123 between second ground state 133 and second excited state 114), which causes transition 123A and then transition 123B to occur, whereby outgoing photon 302 entangled with atom 102 (which is an example of the resonator-coupled quantum emitter) is emitted.

For example, the entangling may involve using the resonator-coupled quantum emitter to function as an entangling gate. As described earlier, an entangling gate refers to a component or group of components or a control sequence configured to entangle qubits, e.g., photonic qubits of the plurality of photons. For example, an entangling gate may include a quantum circuit configured to entangle qubits. An entangling gate may include a resonator-coupled quantum emitter described earlier configured to function as an entangling gate. The entangling gate may, for example, be one of a controlled-Z gate (CZ gate), a controlled NOT gate (CNOT gate), a square root of a SWAP gate, or an imaginary SWAP gate (iSWAP gate). The resonator-coupled quantum emitter may be configured to function as any one or more of these gates.

By way of non-limiting example, FIG. 3 illustrates a controlled-Z, gate implementation, FIG. 5A and FIG. 5B illustrate entanglement unit 501 (including an entanglement unit atom 502) being implemented as an entangling gate, and FIG. 8 and FIG. 9C illustrate a Rubidium ($^{87}$Rb) atom 820 coupled to a cavity 818 in configuration 810 being implemented as an entangling gate.

Non-limiting examples of a waveguide to which photons may be fed include quantum waveguide 930 in FIG. 9A through FIG. 9C or waveguide 1838, 1868 in FIG. 16B through FIG. 16D. The photons may be fed sequentially.

Some disclosed embodiments involve feeding a photon at a frequency corresponding to the frequency of at least one of the first transition or the third transition, thereby mapping a state of the resonator-coupled quantum emitter into a photon. As described earlier, mapping a state of the resonator-coupled quantum emitter into a photon refers to transferring a state of the resonator-coupled quantum emitter qubit to the photon's qubit. For example, mapping a state of the resonator-coupled quantum emitter into a photon may be a consequence of performing a SWAP gate operation on the quantum emitter qubit and the photon's qubit, wherein the SWAP gate operation results in the state of the resonator-coupled quantum emitter being transferred to the photon and the state of the photon being transferred to the resonator-coupled quantum emitter. In other words, the mapping may be achieved by applying a SWAP gate on the quantum emitter and the photon.

As described earlier, feeding a photon at a frequency corresponding to the frequency of a particular transition of the resonator-coupled quantum emitter may map a state of the resonator-coupled quantum emitter onto the photon while leaving the resonator-coupled quantum emitter disentangled from previously interacted photons which are entangled with each other because the state of the resonator-coupled quantum emitter has been swapped with the state of the fed photon.

As the state of the fed photon is transferred to the resonator-coupled quantum emitter, feeding a photon at a frequency corresponding to the frequency of a particular transition of the resonator-coupled quantum emitter may also initialize the resonator-coupled quantum emitter to an initial state such as the first ground state or the second ground state. The first transition is between the first ground state and the first excited state, and the third transition is between the second ground state and the first excited state. Therefore, for example, feeding a photon at a frequency corresponding to the frequency of at least one of the first transition or the third transition further initializes the resonator-coupled quantum emitter to correspond to at least one of the first ground state or the second ground state. In an example, the resonator-coupled quantum emitter may be prepared/initialized in a superposition state of the first ground state and the second ground state, and when a photon at a frequency corresponding to a superposition of the frequency of the first transition and the frequency of the third transition is fed to a waveguide, the photon interacts with the resonator-coupled quantum emitter via the resonator (through an evanescent field around the waveguide). This interaction causes the superposition state of the photon to be swapped with the superposition state of the resonator-coupled quantum emitter.

By way of non-limiting example, FIG. 16B illustrates first transition 1841 between first ground state 1821 and first excited state 1822, and third transition 1843 between second ground state 1823 and first excited state 1822. By way of non-limiting example, FIG. 2E illustrates swap gate 201, wherein incoming photon 202 in a superposition of photonic modes 1 and 2 (photonic modes 1 and 2 being associated with transitions 121 and 122, respectively) causes transition 121A and then transition 122A in FIG. 2A, and transition 122B and then transition 121B in FIG. 2B to occur. Then outgoing photon 204 is left with the state of atom 102, and atom 102 is left with the state of the incoming photon 202.

FIG. 16A illustrates a quantum computing method 1810 according to an embodiment related to related to N-configuration resonator-coupled quantum emitter. The quantum computing method 1810 shown in FIG. 16A includes: step 1811 of initializing a state of a resonator-coupled quantum emitter having at least four levels arranged in an N-configuration, the N-configuration having a first ground state, a second ground state, a first excited state and a second excited state; step 1813 of tuning a frequency of a first transition between the first ground state and the first excited state; step 1815 of tuning a frequency of a second transition between the second ground state and the second excited state; step 1817 of tuning a frequency of a third transition between the second ground state and the first excited state; step 1818 of feeding a plurality of photons at a frequency corresponding to the frequency of the second transition, thereby entangling the plurality of photons to the resonator-coupled quantum emitter; and step 1819 of feeding a photon at a frequency corresponding to the frequency of at least one of the first transition or the third transition, thereby mapping a state of the resonator-coupled quantum emitter into a photon. In an example, at step 1818, the plurality of photons may be fed sequentially.

The same examples described earlier for each step of the embodiments related to N-configuration resonator-coupled quantum emitter are also applicable to the embodiments shown in FIG. 16A. For example, the initializing of the state of the resonator-coupled quantum emitter may include preparing the resonator-coupled quantum emitter in a superposition state of the first ground state and the second ground state. In an example, the tuning of the frequencies of the first transition, the second transition and the third transition may occur before the initializing. In an example, the tuning of one or more of the frequencies of the transitions occurs by light-shift using a laser or through application of a magnetic field. In an example, feeding a plurality of photons may include sequentially feeding a plurality of single photons. Feeding a photon at a frequency corresponding to the frequency of at least one of the first transition or the third transition may further initialize the resonator-coupled quantum emitter to correspond to at least one of the first ground state or the second ground state.

Some disclosed embodiments involve a quantum computing system comprising: a resonator-coupled quantum emitter having at least four levels arranged in an N-configuration, the N-configuration having a first ground state, a second ground state, a first excited state and a second excited state; and at least one processor or circuitry. For example, a resonator-coupled quantum emitter may be configured as described earlier. A resonator may be a ring-shaped whispering gallery mode cavity. Alternatively or additionally, the resonator may include a resonator of a different shape and/or configuration, which is couplable to the quantum emitter to achieve the same effect. The resonator may be capable of interacting with the quantum emitter to facilitate an interaction between a photon being carried in a waveguide and the quantum emitter. For example, the resonator may have an electromagnetic mode which overlaps with the dipole field of the quantum emitter, and/or has an intra-cavity field within which the quantum emitter can be disposed or positioned.

At least one processor may include any physical device or group of devices having electric circuitry that performs a logic operation on an input or inputs. The quantum computing system may also include a memory for storing instructions to be executed by the at least one processor.

Circuitry may include one or more functional units (or one or more layout portions), wherein each functional unit (or each layout portion) is configured to perform one or more process steps. The one or more functional units (or the one or more layout portions) may be arranged (e.g. positioned and connected with each other or with another functional unit or with another layout portion) so that the circuitry is capable of performing some or all steps of the method or the process. For example, circuitry may perform some or all steps of a method or a process according to some disclosed embodiments related to N-configuration resonator-coupled quantum emitter.

For example, FIG. 16B illustrates quantum computing system 1830 according to some embodiments related to an N-configuration resonator-coupled quantum emitter. Quantum computing system 1830 may be related to the quantum computing method 1810 shown in FIG. 16A. For example, quantum computing system 1830 may be configured to perform the quantum computing method 1810. The quantum computing system shown in FIG. 16B includes: a resonator-coupled quantum emitter (e.g. an example quantum emitter 1831 coupled to an example resonator 1833 shown in FIG. 16B through FIG. 16D) having at least four levels arranged in N-configuration 1801, N-configuration 1801 having first ground state 1821, second ground state 1823, first excited state 1822, and second excited state 1824; and at least one processor or circuitry 1839 configured to perform a quantum computing method described herein, e.g., the quantum computing method 1810.

Quantum computing system 1830 in FIG. 16B may also include a plurality of channels (e.g., waveguides 1836, 1838) for carrying a laser (or a pulse) or a magnetic field applicator (e.g. a magnetic field generator or a solenoid) for initializing the state of the resonator-coupled quantum emitter 1831. Waveguide 1836 may serve the same function as utility waveguide 910 in FIG. 9A through FIG. 9C, and waveguide 1838 may serve the same function as quantum waveguide 930 in FIG. 9A through FIG. 9C. Quantum emitter 1831 may be coupled to a resonator which may be a ring-shaped whispering gallery mode cavity 1833 as shown in FIG. 16B through FIG. 16I). Quantum emitter 1831 may be coupled to two resonators 1833, 1863 as shown in FIG. 16D. It is understood that another resonator of a different shape and/or configuration may be coupled to quantum emitter 1831 to achieve the same effect as long as the other resonator is capable of being coupled with the quantum emitter as described earlier.

FIG. 16C illustrates quantum computing system 1850 according to some embodiments related to N-configuration resonator-coupled quantum emitter. Compared to quantum computing system 1830, quantum computing system 1850 further includes at least one of: a laser source 1851; or a magnetic field generator 1853 configured to provide a laser or a magnetic field usable in initializing of the resonator-coupled quantum emitter and/or tuning of a frequency of a transition. Laser source 1851 may provide a laser for light-shifting (e.g., ac-Stark shift), thereby tuning at least one of the frequencies of the transitions. Magnetic field generator 1853 may provide a magnetic field, application of the magnetic field for tuning at least one of the frequencies of the transitions.

FIG. 16D illustrates quantum computing system 1860 according to some embodiments related to N-configuration resonator-coupled quantum emitter. Compared to quantum computing system 1830 or quantum computing system 1850, quantum computing system 1850 further includes an additional resonator 1863 and an additional waveguide 1868. In quantum computing system 1850, two resonators 1833, 1863 are coupled to single quantum emitter 1831, and each resonator 1833, 1863 is provided with its own waveguide 1838, 1868 for coupling a photon carried therein with associated resonator 1833, 1863 through an evanescent field established around waveguide 1838, 1868. It is understood that more than one top waveguide 1836 may also be provided so that each resonator has its own utility waveguide.

The same examples described earlier for each step of the embodiments related to N-configuration resonator-coupled quantum emitter, or for each step of quantum computing method 1810, are also applicable to these embodiments shown in FIG. 16B through FIG. 16D.

Some disclosed embodiments involve a non-transitory computer-readable medium (or a computer-readable medium or a computer program) including instructions that, when executed by at least one processor (or an apparatus), cause the at least one processor (or the apparatus) to carry out a method or a process according to some disclosed embodiments.

For example, the non-transitory computer-readable medium (or a computer-readable medium or a computer program) may include instructions that, when executed by at least one processor (or an apparatus), cause the at least one processor (or the apparatus) to carry out a quantum computing method described herein. According to embodiments related to N-configuration resonator-coupled quantum emitter or those shown in FIG. 16A through FIG. 16D), the instructions may cause the at least one processor (or the apparatus) to carry out a quantum computing method 1810 shown in FIG. 16A.

The same examples described earlier for each step of the embodiments related to N-configuration resonator-coupled quantum emitter or those shown in FIG. 16A through FIG. 16D are also applicable to corresponding features of this non-transitory computer-readable medium (or a computer-readable medium or a computer program) embodiment.

Other embodiments related to N-configuration resonator-coupled quantum emitters include an apparatus, a device, a system, an integrated circuitry device, or circuitry, comprising at least one processor (and a memory) configured to carry out the quantum computing method 1810 shown in FIG. 16A. The same examples described earlier for each step of the embodiments related to N-configuration resonator-coupled quantum emitter are also applicable to corresponding features of these embodiments.

Yet another embodiment related to an N-configuration resonator-coupled quantum emitter, includes a layout of an integrated circuit device or circuitry, having layout portions, each layout portion defined to pattern each feature from the combination of features of the quantum computing system 1830, 1850, 1860 shown in FIG. 16B through FIG. 16D. For example, some embodiments may include a layout of an integrated circuit device or a circuitry, having: a resonator-coupled quantum emitter layout portion defined to pattern one or more resonators and at least one coupling locations for positioning a resonator-coupled quantum emitter (e.g., example resonator 1833, 1863 and example quantum emitter 1831 in FIG. 16B, FIG. 16C, or FIG. 16D); and circuitry layout portion defined to pattern circuitry (e.g., at least one processor or circuitry 1839 in FIG. 16B through FIG. 16D) configured to perform a quantum computing method described herein, e.g., the quantum computing method 1810.

The resonator-coupled quantum emitter layout portion may be defined to pattern two or more resonators associated with one coupling location for positioning one resonator-coupled quantum emitter (e.g., example resonator 1833, 1863 and example quantum emitter 1831 in FIG. 16D)). It is understood that when a quantum emitter that can be lithographically located (e.g. a quantum dot) is used, the resonator-coupled quantum emitter layout portion may be defined to pattern the resonator-coupled quantum emitter (e.g. the quantum dot). The same examples described earlier for each step of the embodiments related to N-configuration resonator-coupled quantum emitter or those shown in FIG. 16A through FIG. 16D are also applicable to corresponding features of this embodiment.

The layout of an integrated circuit device or circuitry may also include a channel layout portion defined to pattern a plurality of channels (e.g., waveguides 1836, 1838) for carrying a laser (or a pulse) or a magnetic field applicator (e.g., a magnetic field generator or a solenoid) for initializing the state of the resonator-coupled quantum emitter 1831.

The layout of an integrated circuit device or circuitry may also include laser or magnetic field layout portion defined to pattern at least one of a laser source 1851 or a magnetic field generator 1853 configured to provide a laser or a magnetic field usable in initializing of the resonator-coupled quantum emitter and/or tuning of a frequency of a transition.

According to yet another embodiment related to N-configuration resonator-coupled quantum emitter, a method is provided for controlling the quantum computing system 1830, 1850, 1860 shown in FIG. 16B through FIG. 16D, wherein the method includes corresponding method steps of the quantum computing method 1810 shown in FIG. 16A. According to yet other embodiments related to N-configuration resonator-coupled quantum emitter, there may be provided a signal or a data carrier signal carrying a plurality of photons entangled to the resonator-coupled quantum emitter 1831 shown in FIG. 16B through FIG. 16D), or the quantum computing method 1810 shown in FIG. 16A. The same examples described earlier for each step of the embodiments related to N-configuration resonator-coupled quantum emitter or those shown in FIG. 16A through FIG. 16D also applicable to corresponding features of these embodiments.

Quantum computation can exploit entanglement between entangled states to perform certain quantum computation operations and/or algorithms. In most conventional photonic quantum computing systems, an output from a source of entangled states, which are sometimes referred to as a Resource State Generator (RSG), is obtained via probabilistic schemes. This means performing quantum computation with or production of this type of output involves taking feedforward measurements (also referred to as heralding) into account due to unpredictable or inconsistent input. Some embodiments described herein are capable of outputting entangled states (e.g., a photonic graph state or a plurality of entangled photons) in a deterministic manner, i.e., of outputting predictable or consistent entangled states via deterministic schemes. This then removes the need for accounting for the feedforward (heralding) when performing quantum computations, for example when performing computation which involves generating photonic graphs. For example, some disclosed embodiments relate to use of heralding-free connections and a Resource State Generator that is capable of generating or outputting entangled states (e.g., a photonic graph state or a plurality of entangled photons) in a deterministic manner.

Some embodiments involve a quantum computing system. Quantum computing refers to a computation performed through utilization or application of one or more quantum state properties, such as superposition, entanglement and interference.

Some embodiments involve a quantum computing system having a plurality of photonic processing stages. A photonic processing stage refers to a group of components configured to receive one or more photons as input, perform one or more operations with, or on, the one or more photons, and output an outcome from the one or more operations. For example, the one or more operations may include a spatial or temporal operations causing emission, transmission, amplification, detection, and/or modulation of a pulse comping the one or more photons. In some embodiments, each photonic processing stage includes at least two linear optics elements. In some embodiments, each photonic processing stage includes at least two of an optical switch, a beam splitter, a waveguide, or a photon generator. In an example, the optical switch may include a phase shifter. In such an example, the decisions about stage settings may include decisions about settings of the phase shifter. Stage settings may refer to parameters for use by one or more components of the photonic processing stage.

In some embodiments, the photon generator that may be included in a photonic processing stage may include a quantum emitter coupled to a resonator. In other words, the photon generator includes a quantum emitter coupled to a resonator.

A photon generator or a photon source unit for sourcing photons described herein is a non-limiting example of such a photon generator capable of providing photons. By way of non-limiting example, FIG. 4A and FIG. 4B illustrate an emitted photon 406 and a time sequential series 412 of output photons, which may be single photons, being generated by source unit 401 (including a source unit atom 402 as quantum emitter). In another non-limiting example, FIG. 8 to FIG. 9B also illustrate a photon, which may be a single photon, being generated and output by a Rubidium ($^{87}$Rb) atom 820 coupled to a cavity 818. Turning to source unit 401 in FIG. 4A and FIG. 4B, source unit 401 includes a cavity, such as optical cavity 103 of FIG. 1, and atom 402 (e.g., a quantum emitter). After initializing pulse 403 initializes the state of atom 402 to be in state 111 (FIG. 1), generating pulse 404 may cause transition 121A and transition 122A of FIG. 2A, resulting in atom 402 emitting photon 406. Repeating this process produces a time sequential series 412 of output photons in FIG. 4B. According to some embodiments, generating pulse 404 is not required to be precisely controlled, e.g., in terms of its pulse time and/or shape, and the output photons may therefore potentially be dirty. Output photons being dirty refers to the output photons having temporal profiles which may exhibit irregularities and hence be potentially distinguishable from one another. For example, some disclosed embodiments related to use of heralding-free connections may be such embodiments because use of heralding-free connections in quantum computing may be enabled from being able to use dirty photons when performing operations involved in quantum computing.

Each photonic processing stage may also include additional linear optics elements. For example, the additional linear optics elements may include one or more of: a channel (e.g., a waveguide), a reflector (e.g., a mirror), a beam splitter, a lens, a phase shifter, or another linear optics instrument capable of affecting or manipulating a property or motion of a photon.

In some embodiments, the photonic processing stages are separated in a time domain. Being separated in a time domain refers to the photonic processing stages being controlled in such a way so that each photonic processing stage is caused to perform a function at different times. The function may, for example, be receiving an input, perform an operation, and/or generate or output an output. In an example, a controller may control each photonic processing stages so that each photonic processing stage's input, operations and output are controlled in such a way that at least the inputs and outputs are controlled among a plurality of photonic processing stages so that one photonic processing stage's output may be fed as another photonic processing stage's input. By way of a non-limiting example, in FIG. 7, a plurality of photonic processing stages 702, 704, 706 are arranged along a temporal axis 405.

In some embodiments, the photonic processing stages are separated in a spatial domain. Being separated in a spatial domain refers to each photonic processing stage being located in a different area (volume or region) of space. Depending on the arrangement and connections between the photonic processing stages (e.g., using switches, connections, and/or channels such as waveguides), this may enable a plurality of photonic processing stages to function concurrently, e.g., in parallel, wherein outputs from those running in parallel may be controlled (e.g., synchronized) so that at least some of those outputs may be fed as another photonic processing stage's input. By way of a non-limiting example, in FIG. 7, a plurality of photonic processing stages is arranged along a spatial axis 710 as an array 708 of similar components fed by series of pulses displaced along the appropriate spatial axis 710.

Some embodiments involve a quantum emitter coupled to a resonator (or a resonator-coupled quantum emitter). In an example where a quantum computing system or a device comprises a plurality of photonic processing stages, at least some of the photonic processing stages may include a quantum emitter. The quantum emitter may be coupled to a resonator. For example, a photonic processing stage may include one or more resonator-coupled quantum emitters. A quantum emitter refers to a component configured to couple to electromagnetic modes, as described earlier. For example, a quantum emitter may include a stationary quantum system with an anharmonic spectrum, configured to couple to electromagnetic modes. A resonator (or a cavity) refers to a structure, enclosure or container that is a component for establishing or supporting oscillations and/or normal modes, as described earlier. The oscillations, for example, may be resonant oscillations at a discrete set of resonant frequencies. For example, a resonator may be capable of confining electromagnetic fields in electromagnetic modes having particular frequencies of oscillation. For example, the resonator may correspond to a cavity in a cavity QED setup, an optical cavity, a whispering gallery mode cavity, or a Fabry-Perot cavity. A quantum emitter coupled to a resonator (also referred to as a resonator-coupled quantum emitter) refers to a quantum emitter that is enabled to interact with a resonator. For example, a quantum emitter coupled to a resonator (or a resonator-coupled quantum emitter) may include a quantum emitter arranged to interact with an electromagnetic field confined by a resonator Therefore, a quantum emitter coupled to a resonator (or a resonator-coupled quantum emitter) may include a quantum emitter whose dipole field overlaps with an electromagnetic mode of a resonator. When a quantum emitter is coupled to a resonator in its associated coupling location, the quantum emitter is coupled to electromagnetic modes of the resonator, and thus the resonator-coupled quantum emitter may be configured to release or emit a photon when excited (e.g., functioning as a photon generator) or interact with a photon being carried in a waveguide nearby the resonator via its coupling with the resonator (e.g., functioning as a SWAP gate or an entangling gate for entangling photons, as described earlier).

By way of non-limiting example, FIG. 4A and FIG. 4B illustrate source unit 401 (including a source unit atom 402 as quantum emitter) being implemented as a photon generator, FIG. 8 to FIG. 9B illustrate a Rubidium ($^{87}$Rb) atom 820 as a quantum emitter being coupled to a cavity 818 (which is an example of a resonator) to function as a photon generator, FIG. 5A and FIG. 5B illustrate entanglement unit 501 (including an entanglement unit atom 502 as quantum emitter) being implemented as an entangling gate, FIG. 8 and FIG. 9C illustrate a Rubidium ($^{87}$Rb) atom 820 as a quantum emitter being coupled to a cavity 818 (which is an example of a resonator) to function as an entangling gate, and FIG. 17B and FIG. 17C illustrate a quantum emitter 1902, 1942 coupled to a resonator 1904, 1944 functioning as an entangling gate.

For example, the quantum emitter may be configured to entangle a quantum emitter qubit to a photonic qubit when a photonic qubit is transmitted toward the quantum emitter. As discussed earlier, the quantum emitter may be implemented as an entangling gate. By way of non-limiting example, FIG. 3 illustrates a controlled-Z gate (CZ gate) implementation, and FIG. 8 and FIG. 9C illustrate a Rubidium ($^{87}$Rb) atom 820 (an example quantum emitter) coupled to a cavity 818 (an example resonator) in configuration 810 being implemented as an entangling gate (e.g., a CZ gate).

In some embodiments, the quantum emitter may be configured to map the quantum emitter qubit to a photonic qubit when the photonic qubit is transmitted toward the quantum emitter. Mapping a quantum emitter qubit to a photonic qubit refers to transferring a quantum emitter qubit to a photonic qubit, as described earlier. For example, such mapping may be a consequence of using the resonator-coupled quantum emitter as a SWAP gate to swap the resonator-coupled quantum emitter's state with a state of a photon so that the photon is reflected while retaining the previous state of the resonator-coupled quantum emitter. A SWAP gate refers to a quantum gate operable on two qubits, such that a quantum state of a first qubit is transferred to a second qubit, and a quantum state of the second qubit is transferred to the first qubit, as described earlier. By way of a non-limiting example, FIG. 2E illustrates a SWAP gate 201 using this SWAP operation to perform "read" and "write" operations of a qubit on an atom 102.

By way of non-limiting example, FIG. 15(A) to FIG. 15(C) illustrates a mechanism behind a SWAP gate which uses a quantum emitter coupled to a resonator. This mechanism is a single-photon Raman interaction (SPRINT) mechanism described in Bechler ( ) et. al. "A passive photon-atom qubit swap operation" *Nature Physics* 14, 996-1000 (2018), Rosenblum S. et. al. "Extraction of a single photon from an optical pulse" *Nature Photon* 10, 19-22 (2016) and Shomroni, I. et al. "All-optical routing of single photons by a one-atom switch controlled by a single photon" *Science* 345.6199, 903-906 (2014), the entire content and single photon extraction and SPRINT mechanism related contents of which are incorporated herein by reference. For example, quantum emitter 1432 is coupled to resonator 1434 at a coupling location 1420 as shown in FIG. 15(A). Two transitions in a multi-level quantum emitter (quantum emitter 1432 or e.g., a single atom such as Rb atom having at least two ground states and at least one exited state) are coupled via resonator 1434 (e.g., a micro-resonator) to different directions of waveguide 1433a. The arrangement of quantum emitter 1432, resonator 1434, and waveguide 1433a is such that light or a photon being carried in waveguide 1433a is evanescently coupled into resonator 1434 by waveguide 1433a. Here, being evanescently coupled refers to being able to interact or transfer through an evanescent field around a waveguide.

As shown in FIG. 15(A), a plurality of photons 1436a, 1436b, 1436c are introduced into waveguide 1433a. As shown in FIG. 15(B), first photon 1436a in waveguide 1433a coming from one direction then interacts with quantum emitter 1432 via resonator 1434 through its evanescent coupling 1435. This interaction causes first photon 1436a coming from this direction to be deterministically reflected as illustrated by reflected photon 1439a shown in FIG. 15(C) due to destructive interference in the transmission. This interaction between first photon 1436a and quantum emitter 1432 is analogous to mapping a quantum emitter qubit to a photonic qubit, e.g., as described earlier with reference to a SWAP gate 201 from FIG. 2E. This interaction results in Raman transfer of quantum emitter 1432 from a ground state to another ground state, and quantum emitter 1432 becomes transparent to subsequent photons from that direction (e.g., second photon 1436b and third photon 1436c). As shown in FIG. 15(C), this means those subsequent photons (e.g., second photon 1436b and third photon 1436c) are just transmitted to the other end of waveguide 1433a. Reflected photon 1439a may then serve as a photonic qubit to which a state of the quantum emitter qubit of quantum emitter 1432 coupled to resonator 1434 is mapped. Therefore, a SPRINT mechanism-based resonator-coupled quantum emitter can be used to in a SWAP gate.

The SPRINT mechanism may also be used in a photon generator according to some disclosed embodiments. For example, when the plurality of photons 1436a, 1436b, 1436c are included in a coherent laser pulse introduced into waveguide 1433a, the mapped photon from this SPRINT mechanism is the first photon 1436a of the coherent laser pulse that interacted with the resonator-coupled quantum emitter for the first time, and hence reflected to be output in the direction it first came from. The subsequent photons (e.g., second photon 1436b and third photon 1436c) of the coherent laser pulse are just transmitted, carrying on as if unaffected, and the first photon of the coherent laser pulse to interact with the resonator-coupled quantum emitter is extracted as a reflected photon and may then be output as a single photon. This enables the photon generator to function as a single photon source configured to provide single photons.

In some embodiments, the quantum emitter may be configured to mediate interactions between consecutive incoming photonic qubits to generate a graph state. Mediating refers to facilitating, enabling, or otherwise promoting interactions. The interactions may transfer, communicate, associate, and/or establish a correlation between the incoming photonic qubits. For example, a resonator-coupled quantum emitter may facilitate an entanglement (e.g., an interaction) between incoming photons, the resonator-coupled quantum emitter being a means through which these interactions between incoming photons are achieved. Consecutive refers to being successive, or sequential, such as one coming after another in a time-sequence. A photonic qubit refers to a basic unit of quantum information stored in (or belonging to) one or more photons or electromagnetic field as described earlier. For example, a photonic qubit includes a quantum bit encoded in a degree of freedom associated with a propagating or stationary mode of the electromagnetic field. A photonic qubit may exhibit characteristics particular to quantum mechanical systems, such as superposition with respect to a degree of freedom (e.g., of one or both vertical and horizontal polarization states) and/or entanglement (e.g., between multiple photonic qubits or with quantum emitter qubits). Thus, the resonator-coupled quantum emitter facilitates interactions (e.g., entanglement) between incoming sequential photonic qubits through the quantum emitter to generate the graph state. For example, each quantum emitter may facilitate entanglement of multiple photonic qubits.

A graph state represents a relation between a group of qubits, a qubit being a basic unit of quantum information, as described earlier. The relation may, for example, refer to being entangled with each other. A photonic qubit refers to a basic unit of quantum information stored in (or belonging to) one or more photons or electromagnetic field. For example, the generated graph state (or multiple graph states) from consecutive incoming photonic qubits may represent a relation between qubits that are stored in (or belonging to) output photons. This relation may, for example, refer to those photonic qubits being entangled with each other.

In some embodiments, the quantum emitter includes a stationary qubit capable of interacting with photons. A stationary qubit may refer to a material quantum system usable in storing and processing quantum information. For example, a stationary qubit may refer to a qubit operable to (or satisfies the conditions of): (i) store quantum information reliably on a nanosecond or greater timescale, (ii) reliably perform calculations and/or operations, including operations may move or convert the information to a flying qubit (e.g., a non-stationary qubit, or a photon), (iii) be reliably measured or read out, and/or (iv) be highly entangled. Examples of stationary qubits may include a qubit stored in, or belonging to, a quantum emitter. For example, qubits stored in, or belonging to, a rubidium or cesium atom may serve as a source of a stationary qubit. A Rydberg atom, for example, may also serve as a source of a stationary qubit. Use of a Rydberg atom may lead properties which are beneficial to quantum computing applications, for example, (i) strong response to electric and magnetic fields, (ii) long decay periods, and (iii) large electric dipole moments. A Rydberg atom may refer to an excited atom with one or more electrons that have a high principal quantum number, n.

In some embodiments, the quantum emitter includes a superconducting qubit. As described earlier, a superconducting qubit refers to a qubit stored in or belonging to a superconducting electronic circuit (e.g., a network of electrical elements using superconductors). For example, a superconducting qubit may refer to a solid-state qubit sourced from a superconducting material, such as aluminum or a niobium-titanium alloy. Superconducting qubits may contain or be coupled to at least one Josephson junction. Examples of a superconducting qubit may include a charge qubit, a flux qubit, a phase qubit, and/or a hybrid thereof (e.g., a transmon).

In some embodiments, the quantum emitter includes a quantum dot. A quantum emitter including a quantum dot may refer to a quantum emitter having a substrate (e.g., a solid state substrate such as a semiconductor particle) having optical and/or electronic properties exhibiting quantum mechanics principles, as described earlier. For example, a quantum dot may be a nanoparticle having optical and electronic properties that differ from its bulk constituent. In the presence of high energy photons (e.g., UV light), an electron in the quantum dot may excited to a high energy state and emit one or more photons when transitioning to a ground state. For example, quantum dots may be manufactured from one or more binary compounds such as lead sulfide, lead selenide, cadmium selenide, cadmium sulfide, cadmium telluride, indium arsenide, or indium phosphide. For example, quantum dots may be self-assembled from Indium Arsenide in a Gallium Arsenide substrate. For example, quantum dots may refer to atomic defects in a solid state substrate such as the nitrogen vacancy center in diamond.

In some embodiments, the quantum emitter includes at least one of a neutral atom or an ion. Neutral refers to an atom that lacks an overall electric charge, such as when the atom has an equal number of protons and electrons. Ion refers to a particle or an atom that has an overall electric charge, such as an atom having an unequal number of photons and electrons. The atom or the ion may be sourced from rubidium, and/or the atom or the ion may be sourced from cesium. In an example, the atom or the ion may be sourced from a Rydberg atom. In an example, the quantum emitter may include at least one of Strontium, Erbium, Ytterbium, Calcium, Barium, Beryllium, or Magnesium atom. The at least one of Strontium, Erbium, Ytterbium, Calcium, Barium, Beryllium, or Magnesium atom may be neutral or in an ion form.

Some embodiments involve a plurality of heralding-free connections. A heralding free connection refers to a connection, or a link, which does not use heralding (or a feedforward), as described earlier. For example, a heralding (or a feedforward) may be achieved by detecting one photon from a pair of single photons generated in highly correlated states and using a photonic or optical delay line to "herald" the other photon from the pair, whereby the state of the other photon is known prior to its detection (the feedforward). A heralding-free connection therefore refers to a connection, or a link, which does not require, and does not involve, such heralding (or feedforward).

As described earlier, conventional quantum computing systems rely on heralding because a source of entangled states used therein is probabilistic. By contrast, some embodiments of the present disclosure may generate photons in a way such that whether generated photons are entangled with each other or not is determinable or known (e.g., the photons are generated deterministically). Thus, some embodiments of the present disclosure, such as the embodiments related to use of heralding-free connections, need not use often complex arrangements for heralding. Thus, heralding connections, such as an optical delay line and various other optics elements arranged to enable heralding, may not be required. Consequently, some embodiments of the present disclosure may utilize one or more connections that are "heralding-free" (non-heralding). In some embodiments, each heralding-free connection is located between adjacent photonic processing stages.

By way of non-limiting example, FIG. 17A illustrates an exemplary system 1901 or an exemplary device according to some embodiments related to use of heralding-free connections. A plurality of heralding-free connections 1913a, 1913b, 1913c, 1913 are located between adjacent photonic processing stages, e.g., between first processing stage 1900a and fourth processing stage 1900d, between second processing stage 1900b and fourth processing stage 1900d, and between third processing stage 1900c and fourth processing stage 1900d, Each of first processing stage 1900a, second processing stage 1900b and third processing stage 1900c has generated entangled photons 1908a, 1908b, 1908c, and the heralding-free connections 1913a, 1913b, 1913c are used to carry those entangled photons to the adjacent processing stage (fourth processing stage 1900d), which generates a cluster state 1908d by entangling those entangled photons from different previous processing stages, and outputs the cluster states 1908d via a heralding-free connection 1913.

Some embodiments involve circuitry configured to regulate photon flow between adjacent stages such that decisions about stage settings or flow between adjacent stages are free of input from a previous stage. Circuitry may include electronics for accomplishing a function. For example, circuitry may include one or more functional units, wherein each functional unit is configured to perform one or more process steps. The one or more functional units may be arranged (e.g., positioned and connected with each other or with another functional unit) so that the circuitry is capable of performing some or all steps of the method or the process. For example, circuitry may perform some or all steps of a method or a process according to some disclosed embodiments. Circuitry, for example, may include one or more optics elements or components capable of performing a function. According to some embodiments, circuitry may refer to a processor configured to perform one or more steps of a disclosed process.

As described earlier, a photonic processing stage refers to a group of components configured to receive one or more photons as input, perform one or more operations with, or on, the one or more photons, and output an outcome from the one or more operations. Regulating photon flow between stages may refer to managing or controlling a movement of one or more photons between two groups of components configured to receive one or more photons as input, perform one or more operations with, or on, the one or more photons, and output an outcome from the one or more operations. Foer example, managing or controlling movement a movement of one or more photons may involve one or more of: setting a number of photons or timing of photons transmitted from one stage to another; coordinating or synchronizing input, operation and/or output from the stages; manipulating or adjusting photon flow by directing, switching, blocking, splitting, and/or phase shifting the one or more photons; and/or determining or making decisions about stage settings, which may involve making modifications or changes to settings of optics elements within a photonic processing stage.

"Free of input from a previous stage" may refer to the regulating being independent of whatever has occurred, is occurring, or will occur in a photonic processing stage that is upstream (e.g., before in the sense of time) of the regulated photon flow. This may refer to determining or making decisions about the stage settings or photon flow without input or information about the decisions made in the previous stage For example, the exemplary system 1901 or the exemplary device in FIG. 17A may also include circuitry configured to manage or control movement of one or more photons (e.g., entangled photons 1908a, 1908b, 1908c being carried in heralding-free connections 1913a, 1913b, 1913c) between first processing stage 1900a, second processing stage 1900b, third processing stage 1900c, and fourth processing stage 1900d, so that fourth processing stage 1900d may be able to output the cluster state 1908d via a heralding-free connection 1913.

In some embodiments, decisions about stage settings include settings of the optical switch. For example, a decision may include whether to set the optical switch in an "on" state or "off" state. For example, a decision may include whether to set the optical switch to connect its input to the first of two outputs or to the second of two outputs. In some embodiments, the decisions about stage settings include settings of the phase shifter. For example, a decision may include whether to phase shift and/or changing the amount of phase shift imparted on a photon. Decisions about the stage settings or photon flow may be determined without input or information about the decisions made in the previous stage. For example, the setting of the optical switch in a photonic processing stage may be set without receiving or knowing the settings of optics elements in the previous stage and/or without receiving or using outputs from the previous stage.

By way of non-limiting example, FIG. 17B illustrates an exemplary photonic processing stage 1900a according to some disclosed embodiments related to use of heralding-free connections. This exemplary photonic processing stage 1900a is an example of the photonic processing stage 1900a included in the system 1901 in FIG. 17A. The photonic processing stage 1900a in FIG. 17B includes: resonator 1904; quantum emitter 1902 couplable to resonator 1904; heralding-free connections 1913a; photon generator 1916a, 1916b configured to generate photons; and first and second circuitry 1918a, 1918b configured to control or manage movement of the photons from photon generator 1916a, 1916b according to a disclosed embodiments described herein.

FIG. 17B shows two separate photon generators 1916a, 1916b but it is understood that a single photon generator may generate first photon 1906a and second photon 1906b. In some examples, photon generator 1916a, 1916b may include a quantum emitter coupled to a resonator (e.g., quantum emitter 1432 coupled to resonator 1434 in FIG. 15(A) to FIG. 15(C)), and photon generator 1916a, 1916b may be configured to generate first photon 1906a and/or second photon 1906b using a single-photon Raman interaction (SPRINT) mechanism with the quantum emitter coupled to the resonator (e.g., quantum emitter 1432 coupled to resonator 1434 in FIG. 15(A) to FIG. 15(C)), as described earlier. In some examples, as described earlier, a quantum emitter in photon generators 1916a, 1916b may be an atom or a fluctuating quantum emitter.

In an example, first and second circuitry 1918a, 1918b may be configured to control photon generator 1916a, 1916b to generate first photon 1906a having a first temporal profile and second photon 1906b having a second temporal profile, and circuitry 1918a may be configured to use first photon 1906a to form a first photonic qubit and use second photon 1906b to form a second photonic qubit.

The photonic processing stage 1900a in FIG. 17B includes waveguides 1912a, 1912b configured to carry one or more photons or lasers. Waveguides 1912a, 1912b in FIG. 17B may, for example, serve the same purpose as waveguides 816, 910, 930 in FIG. 8 to FIG. 9C. First and second circuitry 1918a, 1918b may include one or more linear optics elements configured to perform various functions involved in directing or transporting one or more photons, controlling a flow of one or more photons, manipulating states of the one or more photons, and/or performing quantum computations. For example, first and second circuitry 1918a, 1918b may be configured to use one or more linear optics elements to: couple quantum emitter 1902 to resonator 1904; use quantum emitter 1902 coupled to resonator 1904 to entangle the first photonic qubit (associated with first photon 1906a) with the second photonic qubit (associated with second photon 1906b) to form a pair of entangled photonic qubits 1908a; and transfer the pair of entangled photonic qubits 1908a to another photonic processing stage using a heralding-free connection 1913a. In some disclosed embodiments related to use of heralding-free connections, controller 1914 may be provided to control (e.g., direct or switch between different waveguides) flow of input and output photons between photon generator(s), entangling gate(s) including quantum emitter 1902 coupled to resonator 1904, and heralding-free connections 1913a. For example, such controller 1914 may include one or more processors. A memory, a circuit component or circuitry may also be provided for performing the controlling.

First and second circuitry 1918a and/or 1918b may, for example, receive first photon 1906a and second photon 1906b from photon generator 1916a, 1916b and output first photon 1906a and second photon 1906b so that they may be carried in waveguides 1912a in a sequential manner, e.g., as a sequence of photons. In an example, circuitry 1918a, 1918b may also include an optical delay line configured to carry at least one of first photon 1906a and second photon 1906b, as described herein for some disclosed embodiments related to generating photonic graph states for quantum computing. First photon 1906a and second photon 1906b may then interact with quantum emitter 1902 via resonator 1904 through evanescent coupling 1925 between first photon 1906a or second photon 1906b and resonator 1904 provided by waveguide 1912a, as described earlier with reference to FIG. 15(A) to FIG. 15(C). This interaction between quantum emitter 1902 and first photon 1906a and second photon 1906b may then lead to entanglement between quantum emitter 1902 and first photon 1906a, and between quantum emitter 1902 and first photon 1906b, resulting in entanglement between first photon 1906a and second photon 1906b, as described herein in relation to some embodiments related to entangling gates. Repeating these pairwise entanglements with a plurality of consecutive photons generates a graph state (or a photonic graph state) of entangled photons.

By way of non-limiting example, FIG. 17C illustrates an exemplary photonic processing stage 1900d according to some disclosed embodiments related to use of heralding-free connections. This exemplary photonic processing stage 1900d is an example of the photonic processing stage 1900d included in the system 1901 in FIG. 17A. The photonic processing stage 1900d in FIG. 17C includes resonator 1944; quantum emitter 1942 couplable to resonator 1944; heralding-free connections 1913a, 1913b, 1913c, 1913; first and second circuitry 1918a, 1918b configured to control or manage movement of the photons between heralding-free connections 1913a, 1913b, 1913c, 1913 and waveguides 1912a, 1912b according to a disclosed embodiments described herein. First circuitry 1918a receives entangled photons 1908a, 1908b, 1908c (e.g. see FIG. 17A and FIG. 17B), which may be entangled pair of photon qubits or a photonic graph state of entangled photonic qubits) via respective heralding-free connection 1913b, 1913c, 1913 with another photonic processing stage 1900a, 1900b, 1900c, controls their movement so that one photonic qubit from each entangled group (or each photonic graph state) is fed to waveguide 1912a one by one, whereby quantum emitter 1942 coupled to resonator 1944 entangles those consecutive photonic qubits with itself one by one, resulting in those photonic states from different photonic graph states being entangled to generated a cluster state 1908d. Movement or transfer of those entangled photonic qubits associated with the generated cluster state 1908d are then controlled or managed by second circuitry, which second circuitry 1918b which outputs photonic qubits via heralding-free connection 1913, whereby the system 1901 of FIG. 17A may generate a cluster state 1908d or a photonic graph state. Once the desired entangled photon qubits, cluster state or photonic graph state has been generated, quantum emitter 1902 in photonic processing stage 1900*a* and quantum emitter 1942 in photonic processing stage 1900*d* may be disentangled from, or released from its entanglement with, the entangled photonic qubits, cluster state or photonic graph state by using quantum emitter 1902 and quantum emitter 1942 to implement a SWAP gate as described herein according to some embodiments or examples related to SWAP gates.

Some embodiments involve transmitting or receiving a plurality of photons via a plurality of heralding-free connections, each connection being located between adjacent photonic processing stages, wherein each photonic processing stage includes at least two of an optical switch, a beam splitter, a waveguide, or a photon generator. As discussed earlier, a heralding-free connection refers to a connection, or a link, which does not require, and does not involve, such heralding (or feedforward). Thus, transmitting or receiving a plurality of photons via a plurality of heralding-free connections refers to transferring the plurality of photons though a connection without involving feedforward (e.g., without using an optical delay line to provide feedforward).

Some embodiments involve regulating photon flow between adjacent stages such that decisions about stage settings or flow between adjacent stages are free of input from a previous stage. As discussed earlier, regulating photon flow between adjacent stages may refer to managing or controlling a movement of one or more photons between two adjacent groups of components. Free of input from a previous stage may refer to determining or making decisions about the stage settings or photon flow without input or information about the decisions made in the previous stage, as described earlier.

In some embodiments, at least some of the photonic processing stages include a quantum emitter coupled to a resonator. An example of such embodiment may further include entangling a quantum emitter qubit to a photonic qubit when the photonic qubit is transmitted toward the quantum emitter. As discussed earlier, the quantum emitter may be implemented as an entangling gate to achieve this effect.

An example of such embodiment may include mapping a quantum emitter qubit to a photonic qubit when the photonic qubit is transmitted toward the quantum emitter. As discussed earlier, mapping a quantum emitter qubit to a photonic qubit refers to transferring a quantum emitter qubit to a photonic qubit. For example, such transfer may be a consequence of using the quantum emitter in a SWAP gate.

An example of such embodiment may include mediating interactions between consecutive incoming photonic qubits to generate a graph state. As discussed earlier, mediating refers to facilitating, enabling, or otherwise promoting interactions. The interactions may transfer, communicate, associate, and/or establish a correlation between the incoming photonic qubits. As described earlier, a graph state represents a relation between a group of qubits, a qubit being a basic unit of quantum information. The relation may, for example, refer to being entangled with each other.

Figure 17D:
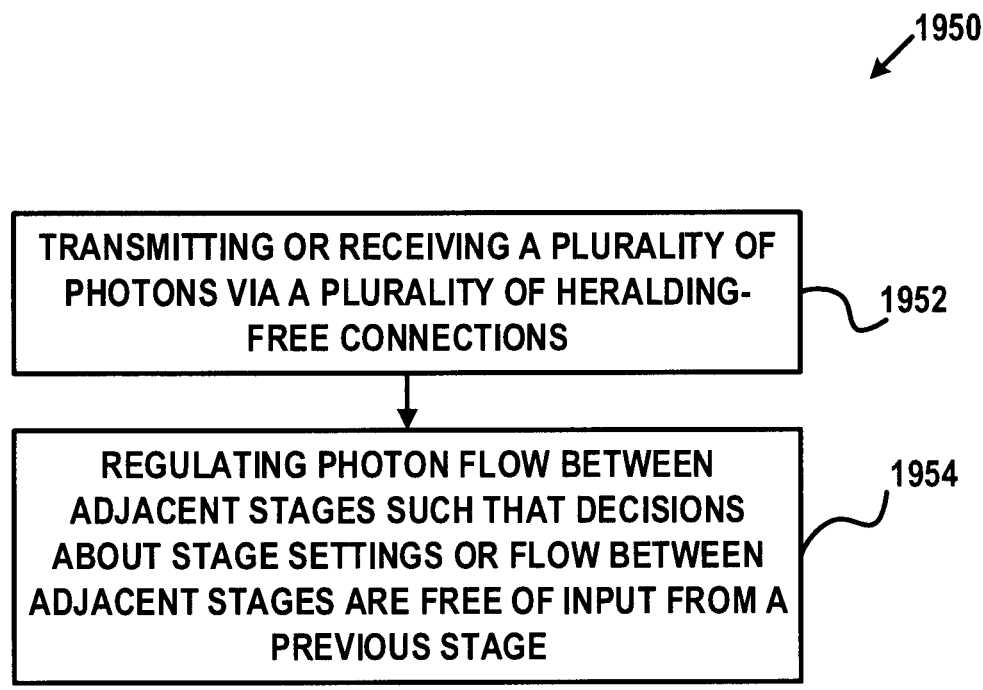
FIG. 17D is a flowchart of an example process according to some embodiments related to use of heralding-free connections.

By way of non-limiting example, FIG. 17D) illustrates an example process 1950 according to some embodiments relating to use of heralding-free connections. The example process 1950 may be a part of a quantum computing method for use in quantum computing. As examples of steps of the process are described throughout this disclosure, and those examples described earlier are not repeated or are simply summarized in connection with FIG. 17D). In some disclosed embodiments, the example process 1950 is performed by at least one processor or circuitry, for example in control system 1031 and/or photonic chips 1015 of FIG. 10, or in first and second circuitry 1918*a*, 1918*b* and/or controller 1914 of FIG. 17B and FIG. 17C, to perform operations or functions described herein. In some disclosed embodiments, some aspects of the process 1950 may be implemented as software (e.g., program codes or instructions) that are stored in a memory provided with the at least one processor, or a non-transitory computer readable medium or a computer readable medium. In some embodiments, some aspects of the process 1950 may be implemented as hardware (e.g., a specific-purpose circuit). In some embodiments, the process 1950 may be implemented as hardware or as a combination of software and hardware.

FIG. 17D includes process steps (or method steps) 1952 and 1954. It will be readily appreciated that various implementations are possible and that any combination of components or devices may be utilized to implement the example process. It will also be readily appreciated that the illustrated process can be altered to modify the order of steps, delete steps, or further include additional steps, such as steps directed to examples or embodiments described herein.

At step 1952, the process involves transmitting or receiving a plurality of photons via a plurality of heralding-free connections. FIG. 17A to FIG. 17C illustrate examples of heralding free connections 1913*a*, 1913*b*, 1913*c*, 1913 transmitting photons or receiving photons 1908*a*, 1908*b*, and 1908*c*.

At step 1954, the process involves regulating photon flow between adjacent stages such that decisions about stage settings or flow between adjacent stages are free of input from a previous stage. FIG. 17A illustrates examples of photons (e.g., entangled photons 1908*a*, 1908*b*, 1908*c*) being transmitted and received to between adjacent photonic processing stages, e.g., between first processing stage 1900*a* and fourth processing stage 1900*d*, between second processing stage 1900*b* and fourth processing stage 1900*d*, and between third processing stage 1900*c* and fourth processing stage 1900*d*, wherein each processing stage operates independently of any input or information from a previous processing stage.

Conventional photonic quantum computation relies on linear optics to generate a graph, which requires one photons of a pair of photons to be "heralded" or measured to determine the state of the other photon. In such conventional photonic quantum computation, heralding connections, such as, optical delay lines are utilized. Embodiments related to use of heralding-free connections described herein illustrate examples capable of utilizing heralding-free connections.

For example, the non-transitory computer-readable medium (or a computer-readable medium or a computer program) may include instructions that, when executed by at least one processor (or an apparatus), cause the at least one processor (or the apparatus) to carry out a process or a quantum computing method described herein. According to embodiments related to use of heralding-free connections, the instructions may cause the at least one processor (or the apparatus) to carry out the quantum computing method or the process 1950 shown in FIG. 17D.

The same examples described earlier for each process or system feature of the embodiments related to use of heralding-free connections are also applicable to corresponding features of this non-transitory computer-readable medium (or a computer-readable medium or a computer program) embodiment.

According to other embodiments related to generating photonic graph states for quantum computing, there are an apparatus, a device, a system, an integrated circuitry device, or circuitry, including at least one processor (and a memory) configured to carry out the quantum computing method or the process 1950 shown in FIG. 17D. The same examples described earlier for each process or system feature of the embodiments related to use of heralding-free connections are also applicable to corresponding features of these embodiments.

According to yet another embodiment related to use of heralding-free connections, a layout of an integrated circuit device or circuitry is provided, comprising layout portions, each layout portion defined to pattern features from the combination of features of the system 1901 in FIG. 17A, photonic processing stage 1900a in FIG. 17B, photonic processing stage 1900d in FIG. 17C, or photon generator based on the mechanism in FIG. 15(A) to FIG. 15(C) according to some embodiments related to use of heralding-free connections. By way of example, a layout of an integrated circuit device or a circuitry, includes: a photonic processing stage layout portion defined to pattern at least two of an optical switch, a beam splitter, a waveguide, or a photon generator; a connection layout portion defined to pattern a plurality of heralding-free connections, each connection being located between adjacent photonic processing stages; and a circuitry layout portion defined to pattern circuitry or at least one processor configured to regulate photon flow between adjacent stages.

In some disclosed embodiments, the photonic processing stage layout portion is defined to pattern a photon generator or a channel for carrying a photon supplied by a photon generator toward a resonator or a quantum emitter. In some disclosed embodiments, patterning the photon generator may include patterning another resonator and another coupling location for coupling another quantum emitter to the other resonator. In some disclosed embodiments, circuitry layout portion may be defined to pattern one or more of: a waveguide for carrying one or more photons or lasers; and one or more linear optics elements for performing various functions involved in directing or transporting one or more photons, controlling a flow of one or more photons, manipulating states of the one or more photons, and/or performing quantum computations.

In some disclosed embodiments, the circuitry layout portion is defined to pattern a controller for controlling (e.g., directing or switching between different waveguides) flow of input and output photons between photon generator(s) and entangling gate(s) or SWAP gate(s), wherein the controller may include one or more processors and a memory, a circuit component, or circuitry for performing the controlling.

FIG. 1 schematically illustrates a device 100 for use in quantum computing according to an embodiment of the present disclosure. For example, device 100 may be a part of a deterministic photonic graph state generator according to an embodiment of the present disclosure. Device 100 includes a four-state system 101 of an atom 102 contained within an optical cavity 103 having input/output photon waveguides 104 and 105. For example, the atom 102, the optical cavity 103 and waveguides 104, 105 arrangement used in the four-state system 101 may be any one of the atom coupled to a cavity (or a resonator) and waveguides arrangements illustrated in FIG. 9A to FIG. 9C or the quantum emitter coupled to a cavity (or a resonator) and waveguides arrangements described herein. A laser source 151 provides pulses for altering the state of atom 102 and to induce emission of photons therefrom. Four-state system 101 includes the following states of atom 102: a first ground state 111, a first excited state 112, a second ground state 113, and a second excited state 114. A transition 121 between first ground state 111 and first excited state 112 has an energy $E_1$, and is associated with an interacting photonic mode 1. A transition 122 between first excited state 112 and second ground state 113 has an energy $E_2$, and is associated with an interacting photonic mode 2. A transition 123 between second ground state 113 and second excited state 114 has an energy $E_4$, and is associated with an interacting photonic mode 3. The transitions 122 and 123 may be selected such that they are orthogonally polarized with respect to each other. A photon 180 is in a non-interacting photonic mode 4, which is not associated with any transitions of atom 102 in optical cavity 103. Photon 180 in photonic mode 4 does not pass through the waveguide associated with optical cavity 103 and atom 102, and therefore does not interact therewith. The modes are indicated in the text by their mode numbers in underlined bold, and in drawings by bold mode numbers in square boxes.

The device 100 further comprises a magnet 141 generating a magnetic field. The magnetic field may be configured to ensure that the transitions are within the bandwidth of the optical cavity 103. It may be further configured to ensure that the first and second excited states 112, 114 are at the same energy level, i.e., that $E_2$ and $E_4$ are equal. Accordingly, a photon emitted in in transition 122 (photonic mode 2) have the same energy as one emitted in transition 123 (photonic mode 3). The first and second ground states 111, 113 may be maintained at different energy levels (i.e., $E_1 \neq E_4$), facilitating addressing transition 121 and transition 123 independently of each other.

The term "mode" (or "photonic mode") herein denotes a solution of the electromagnetic wave equation under some boundary conditions. As a non-limiting example, a given mode might apply to a pulse of photons having a particular pulse shape centered at a wavelength of 780 nm, propagating left in a (single mode) fiber and having a vertical polarization. A change of any parameter (direction, polarization, size, divergence, etc.) renders the originally assigned mode no longer applicable, and changes the mode of the photons to a different, perhaps undefined mode. In embodiments of the present disclosure, atomic transitions are coupled to mode 1, mode 2, or mode 3 of the incoming/outgoing photons. As noted and illustrated in FIG. 1, however, there is no coupling between atomic transitions of this embodiment and a photon in mode 4.

There is no direct transition between first ground state 111 and second ground state 113. The energy difference $E_3$ between them arises on account of an energy splitting of the ground states due to the magnetic field of a magnet 141 located proximate to optical cavity 103. According to this embodiment, the energy differences of the transitions notably on account of the magnetic field are one factor that provides the ability to individually address the different transitions. Another factor for individually addressing the transitions involves the polarization of photons used to excite the transitions, as is discussed in more detail below. Consequently, a control/selection capability 152 uses individual addressing of the transitions for control and selection of the various functions enabled by the individual addressing of the different transitions.

In a related embodiment, magnet 141 is a solenoid or another type of an electromagnet. In another related embodiment, the magnetic field in the region of atom 102 is 50 Gauss or greater. In a further related embodiment, laser source 151 is located within device 101 or external to device 101; and in yet another related embodiment, multiple dedicated laser sources are provided.

In another embodiment, device 100 is incorporated into a miniaturized component along with additional functional units (indicated by ellipsis 161) for specialized purposes.

In another related embodiment, atom 102 is a Rubidium atom, such as an atom of the isotope $^{87}$Rb.

FIG. 2A is a state diagram for a transition of atom 102 of device 100 (FIG. 1), which is initially in first ground state 111, designated as a state $|1\rangle_a$ (shown in dotted lines). An incoming photon 171 via waveguide 104 (FIG. 1) excites a transition 121A in atom 102, from first ground state 111 to first excited state 112. Transition 121A followed by a transition 122A from first excited state 112 to second ground state 113, is a transition sequence which results in an emission of an outgoing photon 172 via waveguide 104 in a direction opposite to that of incoming photon 171. Photon 171 is designated as being in a state $|0\rangle_p$ p with a direction-polarity denoted as $\sigma^-$. In contrast, photon 172 is designated as being in a state $|1\rangle_p$ with a direction-polarity denoted as $\sigma^-$. After transition 122A, atom 102 is designated as being in a state $|0\rangle_a$.

The transition described above and illustrated in FIG. 2A is used in a single-photon source unit according to an embodiment of the present disclosure, as described and illustrated below. The verb "source" and its inflected forms herein denote the providing of photons according to embodiments of the present disclosure, including the providing of single photons, the providing of photon pulses, and the providing of cluster states of single photons. The term "single photon source" herein denotes the case where only a single photon is sourced at a time.

FIG. 2B is a state diagram for a transition of atom 102 of device 100 (FIG. 1), which is initially in second ground state 113, state $|0\rangle_a$ (shown in dotted lines). An incoming photon 173 via waveguide 105 (FIG. 1) excites a transition 122B in atom 102, from second ground state 113 to first excited state 112. Transition 122B followed by a transition 121B from first excited state 112 to first ground state 111, is a transition sequence which results in an emission of an outgoing photon 174 via waveguide 105 in a direction opposite to that of incoming photon 173. Photon 173 is in a state $|1\rangle_p$ with a direction-polarity $\sigma^-$. In contrast, photon 174 is in state $|0\rangle_p$ with a direction-polarity $\sigma^+$. After transition 121B, atom 102 is in state $|1\rangle_a$.

The transition described above and illustrated in FIG. 2B is also used in the source unit according to an embodiment, as described and illustrated below.

Figure 2C:
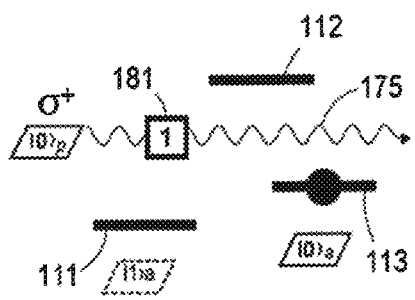
FIG. 2C is a state diagram showing a no interaction condition of the device shown in FIG. 1.

FIG. 2C is a state diagram showing no transitions of atom 102 in second ground state 113 (in state $|0\rangle_a$) for an incoming $\sigma^+$ photon 175 in state $|0\rangle_p$. Incoming $\sigma^+$ photon 175 continues on its way unchanged.

Figure 2D:
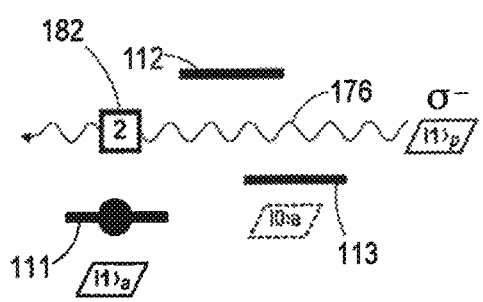
FIG. 2D is a state diagram showing another no interaction condition of the device shown in FIG. 1.
Figure 2E:
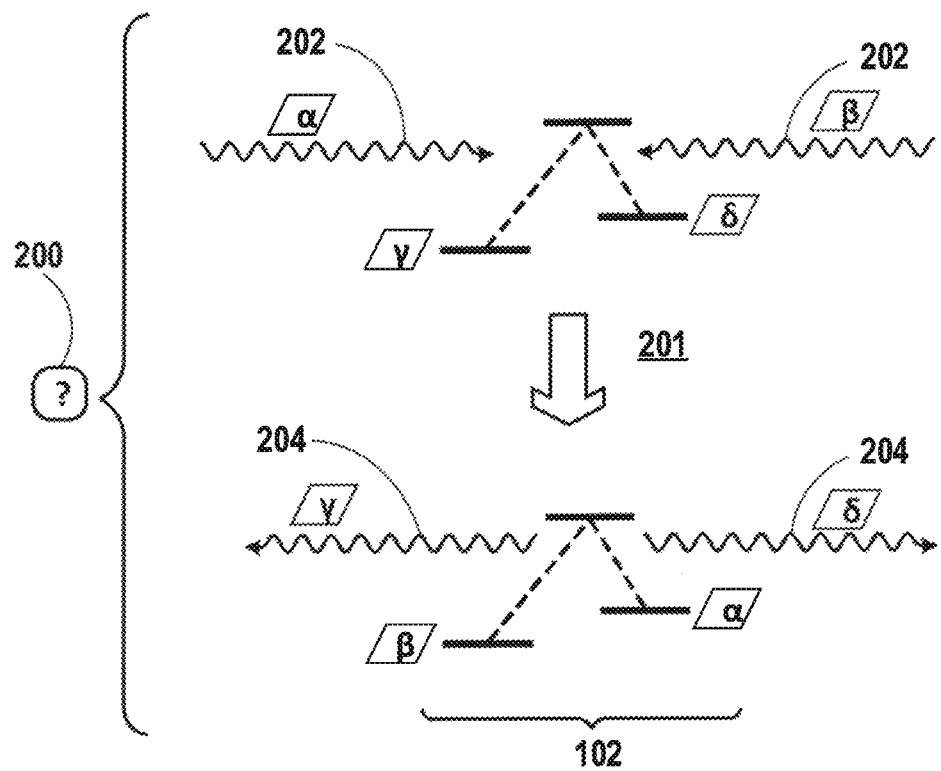
FIG. 2E schematically illustrates making a measurement on an atom of the device shown in FIG. 1, according to a disclosed embodiment.

Likewise, FIG. 2D is a state diagram showing no transitions of atom 102 in first ground state 111 (in state $|1\rangle_a$) for an incoming $\sigma^-$ photon 176 in state $|1\rangle_p$. Incoming $\sigma^-$ photon 176 continues on its way unchanged.

FIG. 2E illustrates a swap gate 201 performing "read" and "write" operations of a qubit on the atom 102, enabling, inter alia, a measurement 200 of the atom of the device 100, according to an embodiment of the present disclosure. This figure combines the results of the transitions previously discussed and illustrated in FIG. 2A through FIG. 2D). In FIG. 2E, the atom 102 is initially in a superposition state of the first and second ground states 111, 113 with probability amplitudes $\gamma$ and $\delta$, respectively. The incoming photon 202 is in a superposition of photonic modes 1 and 2 with probability amplitudes $\alpha$ and $\beta$, respectively (in FIG. 2E, a single photon, e.g., 202, in a superposition of photonic modes is illustrated as two photons; it will be appreciated that this is not meant to imply the presence of two separate photons). Since the processes described in FIG. 2A through 2D are coherent, the state of the incoming photon is swapped with the state of the atom; the outgoing photon 204 is in a superposition state of modes 1 and 2 with probability amplitudes $\delta$ and $\gamma$, respectively, and the atom 102 is left in a superposition state of the first and second ground states 111, 113 with probability amplitudes $\beta$ and $\alpha$, respectively. This interaction allows measuring and setting the state of atom 102 in a single step, by appropriately choosing the state of the incoming photon and by measuring the direction-polarization of the outgoing photon 204. In a related embodiment, this is utilized in an entanglement method, as discussed below.

As illustrated in FIG. 3, the atom 102 is initially in a superposition of ground states 111 and 113, and incoming photon 301 is in a superposition of mode 3 and (non-interacting) mode 4 and has energy $E_4$. (In order to distinguish from the description above of the photon in modes 1 and 2, the photon in modes 3 and 4 will be indicated as $|1\rangle_{p*}$ and $|0\rangle_{p*}$, respectively.) As the atom 102 and the incoming photon 301 may initially be described by their respective superpositions, the atom and the emitted photon 302 are entangled. In particular, the atom 102 and the emitted photon 302 are in a size-2 cluster state, in which a first mode corresponds to a superposition of modes 3 and 4 of the outgoing photon 302

$$\left(\frac{1}{\sqrt{2}}[|0\rangle_{p*} - |1\rangle_{p*}]\right)$$

with the atom in its first ground state 111 of the atom 102, and the second mode corresponds to a complementary superposition of modes 3 and 4 of the outgoing photon $$302\left(\frac{1}{\sqrt{2}}[|0\rangle_{p*} + |1\rangle_{p*}]\right)$$

with the atom in its second ground state 113 of the atom 102. (One having skill in the art will recognize that this is one implementation of controlled-Z, gate with the Duan-Kimble protocol.) The different input states may be summarized as follows:

- the incoming photon 301 is in mode 4 and the atom 102 is in its first ground state 111: no interaction therebetween.
- the incoming photon 301 is in mode 4 and the atom 102 is in its second ground state 113: no interaction therebetween.
- the incoming photon 301 is in mode 3 and the atom 102 is in its first ground state 111: atom is unaffected, but the waveform of the photon is phase-flipped (i.e., the atom is in a non-interacting state with the intra-cavity field, implying that the photon interacts with an empty cavity; accordingly, a photon on resonance with the empty cavity induces an intra-cavity field buildup which in turn results in a phase flip of the outgoing photon 302 relative to a the photon in non-interacting mode 4); and
- the incoming photon 301 is in mode 3 and the atom 102 is in its second ground state 113: the atom transitions from the second ground state to the second excited state 114 (shown as transition 123A), then transitions back to the second ground state (shown as transition 123B), and in the process emits a photon 302, also with energy $E_4$ (i.e., the atom is in an interacting state with the intra-cavity field, implying that the transition 123 is addressed by the incoming photon in mode 3; accordingly, the atom eliminates the intra-cavity field build up, and no phase flip of the outgoing photon 302 occurs).

The quantum entanglement is graphically represented in the drawings by a double line 310 connecting atom 102 with photon 302. The double-line graphical convention also indicates quantum entanglement among photons, where applicable.

FIG. 4A schematically shows a single-photon source unit 401 according to an embodiment of the present disclosure. Source unit 401 includes a device corresponding to device 100 of FIG. 1. In particular, a source unit atom 402 corresponds to atom 102 in FIG. 1, but for clarity the other elements corresponding to those of device 100, such as optical cavity 103, are omitted from FIG. 4A.

To initialize source unit 401 into an initial $|1\rangle_a$ state, an initialization pulse 403 of multiple $\sigma^-$ photons in state $|1\rangle_p$ is introduced. If atom 402 is already in first ground state 111 (in state $|1\rangle_a$), then as shown in FIG. 2D and described above, initialization pulse 403 will have no effect on atom 402, which will remain in state $|1\rangle_a$. However, if atom 402 is in second ground state 113 (in state $|0\rangle_a$), the first photon of initialization pulse 403 to enter source unit 401 will cause atom 402 to transition to first ground state 111 (in state $|1\rangle_a$), as shown in FIG. 2B and described above, thereby initializing source unit 401 into the desired initial state.

Returning to FIG. 4A, after introducing initialization pulse 403, a generating pulse 404 of multiple ø photons in state $|0\rangle_p$ is introduced into source unit 401. A time axis 405 shows the sequence of initialization pulse 403 followed by generating pulse 404. Having first initialized source unit 401 such that atom 402 is in the $|1\rangle_a$ state, the first $\sigma^+$ photon in state $|0\rangle_p$ of generating pulse 404 will cause the transition of FIG. 2A, as previously described, resulting in the output of a single ø photon 406 in state $|1\rangle_p$. Photon 406 is output in the opposite direction from the photons of generating pulse 404 and therefore is easily separated from the other photons of generating pulse 404, which are discarded.

FIG. 4B schematically shows producing a time-sequenced series 412 of a specific number of single photons from single-photon source unit 401 according to an embodiment of the present disclosure. A time-sequenced series 410 of initialization pulse-generating pulse pairs is input into source unit 401, resulting in a time-sequenced series 412 having a single photon output for each pair of initialization pulse generating pulse input. The output photons are individually output and are not yet entangled as of this operation.

It is emphasized that the single photons which emanate from single-photon source unit 401 according to embodiments of the present disclosure are all usable in this architecture; entangling photons through the cavity-enhanced atom-photon interaction does not require the use of indistinguishable photons, as is the case for the probabilistic entanglement with linear optics. In particular, input photon pulses (e.g., pulse 404) do not have to be precisely timed and shaped. Single photons produced according to embodiments of the present disclosure are perfectly suitable for qubit entanglement even when they exhibit irregularities that make them readily distinguishable.

FIG. 5A schematically shows an entanglement unit 501 for quantum entanglement of a photonic state with an atomic state of an entanglement unit atom 502 according to an embodiment of the present disclosure. Entanglement unit 501 includes a device corresponding to device 100 of FIG. 1. In particular, atom 502 corresponds to atom 102 in FIG. 1, but for clarity the other elements corresponding to those of device 100 are omitted from FIG. 5A.

Entanglement unit 501 must first be prepared by setting atom 502 into the quantum superposition state $$\frac{1}{\sqrt{2}}(|0\rangle_a + |1\rangle_a).$$

This is done by introducing a pulse 503 in the appropriate superposition of modes 1 and 2, in order to swap in the desired state. Thereafter, the entanglement mechanism relating to atom 502 corresponds to the process shown in FIG. 3 and described previously. By making a measurement 200 of the state of atom 502, the entanglement between atom 502 and any photon(s) previously entangled therewith is broken. Measurement 200 according to an embodiment of the present disclosure is illustrated in FIG. 2E as previously described. It is noted that device 100 as described above with reference to and as illustrated in FIG. 1 is thus capable of both entanglement of a photon with atom 102 as well as breaking the entanglement (via measurement 200).

FIG. 5B schematically illustrates quantum entanglement of time-sequential series 412 of single photonic states with the prepared superposition state of atom 502 according to an embodiment of the present disclosure. The entanglement operation results in a time-sequential series 512 of entangled photons. After measurement 200 is performed, atom 502 itself is no longer entangled with the photons of series 512, but the photons remain entangled with each other. The photons of series 512 are represented mutually connected by double lines to a single atom, indicating that they are mutually entangled therewith.

FIG. 6 is a flowchart of a method for sourcing a photonic graph state according to an embodiment of the present disclosure. In a related embodiment, this method is performed by a control/select unit 152 of device 100 as detailed in FIG. 1 and described previously. In a preparation step 601, an entanglement unit atom (such as entanglement unit 501 atom 502) is set to state $$\frac{1}{\sqrt{2}}(|0\rangle_a + |1\rangle_a)$$

by utilizing a pulse 503 in the appropriate superposition of modes 1 and 2, in order to swap in the desired state as previously described.

After preparation, a loop begins point 602 starts a loop of steps to repeat n times through a loop end point 608.

Inside loop 602-608 a step 603 initializes a source unit atom (such as source unit 401 atom 402) to a state $|1\rangle_a$ by injecting a pulse 403 of $\sigma^-$ photons in state $|1\rangle_p$, as previously illustrated and described.

Next, in a step 604, a single photon is generated by injecting a classical laser pulse 404 of mode 1 photons into the source unit, as previously illustrated and detailed, and illuminated in a caption 605.

Following, in a step 606, the single mode 2 photon from step 604 is routed into an entanglement unit (such as entanglement unit 501 with atom 502) in a superposition of mode 3 and mode 4:

$$|1\rangle_2 \rightarrow \frac{1}{\sqrt{2}}(|1\rangle_3 |0\rangle_4 + |0\rangle_3 |1\rangle_4),$$

and which is subsequently quantum-entangled with the entanglement unit atom.

A caption 607 details how photonic mode 3 interacts with cyclic transition 123 (FIG. 1) of entanglement unit 501 atom 502, whereas photonic mode 4 has no interaction. This particular configuration implements a controlled-Z quantum gate.

At loop end 608, after n repetitions the state of entanglement unit atom (such as atom 502) will be entangled with the states of n photons, as illuminated in a caption 609.

In a step 610, a measurement is performed on the entanglement unit atom (such as atom 502) in the x-y plane of the Bloch sphere, such as measurement 200, which is illustrated schematically in FIG. 2E and as detailed previously. Carrying out measurement 200 disentangles the entanglement unit atom from being quantum entangled with the photons, leaving a time-sequenced cluster state of n photonic states in an entangled state. It is again noted that device 100 as provided by an embodiment of the present disclosure is capable both of operation as an entanglement unit (such as entanglement unit 501) and of carrying out measurement 200 without the need for additional measurement apparatus. This step is illuminated in a caption 611.

Finally, in a step 612, the time-sequenced cluster state of n entangled photons is output for qubit use in quantum computing.

FIG. 7 schematically illustrates an apparatus according to an embodiment of the present disclosure, which employs an arrangement of multiple devices based on device 100 for sourcing a multi-dimensional graph state or cluster state of quantum-entangled photonic states. In this embodiment, a one-dimensional spatial array combined with a time-dimensional sequence of entangled photons is output; and in a related embodiment, a two-dimensional spatial array combined with a time-dimensional sequence of entangled photons is output. In these embodiments, linear optics elements are used judiciously in a limited capacity to perform specific adjunct functions, rather than as basic components, thereby avoiding the difficulties and shortcomings of linear optics as previously discussed.

In the embodiment illustrated, a series of pulses 701 is fed to a single-photon source unit 702 whose single photon output passes through first stage linear optics and phase control elements 703 to a first stage entanglement unit 704, and from then to second stage linear optics and phase control elements 705, to a second stage entanglement unit 706, and from thence to an output channel 707, which outputs a time-sequence 405 of entangled photons in photonic cluster states and/or graph states. Arranged along a spatial axis 710 is an array 708 of similar components fed by similar series of pulses, as shown in FIG. 7. In related embodiments, spatial axis 710 is an x-axis, a y-axis, or a combination thereof in an x-y plane. For a one-dimensional spatial array, only the first stage linear optics, phase control elements, and entanglement units may be needed, for output of a one-dimensional spatial array of entangled photons in a time-dimensional sequence. With both x-axis and y-axis for a two-dimensional spatial array, the second stage linear optics, phase control elements, and entanglement units are also used, for output of a two-dimensional spatial array of entangled photons in a time-dimensional sequence. In all cases, each single-photon source, the linear optics and phase control elements, and respective entanglement unit (or respective entanglement units, in the case of two-stage operation) are correspondingly displaced along the appropriate spatial axis 710.

It is to be understood that the embodiment, clause, claim, or example described herein using optical photons or optical elements are also implementable using photons at other frequencies of the electromagnetic spectrum, such as microwaves and infrared photons. Thus, all references to optical photons herein are to be considered as also disclosing photons in general.

It is also to be understood that the embodiment, clause, claim, or example described herein using photons or photonic chips are also implementable using phonons, instead of, or in addition to, photons. Thus, all references to photons herein are to be considered as also disclosing phonons, as such photon-based implementations can result in equivalent phonon-based functionality.

This disclosure employs open-ended permissive language, indicating for example, that some embodiments or definitions "may" employ, involve, or include specific features. The use of the term "may" and other open-ended terminology is intended to indicate that although not every embodiment may employ the specific disclosed feature, at least one embodiment employs the specific disclosed feature.

Clauses Relating to an Example Deterministic Photon Graph State Generator:

Clause 1. A method for sourcing a graph state of quantum-entangled photons, the method comprising:
  providing a photon source unit for sourcing single photons, said photon source unit comprising a source unit atom disposed within an intra-cavity field of a source-optical cavity;
  providing a photon entanglement unit for quantum entanglement of photonic states, said photon entanglement unit atom disposed within an intra-cavity field of an entanglement-optical cavity;
  sending a photon pulse to the photon entanglement unit to set the entanglement unit atom to an atomic quantum superposition state $$\frac{1}{\sqrt{2}}(|0\rangle + |1\rangle);$$

sending a photon pulse to the photon source unit to initialize the source unit atom to a quantum state |1⟩; #
  sending a photon pulse of photons in a first photonic mode into the photon source unit to cause the source unit atom to output a single photon in a second photonic mode, wherein the first photonic mode couples to a first transition of the source unit atom, and wherein the second photonic mode couples to a second transition of the source unit atom;
  routing the single photon in the second photonic mode to the photon entanglement unit to a superposition of a third photonic mode and a fourth photonic mode;
    wherein the third photonic mode couples to a third transition of the entanglement unit atom;

wherein the fourth photonic mode does not couple to any transition of the source unit atom;

wherein the fourth photonic mode does not couple to the entanglement-optical cavity; and wherein the output photon in a superposition of a third photonic mode and a fourth photonic mode is quantum-entangled with the entanglement unit atom;

repeating the routing at least once to route at least one additional single photon in the second photonic mode to the photon entanglement unit in a superposition of the third photonic mode and the fourth photonic mode in quantum entanglement with the entanglement unit atom;

performing a measurement on the entanglement unit atom, thereby disentangling it from the photons in the superposition state of the third photonic mode and the fourth photonic mode;

wherein the at least two photons in the superposition state of the third photonic mode and the fourth photonic mode are quantum entangled; and outputting the at least two photons in the superposition state of the third photonic mode and the fourth photonic mode as time-sequenced mutually entangled photons.

Clause 2. The method according to clause 1, wherein performing a measurement on the entanglement unit atom includes performing a measurement in an x-y plane of a Bloch sphere.

Clause 3. A device for sourcing a graph state of quantum-entangled photons, the device comprising:
  a plurality of single photon source units;
  a first stage of linear optics elements; and
  a first plurality of entanglement units;
  wherein the plurality of single photon source units, the first stage of linear optics elements, and the first plurality of entanglement units are correspondingly displaced along a predetermined spatial axis;
  wherein each single photon source unit of the plurality of photon source units outputs single photons to the first stage of linear optics elements, and therefrom into a respective entanglement unit of the first plurality of entanglement units; and
  wherein the first plurality of entanglement unit outputs a one-dimensional spatial array of entangled photons in a time-dimensional sequence.

Clause 4. The device according to clause 3, wherein the single photon source units and/or the entanglement units each comprise:
  an atom in a first ground state, a first excited state, a second ground state, a second excited state, or a superposition thereof;
  the atom being further configured to selectively undergo:
    a first transition between the first ground state and the first excited state;
    a second transition between the first excited state and the second ground state; and
    a third transition between the second ground state and the second excited state;
  the device comprising an optical cavity defining an intracavity field for disposing therewithin the atom, a photonic waveguide coupled to the optical cavity, a magnet configured to produce a magnetic field on the atom, and a laser source configured to produce pulses of photons in coherent states, the device being configured such that each of said transitions are within the resonance of the optical cavity.

Clause 5. The device according to clause 4, wherein the first and second transitions are selected such that they are orthogonally polarized with respect to each other.

Clause 6. The device according to any one of clauses 4 and 5, wherein the first and second excited states are at the same energy level.

Clause 7. The device according to any one of clauses 4 through 6, wherein the first and second ground states are at different energy levels from one another.

Clause 8. The device according to any one of clauses 4 through 7, wherein said laser source is configured for selectively generating:
  a pulse of initializing photons configured to initialize the atom by inducing it to undergo the first and second transitions from the first ground state to the second ground state via the first excited state; and
  a pulse of sourcing photons configured to source a single photon from the atom by inducing it to undergo the second and first transitions from the second ground state to the first ground state via the first excited state.

Clause 9. The device according to any one of clauses 4 through 8, said laser source being configured for selectively generating a preparation photon configured to set the state of the atom to a quantum superposition state, the preparation photon being in state of superposition of first and second preparation modes, wherein interaction of the preparation photon with the atom results in its first and second ground states being in a state of superposition corresponding to the state of superposition of the first and second preparation modes.

Clause 10. The device according to any one of clauses 4 through 9, wherein the atom is a Rubidium atom.

Clause 11. The device according to any one of clauses 4 through 10, wherein the magnet is a solenoid.

Clause 12. The device according to any one of clauses 3 through 11, wherein the first stage of linear optics elements includes phase control.

Clause 13. The device according to any one of clauses 3 through 12, further comprising:
  a second stage of linear optics elements; and
  a second plurality of entanglement units;
  wherein the second stage of linear optics elements, and the second plurality of entanglement units are correspondingly displaced with the plurality of single photon source units, the first stage of linear optics elements, and the first plurality of entanglement units along the predetermined spatial axis; and
  wherein the single photons in an entangled state output from each respective entanglement unit of the first plurality of entanglement units are input to the second stage of linear optics elements and therefrom into a respective entanglement unit of the second plurality of entanglement units.

Clause 14. The device according to clause 13, wherein the second plurality of entanglement unit is configured to output a two-dimensional spatial array of entangled photons in a time-dimensional sequence.

Clause 15. The device according to any one of clauses 3 through 14, configured to produce entangled qubits for use with a quantum computer.

Clause 16. The device according to any one of clauses 3 through 15, configured to carry out the method according to any one of clauses 1 and 2.

Disclosed embodiments may include any one of the following bullet-pointed features alone or in combination with one or more other bullet-pointed features, whether implemented as a system and/or method, by at least one processor or circuitry, and/or stored as executable instructions on non-transitory computer readable media or computer readable media.

a quantum computing system a plurality of photonic cavities a plurality of coupling locations for quantum emitter positioning, each coupling location being associated with a differing one of the plurality of photonic cavities, wherein quantum emitters associated with each coupling location are configured to mediate interactions between consecutive incoming photonic qubits to generate a graph state a photon generator configured to supply photons to the plurality of photonic cavities, wherein the photonic cavities are configured to couple photonic qubits to the quantum emitters a plurality of photon output channels downstream of the plurality of cavities to output the graph state a stationary qubit capable of interacting with photons a superconducting qubit a quantum dot an atom an atom that is neutral an atom that is an ion a quantum emitter including a rubidium atom a quantum emitter including a cesium atom a quantum emitter including at least one of Strontium, Erbium, Ytterbium, Calcium, Barium, Beryllium, or Magnesium atom a photon generator including at least one additional photonic cavity a photon generator including at least one additional quantum emitter and at least one additional coupling location for quantum emitter positioning, each additional coupling location being associated with a differing one of the at least one additional photonic cavity at least one additional quantum emitter including a stationary qubit capable of interacting with photons at least one additional quantum emitter including a superconducting qubit at least one additional quantum emitter including a quantum dot at least one additional quantum emitter including an atom at least one additional quantum emitter including a rubidium atom at least one additional quantum emitter including at least one of Strontium, Erbium, Ytterbium, Calcium, Barium, Beryllium, or Magnesium atom a quantum computing method for generating a graph state coupling a quantum emitter at each of a plurality of coupling locations, such that each of a plurality of quantum emitters is associated with a differing coupling location, wherein each coupling location is associated with a different one of a plurality of photonic cavities, and wherein quantum emitters associated with each coupling location are configured to mediate interactions between consecutive incoming photonic qubits to generate a graph state supplying photons to the plurality of photonic cavities, wherein the photonic cavities are configured to couple photonic qubits to the quantum emitters outputting the graph state via a plurality of photon output channels downstream of the plurality of cavities a (non-transitory) computer-readable storage medium including instructions that, when executed by at least one processor, cause the at least one processor to carry out a quantum computing method coupling a quantum emitter at each of a plurality of coupling locations, such that each of a plurality of quantum emitters is associated with a differing coupling location, wherein each coupling location is associated with a different one of a plurality of photonic cavities, and wherein quantum emitters associated with each coupling location are configured to mediate interactions between consecutive incoming photonic qubits to generate a graph state supplying photons to the plurality of photonic cavities, wherein the photonic cavities are configured to couple photonic qubits to the quantum emitters outputting the graph state via a plurality of photon output channels downstream of the plurality of cavities a quantum computing method for generating photonic graph states positioning a plurality of quantum emitters at a plurality of coupling sites associated with a plurality of cavities initializing a state of a quantum emitter qubit associated with each of the plurality of quantum emitters transmitting photonic qubits toward the plurality of the quantum emitters in at least one first instance transmission for generating an entangling gate between the photonic qubits and the quantum emitter qubit in order to entangle the quantum emitter qubit and the photonic qubits following the at least one first instance transmission, transmitting photonic qubits toward the plurality of quantum emitters in at least one second instance transmission for generating a SWAP gate between the photonic qubits and the quantum emitter qubits to map the quantum emitter qubits to photonic qubits a first instance transmission including a plurality of photonic qubits in a sequence in order to cause a plurality of photon-quantum emitter entanglements, and a second instance transmission, following the first instance transmission in order to output a photonic graph state initializing including using a SWAP gate initializing including applying microwaves initializing including applying optical beams a plurality of quantum emitters including an atom, wherein positioning includes trapping the atom in proximity to a cavity a plurality of quantum emitters including a quantum dot, and positioning including at least one of: lithographically locating the quantum dot in proximity to a cavity; or lithographically locating the cavity in proximity to a self-assembled quantum dot photonic qubits generated using a quantum emitter coupled to a cavity a quantum emitter including a stationary qubit capable of interacting with photons a quantum emitter including a superconducting qubit a quantum emitter including a quantum dot a quantum emitter including an atom an atom that is neutral an atom that is an ion a quantum emitter including at least one of a rubidium atom or a cesium atom a quantum emitter including at least one of Strontium, Erbium, Ytterbium, Calcium, Barium, Beryllium, or Magnesium atom an entangling gate that is one of a controlled-Z gate (CZ gate), a controlled NOT gate (CNOT gate), a square root of a SWAP gate, or an imaginary SWAP gate (iSWAP gate)

an entangling gate that is a controlled-Z gate (CZ gate)

a non-transitory computer-readable storage medium including instructions that, when executed by at least one processor, cause the at least one processor to carry out a quantum computing method for generating photonic graph states positioning a plurality of quantum emitters at a plurality of coupling sites associated with a plurality of cavities initializing a state of a quantum emitter qubit associated with each of the plurality of quantum emitters transmitting photonic qubits toward the plurality of the quantum emitters in at least one first instance transmission for generating an entangling gate between the photonic qubits and the quantum emitter qubit in order to entangle the quantum emitter qubit and the photonic qubits following the at least one first instance transmission, transmitting photonic qubits toward the plurality of quantum emitters in at least one second instance transmission for generating a SWAP gate between the photonic qubits and the quantum emitter qubits to map the quantum emitter qubits to photonic qubits a quantum computing system for generating photonic graph states a plurality of cavities a plurality of coupling sites for positioning a plurality of quantum emitters at the plurality of coupling sites, each coupling site being associated with a differing one of a plurality of cavities at least one processor configured to initialize a state of a quantum emitter qubit associated with each of a plurality of quantum emitters at least one processor configured to transmit photonic qubits toward a plurality of the quantum emitters in at least one first instance transmission for generating an entangling gate between photonic qubits and a quantum emitter qubit in order to entangle the quantum emitter qubit and the photonic qubits at least one processor configured to, following at least one first instance transmission, transmit photonic qubits toward a plurality of quantum emitters in at least one second instance transmission for generating a SWAP gate between photonic qubits and quantum emitter qubits to map the quantum emitter qubits to photonic qubits a method of generating photonic graph states for quantum computing coupling a quantum emitter to a cavity generating a first dirty photon having a first temporal profile using a first dirty photon to form a first photonic qubit generating a second dirty photon having a second temporal profile using a second dirty photon to form a second photonic qubit using a quantum emitter coupled to a cavity to entangle a first photonic qubit with a second photonic qubit to form a pair of entangled photonic qubits using a pair of entangled photonic qubits for quantum computation using a cavity coupled to a quantum emitter to entangle a plurality of additional photons to generate a photonic graph at least some additional photons that are dirty generating a third dirty photon having a third temporal profile different from a first and second temporal profiles using a third dirty photon to form a third photonic qubit using a quantum emitter coupled to a cavity to entangle a third photonic qubit with a first or second photonic qubit, to form three entangled photonic qubits using a pair of entangled photonic qubits for quantum computation including using three entangled photonic qubits for quantum computation a first dirty photon and a second dirty photon generated by extraction from a coherent laser pulse using a quantum emitter coupled to a cavity a first dirty photon and a second dirty photon that are each part of a graph, and wherein the graph contains photonic qubits lacking quantum emitter qubits, or photonic and quantum emitter qubits at least one of a first dirty photon and a second dirty photon obtained from an optical delay line spectra of a first dirty photon and a second dirty photon within an interaction bandwidth of a quantum emitter coupled to a cavity at least one of a first dirty photon and a second dirty photon generated from a fluctuating quantum emitter a quantum emitter including a stationary qubit capable of interacting with photons a quantum emitter including a superconducting qubit a quantum emitter including a quantum dot a quantum emitter including at least one of an atom or an ion an atom or an ion sourced from rubidium an atom or ion sourced from cesium a quantum emitter including at least one of Strontium, Erbium, Ytterbium, Calcium, Barium, Beryllium, or Magnesium atom a second temporal profile different from a first temporal profile a second temporal profile the same as a first temporal profile a system for generating photonic graph states for quantum computing a cavity a quantum emitter couplable to a cavity a photon generator configured to generate dirty photons circuitry configured to couple a quantum emitter to a cavity circuitry configured to control a photon generator to generate a first dirty photon having a first temporal profile circuitry configured to use a first dirty photon to form a first photonic qubit circuitry configured to control a photon generator to generate a second dirty photon having a second temporal profile circuitry configured to use a second dirty photon to form a second photonic qubit circuitry configured to use a quantum emitter coupled to a cavity to entangle a first photonic qubit with a second photonic qubit to form a pair of entangled photonic qubits circuitry configured to use a pair of entangled photonic qubits for quantum computation a (non-transitory) computer-readable storage medium including instructions that, when executed by at least one processor, cause the at least one processor to carry out a method of generating photonic graph states for quantum computing coupling a quantum emitter to a cavity generating a first dirty photon having a first temporal profile using a first dirty photon to form a first photonic qubit generating a second dirty photon having a second temporal profile using a second dirty photon to form a second photonic qubit using a quantum emitter coupled to a cavity to entangle a first photonic qubit with a second photonic qubit to form a pair of entangled photonic qubits using a pair of entangled photonic qubits for quantum computation a quantum computing method initializing a state of a resonator-coupled quantum emitter receiving at least two photonic graph states, each of the at least two photonic graph states containing at least two photons selecting at least one photon from each graph state feeding selected photons through an entangling gate via a resonator-coupled quantum emitter disentangling a resonator-coupled quantum emitter from selected photons, wherein disentangling includes at least one of detecting the state of the resonator-coupled quantum emitter or mapping the state of the resonator-coupled quantum emitter to a state of an additional photon an entangling gate that is one of a controlled-Z gate (CZ gate), a controlled NOT gate (CNOT gate), a square root of a SWAP gate, or an imaginary SWAP gate (iSWAP gate)

feeding selected photons through an entangling gate sequentially mapping achieved by applying a SWAP gate on a quantum emitter and an additional photon an initialized state of a resonator-coupled quantum emitter that is an equal superposition of two ground states a quantum emitter including a stationary qubit capable of interacting with photons a quantum emitter including a superconducting qubit a quantum emitter including a quantum dot a quantum emitter including an atom that is neutral a quantum emitter including an atom that is an ion a quantum emitter including a rubidium atom or a cesium atom a quantum emitter including at least one of Strontium, Erbium, Ytterbium, Calcium, Barium, Beryllium, or Magnesium atom a quantum computing system a resonator-coupled quantum emitter a plurality of switches at least one processor configured to control a plurality of switches to initialize a state of a resonator-coupled quantum emitter at least one processor configured to control a plurality of switches to receive at least two photonic graph states, each of the at least two photonic graph states containing at least two photons at least one processor configured to control a plurality of switches to select at least one photon from each graph state at least one processor configured to control a plurality of switches to feed selected photons through an entangling gate via the resonator-coupled quantum emitter at least one processor configured to control a plurality of switches to disentangle a resonator-coupled quantum emitter from the selected photons, wherein disentangling includes at least one of detecting the state of the resonator-coupled quantum emitter or mapping the state of the resonator-coupled quantum emitter to a state of an additional photon an entangling gate that is one of a controlled-Z gate (CZ gate), a controlled NOT gate (CNOT gate), a square root of a SWAP gate, or an imaginary SWAP gate (iSWAP gate)

feeding selected photons through an entangling sequentially mapping by applying a SWAP gate on a quantum emitter and an additional photon an initialized state of a resonator-coupled quantum emitter that is an equal superposition of two ground states a quantum emitter including a stationary qubit capable of interacting with photons a quantum emitter including one of a superconducting qubit, a quantum dot, or an atom a non-transitory computer-readable medium including instructions that, when executed by at least one processor, cause the at least one processor to carry out a quantum computing method initializing a state of a resonator-coupled quantum emitter receiving at least two photonic graph states, each of the at least two photonic graph states containing at least two photons selecting at least one photon from each graph state feeding selected photons through an entangling gate via a resonator-coupled quantum emitter disentangling a resonator-coupled quantum emitter from selected photons, wherein disentangling includes at least one of detecting the state of the resonator-coupled quantum emitter or mapping the state of the resonator-coupled quantum emitter to a state of an additional photon a quantum computing method initializing a state of a resonator-coupled quantum emitter having at least four levels arranged in an N-configuration, the N-configuration having a first ground state, a second ground state, a first excited state and a second excited state tuning a frequency of a first transition between a first ground state and a first excited state tuning a frequency of a second transition between a second ground state and a second excited state tuning a frequency of a third transition between a second ground state and a first excited state feeding a plurality of photons at a frequency corresponding to a frequency of a second transition, thereby entangling the plurality of photons to a resonator-coupled quantum emitter feeding a photon at a frequency corresponding to a frequency of at least one of a first transition or a third transition, thereby mapping a state of a resonator-coupled quantum emitter into a photon a state of a resonator-coupled quantum emitter that is an electronic state, a nuclear state, or a combination thereof tuning of the frequencies of a first transition, a second transition and a third transition before initializing tuning of one or more of the frequencies of the transitions by light-shift using a laser tuning of one or more of the frequencies of the transitions by Zeeman shift through application of a magnetic field feeding a photon at a frequency corresponding to the frequency of at least one of a first transition or a third transition to further initialize a resonator-coupled quantum emitter to correspond to at least one of a first ground state or a second ground state feeding a plurality of photons by sequentially feeding a plurality of single photons initializing of a state of a resonator-coupled quantum emitter by preparing the resonator-coupled quantum emitter in a superposition state of a first ground state and a second ground state a superposition state that is an equal superposition of a first ground state and a second ground state a resonator-coupled quantum emitter including two resonators coupled to a single quantum emitter a quantum emitter including a stationary qubit capable of interacting with photons a quantum emitter including one of a superconducting qubit or a quantum dot a quantum emitter including a neutral atom a quantum emitter including an ion a quantum emitter including at least one of a rubidium atom or a cesium atom a quantum emitter including at least one of Strontium, Erbium, Ytterbium, Calcium, Barium, Beryllium, or Magnesium atom a quantum computing system a resonator-coupled quantum emitter having at least four levels arranged in an N-configuration, the N-configuration having a first ground state, a second ground state, a first excited state and a second excited state circuitry configured to initialize a state of the resonator-coupled quantum emitter circuitry configured to tune a frequency of a first transition between a first ground state and a first excited state circuitry configured to tune a frequency of a second transition between a second ground state and a second excited state circuitry configured to tune a frequency of a third transition between a second ground state and a first excited state circuitry configured to feed a plurality of photons at a frequency corresponding to a frequency of a second transition, thereby entangling the plurality of photons to a resonator-coupled quantum emitter circuitry configured to feed a photon at a frequency corresponding to the frequency of at least one of a first transition or a third transition, thereby mapping a state of a resonator-coupled quantum emitter into a photon a laser for light-shifting, thereby tuning at least one of the frequencies of the transitions a magnetic field generator for providing a magnetic field, application of the magnetic field for tuning at least one of the frequencies of the transitions a resonator-coupled quantum emitter including two resonators coupled to a single quantum emitter a non-transitory computer-readable medium including instructions that when executed by at least one processor, cause the at least one processor to carry out a quantum computing method initializing a state of a resonator-coupled quantum emitter having at least four levels arranged in an N-configuration, the N-configuration having a first ground state, a second ground state, a first excited state and a second excited state tuning a frequency of a first transition between the first ground state and the first excited state tuning a frequency of a second transition between the second ground state and the second excited state tuning a frequency of a third transition between the second ground state and the first excited state feeding a plurality of photons at a frequency corresponding to the frequency of the second transition, thereby entangling the plurality of photons to the resonator-coupled quantum emitter feeding a photon at a frequency corresponding to the frequency of at least one of the first transition or the third transition, thereby mapping a state of the resonator-coupled quantum emitter into a photon a quantum computing system a plurality of photonic processing stages, wherein each photonic processing stage includes at least two of an optical switch, a beam splitter, a waveguide or a photon generator a plurality of heralding-free connections, each connection being located between adjacent photonic processing stages circuitry configured to regulate photon flow between adjacent stages such that decisions about stage settings or flow between adjacent stages are free of input from a previous stage photonic processing stages separated in a time domain photonic processing stages separated in a spatial domain decisions about stage settings including settings of an optical switch an optical switch including a phase shifter decisions about stage settings including settings of a phase shifter a photon generator including a quantum emitter coupled to a resonator at least some of photonic processing stages including a quantum emitter a quantum emitter coupled to a resonator a quantum emitter configured to entangle a quantum emitter qubit to a photonic qubit when a photonic qubit is transmitted toward the quantum emitter a quantum emitter configured to map a quantum emitter qubit to a photonic qubit when the photonic qubit is transmitted toward the quantum emitter a quantum emitter configured to mediate interactions between consecutive incoming photonic qubits to generate a graph state a quantum emitter including a stationary qubit capable of interacting with photons a quantum emitter including a superconducting qubit a quantum emitter including a quantum dot a quantum emitter including at least one of a neutral atom or an ion an atom that is a rubidium atom or an ion that is a rubidium ion an atom that is a cesium atom or an ion that is a cesium ion a quantum emitter including at least one of Strontium, Erbium, Ytterbium, Calcium, Barium, Beryllium, or Magnesium atom a quantum computing method transmitting or receiving a plurality of photons via a plurality of heralding-free connections, each connection being located between adjacent photonic processing stages, wherein each photonic processing stage includes at least two of an optical switch, a beam splitter, a waveguide, or a photon generator regulating photon flow between adjacent stages such that decisions about stage settings or flow between adjacent stages are free of input from a previous stage at least some photonic processing stages including a quantum emitter coupled to a resonator entangling a quantum emitter qubit to a photonic qubit when the photonic qubit is transmitted toward the quantum emitter mapping a quantum emitter qubit to a photonic qubit when the photonic qubit is transmitted toward the quantum emitter mediating interactions between consecutive incoming photonic qubits to generate a graph state a non-transitory computer-readable medium including instructions that, when executed by at least one processor, cause the at least one processor to carry out a quantum computing method transmitting or receiving a plurality of photons via a plurality of heralding-free connections, each connection being located between adjacent photonic processing stages, wherein each photonic processing stage includes at least two of an optical switch, a beam splitter, a waveguide, or a photon generator regulating photon flow between adjacent stages such that decisions about stage settings or flow between adjacent stages are free of input from a previous stage Also disclosed herein are following clauses.

Clause Set 1:

Clause 1. A quantum computing system, comprising: a plurality of photonic cavities; a plurality of coupling locations for quantum emitter positioning, each coupling location being associated with a differing one of the plurality of photonic cavities, wherein quantum emitters associated with each coupling location are configured to mediate interactions between consecutive incoming photonic qubits to generate a graph state; a photon generator configured to supply photons to the plurality of photonic cavities, wherein the photonic cavities are configured to couple photonic qubits to the quantum emitters; and a plurality of photon output channels downstream of the plurality of cavities to output the graph state.

Clause 2. A quantum computing method for generating a graph state, the method comprising: coupling a quantum emitter at each of a plurality of coupling locations, such that each of a plurality of quantum emitters is associated with a differing coupling location, wherein each coupling location is associated with a different one of a plurality of photonic cavities, and wherein quantum emitters associated with each coupling location are configured to mediate interactions between consecutive incoming photonic qubits to generate a graph state; supplying photons to the plurality of photonic cavities, wherein the photonic cavities are configured to couple photonic qubits to the quantum emitters; and outputting the graph state via a plurality of photon output channels downstream of the plurality of cavities.

Clause 3. A (non-transitory) computer-readable storage medium including instructions that, when executed by at least one processor or circuitry, cause the at least one processor or circuitry to carry out the method of Clause 2.

Clause 4. The system of Clause 1, the method of Clause 2, or the (non-transitory) computer-readable storage medium of Clause 3, wherein the quantum emitter includes a stationary qubit capable of interacting with photons.

Clause 5. The system of Clause 1 or 4, the method of Clause 2 or 4, or the (non-transitory) computer-readable storage medium of Clause 3 or 4, wherein the quantum emitter includes a superconducting qubit.

Clause 6. The system of Clause 1 or 4-5, the method of Clause 2 or 4-5, or the (non-transitory) computer-readable storage medium of Clause 3 or 4-5, wherein the quantum emitter includes a quantum dot.

Clause 7. The system of Clause 1 or 4-6, the method of Clause 2 or 4-6, or the (non-transitory) computer-readable storage medium of Clause 3 or 4-6, wherein the quantum emitter includes an atom.

Clause 8. The system of Clause 1 or 4-7, the method of Clause 2 or 4-7, or the (non-transitory) computer-readable storage medium of Clause 3 or 4-7, wherein the quantum emitter includes a rubidium atom.

Clause 9. The system of Clause 1 or 4-8, the method of Clause 2 or 4-8, or the (non-transitory) computer-readable storage medium of Clause 3 or 4-8, wherein the quantum emitter includes a cesium atom.

Clause 10. The system of Clause 1 or 4-9, the method of Clause 2 or 4-9, or the (non-transitory) computer-readable storage medium of Clause 3 or 4-9, wherein the quantum emitter includes at least one of Strontium, Erbium, Ytterbium, Calcium, Barium, Beryllium, or Magnesium atom.

Clause 11. The system of Clause 7-10, the method of Clause 7-10, or the (non-transitory) computer-readable storage medium of Clause 7-10, wherein the atom, the rubidium atom, cesium atom, or at least one of Strontium, Erbium, Ytterbium, Calcium, Barium, Beryllium, or Magnesium atom, is neutral.

Clause 12. The system of Clause 7-10, the method of Clause 7-10, or the (non-transitory) computer-readable storage medium of Clause 7-10, wherein the atom, the rubidium atom, the cesium atom, or the at least one of Strontium, Erbium, Ytterbium, Calcium, Barium, Beryllium, or Magnesium atom, is an ion.

Clause 13. The system of Clause 1 or 4-12, wherein the photon generator includes at least one additional photonic cavity.

Clause 14. The system of Clause 13, wherein the photon generator includes at least one additional quantum emitter and at least one additional coupling location for quantum emitter positioning, each additional coupling location being associated with a differing one of the at least one additional photonic cavity.

Clause 15. The system of Clause 14, wherein the at least one additional quantum emitter includes a stationary qubit capable of interacting with photons.

Clause 16. The system of Clause 14 or 15, wherein the at least one additional quantum emitter includes a superconducting qubit.

Clause 17. The system of Clause 14-16, wherein the at least one additional quantum emitter includes a quantum dot.

Clause 18. The system of Clause 14-17, wherein the at least one additional quantum emitter includes an atom.

Clause 19. The system of Clause 14-18, wherein the at least one additional quantum emitter includes a rubidium atom.

Clause 20. The system of Clause 14-19, wherein the at least one additional quantum emitter includes a cesium atom.

Clause 21. The system of Clause 14-20, wherein the at least one additional quantum emitter includes at least one of Strontium, Erbium, Ytterbium, Calcium, Barium, Beryllium, or Magnesium atom.

Clause 22. The system of Clause 18-21, wherein the atom, the rubidium atom, the cesium atom, or the at least one of Strontium, Erbium, Ytterbium, Calcium, Barium, Beryllium, or Magnesium atom, is neutral.

Clause 23. The system of Clause 18-21, wherein the atom, the rubidium atom, the cesium atom, or the at least one of Strontium, Erbium, Ytterbium, Calcium, Barium, Beryllium, or Magnesium atom, is an ion.

Clause Set 2:

Clause 31. A quantum computing method for generating photonic graph states, the method comprising: positioning a plurality of quantum emitters at a plurality of coupling sites associated with a plurality of cavities; initializing a state of a quantum emitter qubit associated with each of the plurality of quantum emitters; transmitting photonic qubits toward the plurality of the quantum emitters in at least one first instance transmission for generating an entangling gate between the photonic qubits and the quantum emitter qubit in order to entangle the quantum emitter qubit and the photonic qubits; and following the at least one first instance transmission, transmitting photonic qubits toward the plurality of quantum emitters in at least one second instance transmission for generating a SWAP gate between the photonic qubits and the quantum emitter qubits to map the quantum emitter qubits to photonic qubits.

Clause 32. A (non-transitory) computer-readable storage medium including instructions that, when executed by at least one processor or circuitry, cause the at least one processor or circuitry to carry out the method of Clause 31.

Clause 33. A quantum computing system for generating photonic graph states, the system comprising: a plurality of cavities; a plurality of coupling sites for positioning a plurality of quantum emitters at the plurality of coupling sites, each coupling site being associated with a differing one of the plurality of cavities; and at least one processor configured to: initialize a state of a quantum emitter qubit associated with each of the plurality of quantum emitters; transmit photonic qubits toward the plurality of the quantum emitters in at least one first instance transmission for generating an entangling gate between the photonic qubits and the quantum emitter qubit in order to entangle the quantum emitter qubit and the photonic qubits; and following the at least one first instance transmission, transmit photonic qubits toward the plurality of quantum emitters in at least one second instance transmission for generating a SWAP gate between the photonic qubits and the quantum emitter qubits to map the quantum emitter qubits to photonic qubits.

Clause 34. The method of Clause 31, the (non-transitory) computer-readable storage medium of Clause 32, or the system of Clause 33, wherein the first instance transmission includes a plurality of photonic qubits in a sequence in order to cause a plurality of photon-quantum emitter entanglements, and wherein the second instance transmission, follows the first instance transmission in order to output a photonic graph state.

Clause 35. The method of Clause 31 or 34, the (non-transitory) computer-readable storage medium of Clause 32 or 34, or the system of Clause 33 or 34, wherein initializing involves using a SWAP gate.

Clause 36. The method of Clause 31 or 34-35, the (non-transitory) computer-readable storage medium of Clause 32 or 34-35, or the system of Clause 33 or 34-35, wherein initializing includes applying microwaves.

Clause 37. The method of Clause 31 or 34-36, the (non-transitory) computer-readable storage medium of Clause 32 or 34-36, or the system of Clause 33 or 34-36, wherein initializing includes applying optical beams.

Clause 38. The method of Clause 31 or 34-37, the (non-transitory) computer-readable storage medium of Clause 32 or 34-37, or the system of Clause 33 or 34-37, wherein the plurality of quantum emitters includes an atom, and wherein positioning includes trapping the atom in proximity to a cavity.

Clause 39. The method of Clause 31 or 34-38, the (non-transitory) computer-readable storage medium of Clause 32 or 34-38, or the system of Clause 33 or 34-38, wherein the plurality of quantum emitters includes a quantum dot, and positioning includes at least one of: lithographically locating the quantum dot in proximity to a cavity; or lithographically locating the cavity in proximity to a self-assembled quantum dot.

Clause 40. The method of Clause 31 or 34-39, the (non-transitory) computer-readable storage medium of Clause 32 or 34-39, or the system of Clause 33 or 34-39, wherein the photonic qubits are generated using a quantum emitter coupled to a cavity.

Clause 41. The method of Clause 31 or 34-40, the (non-transitory) computer-readable storage medium of Clause 32 or 34-40, or the system of Clause 33 or 34-40, wherein the quantum emitter includes a stationary qubit capable of interacting with photons.

Clause 42. The method of Clause 31 or 34-41, the (non-transitory) computer-readable storage medium of Clause 32 or 34-41, or the system of Clause 33 or 34-41, wherein the quantum emitter includes a superconducting qubit.

Clause 43. The method of Clause 31 or 34-42, the (non-transitory) computer-readable storage medium of Clause 32 or 34-42, or the system of Clause 33 or 34-42, wherein the quantum emitter includes a quantum dot.

Clause 44. The method of Clause 31 or 34-43, the (non-transitory) computer-readable storage medium of Clause 32 or 34-43, or the system of Clause 33 or 34-43, wherein the quantum emitter includes an atom.

Clause 45. The method of Clause 31 or 34-44, the (non-transitory) computer-readable storage medium of Clause 32 or 34-44, or the system of Clause 33 or 34-44, wherein the quantum emitter includes a rubidium atom.

Clause 46. The method of Clause 31 or 34-45, the (non-transitory) computer-readable storage medium of Clause 32 or 34-45, or the system of Clause 33 or 34-45, wherein the quantum emitter includes a cesium atom.

Clause 47. The method of Clause 31 or 34-46, the (non-transitory) computer-readable storage medium of Clause 32 or 34-46, or the system of Clause 33 or 34-46, wherein the quantum emitter includes at least one of Strontium, Erbium, Ytterbium, Calcium, Barium, Beryllium, or Magnesium atom.

Clause 48. The method of Clause 44-47, the (non-transitory) computer-readable storage medium of Clause 44-47, or the system of Clause 44-47, wherein the atom, the rubidium atom, cesium atom, or at least one of Strontium, Erbium, Ytterbium, Calcium, Barium, Beryllium, or Magnesium atom, is neutral.

Clause 49. The method of Clause 44-47, the (non-transitory) computer-readable storage medium of Clause 44-47, or the system of Clause 44-47, wherein the atom, the rubidium atom, the cesium atom, or the at least one of Strontium, Erbium, Ytterbium, Calcium, Barium, Beryllium, or Magnesium atom, is an ion.

Clause 50. The method of Clause 31 or 34-49, the (non-transitory) computer-readable storage medium of Clause 32 or 34-49, or the system of Clause 33 or 34-49, wherein the entangling gate is one of a controlled-Z gate (CZ gate), a controlled NOT gate (CNOT gate), a square root of a SWAP gate, or an imaginary SWAP gate (iSWAP gate).

Clause 51. The method of Clause 31 or 34-50, the (non-transitory) computer-readable storage medium of Clause 32 or 34-50, or the system of Clause 33 or 34-50, wherein the entangling gate is a controlled-Z gate (CZ gate).

Clause Set 3:

Clause 61. A method of generating photonic graph states for quantum computing, the method comprising: coupling a quantum emitter to a cavity; generating a first dirty photon having a first temporal profile; using the first dirty photon to form a first photonic qubit; generating a second dirty photon having a second temporal profile; using the second dirty photon to form a second photonic qubit; using the quantum emitter coupled to the cavity to entangle the first photonic qubit with the second photonic qubit to form a pair of entangled photonic qubits; and using the pair of entangled photonic qubits for quantum computation.

Clause 62. A (non-transitory) computer-readable storage medium including instructions that, when executed by at least one processor or circuitry, cause the at least one processor or circuitry to carry out the method of Clause 61.

Clause 63. A system for generating photonic graph states for quantum computing, the system comprising: a cavity; a quantum emitter couplable to the cavity; a photon generator configured to generate dirty photons; and circuitry configured to: couple the quantum emitter to the cavity; control the photon generator to generate a first dirty photon having a first temporal profile; use the first dirty photon to form a first photonic qubit; control the photon generator to generate a second dirty photon having a second temporal profile; use the second dirty photon to form a second photonic qubit; use the quantum emitter coupled to the cavity to entangle the first photonic qubit with the second photonic qubit to form a pair of entangled photonic qubits; and use the pair of entangled photonic qubits for quantum computation.

Clause 64. The method of Clause 61, the (non-transitory) computer-readable storage medium of Clause 62, or the system of Clause 63, further comprising using the cavity coupled to the quantum emitter to entangle a plurality of additional photons to generate a photonic graph.

Clause 65. The method of Clause 64, the (non-transitory) computer-readable storage medium of Clause 64, or the system of Clause 64, wherein at least some of the additional photons are dirty.

Clause 66. The method of Clause 61 or 64-65, the (non-transitory) computer-readable storage medium of Clause 62 or 64-65, or the system of Clause 63 or 64-65, further comprising: generating a third dirty photon having a third temporal profile different from the first and second temporal profiles; using the third dirty photon to form a third photonic qubit; using the quantum emitter coupled to the cavity to entangle the third photonic qubit with the first or second photonic qubit, to form three entangled photonic qubits; and wherein the using the pair of entangled photonic qubits for quantum computation includes using the three entangled photonic qubits for quantum computation.

Clause 67. The method of Clause 61 or 64-66, the (non-transitory) computer-readable storage medium of Clause 62 or 64-66, or the system of Clause 63 or 64-66, wherein the first dirty photon and the second dirty photon are generated by extraction from a coherent laser pulse using a quantum emitter coupled to a cavity.

Clause 68. The method of Clause 61 or 64-67, the (non-transitory) computer-readable storage medium of Clause 62 or 64-67, or the system of Clause 63 or 64-67, wherein the first dirty photon and the second dirty photon are each part of a graph, and wherein the graph contains photonic qubits lacking quantum emitter qubits, or photonic and quantum emitter qubits.

Clause 69. The method of Clause 61 or 64-68, the (non-transitory) computer-readable storage medium of Clause 62 or 64-68, or the system of Clause 63 or 64-68, wherein at least one of the first dirty photon and the second dirty photon are obtained from an optical delay line.

Clause 70. The method of Clause 61 or 64-69, the (non-transitory) computer-readable storage medium of Clause 62 or 64-69, or the system of Clause 63 or 64-69, wherein spectra of the first dirty photon and the second dirty photon are within an interaction bandwidth of the quantum emitter coupled to the cavity.

Clause 71. The method of Clause 61 or 64-70, the (non-transitory) computer-readable storage medium of Clause 62 or 64-70, or the system of Clause 63 or 64-70, wherein at least one of the first dirty photon and the second dirty photon are generated from a fluctuating quantum emitter.

Clause 72. The method of Clause 61 or 64-71, the (non-transitory) computer-readable storage medium of Clause 62 or 64-71, or the system of Clause 63 or 64-71, wherein the quantum emitter includes a stationary qubit capable of interacting with photons.

Clause 73. The method of Clause 61 or 64-72, the (non-transitory) computer-readable storage medium of Clause 62 or 64-72, or the system of Clause 63 or 64-72, wherein the second temporal profile is different from the first temporal profile.

Clause 74. The method of Clause 61 or 64-72, the (non-transitory) computer-readable storage medium of Clause 62 or 64-72, or the system of Clause 63 or 64-72, the second temporal profile is the same as the first temporal profile.

Clause 75. The method of Clause 61 or 64-74, the (non-transitory) computer-readable storage medium of Clause 62 or 64-74, or the system of Clause 63 or 64-74, wherein the quantum emitter includes a stationary qubit capable of interacting with photons.

Clause 76. The method of Clause 61 or 64-75, the (non-transitory) computer-readable storage medium of Clause 62 or 64-75, or the system of Clause 63 or 64-75, wherein the quantum emitter includes a superconducting qubit.

Clause 77. The method of Clause 61 or 64-76, the (non-transitory) computer-readable storage medium of Clause 62 or 64-76, or the system of Clause 63 or 64-76, wherein the quantum emitter includes a quantum dot.

Clause 78. The method of Clause 61 or 64-77, the (non-transitory) computer-readable storage medium of Clause 62 or 64-77, or the system of Clause 63 or 64-77, wherein the quantum emitter includes an atom.

Clause 79. The method of Clause 61 or 64-78, the (non-transitory) computer-readable storage medium of Clause 62 or 64-78, or the system of Clause 63 or 64-78, wherein the quantum emitter includes a rubidium atom.

Clause 80. The method of Clause 61 or 64-79, the (non-transitory) computer-readable storage medium of Clause 62 or 64-79, or the system of Clause 63 or 64-79, wherein the quantum emitter includes a cesium atom.

Clause 81. The method of Clause 61 or 64-80, the (non-transitory) computer-readable storage medium of Clause 62 or 64-80, or the system of Clause 63 or 64-80, wherein the quantum emitter includes at least one of Strontium, Erbium, Ytterbium, Calcium, Barium, Beryllium, or Magnesium atom.

Clause 82. The method of Clause 78-81, the (non-transitory) computer-readable storage medium of Clause 78-81, or the system of Clause 78-81, wherein the atom, the rubidium atom, cesium atom, or at least one of Strontium, Erbium, Ytterbium, Calcium, Barium, Beryllium, or Magnesium atom, is neutral.

Clause 83. The method of Clause 78-81, the (non-transitory) computer-readable storage medium of Clause 78-81, or the system of Clause 78-81, wherein the atom, the rubidium atom, the cesium atom, or the at least one of Strontium, Erbium, Ytterbium, Calcium, Barium, Beryllium, or Magnesium atom, is an ion.

Clause Set 4:

Clause 91. A quantum computing method, comprising: initializing a state of a resonator-coupled quantum emitter; receiving at least two photonic graph states, each of the at least two photonic graph states containing at least two photons; selecting at least one photon from each graph state; feeding the selected photons through an entangling gate via the resonator-coupled quantum emitter; and disentangling the resonator-coupled quantum emitter from the selected photons, wherein disentangling includes at least one of detecting the state of the resonator-coupled quantum emitter or mapping the state of the resonator-coupled quantum emitter to a state of an additional photon.

Clause 92. A quantum computing system, comprising: a resonator-coupled quantum emitter; a plurality of switches; and at least one processor or circuitry configured to control the plurality of switches to: initialize a state of the resonator-coupled quantum emitter; receive at least two photonic graph states, each of the at least two photonic graph states containing at least two photons; select at least one photon from each graph state; feed the selected photons through an entangling gate via the resonator-coupled quantum emitter; and disentangle the resonator-coupled quantum emitter from the selected photons, wherein disentangling includes at least one of detecting the state of the resonator-coupled quantum emitter or mapping the state of the resonator-coupled quantum emitter to a state of an additional photon.

Clause 93. A (non-transitory) computer-readable medium including instructions that, when executed by at least one processor or circuitry, cause the at least one processor or circuitry to carry out the method of Clause 91.

Clause 94. The method of Clause 91, the system of Clause 92, or the (non-transitory) computer-readable storage medium of Clause 93, wherein the entangling gate is one of a controlled-Z gate (CZ gate), a controlled NOT gate (CNOT gate), a square root of a SWAP gate, or an imaginary SWAP gate (iSWAP gate).

Clause 95. The method of Clause 91 or 94, the system of Clause 92 or 94, or the (non-transitory) computer-readable storage medium of Clause 93 or 94, wherein feeding the selected photons through an entangling gate occurs sequentially.

Clause 96. The method of Clause 91 or 94-95, the system of Clause 92 or 94-95, or the (non-transitory) computer-readable storage medium of Clause 93 or 94-95, wherein the mapping is achieved by applying a SWAP gate on the quantum emitter and an additional photon.

Clause 97. The method of Clause 91 or 94-96, the system of Clause 92 or 94-96, or the (non-transitory) computer-readable storage medium of Clause 93 or 94-96, wherein the initialized state of the resonator-coupled quantum emitter is an equal superposition of two ground states.

Clause 98. The method of Clause 91 or 94-97, the system of Clause 92 or 94-97, or the (non-transitory) computer-readable storage medium of Clause 93 or 94-97, wherein the quantum emitter includes a stationary qubit capable of interacting with photons.

Clause 99. The method of Clause 91 or 94-98, the system of Clause 92 or 94-98, or the (non-transitory) computer-readable storage medium of Clause 93 or 94-98, wherein the quantum emitter includes a superconducting qubit.

Clause 100. The method of Clause 91 or 94-99, the system of Clause 92 or 94-99, or the (non-transitory) computer-readable storage medium of Clause 93 or 94-99, wherein the quantum emitter includes a quantum dot.

Clause 101. The method of Clause 91 or 94-100, the system of Clause 92 or 94-100, or the (non-transitory) computer-readable storage medium of Clause 93 or 94-100, wherein the quantum emitter includes an atom.

Clause 102. The method of Clause 91 or 94-101, the system of Clause 92 or 94-101, or the (non-transitory) computer-readable storage medium of Clause 93 or 94-101, wherein the quantum emitter includes a rubidium atom.

Clause 103. The method of Clause 91 or 94-102, the system of Clause 92 or 94-102, or the (non-transitory) computer-readable storage medium of Clause 93 or 94-102, wherein the quantum emitter includes a cesium atom.

Clause 104. The method of Clause 91 or 94-103, the system of Clause 92 or 94-103, or the (non-transitory) computer-readable storage medium of Clause 93 or 94-103, wherein the quantum emitter includes at least one of Strontium, Erbium, Ytterbium, Calcium, Barium, Beryllium, or Magnesium atom.

Clause 105. The method of Clause 101-104, the (non-transitory) computer-readable storage medium of Clause 101-104, or the system of Clause 101-104, wherein the atom, the rubidium atom, cesium atom, or at least one of Strontium, Erbium, Ytterbium, Calcium, Barium, Beryllium, or Magnesium atom, is neutral.

Clause 106. The method of Clause 101-104, the (non-transitory) computer-readable storage medium of Clause 101-104, or the system of Clause 101-104, wherein the atom, the rubidium atom, the cesium atom, or the at least one of Strontium, Erbium, Ytterbium, Calcium, Barium, Beryllium, or Magnesium atom, is an ion.

Clause Set 5:

Clause 111. A quantum computing method, comprising: initializing a state of a resonator-coupled quantum emitter having at least four levels arranged in an N-configuration, the N-configuration having a first ground state, a second ground state, a first excited state and a second excited state; tuning a frequency of a first transition between the first ground state and the first excited state; tuning a frequency of a second transition between the second ground state and the second excited state; tuning a frequency of a third transition between the second ground state and the first excited state; feeding a plurality of photons at a frequency corresponding to the frequency of the second transition, thereby entangling the plurality of photons to the resonator-coupled quantum emitter; and feeding a photon at a frequency corresponding to the frequency of at least one of the first transition or the third transition, thereby mapping a state of the resonator-coupled quantum emitter into a photon.

Clause 112. A quantum computing system, comprising: a resonator-coupled quantum emitter having at least four levels arranged in an N-configuration, the N-configuration having a first ground state, a second ground state, a first excited state and a second excited state; and circuitry configured to: initialize a state of the resonator-coupled quantum emitter; tune a frequency of a first transition between the first ground state and the first excited state; tune a frequency of a second transition between the second ground state and the second excited state; tune a frequency of a third transition between the second ground state and the first excited state; feed a plurality of photons at a frequency corresponding to the frequency of the second transition, thereby entangling the plurality of photons to the resonator-coupled quantum emitter; and feed a photon at a frequency corresponding to a frequency of at least one of the first transition or the third transition, thereby mapping a state of the resonator-coupled quantum emitter into a photon.

Clause 113. The system of Clause 112, further comprising at least one of: a laser for light-shifting, thereby tuning at least one of the frequencies of the transitions; or a magnetic field generator for providing a magnetic field, application of the magnetic field for tuning at least one of the frequencies of the transitions.

Clause 114. A (non-transitory) computer-readable medium including instructions that when executed by at least one processor or circuitry, cause the at least one processor or circuitry to carry out the method of Clause 111.

Clause 115. The method of Clause 111, the system of Clause 112-113, or the (non-transitory) computer-readable medium of Clause 114, wherein the state of a resonator-coupled quantum emitter is an electronic state, a nuclear state, or a combination thereof.

Clause 116. The method of Clause 111 or 115, the system of Clause 112-113 or 115, or the (non-transitory) computer-readable medium of Clause 114 or 115, wherein the tuning of the frequencies of the first transition, the second transition and the third transition occur before the initializing.

Clause 117. The method of Clause 111 or 115-116, the system of Clause 112-113 or 115-116, or the (non-transitory) computer-readable medium of Clause 114 or 115-116, wherein the tuning of one or more of the frequencies of the transitions occurs by light-shift using a laser.

Clause 118. The method of Clause 111 or 115-117, the system of Clause 112-113 or 115-117, or the (non-transitory) computer-readable medium of Clause 114 or 115-117, wherein the tuning of one or more of the frequencies of the transitions occurs by Zeeman shift through application of a magnetic field.

Clause 119. The method of Clause 111 or 115-118, the system of Clause 112-113 or 115-118, or the (non-transitory) computer-readable medium of Clause 114 or 115-118, wherein feeding a photon at a frequency corresponding to the frequency of at least one of the first transition or the third transition further initializes the resonator-coupled quantum emitter to correspond to at least one of the first ground state or the second ground state.

Clause 120. The method of Clause 111 or 115-119, the system of Clause 112-113 or 115-119, or the (non-transitory) computer-readable medium of Clause 114 or 115-119, wherein feeding a plurality of photons includes sequentially feeding a plurality of single photons.

Clause 121. The method of Clause 111 or 115-120, the system of Clause 112-113 or 115-120, or the (non-transitory) computer-readable medium of Clause 114 or 115-120, wherein the initializing of the state of the resonator-coupled quantum emitter includes preparing the resonator-coupled quantum emitter in a superposition state of the first ground state and the second ground state.

Clause 122. The method of Clause 121, the system of Clause 121, or the (non-transitory) computer-readable medium of Clause 121, wherein the superposition state is an equal superposition of the first ground state and the second ground state.

Clause 123. The method of Clause 111 or 115-122, the system of Clause 112-113 or 115-122, or the (non-transitory) computer-readable medium of Clause 114 or 115-122, wherein the resonator-coupled quantum emitter includes two resonators coupled to a single quantum emitter.

Clause 124. The method of Clause 111 or 115-123, the system of Clause 112-113 or 115-123, or the (non-transitory) computer-readable medium of Clause 114 or 115-123, wherein the quantum emitter includes a stationary qubit capable of interacting with photons.

Clause 125. The method of Clause 111 or 115-124, the system of Clause 112-113 or 115-124, or the (non-transitory) computer-readable medium of Clause 114 or 115-124, wherein the quantum emitter includes a superconducting qubit.

Clause 126. The method of Clause 111 or 115-125, the system of Clause 112-113 or 115-125, or the (non-transitory) computer-readable medium of Clause 114 or 115-125, wherein the quantum emitter includes a quantum dot.

Clause 127. The method of Clause 111 or 115-126, the system of Clause 112-113 or 115-126, or the (non-transitory) computer-readable medium of Clause 114 or 115-126, wherein the quantum emitter includes an atom.

Clause 128. The method of Clause 111 or 115-127, the system of Clause 112-113 or 115-127, or the (non-transitory) computer-readable medium of Clause 114 or 115-127, wherein the quantum emitter includes a rubidium atom.

Clause 129. The method of Clause 111 or 115-128, the system of Clause 112-113 or 115-128, or the (non-transitory) computer-readable medium of Clause 114 or 115-128, wherein the quantum emitter includes a cesium atom.

Clause 130. The method of Clause 111 or 115-129, the system of Clause 112-113 or 115-129, or the (non-transitory) computer-readable medium of Clause 114 or 115-129, wherein the quantum emitter includes at least one of Strontium, Erbium, Ytterbium, Calcium, Barium, Beryllium, or Magnesium atom.

Clause 131. The method of Clause 127-130, the system of Clause 127-130, or the (non-transitory) computer-readable medium of Clause 127-130, wherein the atom, the rubidium atom, cesium atom, or at least one of Strontium, Erbium, Ytterbium, Calcium, Barium, Beryllium, or Magnesium atom, is neutral.

Clause 132. The method of Clause 127-130, the system of Clause 127-130, or the (non-transitory) computer-readable medium of Clause 127-130, wherein the atom, the rubidium atom, the cesium atom, or the at least one of Strontium, Erbium, Ytterbium, Calcium, Barium, Beryllium, or Magnesium atom, is an ion.

Clause Set 6:

Clause 141. A quantum computing system, comprising: a plurality of photonic processing stages, wherein each photonic processing stage includes at least two of an optical switch, a beam splitter, a waveguide or a photon generator; a plurality of heralding-free connections, each connection being located between adjacent photonic processing stages; and circuitry configured to regulate photon flow between adjacent stages such that decisions about stage settings or flow between adjacent stages are free of input from a previous stage.

Clause 142. A quantum computing method, comprising: transmitting or receiving a plurality of photons via a plurality of heralding-free connections, each connection being located between adjacent photonic processing stages, wherein each photonic processing stage includes at least two of an optical switch, a beam splitter, a waveguide, or a photon generator; and regulating photon flow between adjacent stages such that decisions about stage settings or flow between adjacent stages are free of input from a previous stage.

Clause 143. The method of Clause 142, wherein at least some of the photonic processing stages include a quantum emitter coupled to a resonator, and the method further comprises: entangling a quantum emitter qubit to a photonic qubit when the photonic qubit is transmitted toward the quantum emitter; mapping a quantum emitter qubit to a photonic qubit when the photonic qubit is transmitted toward the quantum emitter; or mediating interactions between consecutive incoming photonic qubits to generate a graph state.

Clause 144. A (non-transitory) computer-readable medium including instructions that, when executed by at least one processor or circuitry, cause the at least one processor or circuitry to carry out the method of Clause 142 or 143.

Clause 145. The system of Clause 141, method of Clause 142-143, or the (non-transitory) computer-readable medium of Clause 144, wherein at least some of the photonic processing stages are separated in a time domain.

Clause 146. The system of Clause 141 or 145, method of Clause 142-143 or 145, or the (non-transitory) computer-readable medium of Clause 144 or 145, wherein at least some of the photonic processing stages are separated in a spatial domain.

Clause 147. The system of Clause 141 or 145-146, method of Clause 142-143 or 145-146, or the (non-transitory) computer-readable medium of Clause 144 or 145-146, wherein decisions about stage settings include settings of the optical switch.

Clause 148. The system of Clause 141 or 145-147, method of Clause 142-143 or 145-147, or the (non-transitory) computer-readable medium of Clause 144 or 145-147, wherein the optical switch includes a phase shifter.

Clause 149. The system of Clause 148, method of Clause 148, or the (non-transitory) computer-readable medium of Clause 148, wherein the decisions about stage settings include settings of the phase shifter.

Clause 150. The system of Clause 141 or 145-149, method of Clause 142-143 or 145-149, or the (non-transitory) computer-readable medium of Clause 144 or 145-149, wherein the photon generator includes a quantum emitter coupled to a resonator.

Clause 151. The system of Clause 141 or 145-150, method of Clause 142-143 or 145-150, or the (non-transitory) computer-readable medium of Clause 144 or 145-150, wherein at least some of the photonic processing stages include a quantum emitter.

Clause 152. The system of Clause 151, method of Clause 151, or the (non-transitory) computer-readable medium of Clause 151, wherein the quantum emitter is coupled to a resonator.

Clause 153. The system of Clause 152, method of Clause 152, or the (non-transitory) computer-readable medium of Clause 152, wherein the quantum emitter is configured to: entangle a quantum emitter qubit to a photonic qubit when a photonic qubit is transmitted toward the quantum emitter; map the quantum emitter qubit to a photonic qubit when the photonic qubit is transmitted toward the quantum emitter; or mediate interactions between consecutive incoming photonic qubits to generate a graph state.

Clause 154. The system of Clause 150-153, method of Clause 150-153, or the (non-transitory) computer-readable medium of Clause 150-153, wherein the quantum emitter includes a stationary qubit capable of interacting with photons.

Clause 155. The system of Clause 150-154, method of Clause 150-154, or the (non-transitory) computer-readable medium of Clause 150-154, wherein the quantum emitter includes a superconducting qubit.

Clause 156. The system of Clause 150-155, method of Clause 150-155, or the (non-transitory) computer-readable medium of Clause 150-155, wherein the quantum emitter includes a quantum dot.

Clause 157. The system of Clause 150-156, method of Clause 150-156, or the (non-transitory) computer-readable medium of Clause 150-156, wherein the quantum emitter includes an atom.

Clause 158. The system of Clause 150-157, method of Clause 150-157, or the (non-transitory) computer-readable medium of Clause 150-157, wherein the quantum emitter includes a rubidium atom.

Clause 159. The system of Clause 150-158, method of Clause 150-158, or the (non-transitory) computer-readable medium of Clause 150-158, wherein the quantum emitter includes a cesium atom.

Clause 160. The system of Clause 150-159, method of Clause 150-159, or the (non-transitory) computer-readable medium of Clause 150-159, wherein the quantum emitter includes at least one of Strontium, Erbium, Ytterbium, Calcium, Barium, Beryllium, or Magnesium atom.

Clause 161. The system of Clause 157-160, method of Clause 157-160, or the (non-transitory) computer-readable medium of Clause 157-160, wherein the atom, the rubidium atom, cesium atom, or at least one of Strontium, Erbium, Ytterbium, Calcium, Barium, Beryllium, or Magnesium atom, is neutral.

Clause 162. The system of Clause 157-160, method of Clause 157-160, or the (non-transitory) computer-readable medium of Clause 157-160, wherein the atom, the rubidium atom, the cesium atom, or the at least one of Strontium, Erbium, Ytterbium, Calcium, Barium, Beryllium, or Magnesium atom, is an ion.

Systems and methods disclosed herein involve unconventional improvements over conventional approaches. Descriptions of the disclosed embodiments are not exhaustive and are not limited to the precise forms or embodiments disclosed. Modifications and adaptations of the embodiments will be apparent from consideration of the specification and practice of the disclosed embodiments. Additionally, the disclosed embodiments are not limited to the examples discussed herein.

The foregoing description has been presented for purposes of illustration. It is not exhaustive and is not limited to the precise forms or embodiments disclosed. Modifications and adaptations of the embodiments will be apparent from consideration of the specification and practice of the disclosed embodiments. For example, the described implementations include hardware and software, but systems and methods consistent with the present disclosure may be implemented as hardware alone.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and, accordingly, all suitable modifications and equivalents may be resorted to, falling within the scope of the disclosure.

Computer programs based on the written description and methods of this specification are within the skill of a software developer. The various functions, scripts, programs, or modules may be created using a variety of programming techniques. For example, programs, scripts, functions, program sections or program modules may be designed in or by means of languages, including JAVASCRIPT, C, C++, JAVA, PHP, PYTHON, RUBY, PERL, BASH, or other programming or scripting languages. One or more of such software sections or modules may be integrated into a computer system, non-transitory computer readable media, or existing communications software. The programs, modules, or code may also be implemented or replicated as firmware or circuit logic.

Moreover, while illustrative embodiments have been described herein, the scope may include any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as non-exclusive. Further, the steps of the disclosed methods may be modified in any manner, including by reordering steps or inserting or deleting steps. It is intended, therefore, that the specification and examples be considered as exemplary only, with a true scope and spirit being indicated by the following claims and their full scope of equivalents.

The invention claimed is:

1. A method of generating photonic graph states for quantum computing, the method comprising:
    coupling a quantum emitter to a cavity;
    generating a first dirty photon having a first temporal profile;
    using the first dirty photon to form a first photonic qubit;
    generating a second dirty photon having a second temporal profile;
    using the second dirty photon to form a second photonic qubit;
    using the quantum emitter coupled to the cavity to entangle the first photonic qubit with the second photonic qubit to form a pair of entangled photonic qubits; and
    using the pair of entangled photonic qubits for quantum computation.

2. The method of claim 1, wherein the method further comprises using the cavity coupled to the quantum emitter to entangle a plurality of additional photons to generate a photonic graph.

3. The method of claim 2, wherein at least some of the additional photons are dirty.

4. The method of claim 1, further comprising:
    generating a third dirty photon having a third temporal profile different from the first and second temporal profiles;
    using the third dirty photon to form a third photonic qubit;
    using the quantum emitter coupled to the cavity to entangle the third photonic qubit with the first or second photonic qubit, to form three entangled photonic qubits; and
    wherein the using the pair of entangled photonic qubits for quantum computation includes using the three entangled photonic qubits for quantum computation.

5. The method of claim 1, wherein the first dirty photon and the second dirty photon are generated by extraction from a coherent laser pulse using a quantum emitter coupled to a cavity.

6. The method of claim 1, wherein the first dirty photon and the second dirty photon are each part of a graph, and wherein the graph contains photonic qubits lacking quantum emitter qubits, or photonic and quantum emitter qubits.

7. The method of claim 1, wherein at least one of the first dirty photon and the second dirty photon are obtained from an optical delay line.

8. The method of claim 1, wherein spectra of the first dirty photon and the second dirty photon are within an interaction bandwidth of the quantum emitter coupled to the cavity.

9. The method of claim 1, wherein at least one of the first dirty photon and the second dirty photon are generated from a fluctuating quantum emitter.

10. The method of claim 1, wherein the quantum emitter includes a stationary qubit capable of interacting with photons.

11. The method of claim 1, wherein the quantum emitter includes a superconducting qubit.

12. The method of claim 1, wherein the quantum emitter includes a quantum dot.

13. The method of claim 1, wherein the quantum emitter includes at least one of an atom or an ion.

14. The method of claim 13, wherein the atom or the ion is sourced from rubidium.

15. The method of claim 13, the atom or the ion is sourced from cesium.

16. The method of claim 13, wherein the quantum emitter includes at least one of Strontium, Erbium, Ytterbium, Calcium, Barium, Beryllium, or Magnesium atom.

17. The method of claim 1, wherein the second temporal profile is different from the first temporal profile.

18. The method of claim 1, wherein the second temporal profile is the same as the first temporal profile.

19. A system for generating photonic graph states for quantum computing, the system comprising:
    a cavity;
    a quantum emitter couplable to the cavity;
    a photon generator configured to generate dirty photons; and
    circuitry configured to:
        couple the quantum emitter to the cavity;
        control the photon generator to generate a first dirty photon having a first temporal profile;
        use the first dirty photon to form a first photonic qubit;
        control the photon generator to generate a second dirty photon having a second temporal profile;
        use the second dirty photon to form a second photonic qubit;
        use the quantum emitter coupled to the cavity to entangle the first photonic qubit with the second photonic qubit to form a pair of entangled photonic qubits; and
        use the pair of entangled photonic qubits for quantum computation.

20. A non-transitory computer-readable storage medium including instructions that, when executed by at least one processor, cause the at least one processor to carry out a method of generating photonic graph states for quantum computing, comprising:
- coupling a quantum emitter to a cavity;
- generating a first dirty photon having a first temporal profile;
- using the first dirty photon to form a first photonic qubit;
- generating a second dirty photon having a second temporal profile;
- using the second dirty photon to form a second photonic qubit;
- using the quantum emitter coupled to the cavity to entangle the first photonic qubit with the second photonic qubit to form a pair of entangled photonic qubits; and
- using the pair of entangled photonic qubits for quantum computation.

* * * * *